United States Patent
Burchard et al.

(10) Patent No.: US 12,411,025 B2
(45) Date of Patent: Sep. 9, 2025

(54) METHODS AND APPARATUSES FOR MEASURING MAGNETIC FLUX DENSITY AND OTHER PARAMETERS BY MEANS OF A PLURALITY OF NV CENTERS, AND APPLICATIONS THEREOF

(71) Applicants: QUANTUM TECHNOLOGIES GMBH, Leipzig (DE); ELMOS SEMICONDUCTOR SE, Dortmund (DE)

(72) Inventors: Bernd Burchard, Essen (DE); Jan Meijer, Bochum (DE)

(73) Assignees: QUANTUM TECHNOLOGIES GMBH, Leipzig (DE); ELMOS SEMICONDUCTOR SE, Dortmund (DE)

( * ) Notice: Subject to any disclaimer, the term of this patent is extended or adjusted under 35 U.S.C. 154(b) by 473 days.

(21) Appl. No.: 17/774,741

(22) PCT Filed: Nov. 6, 2020

(86) PCT No.: PCT/DE2020/100953
§ 371 (c)(1),
(2) Date: May 5, 2022

(87) PCT Pub. No.: WO2021/089091
PCT Pub. Date: May 14, 2021

(65) Prior Publication Data
US 2022/0397429 A1     Dec. 15, 2022

(30) Foreign Application Priority Data
Nov. 7, 2019   (DE) .................... 10 2019 130 114.9

(51) Int. Cl.
| | | |
|---|---|---|
| *G01D 5/26* | (2006.01) | |
| *G01D 5/245* | (2006.01) | |
| *G01D 5/30* | (2006.01) | |

(52) U.S. Cl.
CPC ........... *G01D 5/266* (2013.01); *G01D 5/2451* (2013.01); *G01D 5/30* (2013.01)

(58) Field of Classification Search
CPC ........ G01D 5/266; G01D 5/2451; G01D 5/30; G01D 5/26; G01D 5/145; G01D 21/00;
(Continued)

(56) References Cited

U.S. PATENT DOCUMENTS

| | | | |
|---|---|---|---|
| 2017/0212190 A1* | 7/2017 | Reynolds | G01R 33/26 |
| 2018/0136291 A1* | 5/2018 | Pham | G01R 33/24 |
| 2022/0307997 A1* | 9/2022 | Meijer | G01R 33/032 |

FOREIGN PATENT DOCUMENTS

| | | |
|---|---|---|
| WO | 2016118791 A1 | 7/2016 |
| WO | 2018226784 A2 | 12/2018 |

OTHER PUBLICATIONS

Aggarwal Charu C., "Neural Networks and Deep Learning: A Textbook" Springer; 1. Auflage, Sep. 13, 2018.
(Continued)

*Primary Examiner* — Hwa Andrew Lee
(74) *Attorney, Agent, or Firm* — Mindful IP PLLC; Michael J. McCandlish

(57) ABSTRACT

A sensor system includes a quantum dot including one or more paramagnetic centers. It comprises a control and evaluation device including a pump radiation source, a radiation receiver and which irradiates the quantum dot depending on a transmission signal. The quantum dot emits fluorescence radiation upon irradiation with the pump radiation, which depends on the magnetic flux density and/or on another physical parameter. The control and evaluation
(Continued)

device generates an output signal including a measured value as a function of the fluorescence radiation. The control and evaluation device compensatingly readjusts the sensitivity of the quantum dot for the magnetic flux density and/or the other physical parameter by means of one or more compensation coils.

6 Claims, 76 Drawing Sheets

(58) Field of Classification Search
CPC ......... G01H 11/02; G01S 7/521; G01S 15/86; G01R 33/032; G01R 33/26
See application file for complete search history.

(56) References Cited

OTHER PUBLICATIONS

International Search Report re PCT/DE2020/100953 mailed Mar. 15, 2021 (11 pages).
Schirhagl et al. "Nitrogen-Vacancy Centers in Diamond: Nanoscale Sensors for Physics and Biology" Annual Review of Physical Chemistry., US, vol. 65, No. 1, Apr. 2014 (Apr. 2014), pp. 83-105 DOI: 10.1146/annurev-physchem-040513-103659 ISSN: 0066-426X, XP055758070.
Bradac Carlo et al., "Quantum Nanophotonics with Group IV defects in Diamond", DOI: 10.1038/s41467-020-14316-x, arXiv:1906.10992.
Burchard Bernd et al., "NM Scale Resolution Single Ion Implantation Into Diamond for Quantum Dot Production", Diamond 2004 Conference Riva del Garda.
Burchard B. et al., "Generation of single color centers by focused nitrogen implantation" Appl. Phys. Lett. 87, 261909 (2005); https://doi.org/10.1063/1.2103389.
Herrera Francisco et al., "Multilabel Classification: Problem Analysis, Metrics and Techniques", Springer, Apr. 22, 2018, ISBN-13 : 978-3319822693.
Iwasaki Takayuki et al., "Tin-Vacancy Quantum Emitters in Diamond", Phys. Rev. Lett. 119, 253601 (2017), DOI: 10.1103/PhysRevLett.119.253601, arXiv:1708.03576 [quant-ph].
Jensen Rasmus Høy et al., "Cavity-Enhanced Photon Emission from a Single Germanium-Vacancy Center in a Diamond Membrane", arXiv:1912.05247v3 [quant-ph] May 25, 2020.
Küpfmüller Kohn, "Theoretische Elektrotechnik und Elektronik" Springer 1993 Kapitel 3 mit besonderem Schwerpunkt auf Kapitel 3 Abschnitt I 25.
Tegetmeyer Björn, "Luminescence properties of SiV-centers in diamond diodes" Promotionsschrift, Universität Freiburg, Jan. 30, 2018.
Trusheim Matthew E.et al., "Lead-Related Quantum Emitters in Diamond" Phys. Rev. B 99, 075430 (2019), DOI: 10.1103/PhysRevB.99.075430, arXiv:1805.12202 [quant-ph].
Wang C.et al., "Single photon emission from SiV centres in diamond produced by ion implantation" J. Phys. B: At. Mol.Opt. Phys., 39(37), 2006.
Zaitsev Alexander M., "Optical Properties of Diamond", erschienen im Springer Verlag.
Zi-Ieng et al. "Microwave-free vector magnetometry with nitrogen-vacancy centers along a single axis in diamond" arxiv.org, Cornell University Library, 201 Olin Library Cornell University Ithaca, NY 14853, Apr. 8, 2019 (Apr. 8, 2019), XP081643890.

* cited by examiner state of the art state of the art

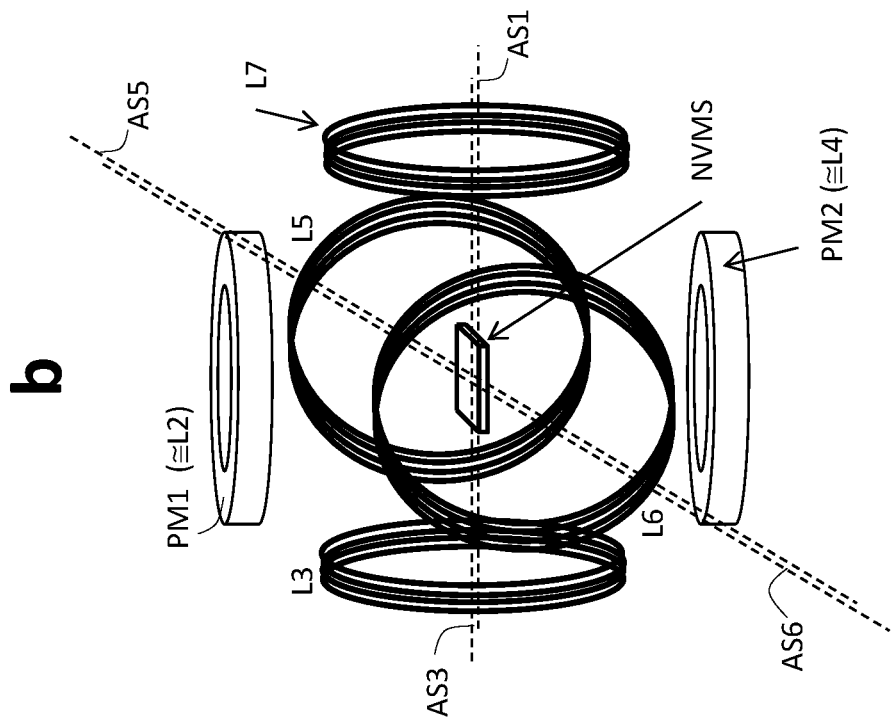
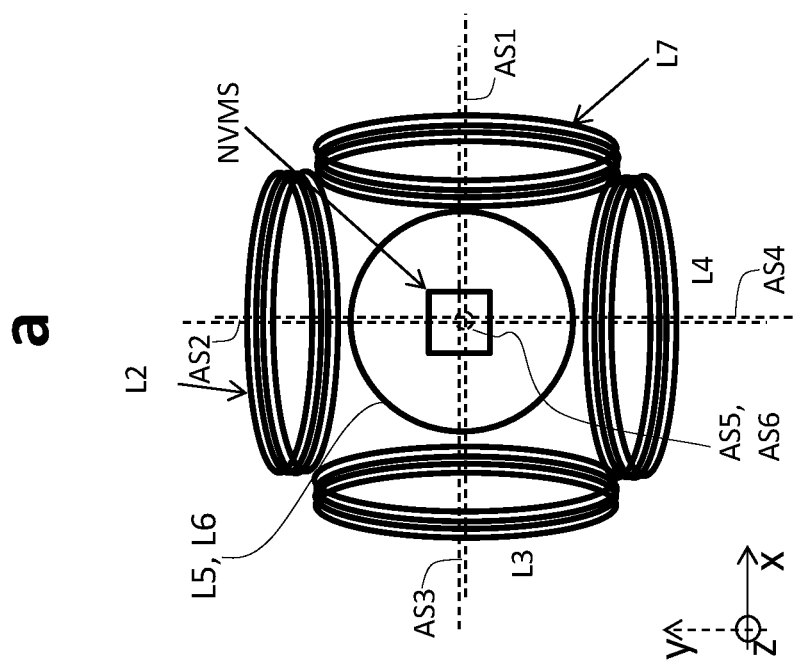
Fig. 18 magnetoencephalography II

METHODS AND APPARATUSES FOR MEASURING MAGNETIC FLUX DENSITY AND OTHER PARAMETERS BY MEANS OF A PLURALITY OF NV CENTERS, AND APPLICATIONS THEREOF

CROSS REFERENCE TO RELATED APPLICATIONS

This application is a US National Phase of International Patent Application Number PCT/DE2020/100827, filed on Sep. 27, 2020, claiming priority to the German patent application DE 10 2019 130 114.9 dated 7 Nov. 2019, the contents of which is incorporated herein by reference in its entirety.

TECHNICAL FIELD

The disclosure is directed to a NV center based sensor system and methods of operating said sensor system and applications thereof. The system differs from the prior art in that no microwave frequency is required. Preferably, a plurality of NV centers are used. Particularly preferably, a plurality of nanodiamonds with different crystal orientations and a plurality of NV centers are used.

INTRODUCTION AND OVERVIEW

The disclosure is explained below with the aid of the exemplary figures. Combinations of features and ideas of the various figures and with features of the list of features of the description are conceivable and may be claimed by the features and their combinations. However, only the claims and their combinations are decisive for the concrete claim.

The term sensor system (NVMS) in this description also includes systems, which exploit quantum properties of optical centers at room temperature in general. This applies in particular to systems, which carry out modifications to quantum states of the paramagnetic centers and/or evaluate and/or record and output them. Preferably, these are systems with diamond as substrate. With regard to other substrates and interfering sites, reference is made to the explanations of the already mentioned and still unpublished PCT/DE2020/100 827 and DE 10 2020 125 189.0. Preferably, the defect centers are defect centers in diamond and more preferably NV centers and/or SiV centers. Other suitable paramagnetic centers may be e.g. ST1 centers, GeV centers, TR1 centers, L2 centers, etc.

The table is only an exemplary compilation of some possible paramagnetic centers. The functionally equivalent use of other paramagnetic centers in other materials is explicitly possible. The wavelengths of the excitation radiation are also exemplary. Other wavelengths are usually possible if they are shorter than the wavelength of the ZPL to be excited.

| Material | exemplary defect center | ZPL | exemplary pump radiation wavelength ($\lambda_{pmp}$) | reference |
|---|---|---|---|---|
| diamond | NV-center | | 520 nm, 532 nm | |
| diamond | SiV center | 738 nm | 685 nm | /1/, /2/, /3/ |
| diamond | GeV center | 602 nm | 532 nm | /3/, /4/ |
| diamond | SnV Center | 620 nm | 532 nm | /3/, /5/ |
| diamond | PbV center | 520 nm, 552 nm | 450 nm | /3/, /6/ |
| | | 715 nm | 532 nm | /6/ |

BACKGROUND

The references for the above defect centers are:
/1/ C. Wang, C. Kurtsiefer, H. Weinfurter, B. Burchard, "Single photon emission from SiV centers in diamond produced by ion implantation" J. Phys. B: At. Mol. Opt. Phys., 39(37), 2006.
/2/ Björn Tegetmeyer, "Luminescence properties of SiV-centers in diamond diodes" PhD thesis, University of Freiburg, Jan. 30, 2018.
/3/ Carlo Bradac, Weibo Gao, Jacopo Forneris, Matt Trusheim, Igor Aharonovich, "Quantum Nanophotonics with Group IV defects in Diamond," DOI: 10.1038/s41467-020-14316-x, arXiv:1906.10992.
/4/ Rasmus Høy Jensen, Erika Janitz, Yannik Fontana, Yi He, Olivier Gobron, Ilya P. Radko, Mihir Bhaskar, Ruffin Evans, Cesar Daniel Rodriguez Rosenblueth, Lilian Childress, Alexander Huck, Ulrik Lund Andersen, "Cavity-Enhanced Photon Emission from a Single Germanium-Vacancy Center in a Diamond Membrane," arXiv:1912.05247v3 [quant-ph] 25 May 2020.
/5/ Takayuki Iwasaki, Yoshiyuki Miyamoto, Takashi Taniguchi, Petr Siyushev, Mathias H. Metsch, Fedor Jelezko, Mutsuko Hatano, "Tin-Vacancy Quantum Emitters in Diamond," Phys. Rev. Lett. 119, 253601 (2017), DOI: 10.1103/PhysRevLett.119.253601, arXiv: 1708.03576 [quant-ph].
/6/ Matthew E. Trusheim, Noel H. Wan, Kevin C. Chen, Christopher J. Ciccarino, Ravishankar Sundararaman, Girish Malladi, Eric Bersin, Michael Walsh, Benjamin Lienhard, Hassaram Bakhru, Prineha Narang, Dirk Englund, "Lead-Related Quantum Emitters in Diamond" Phys. Rev. B 99, 075430 (2019), DOI: 10.1103/PhysRevB.99.075430, arXiv:1805.12202 [quant-ph].

These sensor systems are part of the technical teachings disclosed herein.

SUMMARY

The principles and features mentioned in this disclosure can be combined and are part of the claims to the extent that the result is meaningful.

In addition to the prior art publicly available at the time of the application, the prior art known to the applicants but still unpublished for patentability purposes also plays a role.

This prior art, which is still unpublished at the time of filing of this disclosure, is in particular the subject of the document DE 10 2018 127 394 A1, which is still unpublished at the time of filing of the priority-establishing application of this disclosure, and the subject of the German patent applications DE102019120076.8, DE102019121137.9, DE102019121028.3, DE102018127394.0 and DE102020119414.5, which are still unpublished at the time of filing of this disclosure, and the subject of the international patent applications PCT/DE2020/100648 and PCT/DE2020/100827, which are still unpublished at the time of filing of this disclosure. This unpublished prior art of the German patent applications DE 102019120076.8, DE102019121137.9, DE102019121028.3, DE102018127394A1 and DE102020119 414.5 and the international patent application PCT/DE2020/100648 are fully parts of this disclosure. In particular, the document DE102020119414.5 contains extensive prior art to which reference is made herein. This prior art, which was unpublished at the time of filing of this document, is explained with the aid of FIGS. 1 to 4.

In particular, when quantum dots are referred to in this paper, they may be a paramagnetic center (NV1) and/or a cluster of such paramagnetic centers (NV1) in the form of a plurality (NVC) of paramagnetic centers (NV1) and/or a plurality of such clusters. Preferably, NV centers in diamond are used as paramagnetic centers. Thus, when speaking of a quantum dot, it may in particular be a NV center and/or a cluster of such NV centers in the form of a plurality of NV-centers and/or a plurality of such clusters. Particularly preferred are dense clusters of paramagnetic centers (NV1), thus preferably of NV centers.

BRIEF DESCRIPTION OF THE DRAWINGS

FIGS. 18a and 18b show the combination of an example sensor system (NVMS) comprising at least one paramagnetic center (NV1) with two or three exemplary Helmholtz coil pairs.

DESCRIPTION

FIG. 1

Figure 1:
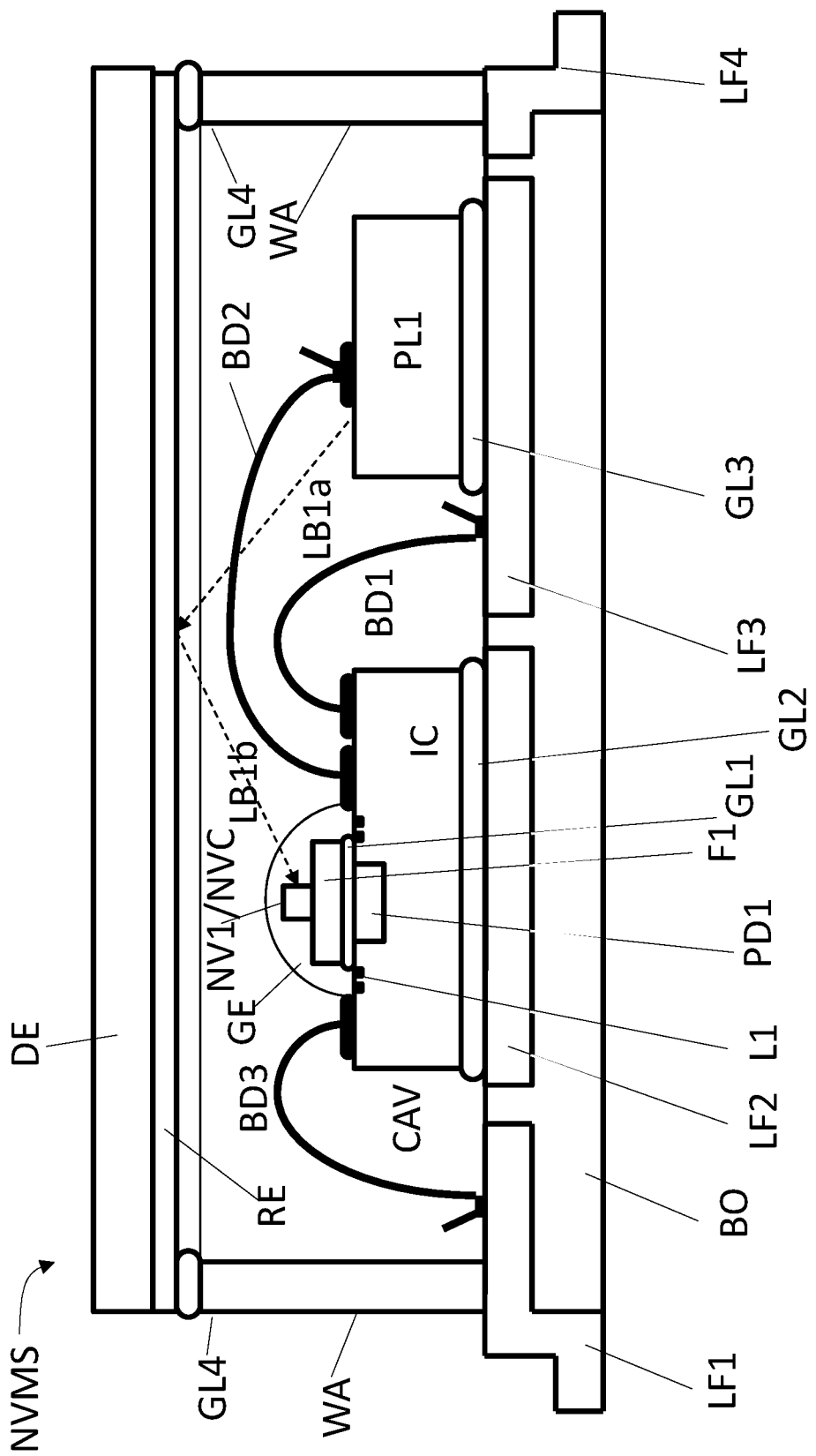
FIG. 1 shows a schematically simplified cross-section of an example housing for an example sensor system.

FIG. 1 shows a schematically simplified cross-section of an exemplary housing corresponding to DE102020119414.5 or PCT/DE2020/100648 for an exemplary sensor system. The housing comprises a housing base (BO), housing walls (WA) and a housing cover (DE). In the example of FIG. 1, the housing cover (DE) is attached to the top edge of the housing wall (WA) with an exemplary fourth adhesive (GL4). Preferably, the housing wall (WA) and the housing bottom (BO) form a so-called pre-molded-open-cavity housing with a cavity (CAV), into which the electronic, magnetic, and optical functional elements of the sensor system can be installed before closing by gluing on the housing cover (DE). Such a pre-molded open cavity housing is preferably manufactured by injection molding using thermosets and filling materials.

A so-called lead frame is typically cast into the base (BO) of the pre-molded open cavity housing. This is structured so that different lead frame islands (LF1, LF2, LF3, LF4) are formed, which are mechanically held and electrically insulated from one another by the injection molding compound of the housing base (BO) after the lead frame is separated after overmolding. This lead frame separation step, called the trim-and-form step, is also used to modify the shape of the terminals. Here, these are the first lead frame island (LF1) and the fourth lead frame island (LF4).

In the exemplary system, an integrated circuit (IC) is attached to the second lead frame island (LF2), which serves here as a so-called die paddle, by means of a preferably electrically conductive second adhesive (GL2).

In the example of FIG. 1, the integrated circuit (IC) comprises a light-sensitive first radiation receiver (PD1). It is also conceivable to install the light-sensitive first radiation receiver (PD1) separately as a discrete component in the cavity (CAV) of the housing and to connect it to the integrated circuit (IC), for example, via bonding wires.

A first pump radiation source (PL1) is attached to the third lead frame island (LF3) by means of a third adhesive (GL3), preferably in an electrically conductive manner.

In the example of FIG. 1, the third lead frame island (LF3) is connected to the integrated circuit (IC) by means of a first bonding wire (BD1) as an example. This establishes an exemplary electrical connection between the backside of the first pump radiation source (PL1) and the integrated circuit (IC) in the example of FIG. 1.

A second terminal of the first pump radiation source (PL1) is also connected to the integrated circuit (IC) in the example of the FIG. 1 by means of a second bond wire (BD2). This enables the integrated circuit (IC) to supply electrical power to and control the first pump radiation source (PL1).

Depending on the control by the integrated circuit (IC), the first pump radiation source (PL1) emits pump radiation (LB1$a$). A reflector (RE) is located on the underside of the housing cover (DE). The reflector (RE) may also be part of the housing cover (DE). For example, the surface of the underside of the housing cover (DE) can have a suitable surface structure. This may be, for example, a roughening, a polish, bevel, other optical functional element, or the like. The cover (DE) can also be made, for example, of a material with particularly good reflective properties, for example a suitable mold compound. Particularly preferably, the housing cover (DE) is made of a white material. At least, the material of the housing cover (DE) should have such a spectral property that it reflects well the radiation of the first pump radiation source (PL1) and/or the fluorescence radiation (FL) of the quantum dot, in particular of the paramagnetic center (NV1) or in particular of the plurality (NVC) of paramagnetic centers (NV1). For example, if the first pump radiation source (PL1) emits green light, a green or white reflector (RE) is particularly favorable. The pump radiation (LB1$a$) emitted by the first pump radiation source (PL1) is reflected at this reflector (RE) and directed as reflected pump radiation (LB1$b$) onto at least one paramagnetic center (NV1) or a plurality (NVC) of paramagnetic centers (NV1).

The paramagnetic center (NV1) or a plurality of paramagnetic centers (NVC) are preferably located in a sensor element, which is not provided here with a separate reference sign in order to simplify the figures. Preferably, the paramagnetic center (NV1) is a defect center in a crystal, the crystal being the sensor element as defined herein. A sensor element may itself again comprise a plurality of sensor elements, for example a plurality of crystals. It may be the case that the plurality (NVC) of paramagnetic centers (NV1) is a defect center in a crystal or in multiple crystals, with the crystal or crystals constituting the sensor element in the sense of this writing. In the case of multiple crystals, it is advantageous if the multiple crystals are assembled by a binder to form the sensor element. Such a binder may be optically transparent plastic or glass or the like. The binder should be sufficiently transparent to the pump radiation wavelength of the pump radiation (LB1$a$, LB1$b$) and the fluorescence wavelength of the fluorescence radiation (FL). Preferably, the crystal is a diamond crystal, or the crystals are diamond crystals. Preferably, the defect center is a NV center in a diamond crystal. Preferably, the defect centers are NV centers. In this paper, NV centers are referred to as nitrogen defect centers in diamond. The use of other defect centers such as that of SiV centers is conceivable. At this point we refer to the standard work Alexander M. Zaitsev, "Optical Properties of Diamond", published by the publisher Springer, in which numerous diamond defect centers are named. However, the NV center has been particularly well researched and is especially suitable because of its optical properties. For the purposes of this paper, the paramagnetic center (NV1) may also be multiple defect centers in a crystal and/or an assemblage of multiple crystals with multiple defect centers, i.e., a plurality (NVC) of paramagnetic centers (NV1). Particularly preferably, the defect centers are arranged so close in distance or in such a large spatial density to each other that these defect centers are coupled to each other. The coupling can occur, for example, by stimulated emission and by absorption and via magnetic moments of the electron configuration of the defect centers. Collective effects then result. Particularly preferably, the defect centers are arranged in the form of regular, especially preferred periodic structures. This can be achieved by the fact that the defect centers or their precursor structures are electrically charged during the manufacturing process, for example, thereby repel each other and therefore arrange themselves in the form of a superlattice by electrostatic attraction, at least in locally limited areas. Of course, a superlattice structure can also be achieved by focused ion implantation. (Bernd Burchard et. Al., "NM Scale Resolution Single Ion Implantation Into Diamond for Quantum Dot Production," Diamond 2004 Conference Riva del Garda: Generation of a superlattice without coupling between lattice points, and B. Burchard, J. Meijer, M. Domhan, C. Wittmann, T. Gaebel, I. Popa, F. Jelezko, and J. Wrachtrup, "Generation of single color centers by focused nitrogen implantation" Appl. Opt. Phys. Lett. 87, 261909 (2005); https://doi.org/10.1063/1.2103389)

For example, the paramagnetic center (NV1) may be a plurality (NVC) of paramagnetic centers (NV1) in the form of multiple, preferably coupled NV centers in a diamond crystal and/or multiple diamonds with multiple NV centers that are also preferably coupled to each other. The preferred coupling or interaction of the NV centers is preferably by stimulated emission and absorption and/or via magnetic coupling.

The paramagnetic center (NV1) or the plurality (NVC) of paramagnetic centers (NV1) receives at least a part of the reflected pump radiation (LB1$b$) and thereupon emits fluorescence radiation (FL), which is not drawn in FIG. 1 for a better overview. Fluorescence radiation (FL), possibly the pump radiation (LB1$a$) and the reflected pump radiation (LB1$b$) typically impinge on a first optical filter (F1). The first optical filter (F1) preferably allows only the fluorescence wavelength ($\lambda_{fl}$) of the fluorescence radiation (FL) to pass. The first optical filter (F1) is preferably not transparent to and/or attenuates the pump radiation wavelength ($\lambda_{pump}$)

of the pump radiation (LB1a) and/or the reflected pump radiation (LB1b) to such an extent that it can be assumed to be substantially blocked for the intended purpose and can be neglected to a first, preferably linear, approximation. The fluorescence radiation (FL) from the paramagnetic center (NV1) or the plurality (NVC) of paramagnetic centers (NV1) then irradiates a first radiation receiver (PD1) which preferably is part of the integrated circuit (IC). However, the first radiation receiver (PD1) can also be constructed separately from the integrated circuit (IC) and is then suitably electrically connected to the integrated circuit (IC), for example via further bond wires.

In the example of FIG. 1, the first filter (F1) is mechanically connected to the integrated circuit (IC) by means of a radiation-transparent first adhesive (GL1). In this case, the first adhesive (GL1) is essentially transparent to the fluorescence radiation (FL). This means that the first adhesive (GL1) attenuates the fluorescence radiation (FL), if at all, only to the extent that it is insignificant for the intended purpose of the device. In the example of FIG. 1, the first optical filter (F1) is located in the radiation path between the paramagnetic center (NV1) or plurality (NVC) of paramagnetic centers (NV1) and the first radiation receiver (PD1). In the example of FIG. 1, the first adhesive (GL1) optically couples the paramagnetic center (NV1) or the plurality (NVC) of paramagnetic centers (NV1) to the first radiation receiver (PD1). In the example of FIG. 1, this coupling refers to the fluorescence radiation (FL). The first optical filter (F1) decouples the first pump radiation source (PL1) from the first radiation receiver (PD1) to the extent necessary for the intended use. For control reasons, a basic optical coupling may be desirable, which is not initially considered here.

The sensor element with the paramagnetic center (NV1) or the plurality (NVC) of paramagnetic centers (NV1) is mechanically connected to the first optical filter (F1) by means of a fastening means (GE) in the example of FIG. 1.

The mounting means (GE) is preferably transparent to the pump radiation (LB1a) or the reflected pump radiation (LB1b) of the first pump radiation source (PL1) so that the pump radiation (LB1a) of the first pump radiation source (PL1) or the reflected pump radiation (LB1b) can reach the paramagnetic center (NV1) or the plurality (NVC) of paramagnetic centers (NV1) in the sensor element.

Later, the use of a compensation radiation source (PLK) that emits a compensation radiation (KS) and irradiates it into the first radiation receiver (PD1) is also described. Provided that a compensation radiation (KS) is used for adjusting an optical working point of the first radiation receiver (PD1), the fixing means (GE) is preferably adapted for the compensation radiation wavelength ($\lambda_{ks}$) of the compensation radiation (KS), or the possibly reflected compensation radiation (KS2) of the compensation radiation source (PLK), so that the compensation radiation (KS) of the compensation radiation source (PLK) or the reflected compensation radiation (KS2) can reach the first radiation receiver (PD1).

The fixing means (GE) is preferably transparent for the fluorescence radiation (FL, FL1) or a possibly depending on the construction occurring reflected fluorescence radiation (FL2) of the paramagnetic center (NV1) resp. of the plurality (NVC) of paramagnetic centers (NV1), so that the fluorescence radiation (FL, FL1) of the paramagnetic center (NV1) or of the plurality (NVC) of paramagnetic centers (NV1) or the reflected fluorescence radiation (FL2) can reach the first radiation receiver (PD1).

As described above, the paramagnetic center (NV1) in the sensor element is preferably at least one NV center in at least one diamond crystal, the at least one diamond crystal constituting the sensor element. The plurality (NVC) of paramagnetic centers (NV1) is preferably a plurality of NV centers in one or more diamonds, in particular nanodiamonds. Additional bond wires (BD3) provide further electrical connections. Some of the electrical connections relate to the terminals of the exemplary package. In the example of FIG. 1, the connections of the exemplary package are represented by the first leadframe island (LF1) and the fourth leadframe island (LF4). For simplicity, not all necessary bond wire connections are shown.

FIG. 2

Figure 2:
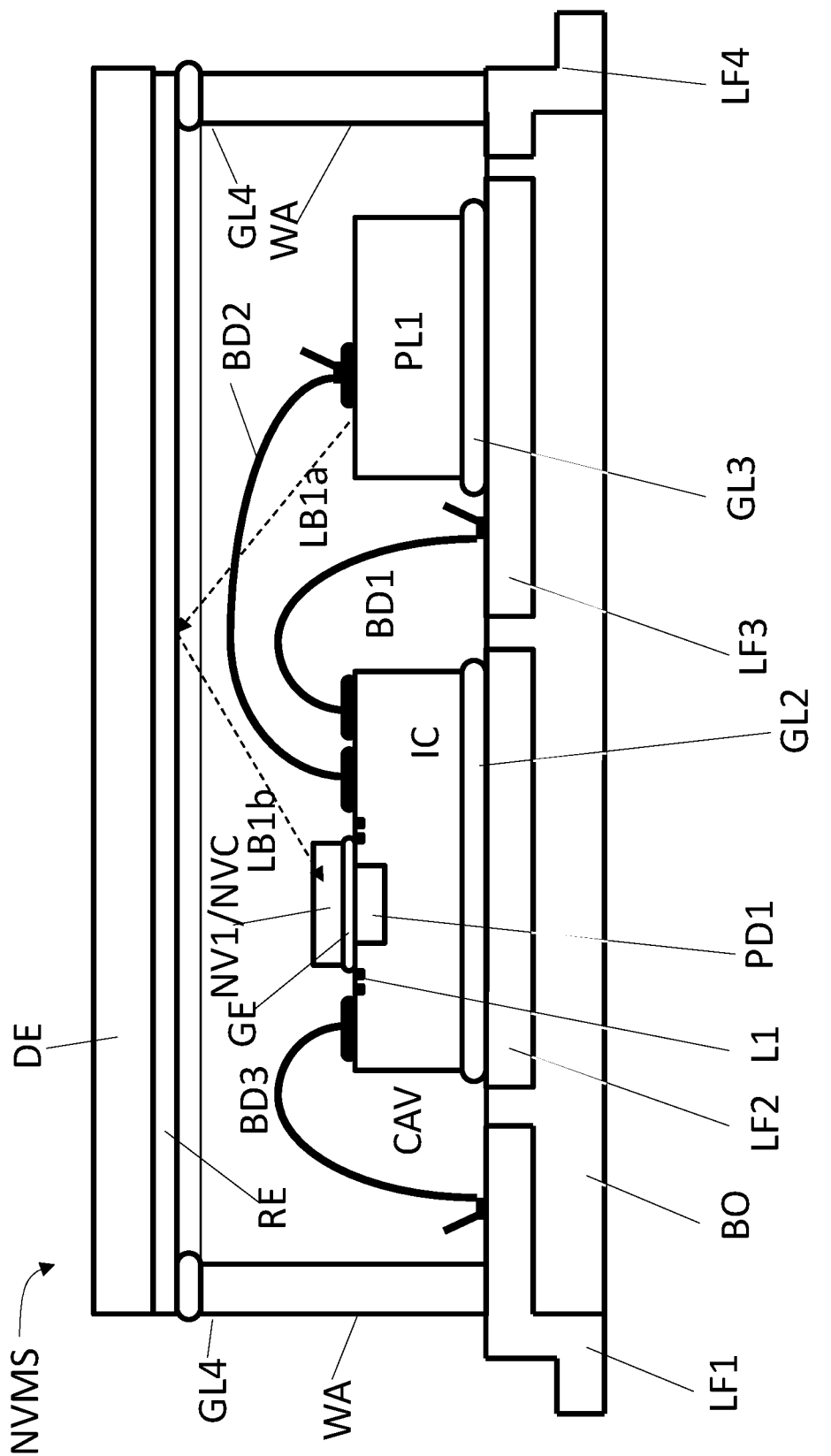
FIG. 2 is a simplification of FIG. 1 with the first optical filter (F1) and the first adhesive (GL1) removed.

FIG. 2 is a simplification of FIG. 1. In contrast to FIG. 1, the first optical filter (F1) and the first adhesive (GL1) are missing. Instead, the sensor element with the paramagnetic center (NV1) or the plurality (NVC) of paramagnetic centers (NV1) is directly connected mechanically and optically to the first radiation receiver (PD1) by means of the fixing means (GE). There are two usage scenarios for this:

a) The first pump radiation source (PL1) is active at first times (T1) and emits the pump radiation (LB, LB1a) during these first times (T1). This is exemplified by a logical level of 1 in FIGS. 3a, 3b, 4a, 4b, 5, 6a, 6b, 7. The first pump radiation source (PL1) is not active at second times (T2) and does not emit pump radiation (LB, LB1a) during these second times (T2). The first times (T1) and the second times (T2) alternate sequentially in FIGS. 3a, 3b, 4a, 4b. The first times (T1) and the second times (T2) and the third times (T3) alternate consecutively in FIGS. 5, 6a, 6b and 7. This is exemplified by a logic level of 0 in FIGS. 3a, 3b, 4a, 4b, 5, 6a, 6b and 7. Preferably, in this scenario, the fluorescence radiation (FL, FL1) is evaluated only at second times (T2). This is possible because the fluorescence radiation (FL, FL1) has a phase shift of one fluorescence phase shift time ($\Delta TFL$) with respect to the pump radiation (LB, LB1a). When using one NV center as a paramagnetic center (NV1) or a plurality of NV centers as a plurality (NVC) of paramagnetic centers (NV1), this by a fluorescence phase shift time ($\Delta TFL$) is typically on the order of 1 ns. The evaluation of the receiver output signal (S0) of the first radiation receiver (PD1) is illustrated by the exemplary measurement signal (MES) in FIGS. 3a, 3b, 4a, 4b, 5, 6a, 6b, and 7, which is for illustrative purposes only. Here, an exemplary logical level of the measurement signal (MES) of 1 shall mean, for example, an evaluation of the signal received from the first radiation receiver (PD1) and an exemplary logical level of 0 shall mean, for example, no evaluation of the signal received from the first radiation receiver (PD1). In the example of FIG. 4a and FIG. 4b, this evaluation of the signal received by the first radiation receiver (PD1) takes place only at second times (T2). At these second times (T2) only the afterglow of the fluorescence radiation (FL, FL1) of the paramagnetic center (NV1) or the plurality (NVC) of paramagnetic centers (NV1) in the sensor element, for example the NV center in one or more diamonds, is detected. If the phase is correct, the signal of the pump radiation (LB, LB1a) is not detected and thus separated from the fluorescence signal of the fluorescence radiation (FL).

b) In the case where the sensor element has a plurality (NVC) of paramagnetic centers (NV1) in a high density of paramagnetic centers (NV1) and a suitable sufficient thickness, the sensor element itself can serve as a first optical filter (F1) since its absorption of pump radiation (LB, LB1a, LB1b) itself is sufficient to prevent pump radiation (LB, LB1a, LB1b) from reaching the first radiation receiver (PD1). For example, if the sensor element is a diamond with a plurality of NV centers as a plurality (NVC) of paramagnetic centers (NV1), this diamond will appear red. If the density of NV centers is sufficient and if the thickness of the diamond is sufficient, the diamond will transmit sufficiently little or no green pump radiation (LB, LB1a, LB1b) from the pump radiation source (PL1), for example a green LED or a green laser, for the application.

FIG. 3

FIG. 3a

FIG. 3a shows when the receiver output signal (S0) of the first radiation receiver (PD1) is evaluated in relation to the activity of the first pump radiation source (PL1). Here, a logical 1 of the exemplary measurement signal (MES) shall mean that the receiver output signal (S0) of the first radiation receiver (PD1) is evaluated, and a logical 0 of the exemplary measurement signal (MES) shall mean that the receiver output signal (S0) of the first radiation receiver (PD1) is not evaluated. The measurement signal (MES) drawn in the FIG. 3a serves only for explanation. In the realization of the proposal the technical realization can deviate if necessary, without deviating content wise regarding the technical effect.

The first pump radiation source (PL1) is active at first times (T1) in the example of FIG. 3a and emits pump radiation (LB, LB1a). This is illustrated by an exemplary logical value of 1 in FIG. 3a for the intensity of the pump radiation (LB, LB1a).

The first pump radiation source (PL1) is not active at second times (T2) in the example of FIG. 3a and emits essentially no pump radiation (LB, LB1a). This is illustrated by an exemplary logical value of 0 in FIG. 3a for the intensity of the pump radiation (LB, LB1a).

The pump radiation (LB, LB1a, L1b) at least partially irradiates the paramagnetic center (NV1) or the plurality (NVC) of paramagnetic centers (NV1) of the sensor element. Therefore, the paramagnetic center (NV1) or the plurality (NVC) of paramagnetic centers (NV1) emits fluorescence radiation (FL, FL1). This occurs with a time delay. For one NV center in diamond as a paramagnetic center (NV1) in a sensor element or for a plurality of NV centers as a plurality (NVC) of paramagnetic centers (NV1) in a sensor element, this delay is on the order of 1 ns. Therefore, the signal of the fluorescence radiation (FL, FL1) is phase-shifted in time with respect to the signal of the pump radiation (LB, LB1a, L1b) by a fluorescence phase shift time (ΔTFL).

The paramagnetic center (NV1) or the plurality (NVC) of paramagnetic centers (NV1) in the example of FIG. 3a are thus active with a time shift to the first times (T1) and emit fluorescence radiation (FL, FL1). This is exemplified by an arbitrary logical value of 1 in FIG. 3a for the intensity of the fluorescence radiation (FL, FL1).

The paramagnetic center (NV1) or the plurality (NVC) of paramagnetic centers (NV1) in the example of FIG. 3a are therefore not active at the second times (T2) and do not emit fluorescence radiation (FL, FL1). This is exemplified by an arbitrary logical value of 0 in FIG. 3a for the intensity of the fluorescence radiation (FL, FL1).

In the example of FIG. 3a the evaluation of the receiver output signal (S0) of the first radiation receiver (PD1) takes place at first times (T1). The measurement signal (MES) serving for clarification has the logical, arbitrary value 1 at these first times (T1). Therefore, in measurement systems with this time scheme of FIG. 3a, a separation of the signal of the pump radiation (LB, LB1a) from the signal of the fluorescence radiation (FL, FL1) can only be achieved by a first optical filter (F1) or by a filter effect of the sensor element with a plurality (NVC) of paramagnetic centers (NV1).

FIG. 3b

FIG. 3b shows when the receiver output signal (S0) of the first radiation receiver (PD1) is evaluated in relation to the activity of the first pump radiation source (PL1) and to the activity of a compensation radiation source (PLK). Here again, a logical 1 of the exemplary measurement signal (MES) shall mean that the receiver output signal (S0) of the first radiation receiver (PD1) is evaluated. A logical 0 of the exemplary measurement signal (MES) shall mean that the receiver output signal (S0) of the first radiation receiver (PD1) is not evaluated. The measurement signal (MES) drawn in FIG. 3b is only for explanation. In the realization of the proposal, the technical realization can deviate if necessary, without deviating content wise regarding the technical effect.

The first pump radiation source (PL1) is active at first times (T1) in the example of FIG. 3b and emits pump radiation (LB, LB1a). This is illustrated by an exemplary logical value of 1 in FIG. 3b for the intensity of the pump radiation (LB, LB1a).

In the example of FIG. 3b, the first pump radiation source (PL1) is not active at second times (T2) and at third times (T3) and does not emit pump radiation (LB, LB1a). This is illustrated by an exemplary logical value of 0 in FIG. 3b for the intensity of the pump radiation (LB, LB1a).

The compensation radiation source (PLK) is active at second times (T2) in the example of FIG. 3b and then emits compensation radiation (KS). This is illustrated by an exemplary logical value of 1 in FIG. 3b for the intensity of the compensating radiation (KS).

In the example of FIG. 3b, the compensation radiation source (PLK) is not active at the first times (T1) and then does not emit any compensation radiation (KS). This is illustrated by an exemplary logical value of 0 in FIG. 3b for the intensity of the compensating radiation (KS).

The pump radiation (LB, LB1a, LB1b) at least partially irradiates the paramagnetic center (NV1) or the plurality (NVC) of paramagnetic centers (NV1) of the sensor element. Therefore, the paramagnetic center (NV1) or the plurality (NVC) of paramagnetic centers (NV1) emit fluorescence radiation (FL, FL1). This occurs with a time delay. In the case of one NV center in diamond as a paramagnetic center (NV1) in a sensor element or a plurality of NV centers in one or more diamonds as a plurality (NVC) of paramagnetic centers (NV1), this delay is on the order of 1 ns. Therefore, the signal of the fluorescence radiation (FL, FL1) is phase shifted in time with respect to the signal of the pump radiation (LB, LB1a) by a fluorescence phase shift time (ΔTFL).

The paramagnetic center (NV1) or the plurality (NVC) of paramagnetic centers (NV1) in the example of FIG. 3b is thus active with a time shift to the first times (T1) and emits fluorescence radiation (FL, FL1). This is exemplified by an arbitrary logical value of 1 in FIG. 3b for the intensity of the fluorescence radiation (FL, FL1).

The paramagnetic center (NV1) or the plurality (NVC) of paramagnetic centers (NV1) in the example of FIG. 3b is thus not active at the second times (T2) with a time shift and then does not emit any fluorescence radiation (FL, FL1).

This is exemplified by an arbitrary logical value of 0 in FIG. 3b for the intensity of the fluorescence radiation (FL, FL1).

The compensating radiation (KS) preferably does not generate any interaction with the paramagnetic center (NV1) or the plurality (NVC) of paramagnetic centers (NV1).

In the example of FIG. 3b the evaluation of the receiver output signal (S0) of the first radiation receiver (PD1) takes place again at first times (T1). The measurement signal (MES) serving for clarification has the logical, arbitrary value 1 at these first times (T1). Therefore, in measuring systems with this time scheme of FIG. 3b, a separation of the signal of the pump radiation (LB, LB1a) from the signal of the fluorescence radiation (FL, FL1) can only be achieved by a first optical filter (F1) or by a filtering effect of the sensor element with the paramagnetic centers (NV1) or with the plurality (NVC) of paramagnetic centers (NV1).

FIG. 4

FIG. 4a

FIG. 4a shows when the receiver output signal (S0) of the first radiation receiver (PD1) is evaluated in relation to the activity of the first pump radiation source (PL1). Here, a logical 1 of the exemplary measurement signal (MES) shall mean that the receiver output signal (S0) of the first radiation receiver (PD1) is evaluated, and a logical 0 of the exemplary measurement signal (MES) shall mean that the receiver output signal (S0) of the first radiation receiver (PD1) is not evaluated. The measurement signal (MES) drawn in the FIG. 4a serves only for explanation. In the realization of the proposal, if necessary, the technical realization can deviate without deviating in content with respect to the technical effect.

The first pump radiation source (PL1) is active at first times (T1) in the example of FIG. 4a and emits pump radiation (LB, LB1a). This is illustrated by an exemplary logical value of 1 in FIG. 4a for the intensity of the pump radiation (LB, LB1a).

The first pump radiation source (PL1) is not active at second times (T2) in the example of FIG. 4a and does not emit pump radiation (LB, LB1a). This is illustrated by an exemplary logical value of 0 in FIG. 4a for the intensity of the pump radiation (LB, LB1a).

The pump radiation (LB, LB1a) at least partially irradiates the paramagnetic center (NV1) of the sensor element or the plurality (NVC) of paramagnetic centers (NV1) of the sensor element. Therefore, the paramagnetic center (NV1) or the plurality (NVC) of paramagnetic centers (NV1) emit fluorescence radiation (FL, FL1). This occurs with a time delay. For a NV center in diamond as a paramagnetic center (NV1) in a sensor element or a plurality of NV centers in one or more diamonds as a plurality (NVC) of paramagnetic centers (NV1), this delay is on the order of 1 ns. Therefore, the signal of the fluorescence radiation (FL, FL1) is phase shifted in time with respect to the signal of the pump radiation (LB, LB1a) by a fluorescence phase shift time ($\Delta$TFL).

In the example of FIG. 4a, the paramagnetic center (NV1) or the plurality (NVC) of paramagnetic centers (NV1) are thus active with a time shift at the first times (T1) and emit fluorescence radiation (FL, FL1) with a time shift at the first times (T1). This is exemplified by an arbitrary, logical value of 1 in FIG. 4a for the intensity of the fluorescence radiation (FL, FL1).

In the example of FIG. 4a, the paramagnetic center (NV1) or the plurality (NVC) of paramagnetic centers (NV1) are thus not active with a time shift at the second times (T2) and then do not emit any fluorescence radiation (FL, FL1) with a time shift at the second times (T2). This is exemplified by an arbitrary logical value of 0 in FIG. 4a for the intensity of the fluorescence radiation (FL, FL1).

In the example of the FIG. 4a the evaluation of the receiver output signal (S0) of the first radiation receiver (PD1) takes place in contrast to the FIG. 3a now however at second times (T2). The measurement signal (MES) serving for clarification has the logical, arbitrary value 1 at these second times (T2). Therefore, in measuring systems with this time scheme of FIG. 4a a separation of the signal of the pump radiation (LB, LB1a) from the signal of the fluorescence radiation (FL, FL1) can be achieved in contrast to FIG. 3a also without a first optical filter (F1) and without a filter effect of the sensor element with the paramagnetic centers (NV1) or with clusters of paramagnetic centers (NV1) with in each case a plurality (NVC) of paramagnetic centers (NV1). However, only the part of the fluorescence radiation (FL, FL1) that falls temporally in the second times (T2) is detected. This may result in degraded sensitivity.

FIG. 4b

FIG. 4b shows when the receiver output signal (S0) of the first radiation receiver (PD1) is evaluated in relation to the activity of the first pump radiation source (PL1) and to the activity of a compensation radiation source (PLK). Here again, a logical 1 of the exemplary measurement signal (MES) should mean that the receiver output signal (S0) of the first radiation receiver (PD1) is evaluated, and a logical 0 of the exemplary measurement signal (MES) should mean that the receiver output signal (S0) of the first radiation receiver (PD1) is not evaluated. The measurement signal (MES) drawn in FIG. 4b is again only for explanation. In the realization of the proposal the technical realization can deviate if necessary, without deviating content wise regarding the technical effect.

The first pump radiation source (PL1) is active at first times (T1) in the example of FIG. 4b and emits pump radiation (LB, LB1a). This is illustrated by an exemplary logical value of 1 in FIG. 4b for the intensity of the pump radiation (LB, LB1a).

The first pump radiation source (PL1) is not active at second times (T2) in the example of FIG. 4b and does not emit pump radiation (LB, LB1a). This is illustrated by an exemplary logical value of 0 in FIG. 4b for the intensity of the pump radiation (LB, LB1a).

The compensation radiation source (PLK) is active in the example of FIG. 4b at second times (T2) and then emits compensation radiation (KS). This is illustrated by an exemplary logical value of 1 in FIG. 4b for the intensity of the compensating radiation (KS).

In the example of FIG. 4b, the compensation radiation source (PLK) is not active at the first times (T1) and then does not emit any compensation radiation (KS). This is illustrated by an exemplary logical value of 0 in FIG. 4b for the intensity of the compensating radiation (KS).

The pump radiation (LB, LB1a) at least partially irradiates the paramagnetic center (NV1) of the sensor element or the plurality (NVC) of paramagnetic centers (NV1) of the sensor element. Therefore, the paramagnetic center (NV1) or the plurality (NVC) of paramagnetic centers (NV1) emits fluorescence radiation (FL, FL1). This occurs with a time delay. In the case of one NV center in diamond as a paramagnetic center (NV1) in a sensor element or a plurality of NV centers in one or more diamonds as a plurality (NVC) of paramagnetic centers (NV1), this delay is on the order of 1 ns. Therefore, the signal of the fluorescence radiation (FL) is phase shifted in time by a fluorescence phase shift time ($\Delta$TFL) with respect to the signal of the pump radiation (LB, LB1a).

In the example of FIG. 4b, the paramagnetic center (NV1) or the plurality (NVC) of paramagnetic centers (NV1) are thus active with a time shift at the first times (T1) and emit fluorescence radiation (FL, FL1). This is exemplified by an arbitrary logical value of 1 in FIG. 4b for the intensity of the fluorescence radiation (FL, FL1).

The paramagnetic center (NV1) or the plurality (NVC) of paramagnetic centers (NV1) in the example of FIG. 4b are therefore not active at the second times (T2) and do not emit fluorescence radiation (FL, FL1). This is exemplified by an arbitrary logical value of 0 in FIG. 4b for the intensity of the fluorescence radiation (FL, FL1).

The compensating radiation (KS) preferably does not generate any interaction with the paramagnetic center (NV1) or the plurality (NVC) of paramagnetic centers (NV1).

In the example of FIG. 4b, the evaluation of the receiver output signal (S0) of the first radiation receiver (PD1) now takes place at second times (T2) in contrast to the time scheme of FIG. 3b. The measurement signal (MES) serving for clarification has the logical, arbitrary value 1 at these second times (T2) in contrast to the time scheme of FIG. 3b. Therefore, in measuring systems with this time scheme of FIG. 4b a separation of the signal of the pump radiation (LB, LB1a) from the signal of the fluorescence radiation (FL, FL1) can be achieved even without a first optical filter (F1) and without a filter effect of the sensor element with the paramagnetic centers (NV1) or the clusters with a plurality (NVC) of paramagnetic centers (NV1) each.

Figure 5:
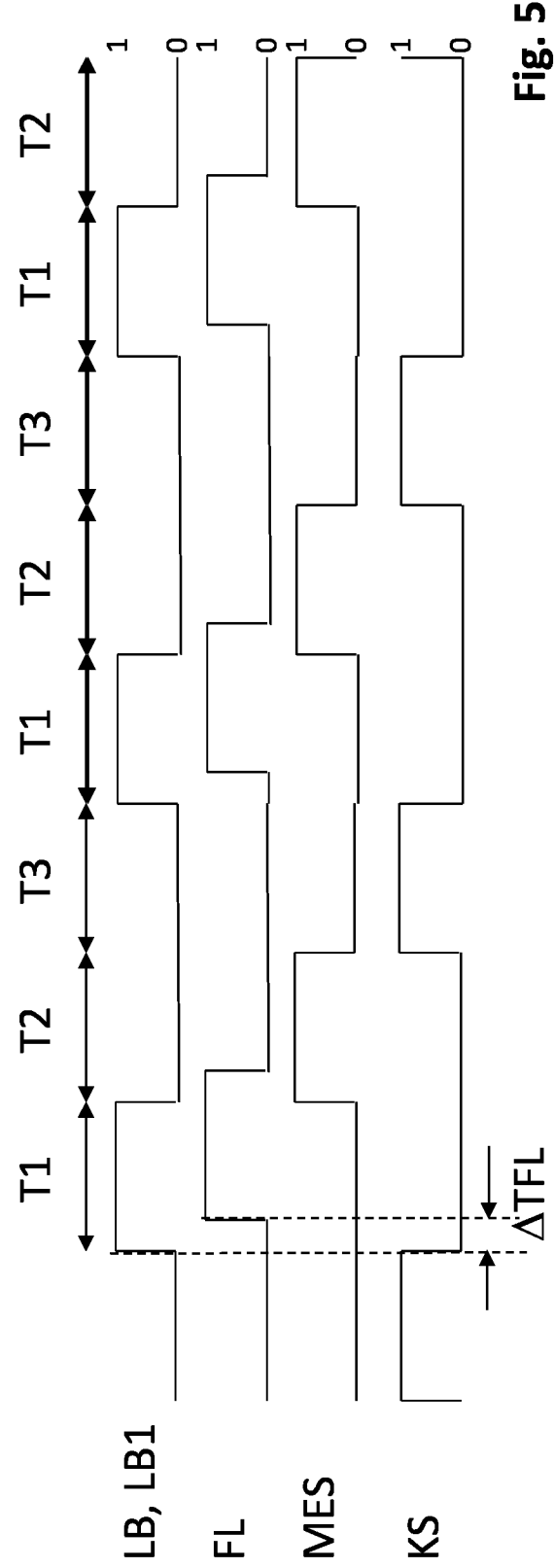
FIG. 5 is a diagram of an example timing of the first radiation receiver (PD1) relative to the first pump radiation source (PL1) and the compensation radiation source (PLK).
Figure 6:
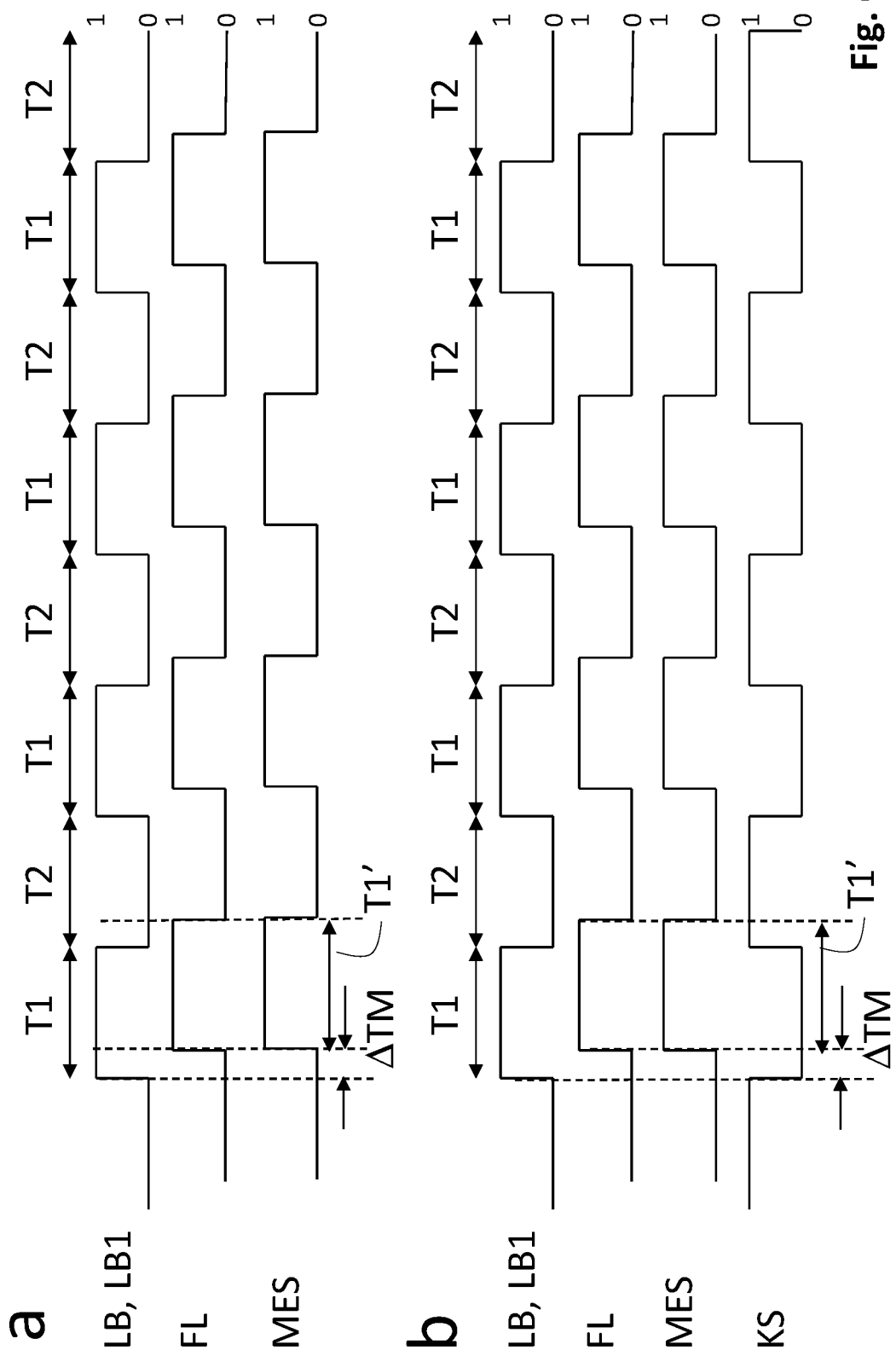
FIG. 6a is a mixture of FIG. 3a and FIG. 4a whereby the timing scheme of FIG. 6a corresponds to the timing scheme of FIG. 3a with the difference that the measurement signal (MES) corresponds to the signal of the pump radiation (LB, LB1a) shifted by a measurement phase shift time (ATM).
FIG. 6b is a mixture of FIG. 3b and FIG. 4b whereas the timing scheme of FIG. 6b corresponds to the timing scheme of FIG. 3b with the difference that the measurement signal (MES) corresponds to the signal of the pump radiation (LB, LB1a) shifted by a measurement phase shift time (ATM).

Further Development of the Unpublished State of the Art FIG. 5

FIG. 5 shows when the receiver output signal (S0) of the first radiation receiver (PD1) is evaluated in relation to the activity of the first pump radiation source (PL1) and to the activity of a compensation radiation source (PLK). Here again, a logical 1 of the exemplary measurement signal (MES) should mean that the receiver output signal (S0) of the first radiation receiver (PD1) is evaluated, and a logical 0 of the exemplary measurement signal (MES) should mean that the receiver output signal (S0) of the first radiation receiver (PD1) is not evaluated. The measurement signal (MES) drawn in the FIG. 5 serves again only for the explanation. In the realization of the suggestion if necessary, the technical realization can deviate, without deviating content wise regarding the technical effect.

The first pump radiation source (PL1) is active at first times (T1) in the example of FIG. 5 and emits pump radiation (LB, LB1a). This is illustrated by an exemplary logical value of 1 in FIG. 5 for the intensity of the pump radiation (LB, LB1a).

In the example of FIG. 5, the first pump radiation source (PL1) is not active at second times (T2) and at third times (T3) and does not emit pump radiation (LB, LB1a). This is illustrated by an exemplary logical value of 0 in FIG. 5 for the intensity of the pump radiation (LB, LB1a).

The compensation radiation source (PLK) is active at third times (T3) in the example of FIG. 5 and then emits compensation radiation (KS). This is illustrated by an exemplary logical value of 1 in FIG. 5 for the intensity of the compensating radiation (KS).

In the example of FIG. 5, the compensation radiation source (PLK) is not active at first times (T1) and second times (T2) and then does not emit any compensation radiation (KS). This is illustrated by an exemplary logical value of 0 in FIG. 5 for the intensity of the compensating radiation (KS).

The pump radiation (LB, LB1a) at least partially irradiates the paramagnetic center (NV1) of the sensor element or the plurality (NVC) of paramagnetic centers (NV1) of the sensor element. Therefore, the paramagnetic center (NV1) or the plurality (NVC) of paramagnetic centers (NV1) emits fluorescence radiation (FL, FL1). This occurs with a time delay. For a NV center in diamond as a paramagnetic center (NV1) in a sensor element or a plurality of NV centers in one or more diamonds as a plurality (NVC) of paramagnetic centers (NV1), this delay is on the order of 1 ns. Therefore, the signal of the fluorescence radiation (FL, FL1) is phase shifted in time with respect to the signal of the pump radiation (LB, LB1a) by a fluorescence phase shift time (ΔTFL).

In the example of FIG. 5, the paramagnetic center (NV1) or the plurality (NVC) of paramagnetic centers (NV1) are thus active with a time shift to the first times (T1) and emit fluorescence radiation (FL, FL1). This is exemplified by an arbitrary logical value of 1 in FIG. 5 for the intensity of the fluorescence radiation (FL, FL1).

The paramagnetic center (NV1) or the plurality (NVC) of paramagnetic centers (NV1) in the example of FIG. 5 are therefore not active at the second times (T2) and the third times (T3) and do not emit any fluorescence radiation (FL, FL1). This is exemplified by an arbitrary logical value of 0 in FIG. 5 for the intensity of the fluorescence radiation (FL, FL1).

The compensating radiation (KS) preferably does not generate any interaction with the paramagnetic center (NV1) or with the plurality (NVC) of paramagnetic centers (NV1).

In the example of FIG. 5, the evaluation of the receiver output signal (S0) of the first radiation receiver (PD1) now takes place at second times (T2) in contrast to the time scheme of FIG. 3b. The measurement signal (MES) serving for clarification has the logical, arbitrary value 1 at these second times (T2) in contrast to the time scheme of FIG. 3b.

However, compensation by the compensating radiation (KS) now occurs at third times (T3), which are different from the second times (T2) and first times (T1).

Therefore, in measuring systems with this timing scheme of FIG. 5, a separation of the signal of the pump radiation (LB, LB1a) from the signal of the fluorescence radiation (FL, FL1) can be achieved even without a first optical filter (F1) and without a filtering effect of the sensor element with the paramagnetic centers (NV1) or with the plurality (NVC) of paramagnetic centers (NV1). In particular, this timing scheme avoids a disturbance of the first radiation receiver (PD1) by the compensating radiation (KS) during the evaluation of the fluorescence radiation (FL, FL1)

FIG. 6

FIG. 6a

The timing scheme of FIG. 6a corresponds to the timing scheme of FIG. 3a with the difference that the measurement signal (MES) corresponds to the signal of the pump radiation (LB, LB1a) shifted by a measurement phase shift time (ATM). FIG. 6a is thus a mixture of FIG. 3a and FIG. 4a.

FIG. 6b

The timing scheme of FIG. 6b corresponds to the timing scheme of FIG. 3b with the difference that the measurement signal (MES) corresponds to the signal of the pump radiation (LB, LB1a) shifted by a measurement phase shift time (ATM). FIG. 6b is thus a mixture of FIG. 3b and FIG. 4b.

FIG. 7

Figure 7:
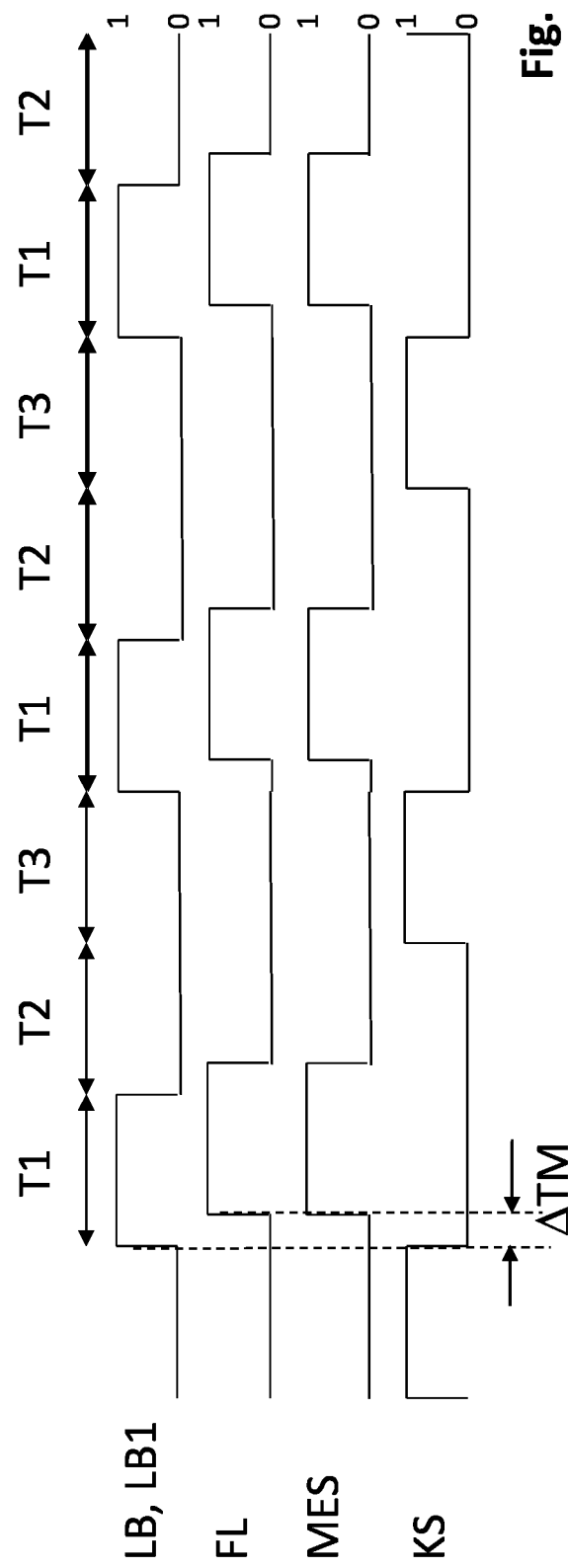
FIG. 7 corresponds to FIG. 5 whereas the timing scheme of FIG. 7 corresponds to the timing scheme of FIG. 5 with the difference that the measurement signal (MES) corresponds to the signal of the pump radiation (LB, LB1a) shifted by a measurement phase shift time (ATM).

The timing scheme of FIG. 7 corresponds to the timing scheme of FIG. 5 with the difference that the measurement signal (MES) corresponds to the signal of the pump radiation (LB, LB1a) shifted by a measurement phase shift time (ATM).

FIG. 8

Figure 8:
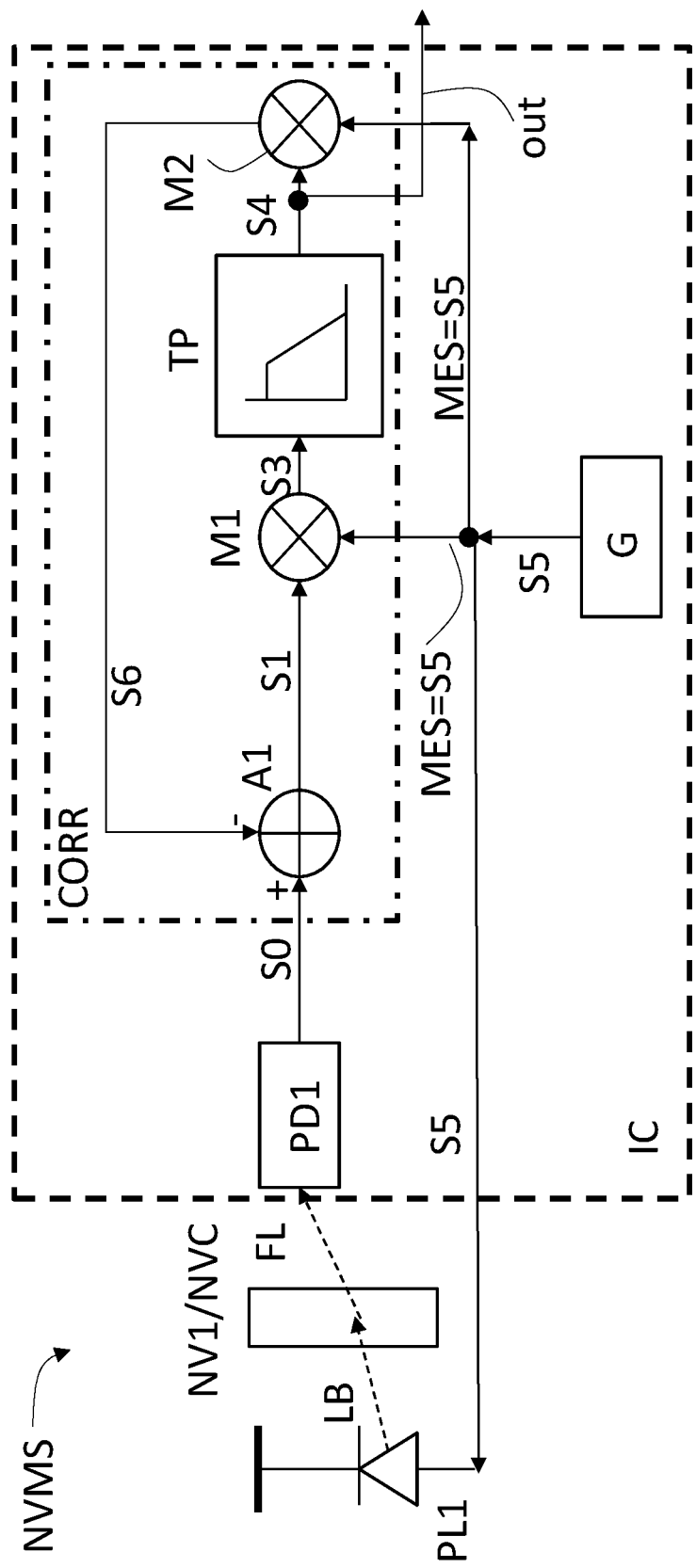
FIG. 8 shows a schematically simplified example evaluation system for the fluorescence radiation (FL) of the paramagnetic center (NV1) of the sensor element or the plurality (NVC) of paramagnetic centers (NV1) of the sensor system.

FIG. 8 schematically simplifies a particularly simple evaluation system for the fluorescence radiation (FL) of the paramagnetic center (NV1) of the sensor element or the plurality (NVC) of paramagnetic centers (NV1) of the sensor system. Preferably, it is a matter of several paramagnetic centers (NV1) and several sensor elements. In a particularly preferred variant, the sensor element is a diamond, and the paramagnetic center (NV1) is a NV center. In another exemplary variant, the sensing element comprises one or more diamonds and a plurality (NVC) of paramagnetic centers (NV1), again NV centers being preferred paramagnetic centers (NV1). In another exemplary variant, the sensor element comprises a plurality of diamonds, which are preferably connected to form a sensor element, and the paramagnetic center (NV1) comprises a plurality (NVC) of paramagnetic centers (NV1), NV centers being preferred as paramagnetic centers (NV1) in this case as well.

In a typical variant, the system comprises a first pump radiation source (PL1), the at least one paramagnetic center (NV1) in at least one sensor element and/or a plurality (NVC) of paramagnetic centers (NV1) in at least one sensor element, and an evaluation circuit, here in the form of the integrated circuit (IC). The first pump radiation source (PL1) is modulated and energized with the transmission signal (S5) of a signal generator (G). In the case of using NV centers in diamond as paramagnetic centers (NV1), the first pump radiation source (PL1) is preferably a green light source that can cause the paramagnetic center, for example an NV center, (NV1) to emit typically red fluorescence radiation (FL) by means of its pump radiation (LB). In particular, green laser diodes and LEDs are well suited as pump radiation sources (PL1) in this case.

In the case of NV centers in diamond or in diamonds, a laser diode of the company Osram of the type PLT5 520B is suitable, for example, as a first pump radiation source (PL1) with 520 nm pump radiation wavelength ($\lambda_{pump}$). When NV centers are used as paramagnetic centers (NV1) the pump radiation (LB) of the first pump radiation source (PL1) should have a pump radiation wavelength ($\lambda_{pump}$) in a wavelength range of 400 nm to 700 nm wavelength and/or better 450 nm to 650 nm and/or better 500 nm to 550 nm and/or better 515 nm to 540 nm. Pump radiation (LB) of this function is referred to herein as "green" pump radiation (LB). Clearly, a wavelength of 532 nm is preferred as the pump radiation wavelength ($\lambda_{pump}$) of the pump radiation (LB) when using NV centers. 520 nm has also been used successfully. For cost reasons, the first pump radiation source (PL1) is preferably a light-emitting diode or a laser, which will also be referred to collectively and simplistically as LED in the following. It is conceivable to use other illuminants, e.g., organic light emitting diodes (OLEDs) or electroluminescent devices, as pump radiation sources (PL1). However, the use of LEDs as pump radiation sources (PL1) is clearly more advantageous at present.

The first pump radiation source (PL1) emits pump radiation (LB) depending on the transmission signal (S5). In the case of NV centers as paramagnetic centers (NV1), this pump radiation (LB) is preferably green light.

This pump radiation (LB) causes the paramagnetic center (NV1) or the plurality (NVC) of paramagnetic centers (NV1) to emit fluorescence radiation (FL), which depends on the pump radiation (LB) irradiated onto the paramagnetic center (NV1) or the plurality (NVC) of paramagnetic centers (NV1) and typically on the magnetic flux density (B) at the location of the respective paramagnetic center (NV1) and possibly other physical parameters.

Other physical parameters besides the magnetic flux density (B), which could possibly be measured in this way by means of the intensity ($I_{fl}$) of the fluorescence radiation (FL) of the paramagnetic center (NV1) or the plurality (NVC) of paramagnetic centers (NV1), would be, for example, electric flux density D, acceleration a, gravitational field strength g, pressure P, temperature $\vartheta$, rotational speed $\omega$, oscillation frequency of mechanical parts (bars), position, intensity of ionizing radiation, etc.

Thus, by detecting a value corresponding to the intensity of fluorescence radiation (FL) and/or a value of fluorescence phase shift time ($\Delta TFL$), a value can be determined as a measurement of a value of one or more of these physical quantities.

When using a plurality (NVC) of paramagnetic centers (NV1) in the form of a plurality (NVC) of paramagnetic centers (NV1), if the density of these plurality (NVC) of paramagnetic centers (NV1) in the sensor element is very high, two or more paramagnetic centers (NV1) of the plurality (NVC) of paramagnetic centers (NV1) may couple with each other. It has been shown that this can lead to coupling effects. If at the same time the intensity of the pump radiation (LB) at the location of the paramagnetic centers (NV1) of the plurality (NVC) of paramagnetic centers (NV1), becomes very high, there is an amplification of the interaction with a magnetic flux density (B) at the location of the paramagnetic center (NV1) or the plurality of paramagnetic centers (NV1). This is particularly advantageous in the case of using NV centers in diamond as paramagnetic centers (NV1). Preferably, in the case of the use of NV centers in diamond as paramagnetic centers (NV1), the sensor element is a diamond with high NV density and, more preferably, a diamond artificially produced by means of high-pressure high-temperature with preferably a content of NV centers as paramagnetic centers (NV1) in a concentration range from 0.1 ppm to 500 ppm and, more preferably, of more than 50 ppm, more preferably more than 100 ppm, more preferably more than 200 ppm. In this respect, the fluorescence radiation (FL) does not necessarily depend linearly on the intensity of the incident pump radiation (LB). For small amplitudes, however, the dependence can be linearized.

In the example of FIG. 8 the sensor element with the paramagnetic centers (NV1) is chosen so thick and the total number of paramagnetic centers (NV1) in the beam path of the pump radiation (LB) as a plurality (NVC) of paramagnetic centers (NV1) is chosen so high, that due to the absorption of the pump radiation (LB) by the paramagnetic centers (NV1) of the plurality (NVC) of paramagnetic centers (NV1) of the sensor element practically no pump radiation (LB) reaches the first radiation receiver (PD1) following in the beam path. Thus, in this example, the sensor element with the paramagnetic centers (NV1) in the beam path of the pump radiation (LB) acts like a first optical filter (F1) that separates the signal of the pump radiation (LB) from the signal of the fluorescence radiation (FL). Thus, in this example, assuming a sufficient amount of paramagnetic centers (NV1) in the beam path of the pump radiation (LB), a first optical filter (F1) is no longer necessary. Thus, the timing scheme of FIG. 3*a* can be applied.

The first radiation receiver (PD1) receives superimposed the signal of the fluorescence radiation (FL) of the paramagnetic centers (NV1) resp. of the plurality (NVC) of paramagnetic centers (NV1) of the sensor element as well as the signal of the components of the pump radiation (LB) which have not been filtered out—if the arrangement should not be perfect in this respect—and generates the receiver output signal (S0) from the total signal as a function of the signal of the intensity of the fluorescence radiation (FL) of the paramagnetic centers (NV1) or the plurality (NVC) of the paramagnetic centers (NV1) of the sensor element as well as the signal of the intensity of the not filtered away parts of the pump radiation (LB).

Preferably, the filtering effect of the sensor element with the paramagnetic centers (NV1) or the plurality (NVC) of paramagnetic centers (NV1) with respect to the filtering of the pump radiation (LB) is designed in such a way that the intensity of the portions of the pump radiation (LB) that are not filtered away can be neglected and can be assumed here to be approximately zero.

Preferably, the filtering effect of the sensor element with the paramagnetic centers (NV1) or the plurality (NVC) of paramagnetic centers (NV1) with respect to the filtering of the fluorescence radiation (FL) is designed in such a way that the intensity of the portions of the fluorescence radiation (FL) filtered away can be neglected and can be assumed here to be approximately zero, the fluorescence radiation (FL) is thus not filtered by the sensor element in a manner essentially relevant for the function of the system.

The first radiation receiver (PD1) may include other amplifiers and/or filters and/or other signal conditioning, which for simplicity are not discussed further here.

A correlator (CORR) correlates the reduced receiver output signal (S1) with the measurement signal (MES). A subtractor (A1) subtracts a feedback signal (S6) from the receiver output signal (S0) in the example of FIG. 8 and thus forms the reduced receiver output signal (S1).

The output signal of the correlator (CORR) is a filter output signal (S4), which indicates how much of the measurement signal (MES), which here is equal to the transmission signal (S5), is included in the receiver output signal (S0). In the example of FIG. 8 it is used as output signal (out) of the sensor system.

In the example of FIG. 8, a synchronous demodulator consisting of a first multiplier (M1) and a filter (TP) performs the actual correlation of the correlator (CORR) as an example. However, another processing block, such as a linear optimal filter, can also be used as the correlator (CORR), which is optimized for the transmission signal (S5). In the example of FIG. 8, the filter (TP) shall be a low pass filter. The output of the filter (TP) is preferably provided with a clocked hold circuit (English: Sample & Hold circuit), which detects and freezes the output value of the filter at the end of a repetition period of the transmission signal (S5) and passes it as filter output signal (S4) to the subsequent stages in the signal path.

In the example of FIG. 8, the first multiplier (M1) multiplies the reduced receiver output signal (S1) by the measurement signal (MES), which in this case is equal to the transmission signal (S5), and thus generates the filter input signal (S3). The filter (TP), which in the example of FIG. 8 should be a low-pass filter, filters the filter input signal (S3) to the filter output signal (S4). The filter should preferably have essentially an integrating property. Effectively, the integrating effect of the filter (TP) is in the foreground, which hereby forms a temporal integral during the temporal duration of a transmit signal period of the transmission signal (S5) over the product of the measurement signal (MES), here equal to the transmission signal (S5), on the one hand, and the reduced receiver output signal (S1) on the other hand, in interaction with the sample & hold output circuit of the filter (TP), which is not drawn and is preferably used. This corresponds to a scalar product in the so-called L2 form of the reduced receiver output signal (S1) and the measurement signal (MES). Thus, the first multiplier (M1) and the preferably integrating filter (TP) mathematically define a scalar product and thus a Hilbert space or at least a Banach space. The vectors within this Banach space are the signals. Since only a finite set of measurement signals can be used, it is usually a Banach space. The second multiplier (M2) reconstructs the amplified part of the measurement signal (MES) in the receiver output signal (S0) as a feedback signal (S6) by multiplying the filter output signal (S4) with the measurement signal (MES), which here is equal to the transmission signal (S5). If the gain of the filter (TP) is very large, the reduced receiver output signal (S1) then contains almost no more of the measurement signal (MES). The reduced receiver output signal (S1) is then typically approximately a DC signal in the ideal case. Of course, the system still shows control errors and system noise, which are not considered and neglected here for the time being.

Instead of the scalar product formation by the first multiplier (M1) and the integrating filter (TP), other scalar products of other scalar product formation devices can be used. They only must allow a Banach space for signals.

The value of the filter output signal (S4) and thus the output signal (out) thus represents a measured value for the intensity of the current fluorescence radiation (FL).

Since the fluorescence radiation (FL) depends on
- the intensity of the pump radiation (LB) and/or
- the magnetic flux density (B) at the location of the at least one paramagnetic center (NV1) or the plurality (NVC) of paramagnetic centers (NV1) and/or
- the distance from the first pump radiation source (PL1) to the at least one paramagnetic center (NV1) or to the plurality (NVC) of paramagnetic centers (NV1) and/or
- the distance from the at least one paramagnetic center (NV1) or from the plurality (NVC) of paramagnetic centers (NV1) to the first radiation receiver (PD1) and/or
- the transmittance of the optical path between the first pump radiation source (PL1) and the at least one paramagnetic center (NV1) or the plurality (NVC) of paramagnetic centers (NV1) for the pump radiation (LB) and/or
- the transmittance of the optical path between the at least one paramagnetic center (NV1) or a plurality (NVC) of paramagnetic centers (NV1) and the first radiation receiver (PD1) for the fluorescence radiation (FL) and/or
- in certain cases also from the crystal orientation of the sensing element, for example of the diamond crystal in the case of NV centers as paramagnetic centers (NV1), relative to the direction of the magnetic flux density (B) and/or
- if necessary, one or more other physical parameters such as the electric flux density D, the acceleration a, the gravitational field strength g, the rotation speed $\Omega$, the oscillation frequencies $\omega$, the modulation of electromagnetic radiation, the intensity of ionizing radiation, the temperature $\vartheta$, it is possible to use the filter output signal (S4) as sensor output signal (out), which signals the measured value, for example via its magnitude, for one of these values, if the other values can be kept constant.

The resulting timing scheme corresponds to that of FIG. 3a.

FIG. 9

Figure 9:
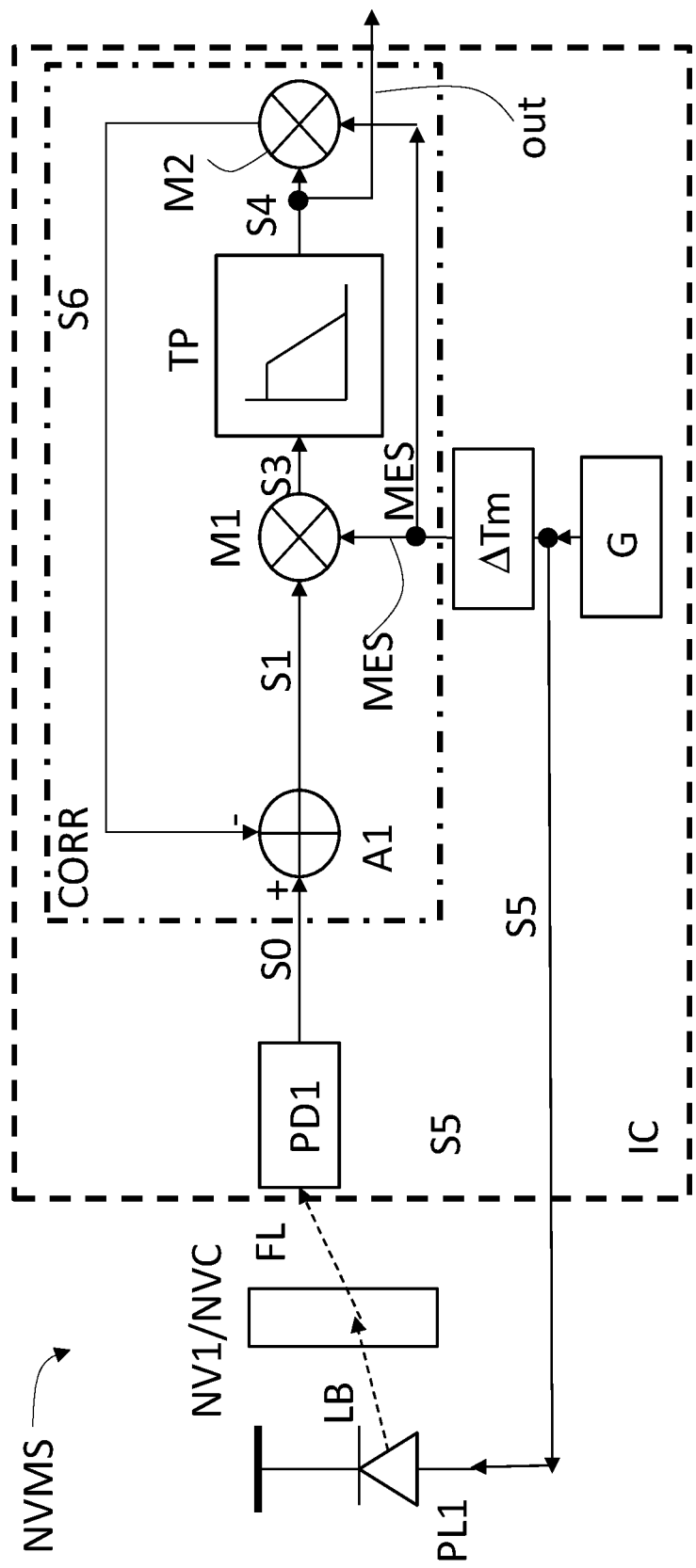
FIG. 9 corresponds to FIG. 8, whereby a measuring phase shift unit (ΔTm) delays the transmission signal (S5) by a measuring phase shift time (ATM) with respect to the measured signal (MES).

FIG. 9 corresponds to FIG. 8, whereby a measuring phase shift unit ($\Delta$Tm) delays the transmission signal (S5) by a measuring phase shift time (ATM) with respect to the measured signal (MES). The resulting timing scheme corresponds to that shown in FIG. 6a.

FIG. 10

Figure 10:
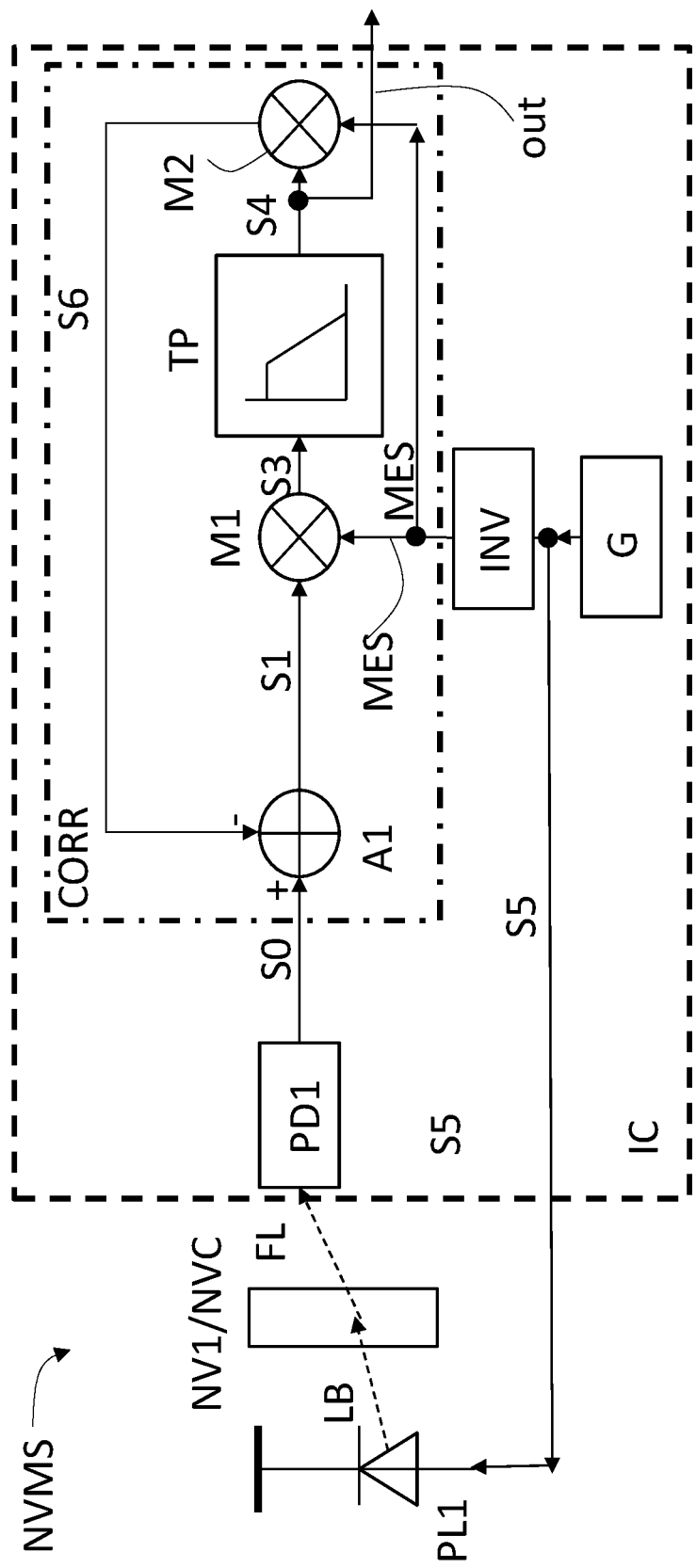
FIG. 10 corresponds to FIG. 8 with an inverting unit (INV) inverting the transmission signal (S5) to the measured signal (MES).

FIG. 10 corresponds to FIG. 8 with an inverting unit (INV) inverting the transmission signal (S5) to the measured signal (MES). The resulting timing scheme corresponds to that of FIG. 4a.

FIG. 11

Figure 11:
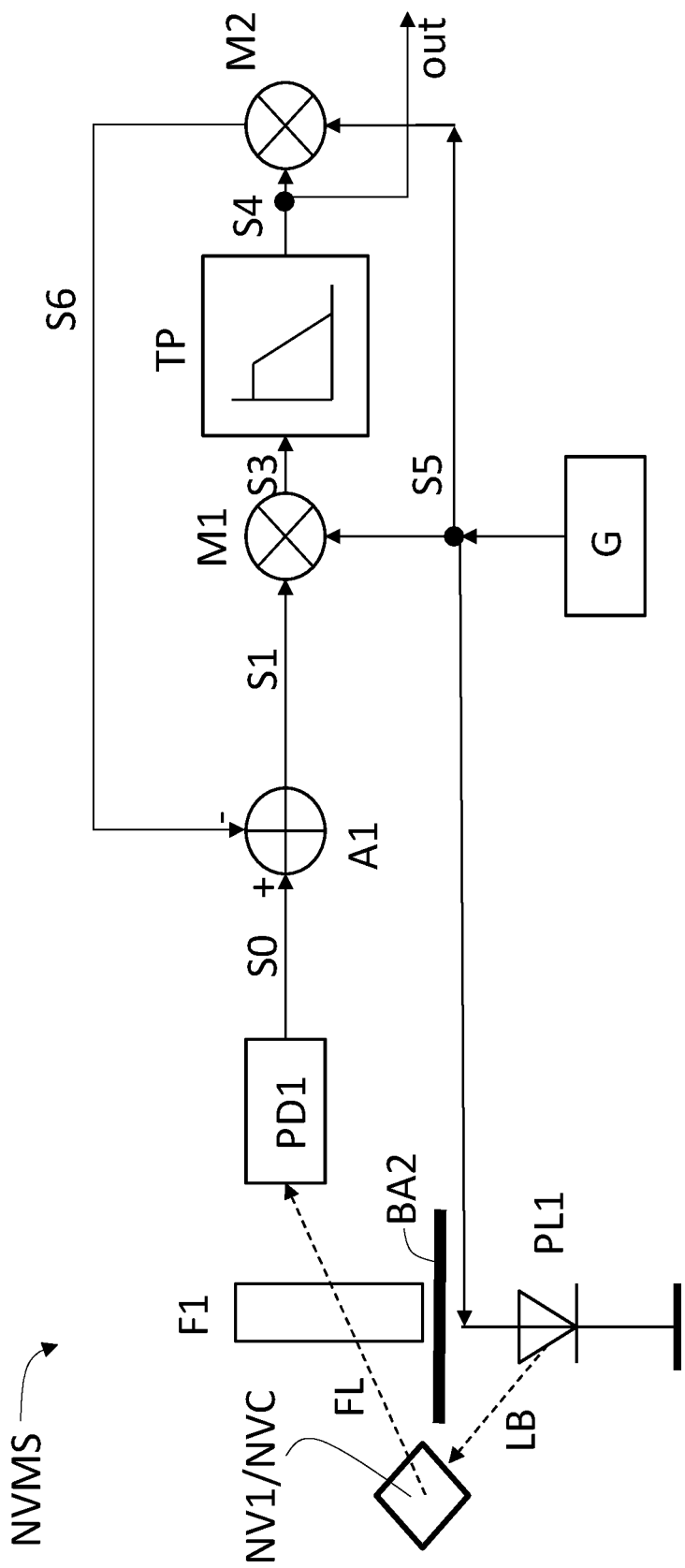
FIG. 11 corresponds to FIG. 8 with the difference that the sensor element with the paramagnetic centers (NV1) or the plurality (NVC) of paramagnetic centers (NV1) now no longer includes the function of the first optical filter (F1).

FIG. 11 corresponds to FIG. 8 with the difference that the sensor element with the paramagnetic centers (NV1) or the plurality (NVC) of paramagnetic centers (NV1) now no longer includes the function of the first optical filter (F1). Therefore, a first optical filter (F1) is included here in the optical path of the fluorescence radiation (FL) to prevent pump radiation (LB) from the first pump radiation source (PL1) from falling on the first radiation receiver (PD1). The first optical filter (F1) is preferably substantially transparent to radiation having the fluorescence wavelength ($\lambda_{FL}$) of the fluorescence radiation (FL) and substantially non-transparent to radiation having the pump radiation wavelength ($\lambda_{pump}$) of the pump radiation (LB) of the first pump radiation source (PL1). Provided that a compensation radiation (KS) is used (will be discussed later), the first optical filter (F1) is preferably substantially transparent to radiation of the compensation radiation wavelength ($\lambda_{ks}$) of the compensation radiation (KS) of the compensation radiation source (PLK), provided that the compensation radiation (KS) has to pass through the first optical filter (F1) on its way to the first radiation receiver (PD1).

The existence of a property "essentially" is the case in the sense of this writing if the remaining deviations from the property in question are not relevant for the intended purpose and/or the actual use and/or can be neglected.

In the example of FIG. 11, an exemplary second aperture (BA2) also prevents pump radiation (LB) from the first pump radiation source (PL1) from reaching the first radiation receiver (PD1) via a direct path.

Combinations of FIG. 11 are possible in particular with the systems of FIGS. 8 to 10.

FIG. 12

Figure 12:
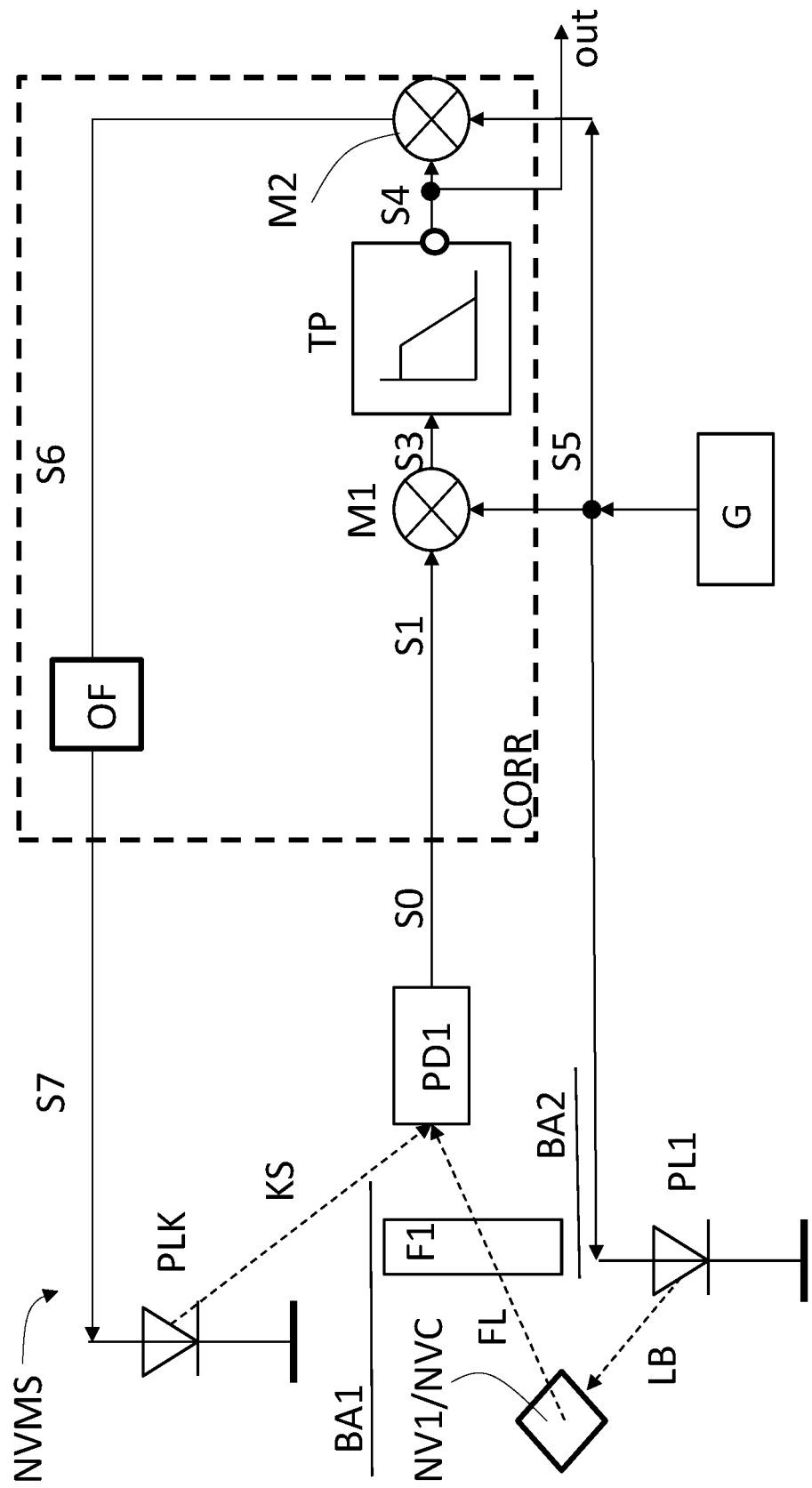
FIG. 12 corresponds to FIG. 11 except that there is no first subtractor (A1).

FIG. 12 is largely the same as FIG. 11 except that there is no first subtractor (A1) to subtract the feedback signal (S6) from the receiver output signal (S0) to form the reduced receiver output signal (S1). In the case of FIG. 12, it is rather the case that a compensation radiation source (PLK) radiates a compensation radiation (KS) into the first radiation receiver (PD1). Thus, in the first radiation receiver (PD1), the fluorescence radiation (FL) and the compensation radiation (KS) and the parasitic components of the pump radiation (LB), which are nevertheless transmitted through the first optical filter (F1), are generally superimposed in a substantially summing manner. Typically, the parts of the pump radiation (LB) transmitted through the first optical filter (F1) can be neglected when considering the system behavior.

Since a negative intensity of the compensating radiation (KS) would correspond to an impossible negative energy, an offset device (OF) adds a DC component to the feedback signal (S6), thus generating an offset feedback signal (S7).

The DC component is transformed into the frequency spectrum of the measurement signal (MES) by the subsequent multiplication of the reduced receiver output signal (S1) in the first multiplier (M1) with the measurement signal (MES), which here is equal to the transmission signal (S5). If the filter (TP) is suitably designed, for example as a low-pass filter, it filters out this signal component, which differs from 0 Hz, from the filter input signal (S3), which is the output signal of the first multiplier (M1), or preferably attenuates it to such an extent that it can be neglected in the consideration made here.

Preferably, the gain of the filter (TP) is chosen very high and negative.

Due to the negative sign of the gain of the filter (TP), which is indicated by a small circle at the output of the filter (TP) in FIG. 12, the signal content of the feedback signal (S6) is again subtracted from the signal content of the fluorescence radiation (FL). Thus, the receiver output signal (S0) in this configuration is equal to the reduced receiver output signal (S1). The advantage is that the first radiation receiver (PD1) can always be operated at the same optical operating point.

An optional first barrier (BA1) prevents in the case that the compensating radiation source (PLK) can directly irradiate the at least one sensor element with the at least one paramagnetic center (NV1) or the plurality (NVC) of paramagnetic centers (NV1). Between the first barrier (BA1) and the second barrier (BA2) there may be, for example, a window in an overall barrier comprising the first barrier (BA1) and the second barrier (BA2), that in the example of FIG. 12 is in the form of the first optical filter (F1). The preferred properties of the first optical filter (F1) have already been discussed several times.

The first transmission path for the pump radiation (LB) from the first pump radiation source (PL1) to the at least one sensor element with at least one paramagnetic center (NV1) or with a plurality (NVC) of paramagnetic centers (NV1) is preferably known and constant in its properties.

The second transmission path for the fluorescence radiation (FL) from the at least one sensor element with at least one paramagnetic center (NV1) or with the plurality (NVC) of paramagnetic centers (NV1) is preferably known and constant in its properties The third transmission path for the compensating radiation (KS) from the compensating radiation source (PLK) to the first radiation receiver (PD1) is preferably known and constant in its properties.

FIG. 13

Figure 13:
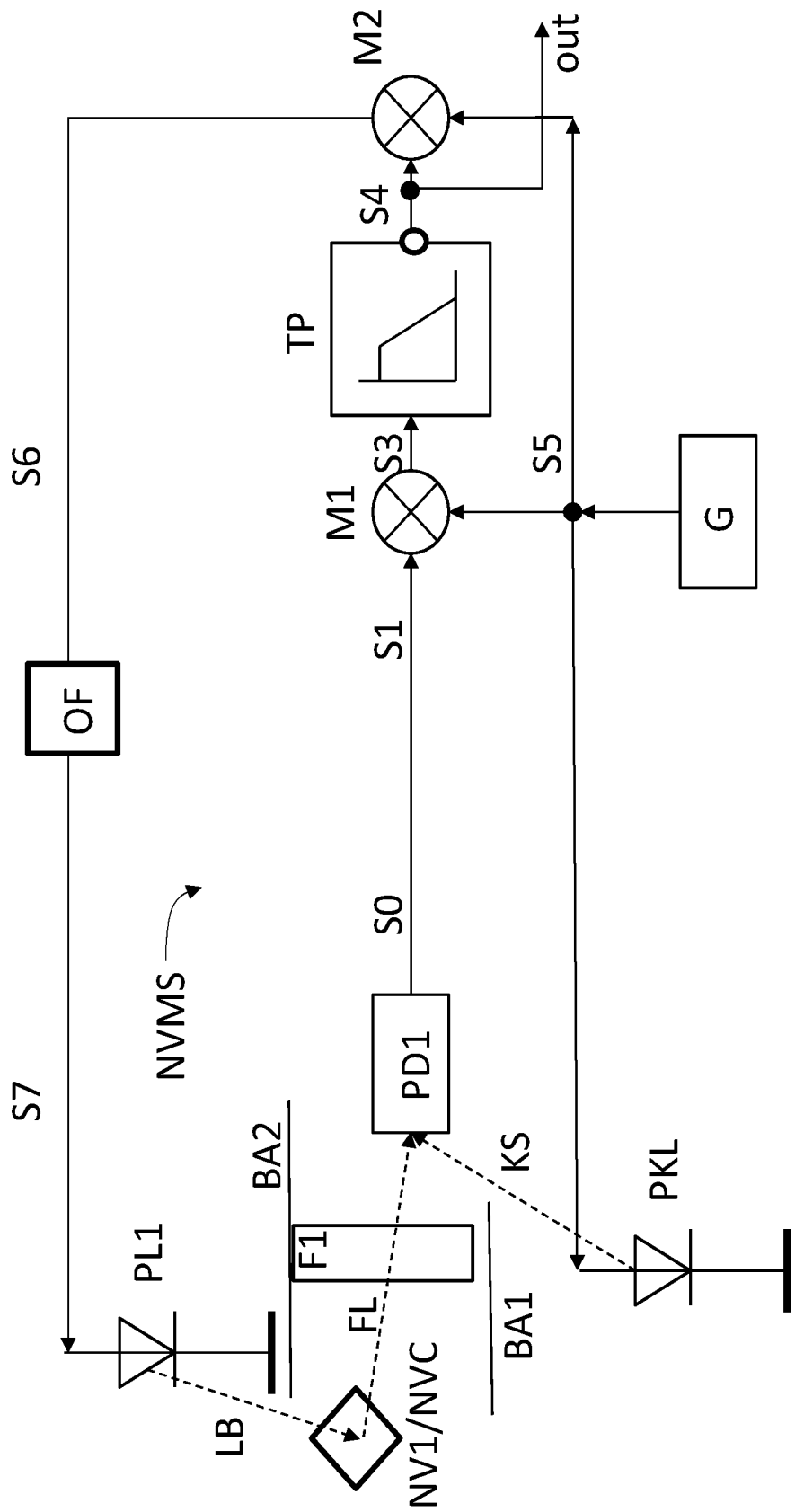
FIG. 13 corresponds to FIG. 12 with the difference that the compensating radiation source (PLK) is not controlled and instead the first pump radiation source (PL1) is now controlled.

FIG. 13 corresponds to FIG. 12 with the difference that the compensating radiation source (PLK) is not controlled and instead the first pump radiation source (PL1) is now controlled.

FIG. 14

Figure 14:
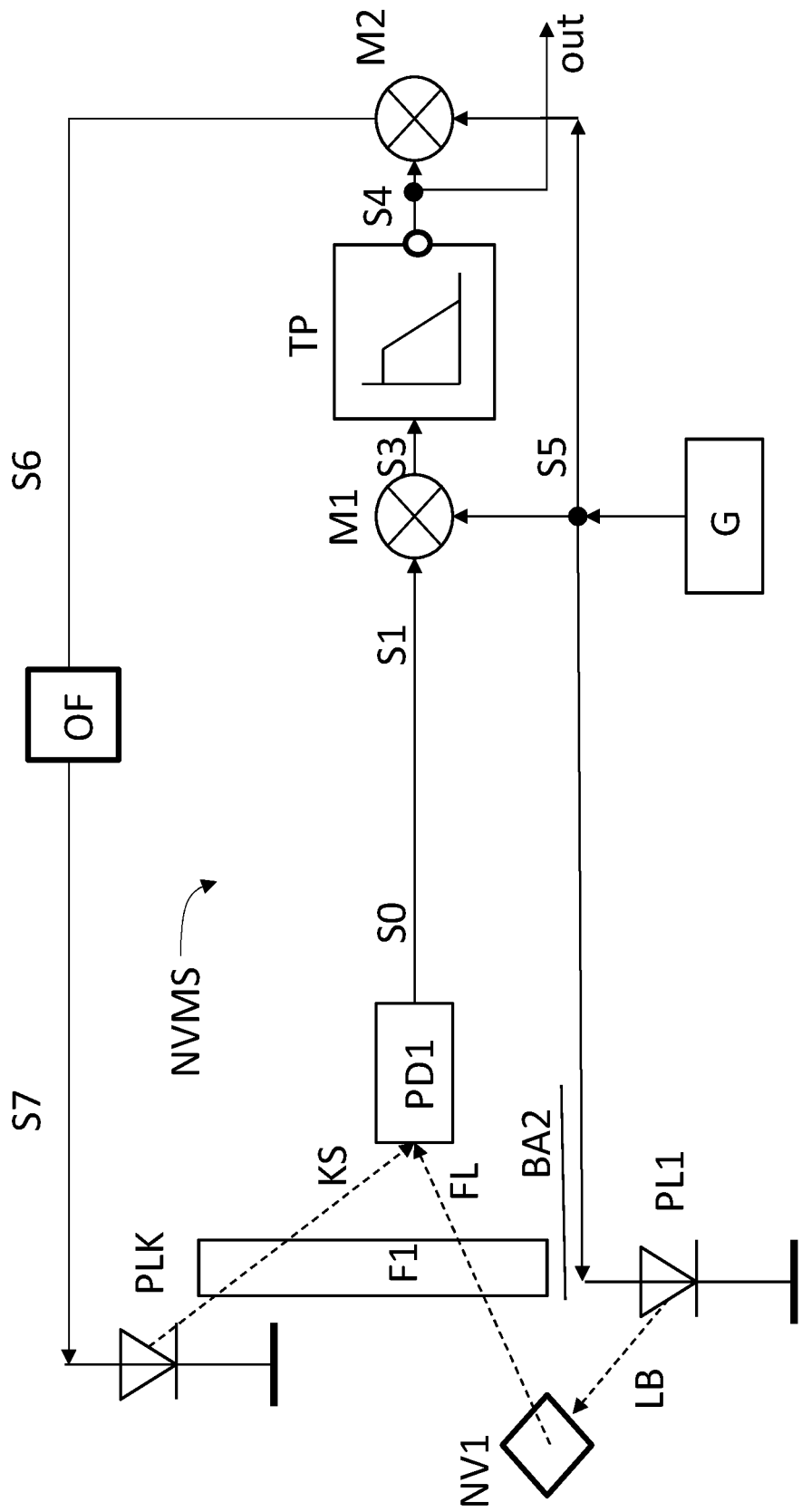
FIG. 14 corresponds to FIG. 12 with the difference that the first optical filter (F1) is also passed by the compensating radiation (KS).

FIG. 14 corresponds to FIG. 12 with the difference that the first optical filter (F1) is also passed by the compensating radiation (KS). For the control to work, the first optical filter (F1) must be transparent for the compensation radiation wavelength ($\lambda_{ks}$) of the compensation radiation (KS).

In the case of the at least one diamond as a sensing element and the at least one NV center in this at least one diamond as a paramagnetic center (NV1) or a plurality of NV centers as a plurality (NVC) of paramagnetic centers (NV1), the compensation radiation wavelength ($\lambda_{ks}$) of the compensation radiation (KS) is preferably longer than the fluorescence wavelength ($\lambda_{fl}$) of the fluorescence radiation (FL) and preferably longer than the pump radiation wavelength ($\lambda_{pump}$) of the pump radiation (LB).

In the case of the at least one diamond as a sensing element and the at least one NV center in this at least one diamond as a paramagnetic center (NV1) or a plurality of NV centers as a plurality (NVC) of paramagnetic centers (NV1), the fluorescence wavelength ($\lambda_{fl}$) of the fluorescence radiation (FL) is preferably shorter than the compensation radiation wavelength ($\lambda_{ks}$) of the compensation radiation (KS) and preferably longer than the pump radiation wavelength ($\lambda_{pump}$) of the pump radiation (LB).

Preferably, the compensating radiation is an infrared electromagnetic radiation. Most preferably, the compensating radiation source (PLK) is an infrared diode or an infrared laser diode.

FIG. 15

Figure 15:
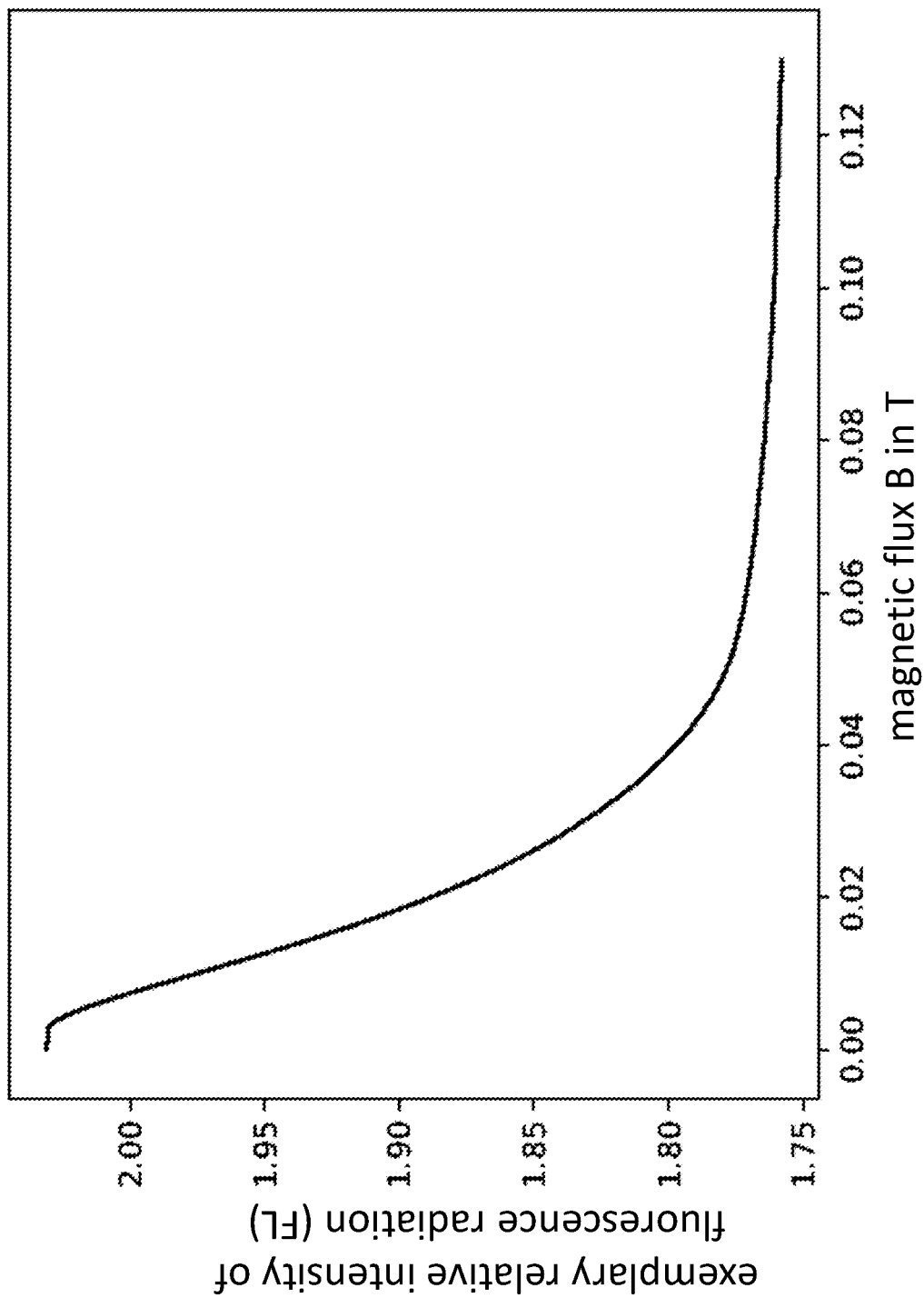
FIG. 15 shows an example dependence of the intensity of the fluorescence radiation (FL) of a plurality (NVC) of NV centers in diamond.

FIG. 15 shows an exemplary dependence of the intensity of the fluorescence radiation (FL) of a plurality (NVC) of NV centers in diamond, which were used as a plurality (NVC) of paramagnetic centers (NV1) in a plurality of sensor elements, as a function of a magnetic flux density (B) in Tesla (unit sign T). The vertical axis shows the measured intensity of fluorescence radiation (FL) of such an assembly of multiple NV centers in a plurality of small nano-diamonds and is arbitrarily normalized to an arbitrary intensity value.

The horizontal variation in the range smaller than 10 mT is due to limitations of the measurement setup used.

Importantly, the shape of this curve is not directional due to the use of differently oriented nanodiamonds as a plurality of differently oriented sensor elements. Therefore, the sensors described here do not need to be aligned for use. This is of crucial importance for series production and CMOS compatibility, because it eliminates the alignment step required in other techniques.

Essentially, the curve can be approximated in broad areas by a falling exponential curve with an offset.

The decrease in the intensity of fluorescence radiation (FL) with increasing strength of flux density (B) is currently known to be related to coupling of multiple NV centers.

This coupling of the paramagnetic centers (NV1), in particular the NV centers, also leads to a sensitivity of the intensity of the fluorescence radiation (FL) of the paramagnetic centers (NV1) to a change in the magnetic flux density (B) during decalibration. It is therefore important that at least two, better at least 4, better at least 8, better at least 20, better at least 40, better at least 100, better at least 200, better at least 400, better at least 1000 paramagnetic centers (NV1)—here NV centers in diamond—are coupled together to achieve this effect. Accordingly, it is useful if measures are taken to couple at least two, better at least 4, better at least 8, better at least 20, better at least 40, better at least 100, better at least 200, better at least 400, better at least 1000 paramagnetic centers (NV1).

This coupling can also take place via optical and/or electronic functional elements of the integrated circuit (IC) and/or via optical functional elements of the housing.

FIG. 16

Figure 16:
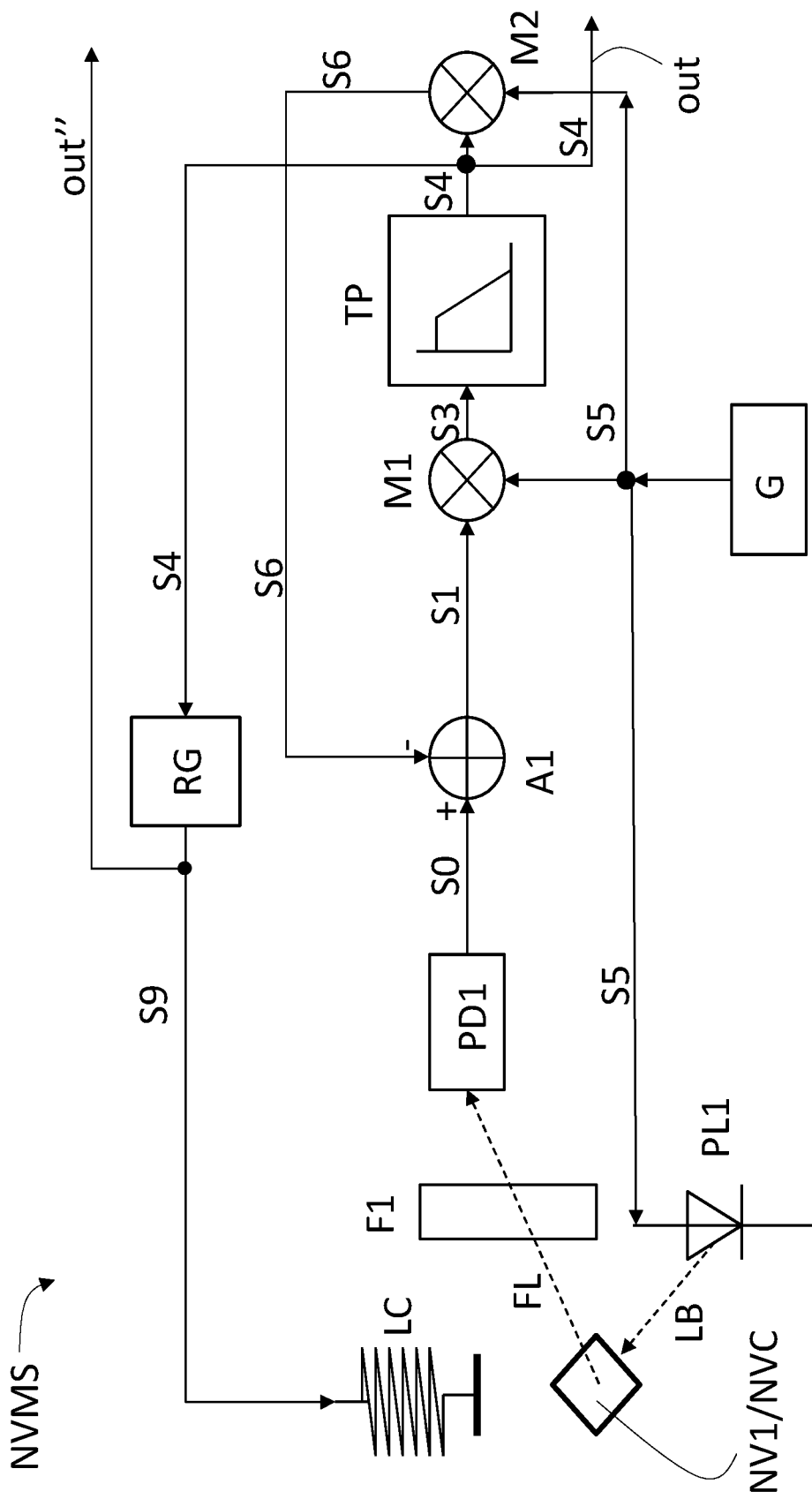
FIG. 16 shows an example of the proposed sensor system comprising a sensor element and/or quantum technological device element.

Another variant of the proposed sensor system concerns a sensor system and/or quantum technological system, hereinafter also referred to simplified as sensor system, in which the sensor system comprises a sensor element and/or quantum technological device element and in which the sensor system comprises a paramagnetic center (NV1) or a plurality (NVC) of paramagnetic centers (NV1) in the material of this sensor element and/or quantum technological device element. The sensor system of FIG. 16 is essentially the same as the sensor system of FIG. 8. In contrast to the sensor system of FIG. 8, the sensor system of FIG. 16 has a stabilization of the flux density (B) at the location of the paramagnetic center (NV1) by means of the magnetic field of a compensation coil (LC).

The sensor system again comprises a first pump radiation source (PL1) for pump radiation (LB), in particular preferably in the form of an LED or a laser, and a first radiation receiver (PD1). The pump radiation (LB) has a pump radiation wavelength ($\lambda_{pump}$). The pump radiation (LB) causes the paramagnetic center (NV1) or the plurality (NVC) of paramagnetic centers (NV1) to emit fluorescence radiation (FL) having a fluorescence wavelength ($\lambda_{fl}$). The first radiation receiver (PD1) is preferably sensitive to the fluorescence wavelength ($\lambda_{fl}$). The first pump radiation source (PL1) for pump radiation (LB) emits the pump radiation (LB). In particular, the sensor system is designed by means of optical functional elements such that the pump radiation (LB) falls on the paramagnetic center (NV1) or the plurality (NVC) of paramagnetic centers (NV1). Furthermore, the sensor system is preferably designed, in particular by means of optical functional elements, such that the fluorescence radiation (FL) irradiates the first radiation receiver (PD1). The special feature of the variant presented here is now that the sensor system comprises means, in particular a regulator (RG) and/or in particular a compensation coil (LC) and/or a possibly additional or replacing permanent magnet, in order to maximize the change in the intensity of the fluorescence radiation (FL) in the event of a change in the value of the magnetic flux density (B) or a change in the value of another of the physical parameters mentioned above at the location of the paramagnetic center (NV1) or at the location of the plurality (NVC) of paramagnetic centers (NV1) with respect to the respective application. I.e. by subtraction or addition of a quasi-static component of the magnetic flux (B), by subtraction and/or addition of a coil current fed by the regulator (RG), the total magnetic flux density (B) at the location of the paramagnetic center (NV1) or at the location of the plurality (NVC) of paramagnetic centers (NV1) is shifted in the direction of an operating point in the curve of FIG. 15 which has an optimized distance to the point of maximum sensitivity. This takes advantage of the fact that the paramagnetic centers (NV1) of a plurality (NVC) of paramagnetic centers (NV1) (in the case of FIG. 15 these are NV centers in diamond) couple at a sufficiently high local density of paramagnetic centers (NV1) at the location of the plurality (NVC) of paramagnetic centers (NV1) and thus produce collective effects of groups of paramagnetic centers (NV1). These lead to the modulation of the sensitivity.

If this operating point adjustment of the magnetic flux density (B) is made by means of a compensation coil (LC), it is useful to energize it with an electric current derived from the measured value of the magnetic flux density (B), i.e., the filter output signal (S4) of the filter (TP). Preferably, said regulator (RG) derives the corresponding operating point control signal (S9) from the filter output signal (S4). Preferably, the regulator (RG) has a low-pass characteristic or, better, an integrating characteristic. Preferably, therefore, it is a PI controller or a substantially functionally equivalent controller. The control by the regulator (RG) is then preferably with a first time constant $\tau_1$, while the compensation control by means of the filter (TP) is with a second time constant $\tau_2$. I.e., a first output signal (out) reproduces the short-term changes of a magnetic flux density alternating field of the value of the magnetic flux density (B) while a second output signal (out") reproduces the long-term changes or the current quasi-static operating point of the sensor system. For this to be possible, preferably the first time constant of the ti regulator (RG) is larger than the second time constant $\tau_2$ of the filter (TP). Thus, it is preferably valid: ($\tau_1 > \tau_2$).

FIG. 17

Figure 17:
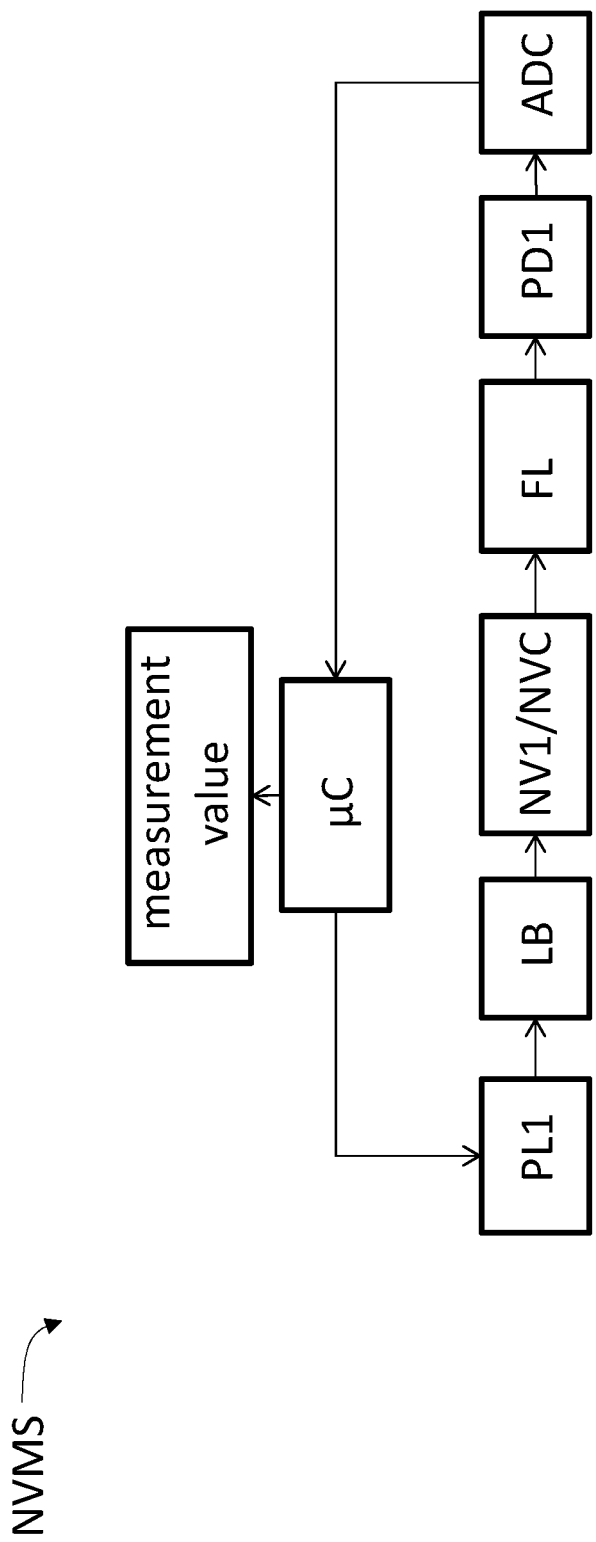
FIG. 17 shows the structure of an example sensor system (NVMS) based on a microcomputer (μC).

FIG. 17 shows the structure of an exemplary sensor system (NVMS) based on a microcomputer ($\mu$C). In the example shown in FIG. 17, the microcomputer ($\mu$C) controls the first pump radiation source (PL1). This generates the pump radiation (LB). The pump radiation (LB) acts on the paramagnetic centers (NV1) or the plurality (NVC) of paramagnetic centers (NV1). Preferably, the paramagnetic centers (NV1) are at least one, preferably several NV centers, i.e., a plurality (NVC) of paramagnetic centers (NV1), in at least one or more sensor elements, preferably one or more diamonds.

Depending on the magnetic flux density (B) at the location of the respective paramagnetic centers (NV1) or at the location of the plurality (NVC) of paramagnetic centers (NV1) and depending on the intensity of the pump radiation (LB) at the location of the respective paramagnetic centers (NV1) or at the location of the plurality (NVC) of paramagnetic centers (NV1), the paramagnetic centers (NV1) generate a fluorescence radiation (FL) which acts on the first radiation receiver (PD1). In the example of FIG. 17, the signal of this receiver is detected by an analog-to-digital converter (ADC) and fed to the microcomputer (µC). The microcomputer (µC) then preferably controls the first pump radiation source (PL1) as a function of the signal from the analog-to-digital converter (ADC). The signal from the first pump radiation source (PL1) may also be static and/or quasi-static. Preferably, the microcomputer (µC) emulates a system according to FIGS. 8 to 14 and 16.

The microcomputer (µC) determines a measured value from the value supplied by the analog-to-digital converter (ADC) to the microcomputer (µC). The microcomputer (µC) then preferably outputs this measured value via a first output signal (out). In case of using a microcomputer (µC), the first output signal (out) is preferably a signaling via a data bus (DB) not shown separately in FIG. 17 to which the microcomputer (µC) is connected.

This measured value may depend on the following parameters, among others:
- the intensity of the pump radiation (LB) reaching the paramagnetic center (NV1) and thus the transmission characteristics of the transmission path from the first pump radiation source (PL1) to the paramagnetic center (NV1), and
- the magnetic flux density (B) at the location of the at least one paramagnetic center (NV1) and
- the transmission characteristics of the transmission path from the at least one paramagnetic center (NV1) to the first radiation receiver (PD1), and
- in certain cases also by the crystal orientation of the sensing element, for example of the diamond crystal in the case of NV centers as paramagnetic centers (NV1), relative to the direction of the magnetic flux density (B), and
- if necessary, of one or more other physical parameters, such as the electric flux density D, the acceleration a, the gravitational field strength g, the rotational speed $\Omega$, oscillation frequencies $\omega$, the modulation of electromagnetic radiation, the intensity of ionizing radiation, the temperature $\vartheta$.

I.e., the measured value can reflect reflectivities, transmittances, distances, magnetic flux densities, and other physical parameters that influence these transmission distances and the paramagnetic center (NV1) or the plurality (NVC) of paramagnetic centers (NV1). Preferably, the respective sensor system (NVMS) is designed in such a way that, except for the parameter to be detected, all other influencing variables are kept essentially constant.

FIG. 18

FIG. 18 shows the combination of one of the previously described or derived sensor systems (NVMS) comprising at least one paramagnetic center (NV1) with two or three exemplary Helmholtz coil pairs. The paramagnetic center (NV1) is preferably again at least one NV center in at least one diamond. Provided it is a plurality (NVC) of paramagnetic centers (NV1), the sensor system (NVMS) preferably again comprises one or more sensor elements preferably again comprising the plurality (NVC) of paramagnetic centers (NV1). Preferably, it is a collection of nano-diamonds of different orientations with NV centers as paramagnetic centers (NV1).

Preferably, a system corresponding to FIG. 17 forms the basis of the control of the Helmholtz coil pairs.

When coils are referred to here, this means magnetic field generating components. They can be, for example, inductors, which are typically designed as copper windings or windings of electrically conducting wires on a coil former or the like. The coils (L2 to L7) mentioned below may also be, for example, permanent magnets (PM1, PM2) or comprise inductors and/or permanent magnets. Details of magnetic circuits such as magnetic cores, etc., are omitted to keep the presentation simple. In this context, reference is made to the book Küpfmüller, Kohn, "Theoretische Elektrotechnik and Elektronik" Springer 1993 Chapter 3 with special emphasis on Chapter 3 Section I 25. However, the disclosure includes the typical elements of magnetic circuits such as air gaps, ferromagnetic yokes, ferrite cores, permanent magnets, etc. However, it is also conceivable to use the device, as shown, as a pure air system without magnetic yokes.

In the example of FIG. 18a, a seventh coil (L7) and a third coil (L3) form the first Helmholtz coil pair. The seventh coil (L7) and the third coil (L3) are preferably connected in series so that the same current flows through them. The first axis (AS1) of the first Helmholtz coil, the seventh coil (L7), and the third axis (AS3) of the third Helmholtz coil, the third coil (L3), are preferably aligned and preferably the same. In the example of FIG. 18, however, they are drawn slightly offset for clarification only.

In the example of FIG. 18a, a second coil (L2) and a fourth coil (L4) form the second Helmholtz coil pair. The second coil (L2) and the fourth coil (L4) are preferably connected in series so that the same current flows through them. The second axis (AS2) of the second Helmholtz coil (L2) and the fourth axis (AS4) of the fourth Helmholtz coil (L4) are preferably aligned and preferably the same. In the example of FIG. 18, however, they are drawn slightly offset for clarification only.

The first axis (AS1) and third axis (AS3) are preferably perpendicular to the second axis (AS2) and fourth axis (AS4). In the example of FIG. 18, they are drawn only for clarification but slightly offset.

In the example of FIG. 18a, a fifth coil (L5) and a sixth coil (L6) form the third Helmholtz coil pair. The fifth coil (L5) and the sixth coil (L6) are preferably connected in series so that the same current flows through them. The fifth axis (AS5) of the fifth Helmholtz coil (L5) and the sixth axis (AS6) of the sixth Helmholtz coil (L6) are preferably aligned and preferably the same. In the example of FIG. 18, however, they are drawn slightly offset for clarification only.

The first axis (AS1) and third axis (AS3) are preferably perpendicular to the fifth axis (AS5) and sixth axis (AS6).

The second axis (AS2) and fourth axis (AS4) are preferably perpendicular to the fifth axis (AS5) and sixth axis (AS6).

The fifth axis (AS5) and sixth axis (AS6) are therefore preferably perpendicular to the plane spanned by the first axis (AS1) and third axis (AS3) on the one hand and the second axis (AS2) and fourth axis (AS4) on the other.

The device may have only two pairs of coils or only one pair of coils instead of three ([L3, L7], [L4, L2], [L5, L6]). Of course, additional pairs of coils can be provided if necessary. The axes of these further coil pairs, which are not drawn in here, are preferably tilted by an angle deviating from 90° with respect to the axis of one or more coil pairs.

Instead of the pairs of coils, individual coils can also be used, in which case the paramagnetic center (NV1) and/or the plurality (NVC) of paramagnetic centers (NV1) and/or the quantum dot (NV1) is preferably located at the point of the axis of the coil in the coil plane or at least in the vicinity of this point. One, two or three of the pairs of coils can thus be replaced by one coil each.

The microcomputer (μC) of FIG. 17 can now compensate for an external magnetic field acting on the sensor system (NVMS) or the paramagnetic center (NV1) from any direction by changing the current of the three Helmholtz coil pairs exemplified here in the example of FIG. 18. In principle, the exemplary three Helmholtz coil pairs of FIG. 18 have the function of the compensation coil (LC) of FIG. 16, whereas the microcomputer (μC) would have the function of the regulator (RG) of FIG. 16 in this example.

An exemplary method for controlling the magnetic flux (B) of the compensation magnetic field generated by the pairs of coils (L2 to L7) may be as follows:

In a first step, the microcomputer (μC) adjusts the first coil current of the first Helmholtz coil pair (L7, L3) so that the fluorescence radiation (FL) of the paramagnetic center (NV1) of the sensor system (NVMS) comes to a first maximum.

In a second step, the microcomputer (μC) adjusts the second coil current of the second pair of Helmholtz coils (L2, L4) so that the fluorescence radiation (FL) of the paramagnetic center (NV1) of the sensor system (NVMS) comes into a second maximum.

In a third step, the microcomputer (μC) adjusts the third coil current of the third pair of Helmholtz coils (L5, L6) so that the fluorescence radiation (FL) of the paramagnetic center (NV1) of the sensor system (NVMS) comes to a third maximum.

As mentioned above, instead of pairs of coils, only single coils can be used for this procedure if necessary.

Essentially, after the compensation coil system has compensated, the magnetic flux density (B) at the location of the paramagnetic center (NV1) is then preferably compensated to zero or at least adjusted to a minimum in terms of magnitude.

The value of the first coil current of the first Helmholtz coil pair (L7, L3) then represents a first value B1 of the magnetic flux density (B) in a first direction, here the x-direction.

The value of the second coil current of the second pair of Helmholtz coils (L2, L4) then represents a second value B2 of the magnetic flux density (B) in a second direction, here the y-direction.

The value of the third coil current of the third pair of Helmholtz coils (L5, L6) then represents a third value B3 of the magnetic flux density (B) in a third direction, here the z-direction.

The 3-tuple of the first value B1 of magnetic flux density (B) and the second value B2 of magnetic flux density (B) and the third value B3 of magnetic flux density (B) then represents a vector representing the vector of magnetic flux density (B).

In addition to the first value B1, second value B2 and third value B3 of the magnetic flux density (B), the measuring system can also pass on this vector in its entirety or in parts as a measured value.

In FIG. 18b the third Helmholtz coil pair (L5, L6) is replaced by the pair of two permanent magnets (PM1, PM2). These are preferably designed to generate a homogeneous bias field in the region of the paramagnetic center (NV1) or in the region of the plurality (NVC) of paramagnetic centers within the sensor system (NVMS). This allows an optimum operating point of the magnetic flux density (B) to be determined with maximum sensitivity.

FIG. 19

Figure 19:
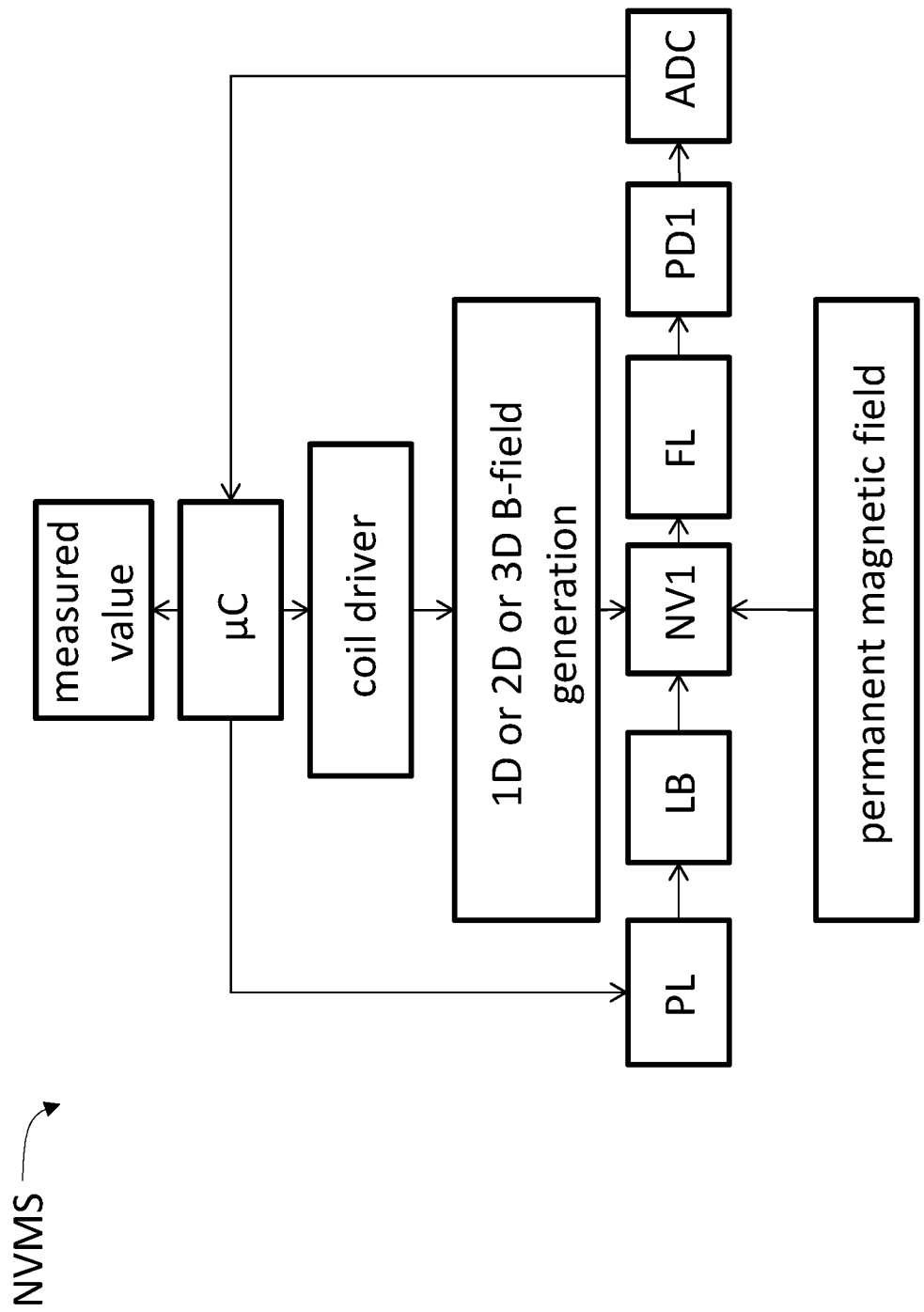
FIG. 19 shows the system of FIG. 17 extended by a control of the Helmholtz coil pairs ([L3, L7], [L4, L2], [L5, L6]) of FIGS. 18a and 18b.

FIG. 19 shows the system of FIG. 17 extended by a control of the Helmholtz coil pairs ([L3, L7], [L4, L2], [L5, L6]) of FIG. 18. The microcomputer (μC) controls coil drivers, which are preferably part of the sensor system (NVMS) together with the microcomputer (μC). These generate the respective coil current of the Helmholtz coil pairs ([L3, L7], [L4, L2], [L5, L6]). The Helmholtz coil pairs form the 1D-2D or 3D-B field generation. The sensor system can also be used for the one-dimensional measurement of only one magnetic field component by means of only one Helmholtz coil pair, i.e. by means of a 1D B-field generation, or the two-dimensional measurement of only two magnetic field components by means of only two non-parallel and preferably perpendicular Helmholtz coil pairs, i.e. by means of a 2D B-field generation, or the three-dimensional measurement of three magnetic field components by means of three non-parallel and preferably perpendicular Helmholtz coil pairs, i.e. by means of a 3D B-field generation. The measurement procedure is simplified accordingly in the case of 1D B-field generation or 2D B-field generation by omitting the optimization of the coil current of the missing Helmholtz coil pairs.

The magnetic flux density (B) generated by the Helmholtz coil pairs ([L3, L7], [L4, L2], [L5, L6]). and the permanent magnets (PM1, PM2) then acts on the paramagnetic center (NV1) or the plurality (NVC) of paramagnetic centers (NV1) of the sensor system (NVMS). This action is detected, for example, by the microcomputer (μC) via the measurement path and changes the control of the Helmholtz coil pairs ([L3, L7], [L4, L2], [L5, L6]) accordingly. The system can of course also be built analogously according to one or more of the previously presented systems or according to a prior art system.

The system discussed here can be simplified, if necessary, with possible losses in performance. For example, in certain cases single coils can be provided instead of Helmholtz coil pairs. The latter would result in field inhomogeneities, which may have effects.

FIG. 20

Figure 20:
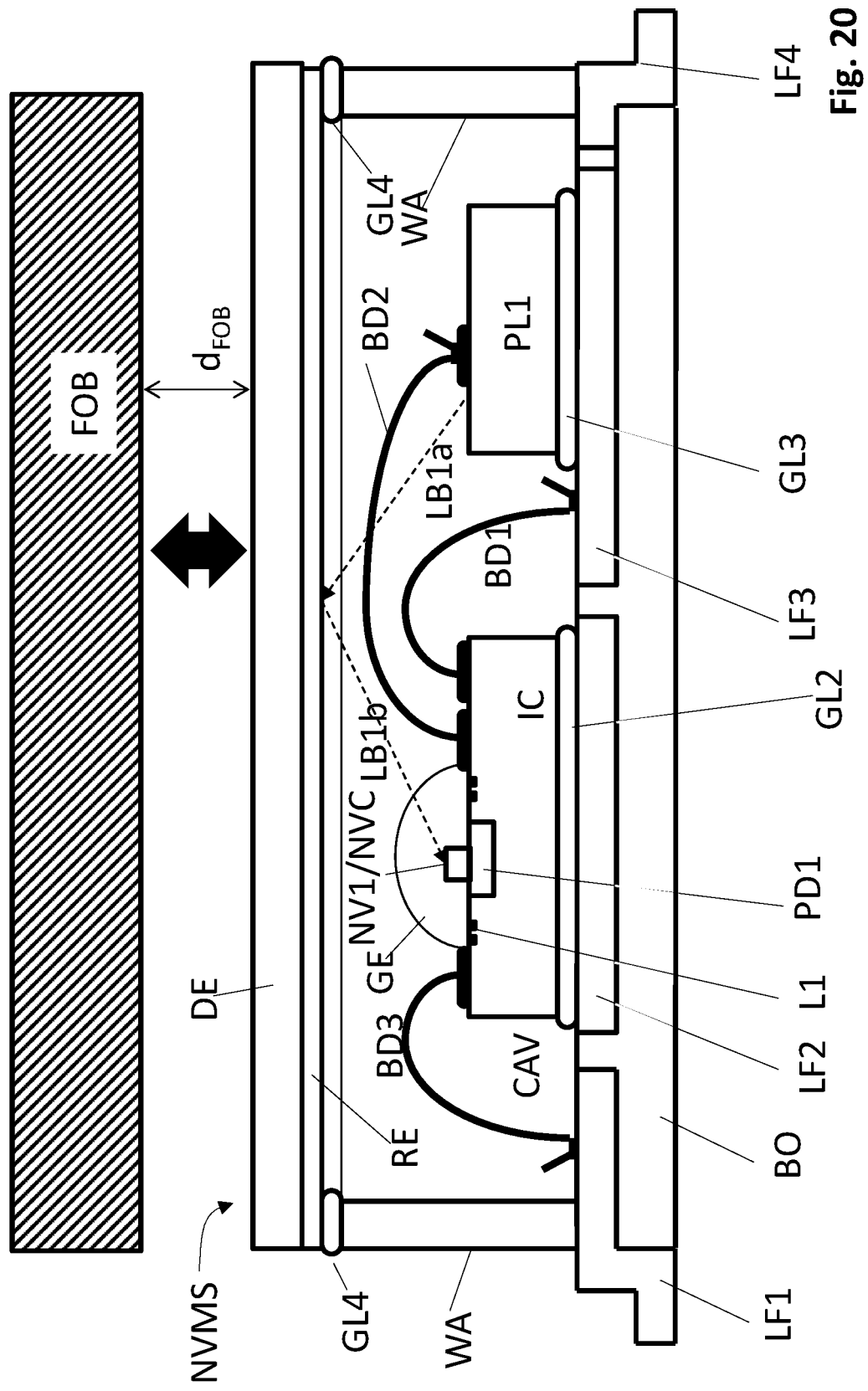
FIG. 20 shows a detection of a ferromagnetic object (FOB) by the example sensor system (NVMS) of FIG. 1.

FIG. 20 shows the detection of a ferromagnetic object (FOB) by the sensor system (NVMS) of FIG. 1. Preferably, all components of the sensor system (NVMS) are non-ferromagnetic. Also, the currents within the sensor system should be as low as possible in order not to falsify the measurement result.

When the ferromagnetic object (FOB) is approached to the sensor system (NVMS), the magnetic flux density (B) at the location of the paramagnetic center (NV1) or the plurality (NVC) of paramagnetic centers (NV1) of the sensor system (NVMS) usually changes. As a result, the intensity of the fluorescence radiation (FL) or the fluorescence phase shift time (ΔTFL) of the paramagnetic center (NV1) or the plurality (NVC) of paramagnetic centers (NV1) changes, and thus the relevant measured value detected by the sensor system (NVMS) changes. The sensor system (NVMS) can therefore be used to measure the distance ($d_{FOB}$) to a magnetized object, in this case the ferromagnetic object (FOB). Also, a change in the shape of the ferromagnetic object (FOB) can be detected. Furthermore, a change in the magnetization of the ferromagnetic object and/or the magnetic flux (B) generated by the ferromagnetic object (FOB) can be detected. This can be done, for example, by exceeding the Curie point due to temperature increase. Similarly, the material properties of dia- and/or paramagnetic substances occupying the location of the ferromagnetic object (FOB) can also be detected when a device generating a magnetic flux density, for example, a permanent magnet and/or a current-carrying coil, generates a magnetic flux (B) with which dia- and/or paramagnetic substances occupying the location of the ferromagnetic object (FOB) interact. The magnetic flux density (B) of the device generating the magnetic flux density (B) should thereby flow through the location of the paramagnetic center (NV1) or the location of the plurality (NVC) of paramagnetic centers (NV1).

FIG. 21

Figure 21:
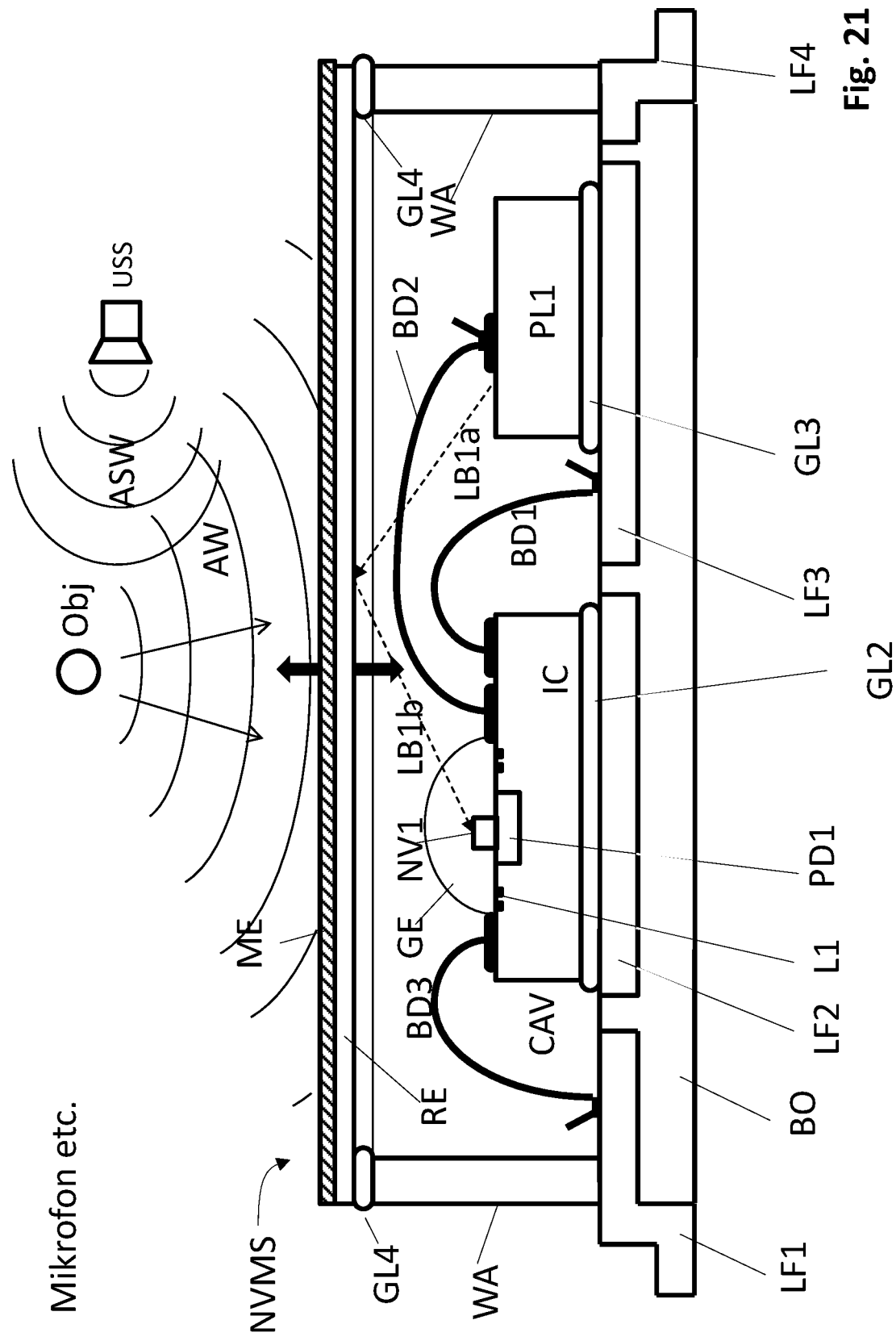
FIG. 21 shows the example sensor system (NVMS) of FIG. 1 having a cover designed as a mechanically vibrating ferromagnetic membrane (ME).

In FIG. 21, the cover of the sensor system (NVMS) of FIG. 1 is designed as a mechanically vibrating ferromagnetic membrane (ME). An object (Obj) emits sound waves as acoustic waves (AW). This can be, for example, one or more ultrasonic waves reflected by an object (Obj). Whereby a reflected ultrasonic wave is typically an acoustic transmission wave (ASW) reflected by the object (Obj), which in turn originates from an ultrasonic transmitter or an ultrasonic transmission system (USS).

These sound waves cause the ferromagnetic membrane (ME) in the example of FIG. 21 to vibrate mechanically. These mechanical oscillations modify the magnetic flux density (B) at the location of the paramagnetic center (NV1) in the form of an oscillation of the value of the magnetic flux density (B) at the location of the paramagnetic center (NV1) or at the location of the plurality (NVC) of paramagnetic centers (NV1). These oscillations of the value of the magnetic flux density (B) lead to an oscillation of the value of the intensity of the fluorescence radiation (FL) and/or an oscillation of the value of the fluorescence phase shift time (ΔTFL). These oscillations are therefore detected by the sensor system (NVMS). The sensor system (NVMS) of FIG. 21 thus works like a microphone. In the simplest case then the temporal course of a first output signal (out) of the sensor system (NVMS) of FIG. 21 reflects the temporal course of the value of the sound pressure of the acoustic wave (AW), if necessary, with a phase shift. The membrane (ME) is preferably manufactured elastically. The measured values determined by the sensor system (NVMS) typically correspond to the position or the deflection of the diaphragm (ME) at the time of measurement.

The path of action is described as such, that the acoustic oscillation of the acoustic wave (AW) is converted in a first step into a mechanical oscillation of the membrane (ME) and in a second step into an oscillation of the magnetic flux density (B) by the magnetization of the membrane (ME) and then in a third step by the paramagnetic center (NV1) or the plurality (NVC) of paramagnetic centers (NV1) into an oscillation of the intensity of the fluorescence radiation (FL) and/or an oscillation of the fluorescence phase shift time (ΔTFL), and then in a fourth step is converted by the first radiation receiver (PD1) into an oscillation of the value of the receiver output signal (S0). In an optional fifth step, the previously described further processing can then take place, which can result in particular in the said measured value of FIGS. 16 and 19 or in a value of a first output signal (out).

FIG. 22

Figure 22:
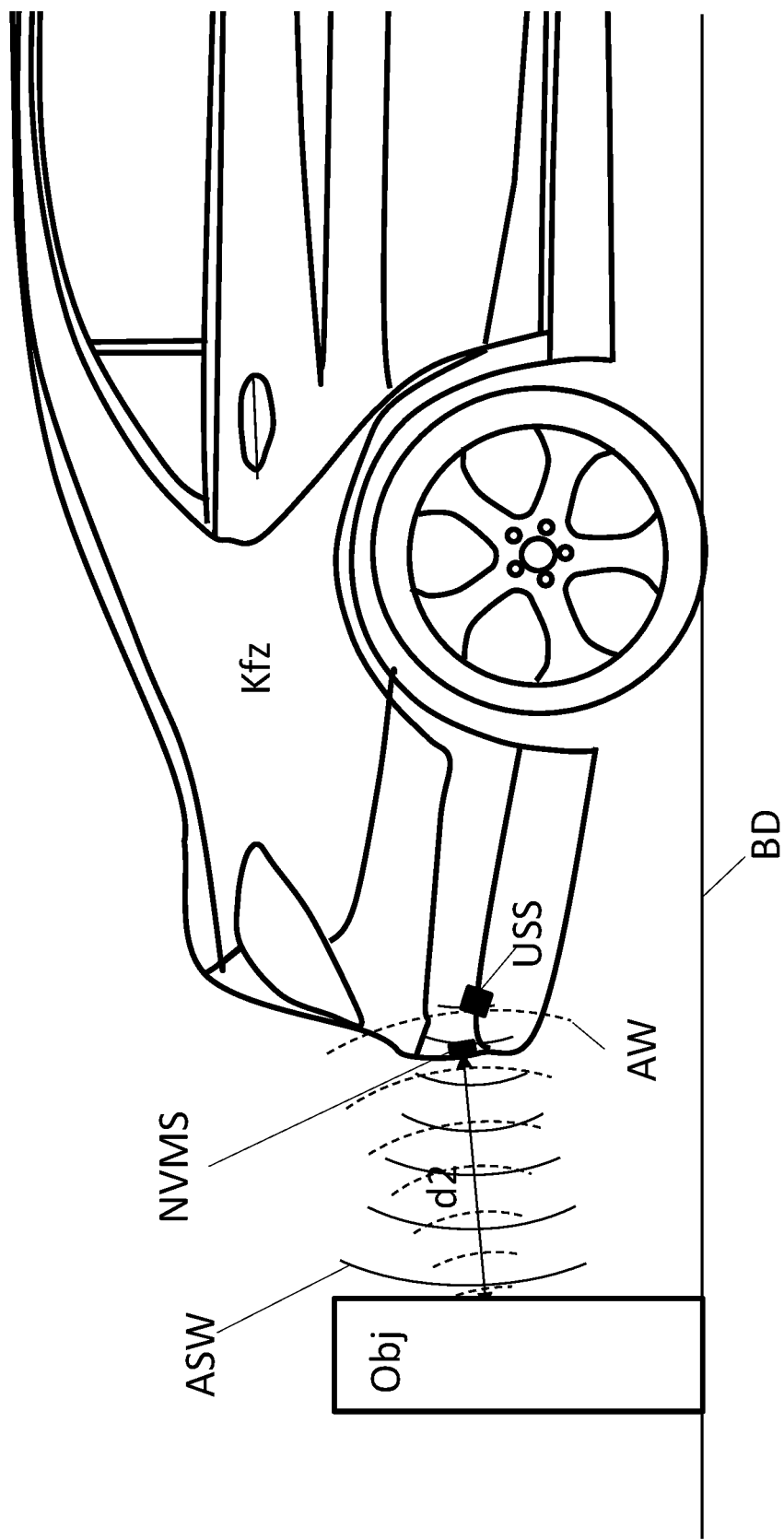
FIG. 22 shows an example application in which the microphone corresponding to FIG. 21 is used.

FIG. 22 shows a situation in which a microphone corresponding to FIG. 21 is used. An ultrasonic transmitter (USS), which is mounted in the bumper of a vehicle (motor vehicle) as an example, emits an ultrasonic signal, which is an acoustic transmission wave (ASW). This hits the object (Obj) after a propagation time over the distance d2 and is reflected there. The sensor system (NVMS), e.g. one corresponding to FIG. 21, detects the reflected sound signal in the form of an acoustic wave (AW), in this case the ultrasonic signal, with the aid of its paramagnetic center (NV1) or with the aid of a plurality (NVC) of paramagnetic centers (NV1) and converts the measured values of the position of the membrane (ME) determined at different points in time or of the single or multiple time derivatives and/or integrations of the measured values of this position into a possibly otherwise filtered data stream, which preferably substantially corresponds to the respective sound pressure or otherwise corresponds to extracted measured values. For example, the distance d2 can be extracted and estimated and output.

This data stream is then preferably compressed by the microcomputer (µC) or a corresponding device and transmitted to a higher-level computer system, where it is preferably decompressed and combined and/or converted with measurement data streams and measurement values of other sensors, for example other ultrasonic sensors and/or LIDAR sensors and/or radar sensors and/or Halios sensors and/or electrostatic sensors by means of sensor fusion to form new measurement values.

Preferably, the superordinate computer system executes an artificial intelligence program. Very preferably, the superordinate computer system executes an emulation of a neural network model. In this context, reference is made to the as yet unpublished international property right application PCT/EP2020/056727, the disclosure content of which is fully part of the disclosure presented here.

Thus, a superordinate computer system is proposed that executes a neural network model, wherein the neural network model comprises network nodes organized in network layers, and wherein each network node of the neural network has input and output parameters, and wherein at least one, preferably a plurality of input parameters of network nodes are either an input parameter of the neural network model or an output parameter of another network node of the neural network model and wherein at least one, preferably a plurality of output parameters of a network node are an output parameter of the neural network model or an input parameter of another neural network node and wherein a network node, in which an output parameter is an output parameter of the neural network model does not have an input parameter which is an input parameter of the neural network model, and wherein a network node in which an input parameter is an input parameter of the neural network model does not have an output parameter that is an output parameter of the neural network model, and wherein no network node of the neural network in which an output parameter is an output parameter of the neural network model has an input parameter that is an output parameter of a network node in which an input parameter is an input parameter of the neural network model. The input parameters of a network node of the neural network model are linked within a network node to the output parameters of this neural network node by means of a linking function for the neural network node concerned. Preferably, this link function is strongly nonlinear. The properties of the linking function thereby depend on linking function parameters that are preferably specific to the network node in question. The link function may vary from network node to network node. The link function parameters are determined and trained in a training process. The description here describes an at least three-layer neural network with at least three network layers.

It is now proposed that at least one, preferably several, input parameters of the neural network model executing the higher-level computing unit depend on a parameter of the paramagnetic center (NV1) or plurality (NVC) of paramagnetic centers (NV1). For example, such a parameter may be the value of the fluorescence radiation intensity (FL) and/or the value of the fluorescence phase shift time (ΔTFL).

The use of such artificial intelligence methods and processes is of particular importance for autonomous driving and/or the operation of complex systems and/or the operation of devices in possibly complex environments.

Preferably, one of the systems presented here determines, for example, a distance (d2) between the vehicle (Kfz) and an object (Obj) in the direction of movement of the vehicle (Kfz). Preferably, this information is used to change the direction of movement and/or the speed and/or acceleration or other vehicle parameters by the driver or a fully automatic system. Thus, an operating parameter of the vehicle (motor vehicle) then depends on the fluorescence radiation (FL) of a quantum dot (NV1) or a paramagnetic center (NV1) or a plurality (NVC) of paramagnetic centers (NV1) or one or more NV centers in the sensor system (NVMS). Here, an exemplary operating parameter would be the speed and/or acceleration and/or rotation and/or direction of the vehicle.

FIG. 23

Figure 23:
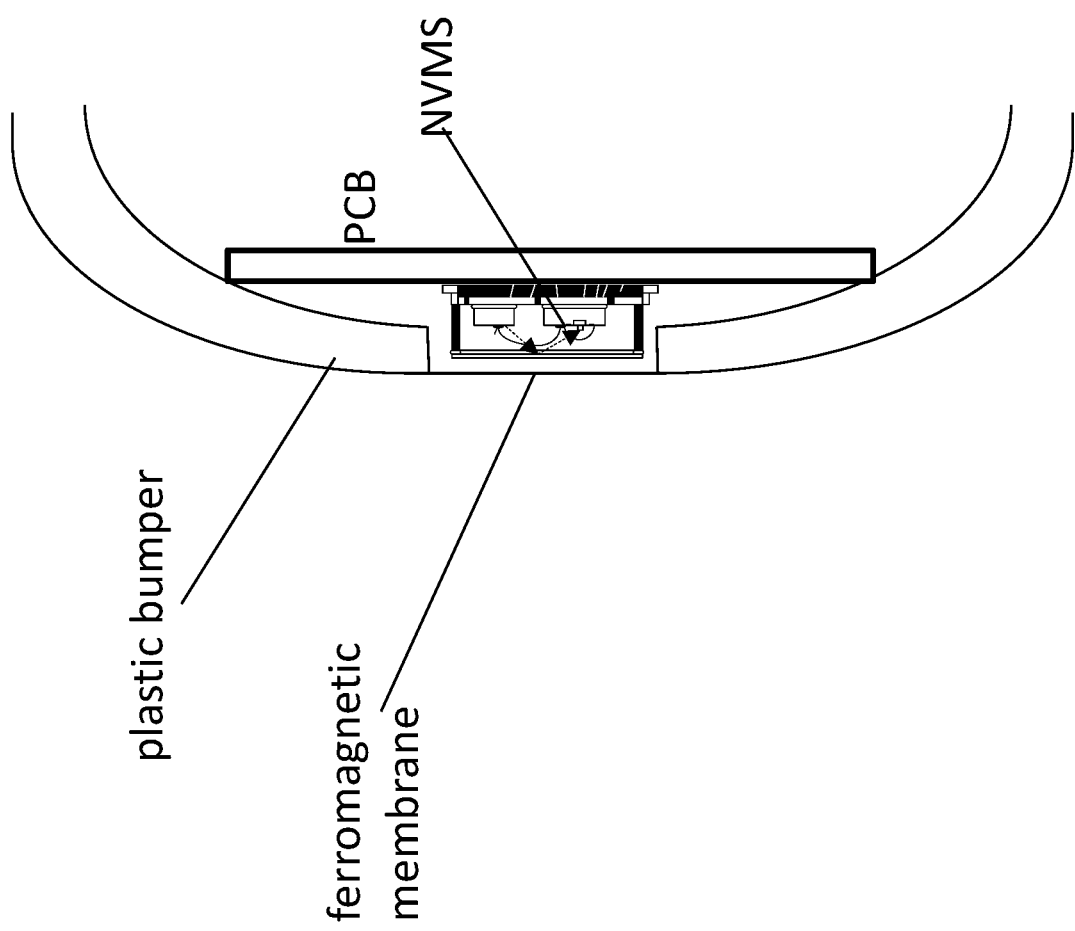
FIG. 23 shows the example sensor system of FIG. 21 in a simplified installation situation in the bumper of a vehicle, for example the vehicle (motor vehicle) of FIG. 22.

FIG. 23 shows a sensor system of FIG. 21 in a simplified installation situation in the bumper of an exemplary vehicle (motor vehicle)—in this case a motor vehicle, for example the vehicle (motor vehicle) of FIG. 22. A vehicle (motor vehicle) can also be another mobile device and/or a robot or a missile or a projectile or a watercraft or a floating or submersible body.

The sensor system is preferably mounted, for example soldered, on a printed circuit board (PCB). In the example of FIG. 23, the housing of the sensor system (NVMS) preferably has a non-magnetic cover, as shown for example in FIG. 18.

The ferromagnetic diaphragm (ME) is now located on the outside of the bumper. This has the advantage that the bumper can be painted through without having to keep the sound inlet window open, which is of great aesthetic advantage. Preferably, the bumper is made of non-magnetic material so as not to interfere with the sensor system (NVMS).

FIG. 24

Figure 24:
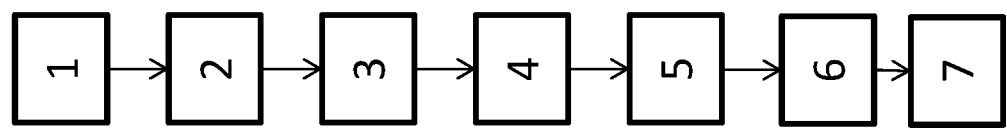
FIG. 24 shows an example process for operating an ultrasonic measurement system with a sensor system (NVMS).

FIG. 24 shows a typical procedure for operating an ultrasonic measurement system with a sensor system (NVMS) with at least one sensor element with at least one paramagnetic center (NV1) or a plurality (NVC) of paramagnetic centers (NV1).

In a first step (1), an ultrasonic transmitter (USS) emits an ultrasonic wave as an acoustic transmission wave (ASW). In a second step (2), one or more objects (Obj) reflect the acoustic transmission wave (ASW) as a reflected ultrasonic wave in the form of a reflected acoustic wave (AW). The reflected ultrasonic wave, i.e., the reflected acoustic wave (AW), vibrates a membrane (ME) with a ferromagnetic sub-device in a third step (3). In a fourth step (4), this oscillating membrane (ME) with the ferromagnetic sub-device causes a modulation of the magnetic flux density (B) at the location of the paramagnetic center (NV1) or of the plurality (NVC) of paramagnetic centers (NV1) of the sensor system (NVMS). In a fifth step (5), the modulation of the magnetic flux density (B) at the location of the paramagnetic center (NV1) or of the plurality (NVC) of paramagnetic centers (NV1) of the sensor system (NVMS) changes the fluorescence radiation (FL) of the at least one paramagnetic center (NV1) or of the plurality (NVC) of paramagnetic centers (NV1). In a sixth step (6), a first radiation receiver (PD1) of the sensor system (NVMS) detects this modulation of the fluorescence radiation (FL), in particular the modulation of the intensity of the fluorescence radiation (FL) and/or of the modulation of the fluorescence phase shift time (ΔTFL), as receiver output signal (S0). In a seventh step (7), an evaluation circuit generates therefrom one or more measured values, preferably a temporal sequence of measured values, which are then transmitted, preferably in whole or in part or after compression, for example to a higher-level computer system and, if necessary, decompressed and used in the higher-level computer system or in the sensor system (NVMS) itself for other purposes.

The method can also be used for normal sound and infrasound.

FIG. 25

Figure 25:
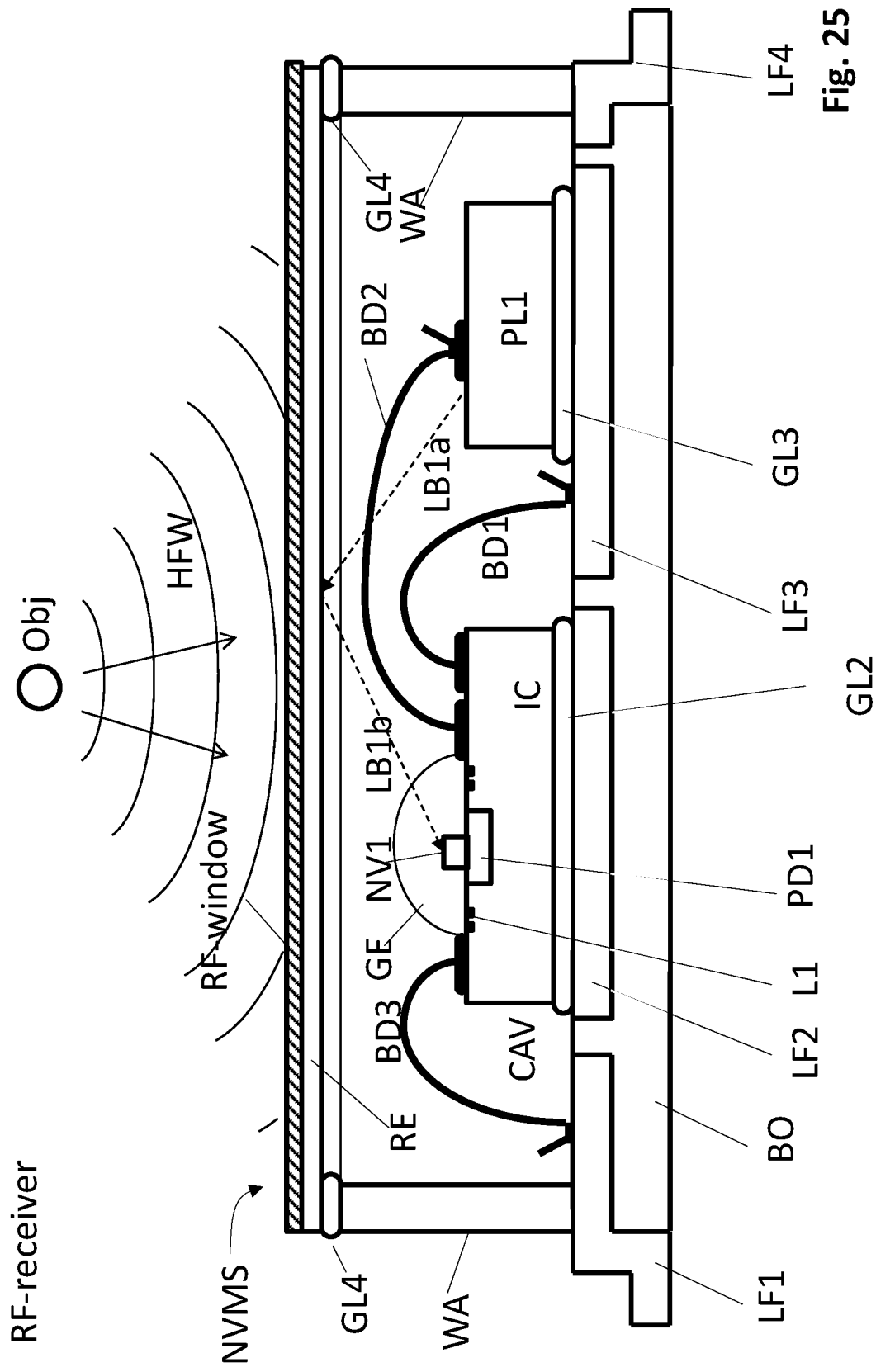
FIG. 25 shows the example sensor system corresponding to FIG. 1 as an RF receiver for electromagnetic RF radiation.

FIG. 25 shows a sensor system corresponding to FIG. 1 as an RF receiver for electromagnetic RF radiation. A use as receiver in radar systems especially in the mentioned vehicles and in stationary devices is conceivable. In addition, a use for broadband receivers is conceivable.

An object (Obj) emits electromagnetic waves (HFW). The object (Obj) can reflect electromagnetic waves (HFW) radiated onto the object (Obj) or emit them itself as a transmitter. These electromagnetic waves (HFW) interact with the paramagnetic center (NV1) or with the plurality (NVC) of paramagnetic centers (NV1) of the sensor system (NVMS). This modulates the fluorescence radiation (FL). This modulation of the fluorescence radiation (FL) can be a modulation of the intensity of the fluorescence radiation (FL) and/or of the modulation of the fluorescence phase shift time (ΔTFL).

Since the fluorescence-radiation (FL) has a time-constant $\tau_{FL}$ with which the fluorescence-radiation (FL) can follow changes of the magnetic flux density (B), the reception of the electromagnetic waves (HFW) is limited to periods above this time constant $\tau_{FL}$. Therefore, the maximum frequency ($f_{HFmax}$) of the non-attenuated reception of electromagnetic waves (HFW) is $2\pi f_{HFmax}=1/\tau_{FL}$.

In order to be able to receive higher frequencies, for example, a magnetic and/or electromagnetic alternating field of very high frequency $f_{LC}$ can be generated by a first coil (L1) and/or a resonator or the like in the immediate vicinity of the paramagnetic center (NV1) or the plurality (NVC) of paramagnetic centers (NV1). This then overlaps with the alternating magnetic field of the incident electromagnetic wave (HFW). This produces two wave components.

The first wave component has a sum frequency $f_S$ which corresponds to the sum of the frequency $f_{HF}$ of the incident electromagnetic wave (HFW) and the frequency fir of the alternating magnetic field generated by the first coil (L1) and/or a resonator or the like. This first wave component cannot be followed by the paramagnetic center (NV1) or the plurality (NVC) of paramagnetic centers (NV1), since for this sum frequency $f_S$ holds: $2\pi f_S>1/\tau_{FL}$. This first wave component, if it does not correspond energetically to a transition of the paramagnetic center (NV1), is ignored. In this respect, the paramagnetic center (NV1) typically exhibits a low-pass behavior.

The second wave component has a difference frequency $f_D$ which corresponds to the difference between the frequency $f_{HF}$ of the incident electromagnetic wave (HFW) and the frequency fir of the alternating magnetic field generated by the first coil (L1) and/or a resonator or the like. With a suitable choice of the frequency fir of the alternating magnetic field generated by the first coil (L1) and/or a resonator or the like, the paramagnetic center (NV1) or the plurality (NVC) of paramagnetic centers (NV1) can follow this second wave component if the following holds for this difference frequency $f_D$: $2\pi f_D < 1/\tau_{FL}$. This second wave component is converted by the paramagnetic center (NV1) or the plurality (NVC) of paramagnetic centers (NV1) into a modulation of the fluorescence radiation (FL) modulated with the difference frequency $f_D$, which can be received by the first radiation receiver (PD1) and converted into a first output signal (out) by the integrated circuit (IC). The modulation of the fluorescence radiation (FL) can again be a modulation of the intensity of the fluorescence radiation (FL) and/or the modulation of the fluorescence phase shift time (ΔTFL).

FIG. 26

Figure 26:
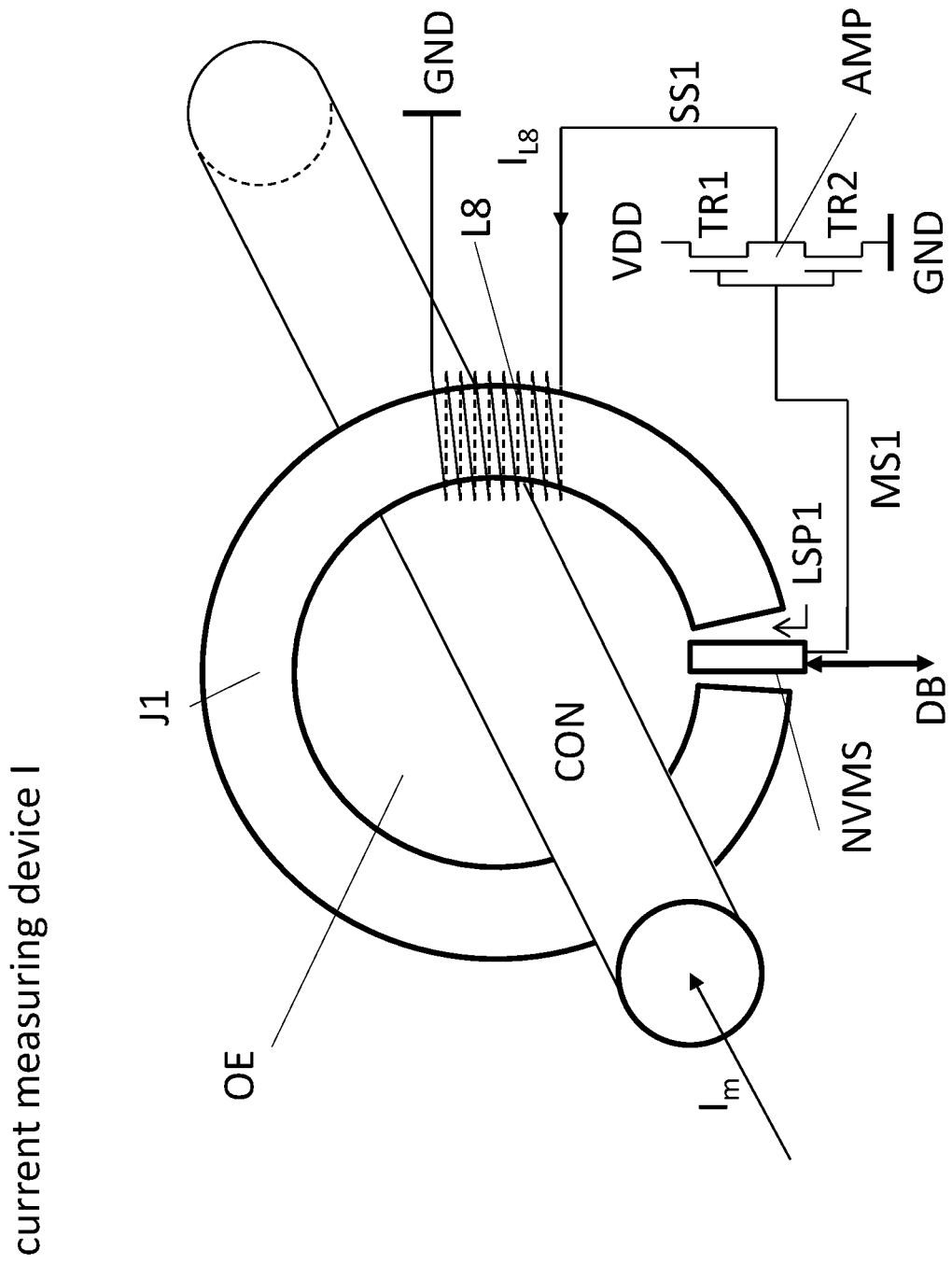
FIG. 26 shows a measuring device for the electric current ($I_m$) through a conductor (CON).

FIG. 26 shows a measuring device for the electric current ($I_m$) through a conductor (CON). A toroidal or ring-shaped yoke (J1) detects the magnetic flux density (B) generated by the electric current ($I_m$) through the conductor (CON). The yoke (J1) has a first air gap (LSP1) in which the sensor system (NVMS) with the paramagnetic center (NV1) or at least the paramagnetic center (NV1) is placed.

It is a closed magnetic circuit with a first air gap (LSP1).

The sensor system (NVMS) generates a first measured value signal (MS1) as a function of the measured value of the magnetic flux density (B), e.g., as a function of the first output signal (out). An exemplary amplifier (AMP) as regulator (RG) amplifies this first measured value signal (MS1) to a first control signal on a control signal line (SS1). The amplifier (AMP) may be part of the sensor system (NVMS). The exemplary amplifier (AMP) in the example of FIG. 26 is a push-pull stage with a first transistor (TR1) and a second transistor (TR2) connected between an operating voltage line (VDD) at operating voltage potential and a reference potential line (GND) at reference potential. In reality, more complicated amplifiers are certainly used.

An eighth coil current ($I_{L8}$) flows then through the control signal line (SS1) into an eighth coil (L8). The control signal line (SS1) thus typically corresponds in its function to the operating point control signal (S9) of FIG. 16. The eighth coil (L8), which corresponds functionally to the compensation coil (LC) of FIG. 16, then generates an additional excitation in the first yoke (J1) in the form of a magnetic field strength H, which counteracts the magnetic excitation by the electric current ($I_m$) to be detected flowing through the conductor (CON). Hereby the magnetic flux (B) at the location of the paramagnetic center (NV1) or at the location of the plurality (NVC) of paramagnetic centers (NV1) of the sensor system (NVMS) is regulated back to almost zero, except for control errors and noise, if the transfer functions of the control system are chosen correctly.

For example, the sensor system may have a microcomputer (μC) and an analog-to-digital converter (ADC) and may, for example, transmit the value of the first measured value signal (MS1) or a control value to a higher-level computer system via a data bus (DB) as a measured value for the value and/or magnitude of the electric current ($I_m$) through the conductor (CON). For example, the sensor system (NVMS) may have, in whole or in part, a structure as shown in FIGS. 16, 17 and/or 19. In principle, it is a one-dimensional system with only one coil according to FIG. 18. The device of FIG. 26 is particularly suitable for sensing the conductor current in electro-mobile batteries and motors or other devices in electric cars and other vehicles and power engineering devices such as generators, transformers and motors. Also, the device of FIG. 26 is particularly suitable for use in sensing the currents in overhead power lines and in the conductor lines to electrochemical devices such as electrolytic cells and the like.

In combination with optical waveguides, as shown in the following FIG. 28, the toroidal yoke (J1) with the sensor element and the one or more paramagnetic centers (NV1) or the plurality (NVC) of paramagnetic centers (NV1) can be mounted, for example, around a current-carrying line at high electrical potential, while the control and evaluation device (AWV) is arranged in the low-voltage range. The sensor element in the first air gap (LSP1) of the yoke (J1), which comprises the one or more paramagnetic centers (NV1) or the plurality (NVC) of paramagnetic centers (NV1), is thereby coupled to the control and evaluation device (AWV) by means of one or more optical waveguides (LWL1, LWL2). In this way a very good galvanic isolation can be achieved. In this application, the optical waveguides (LWL1, LWL2—see FIG. 28) are preferably sheathed with insulators, which preferably have circumferential ribs to extend the creepage distance and to protect against moisture. The preferred mounting situation for these insulators is that the optical fibers (LWL1, LWL2) are then mounted as vertically as possible.

FIG. 27

Figure 27:
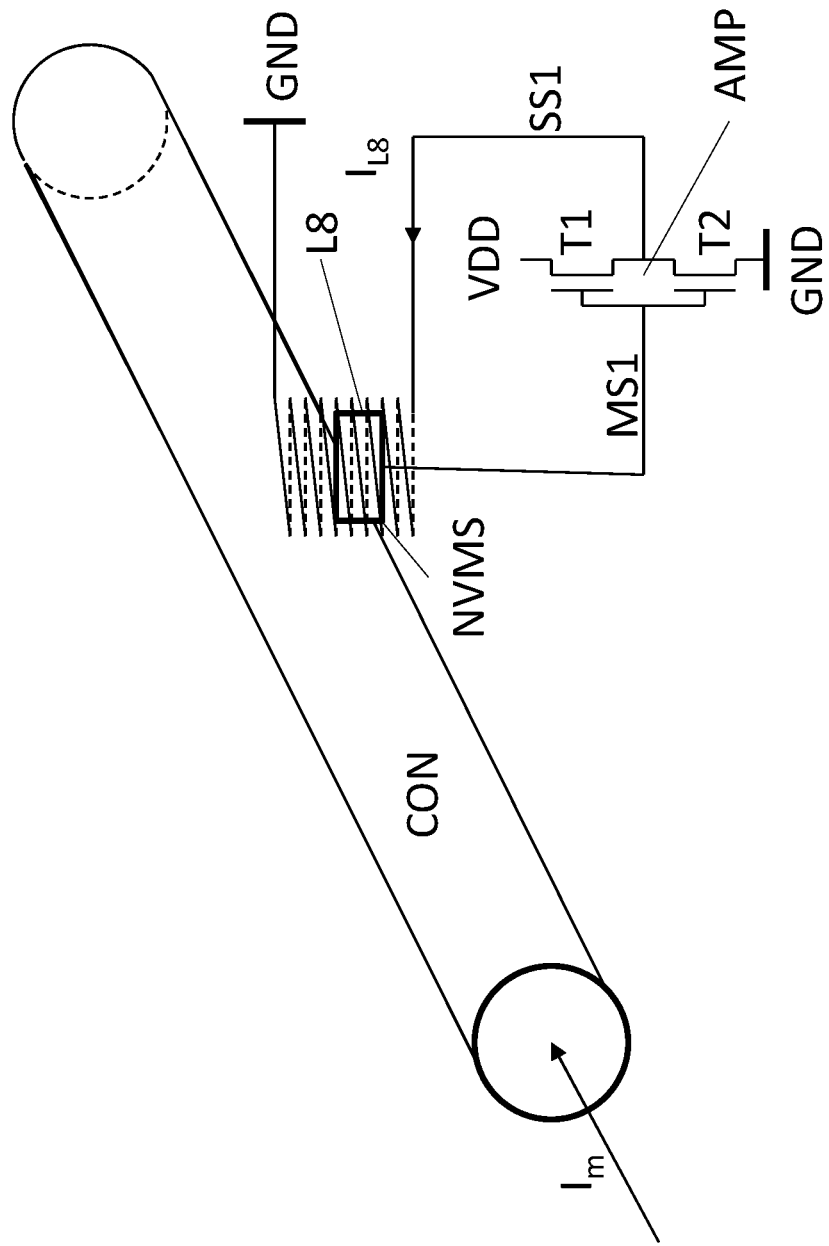
FIG. 27 corresponds to FIG. 26 with the difference that a ring- or torus-shaped yoke (J1) is no longer provided.

FIG. 27 corresponds to FIG. 26 with the difference that a ring- or torus-shaped yoke (J1) is no longer provided, since the field lines of the magnetic flux density (B) do not have to be perpendicular to the sensor system (NVMS), since the curve of FIG. 15, in contrast to sensitivity curves for Hall and AMR sensors, is not directional, which is a significant advantage of this device.

Therefore, the yoke (J1) can be omitted for sensor systems (NVMS) with a paramagnetic center (NV1). However, the yoke (J1) of FIG. 26 has the advantage that it significantly increases the sensitivity of the sensor system (NVMS).

FIG. 28

The paramagnetic center (NV1) or the plurality (NVC) of paramagnetic centers (NV1) can be separated from the rest of the sensor system (NVMS) if optical functional elements transport the pump radiation (LB) to the sensor element with the paramagnetic center (NV1) or the plurality (NVC) of paramagnetic centers (NV1), for example at least one NV center in at least one diamond or a plurality of NV centers in one or more diamonds, which are preferably oriented differently. Preferably, conversely, these or other optical functional elements transport the fluorescence radiation (FL) of the paramagnetic center (NV1) or the plurality (NVC) of paramagnetic centers (NV1) to the first radiation receiver (PD1). Preferably, these transmission paths do not have too much attenuation.

Figure 28:
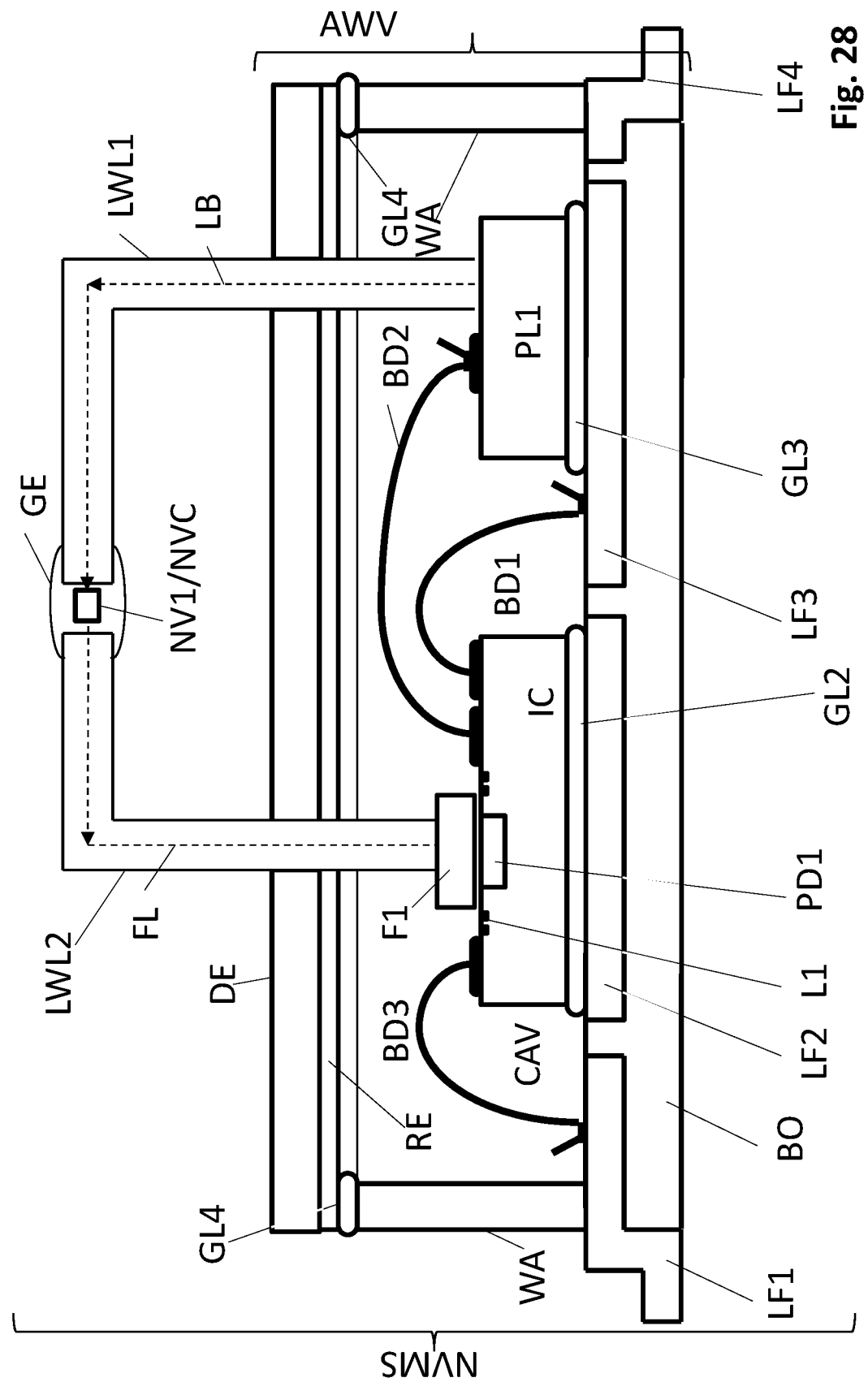
FIG. 28 show an example in which a first optical waveguide (LW1) transports the pump radiation (LB) to the sensor element with the paramagnetic center (NV1) or the plurality (NVC) of paramagnetic centers (NV1).

In the example of FIG. 28, a first optical waveguide (LW1) transports the pump radiation (LB) to the sensor element with the paramagnetic center (NV1) or the plurality (NVC) of paramagnetic centers (NV1), for example to at least one NV center in at least one diamond or a plurality of NV centers in one or more diamonds, which are preferably oriented differently. A second optical fiber (LWL2) transports the fluorescence radiation (FL) of the paramagnetic center (NV1) or the plurality (NVC) of paramagnetic centers (NV1) to the first radiation receiver (PD1). In the example of FIG. 28, the sensor element is mechanically and optically coupled to the paramagnetic center (NV1) or to the plurality (NVC) of paramagnetic centers (NV1), for example a diamond with one NV center or a plurality of NV centers in one or more diamonds with preferably different orientations, with a fastening means (GE) to the first optical fiber (LWL1) and the second optical fiber (LWL2). Preferably, the attachment means (GE) is transparent to radiation with the fluorescence wavelength (4) of the fluorescence radiation (FL) and transparent to radiation with the pump radiation wavelength ($\lambda_{pump}$) of the pump radiation (LB). Preferably, the first optical fiber (LWL1) is transparent to radiation having the pump radiation wavelength ($\lambda_{pump}$) of the pump radiation (LB). Preferably, the second optical waveguide (LWL2) is transparent for radiation with the fluorescence wavelength (4) of the fluorescence radiation (FL).

The advantage of this sensor system (NVMS) setup is that the optical fibers (LWL1, LWL2) are generally electrically non-conductive or poorly conductive and therefore do not generate substantially any magnetic field or do not substantially interfere with the magnetic field.

Another advantage of this sensor system design (NVMS) is that the optical fibers (LWL1, LWL2) are generally thermally non-conductive or poorly conductive and therefore essentially do not carry any disturbing thermal energy to or from the measurement location. This enables thermal decoupling of magnetic field measurement and evaluation electronics.

Since the optical waveguides (LWL1, LWL2) can be made of chemically largely inert material, for example glass, the sensor element with the paramagnetic center (NV1) or with the plurality (NVC) of paramagnetic centers (NV1) can then be introduced into environments with harsh operating conditions. This includes, but is not limited to, high and low temperatures, radioactive radiation fields, radiation fields with X-rays or gamma radiation, areas of high electric field strengths, corrosive environments with very high and/or low ph-value, salt solutions, abrasive environments, etc.

For example, the sensor element with the paramagnetic center (NV1) or plurality (NVC) of paramagnetic centers (NV1) can be placed in close proximity to a superconducting magnet and/or superconducting lead in a cryogenic region to detect the generated magnetic flux density (B).

For example, the sensor element with the paramagnetic center (NV1) or with the plurality (NVC) of paramagnetic centers (NV1) can be operated in a high-temperature area, for example in induction furnaces and/or in induction hotplates for measuring the magnetic flux densities (B) and/or current strengths there.

It is also conceivable to use it to measure the piston position in ferromagnetic pistons of internal combustion engines.

It could also be used in rocket engines and turbines.

In particular, the use in hypersonic engines or fusion reactors or plasma chambers for the measurement of the magnetic properties of the plasma and/or magnetic field generating elements and/or the detection of the magnetic flux density (B) within these systems is conceivable. Thus, a fusion or plasma reactor, or hypersonic engine is proposed, comprising a plasma chamber and a magnetic field generating device which generates a magnetic flux density (B) within the plasma chamber. Thereby a sensing element having a paramagnetic center (NV1) and/or a plurality (NVC) of paramagnetic centers (NV1) is arranged within the plasma chamber within the magnetic field of the magnetic field generating device. Thereby the sensor element is coupled to an optical device having a control and evaluation device (AWV). Thereby the control and evaluation device (AWV) comprises a first pump radiation source (PL1) which can generate a pump radiation (LB). Thereby the pump radiation (LB) excites the paramagnetic center (NV1) or the plurality (NVC) of paramagnetic centers (NV1) of the sensor element within the plasma chamber to emit a fluorescence radiation (FL) which depends on at least one physical parameter, in particular the magnetic flux density (B), within the plasma chamber. Thereby the evaluation device, in particular by means of a first radiation receiver (PD1), evaluates the fluorescence radiation (FL) of the paramagnetic center (NV1) or of the plurality (NVC) of paramagnetic centers (NV1). Thereby the control and evaluation device (AWV) generates one or more measured values as a function of the detected fluorescence radiation (FL). Preferably, one or more operating parameters of the hypersonic engine or the fusion reactor or the plasma chamber depend on one or more of these measured values.

Furthermore, it is conceivable to melt one or more sensor elements (NV1) with one or more paramagnetic centers (NV1) or a plurality (NVC) of paramagnetic centers (NV1), for example one or more nanodiamonds with one or more NV centers in one or more diamonds, into glass as a fastener (GE).

Thus, the disclosure also includes a glass body in which at least one sensor element having at least one paramagnetic center (NV1) or a plurality (NVC) of paramagnetic centers (NV1) is molded.

Instead of glass, other equivalent materials are certainly also possible as fasteners (GE). In particular, potting with transparent plastics is conceivable.

Furthermore, it is conceivable to place one or more sensor elements with one or more paramagnetic centers (NV1) or a plurality (NVC) of paramagnetic centers (NV1) as sensors for current density measurement in electrochemical cells, accumulators or batteries. Thus, an electrochemical cell, in particular an accumulator or a battery or an electrolysis device, is proposed having a cell chamber and a magnetic field generating device which generates a magnetic flux density (B) inside the cell chamber. Thereby a sensor element having a paramagnetic center (NV1) or a plurality (NVC) of paramagnetic centers (NV1) is arranged within the cell chamber within the magnetic field of the magnetic field generating device. Thereby the sensor element is coupled to an optical device with a control and evaluation device (AWV). Therein the control and evaluation device (AWV) comprises a pump radiation source (PL1) which can generate a pump radiation (LB). Therein the pump radiation (LB) comprises the paramagnetic center (NV1) resp. the plurality (NVC) of paramagnetic centers (NV1) of the sensor element within the cell chamber to emit a fluorescence radiation (FL). The fluorescence radiation (FL) depends on at least one physical parameter, in particular the magnetic flux density (B) within the cell chamber. Therein the control and evaluation device (AWV), in particular by means of a first radiation receiver (PD1), evaluates the fluorescence radiation of the paramagnetic center (NV1) or of the plurality (NVC) of paramagnetic centers (NV1). Therein the control and evaluation device (AWV) generates one or more measured values as a function of the detected fluorescence radiation (FL). Preferably, one or more operating parameters of the electrochemical cell, in particular of the accumulator or battery or electrolysis device, or of the cell chamber depend on one or more of these measured values. The cell chamber is typically completely or partially filled with an electrolyte or a melt. The magnetic field generating device may also be the electrolyte or other fluid within the cell chamber, through which an electric current flows to create a magnetic field.

FIG. 29

Figure 29:
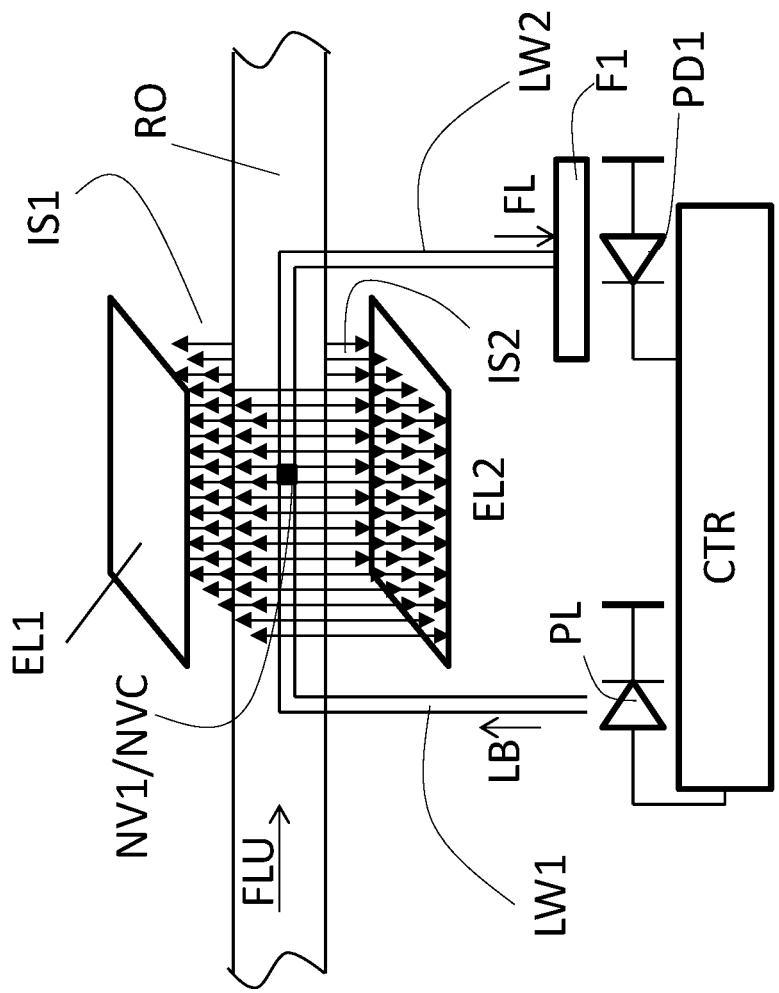
FIG. 29 shows an example placement of one or more sensor elements, e.g. of several preferably differently oriented nanodiamonds with several NV centers, in a fluidic conduit (RO).

FIG. 29 shows a placement of one or more sensor elements with one or more paramagnetic centers (NV1) or with a plurality (NVC) of paramagnetic centers (NV1), e.g. of several preferably differently oriented nanodiamonds with several NV centers, in a fluidic conduit (RO). In the fluidic conduit (RO) there is a fluid (FLU), which is typically in motion in a flow direction. A DC or AC electrical voltage is established between a first electrode (EL1) and a second electrode (EL2).

The first electrode (EL1) is separated from the fluid (FLU) in the fluidic line (RO) by a first electrical insulation (IS1).

The second electrode (EL2) is separated from the fluid (FLU) in the fluidic line (RO) by a second electrical insulation (IS2).

The electric field leads to displacement currents in the fluid (FLU), which can be measured by means of the modulated fluorescence radiation (FL) of the paramagnetic centers (NV1) or the plurality (NVC) of paramagnetic centers (NV1). The corresponding measuring devices have been described previously.

One problem is the double layers and space charge zones that occur.

FIG. 30

Figure 30:
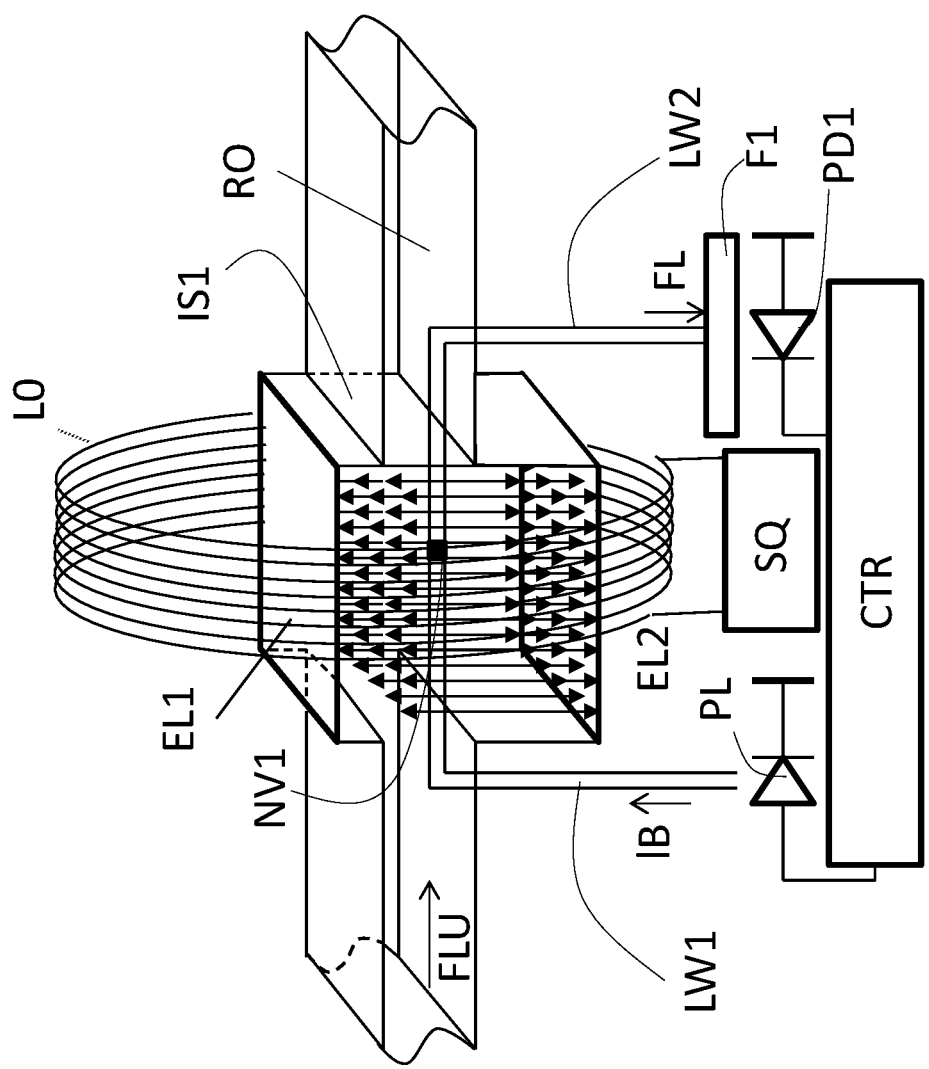
FIG. 30 shows an example electrochemical cell like the one in FIG. 29, wherein the first electrode (E1) and the second electrode (E2) are in electrical contact with the fluid (FLU).

FIG. 30 shows an electrochemical cell like the one in FIG. 29, except that the first electrode (E1) and the second electrode (E2) are in electrical contact with the fluid (FLU). The fluid (FLU) may be a liquid and/or a gas or a plasma. Mixtures may also be present. This is the typical situation in plasma chambers, batteries, accumulators, and electrolysis cells. Thus, for the first time, the sensor elements with the paramagnetic centers (NV1) make it possible to measure the electric current densities inside such electrochemical cells without affecting the fields through the feed lines. In addition, galvanic isolation is possible.

In the example of FIG. 30, a current source (SQ) generates a magnetic flux density (B) by means of a coil (L0). This constellation of quantum dot (NV1) to coil (L0) can be found for example in fusion reactors, plasma reactors and hypersonic engines.

Combinations with multiple coils, multiple electrodes and multiple quantum dots are also possible.

FIG. 31

Figure 31:
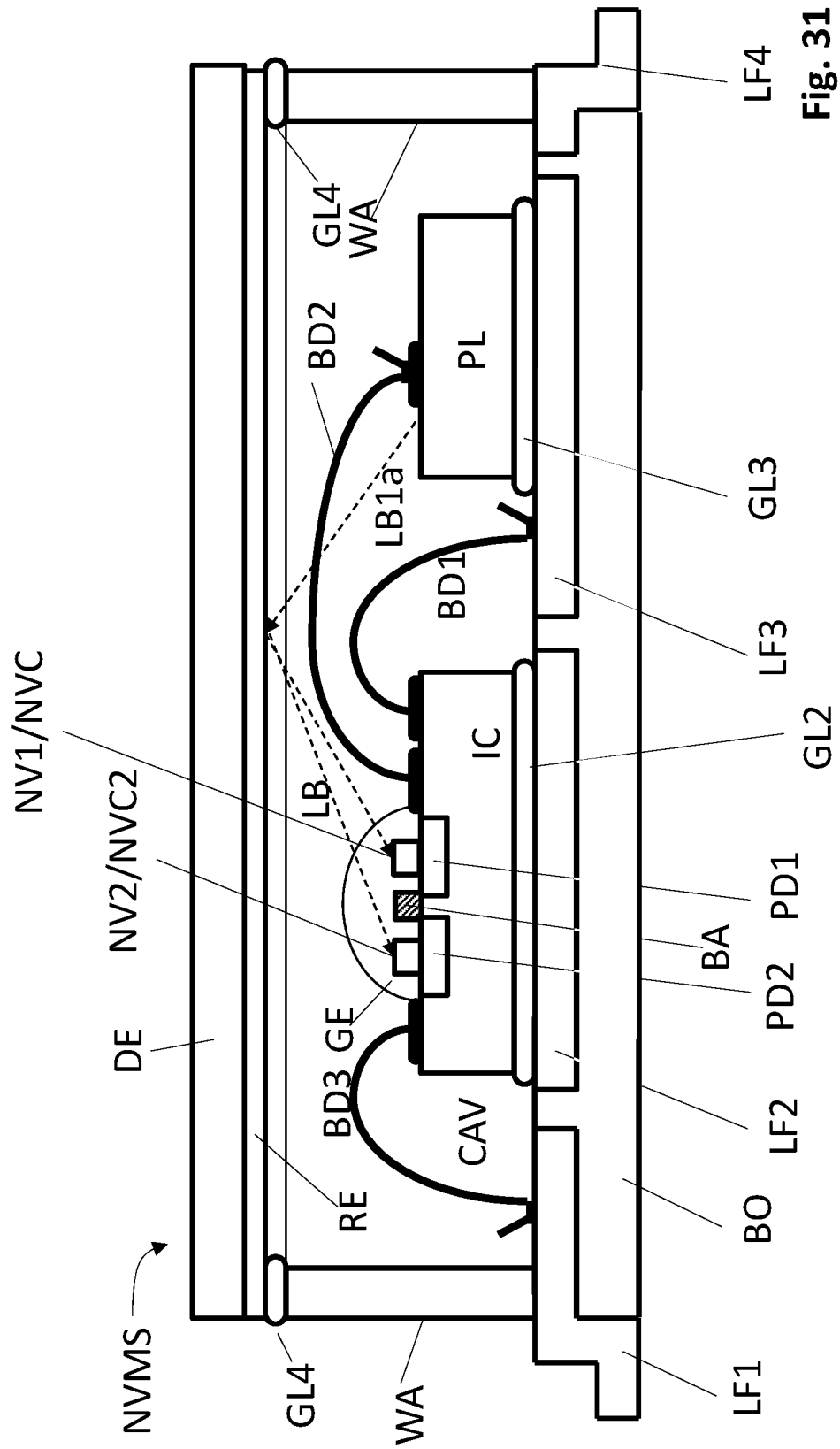
FIG. 31 shows the example device of FIG. 1 supplemented by a second radiation receiver (PD2) and a second sensor element.

FIG. 31 shows the device of FIG. 1 supplemented by a second radiation receiver (PD2) and a second sensor element with at least one further second paramagnetic center (NV2) or with a second plurality (NVC2) of second paramagnetic centers (NV2). Preferably, the first sensor element having the first paramagnetic center (NV1) or plurality (NVC) of paramagnetic centers (NV1) is one or more first diamond crystals having one or more first NV centers. Preferably, these first NV centers couple to each other. Preferably, the second sensor element having the second paramagnetic center (NV2) or the second plurality (NVC2) of second paramagnetic centers (NV2) is one or more second diamond crystals having one or more second NV centers. Preferably, these second NV centers couple to each other. The first sensor element having the first paramagnetic center (NV1) or plurality (NVC) of paramagnetic centers (NV1) is spaced apart from the second sensor element having the second paramagnetic center (NV2) or second plurality (NVC2) of second paramagnetic centers (NV2). Preferably, the first optical transmission path of the pump radiation (LB) from the pump radiation source (PL1) to the first sensor element with the first paramagnetic center (NV1) or the plurality (NVC) of paramagnetic centers (NV1) is designed to have approximately the same optical transmission properties as the second optical transmission path from the pump radiation source (PL1) to the second sensor element with the second paramagnetic center (NV2) or the second plurality (NVC2) of second paramagnetic centers (NV2).

The pump radiation source (PL1) therefore irradiates the first sensor element comprising the first paramagnetic center (NV1) or the plurality (NVC) of paramagnetic centers (NV1) with pump radiation (LB) and thus causes the first paramagnetic center (NV1) or the plurality (NVC) of paramagnetic centers (NV1) to emit a first fluorescence radiation (FL1). The first radiation receiver (PD1) receives this first fluorescence radiation (FL1). A barrier (BA) prevents the second paramagnetic center (NV2) or the second plurality (NVC2) of second paramagnetic centers (NV2) from directly radiating the second fluorescence radiation (FL22) emitted by it into the first radiation receiver (PD1).

The pump radiation source (PL1) therefore irradiates the second sensor element with the second paramagnetic center (NV2) or the second plurality (NVC2) of second paramagnetic centers (NV2) with pump radiation (LB) and thus causes the second paramagnetic center (NV2) or the second plurality (NVC2) of second paramagnetic centers (NV2) to emit second fluorescence radiation (FL22). The second radiation receiver (PD2) receives this second fluorescence radiation (FL22). A barrier (BA) prevents the first paramagnetic center (NV1) or plurality (NVC) of paramagnetic centers (NV1) from directly radiating the first fluorescent radiation (FL1) emitted therefrom into the second radiation receiver (PD2).

Based on the known spacing between the first sensor element comprising the first paramagnetic center (NV1) resp. the plurality (NVC) of paramagnetic centers (NV1) and the second sensor element comprising the second paramagnetic center (NV2) resp. the second plurality (NVC2) of second paramagnetic centers (NV2) a microcomputer (µC), which can be a part of the integrated circuit (IC), can, for example, determine a gradient of the magnetic flux density (B). The microcomputer (µC) can, for example, determine the gradient of the magnetic flux density (B) by comparing the two values of the magnetic flux density (B) measured with the aid of the first sensor element with the first paramagnetic center (NV1) resp. with the plurality (NVC) of paramagnetic centers (NV1) and with the aid of the second sensor element with the second paramagnetic center (NV2) or with the aid of the second plurality (NVC2) of second paramagnetic centers (NV2). The microcomputer (µC) calculates the difference of the two measured values and divides these values by the known distance of the first sensor element with the first paramagnetic center (NV1) resp. the plurality (NVC) of paramagnetic centers (NV1) to the second sensor element with the second paramagnetic center (NV2) resp. the second plurality (NVC2) of second paramagnetic centers (NV2) and thus obtains approximately the derivative of the magnetic flux density (B) along the line between the first sensor element and the second sensor element. The microcomputer (µC) can then transmit this measured value to a higher-level system, in particular a higher-level computer system, for example via a data line or a data bus (DB).

FIG. 32

Figure 32:
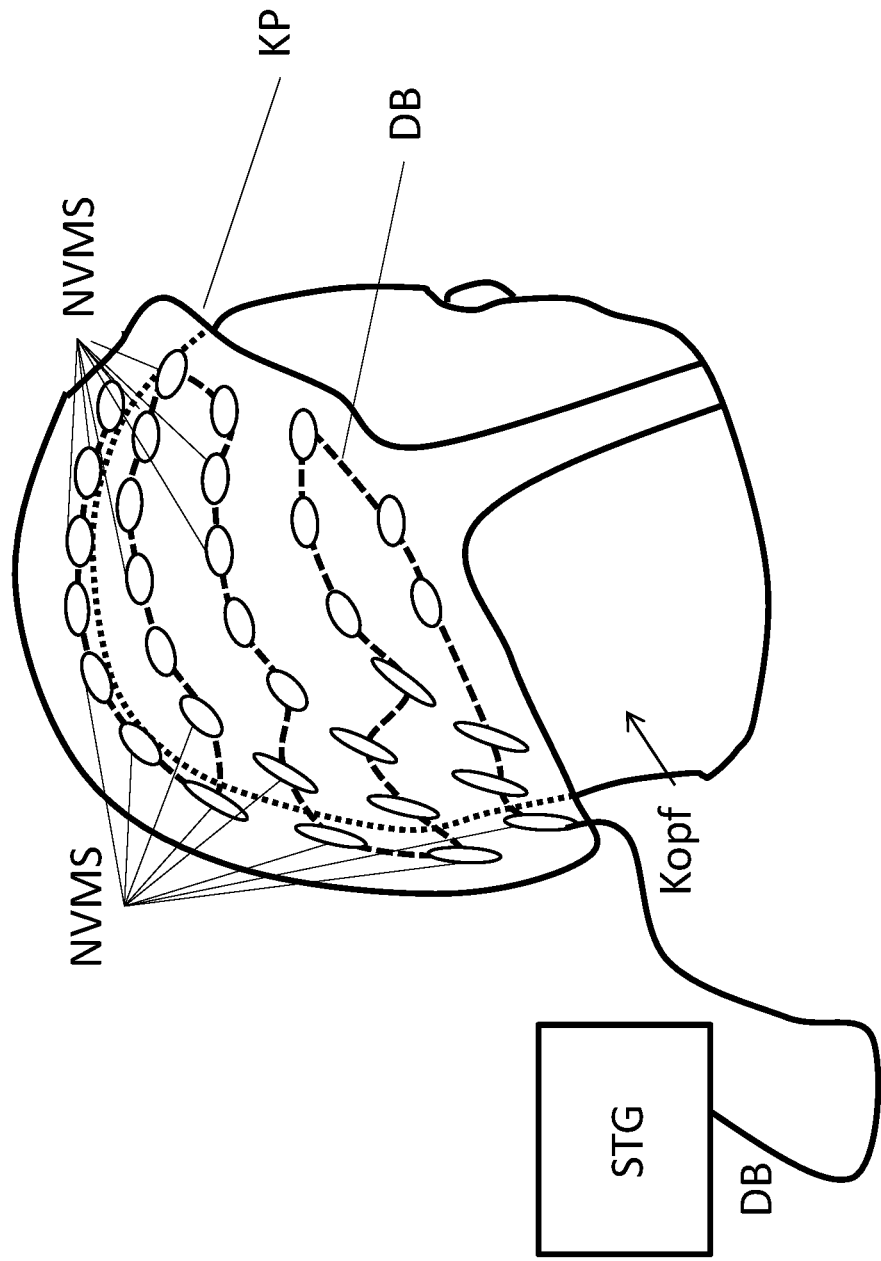
FIG. 32 shows an example use of several sensor systems (NVMS) as a magnetoencephalographic recording system.

FIG. 32 shows the use of several sensor systems (NVMS), each comprising at least one sensor element with at least one paramagnetic center (NV1) or a plurality (NVC) of paramagnetic centers (NV1), as a magnetoencephalographic recording system.

The sensor systems (NVMS) are preferably uniformly distributed on a cap (KP), which is preferably, but not necessarily, rigid. The sensor systems (NVMS) are preferably connected to a data bus (DB), which is preferably common to the sensor systems (NVMS).

In the case of a rigid cap (KP) (e.g., a helmet), the relative positions of the systems to each other are known. Therefore, spatially resolved information about these currents can then be determined from the measured magnetic fields of the brain currents in the form of magnetic flux density values (B). This is of course also possible for other body parts, too. For example, it is conceivable to distribute the sensors evenly over a lying surface by means of a mat, so that a whole-body measurement becomes possible.

A control unit (STG) is connected to the data bus (DB). The control unit (STG) causes one or more sensor systems (NVMS) to record the magnetic flux density (B) at the location of the paramagnetic center(s) (NV1) or at the location of the plurality (NVC) of paramagnetic centers (NV1) at a specific time via the data bus (DB). The control unit (STG) receives measured values for the flux density (B) from the sensor systems (NVMS) at the location of the paramagnetic center or centers (NV1) or at the location of the plurality (NVC) of paramagnetic centers (NV1). The control unit (STG) processes these measured values.

FIG. 33

FIG. 33 shows again the positioning of the sensor systems (NVMS) with the paramagnetic centers (NV1) opposite the brain to further illustrate the idea of FIG. 32.

FIG. 34

Figure 33:
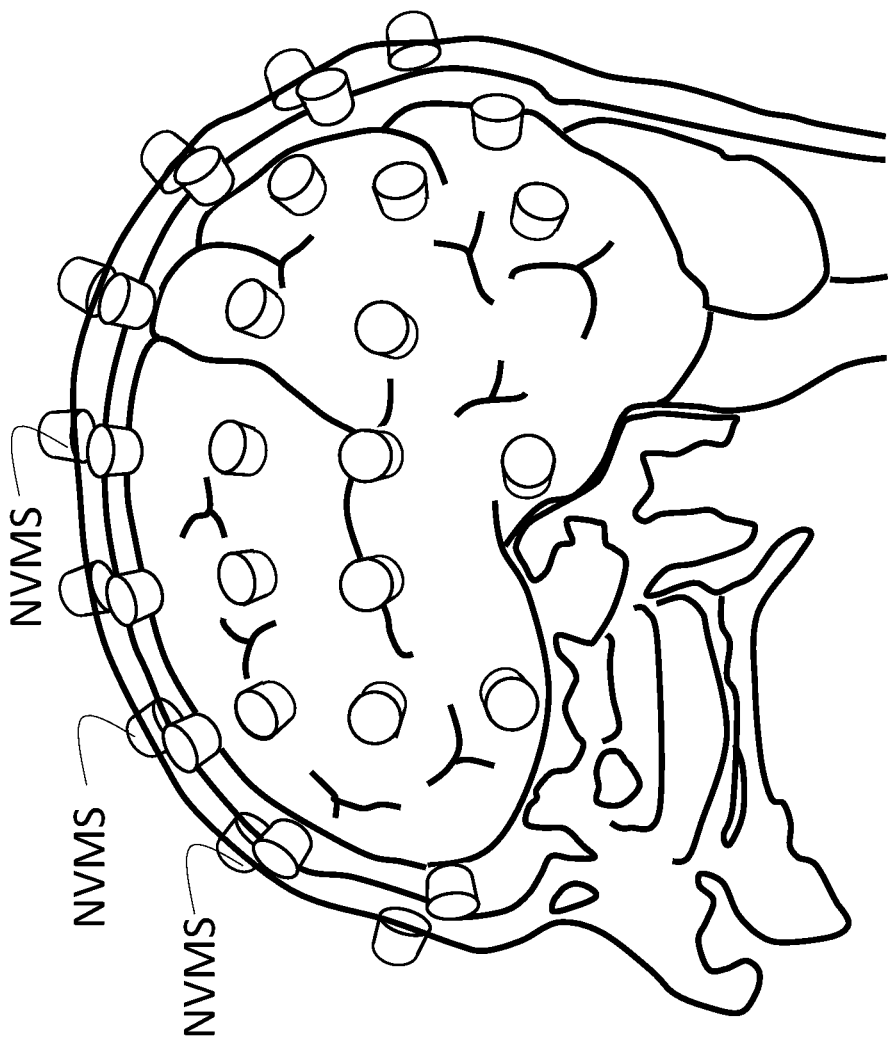
FIG. 33 shows an example positioning of the example sensor systems (NVMS) with the paramagnetic centers (NV1) opposite the brain to further illustrate the idea of FIG. 32.

If the brain waves are recorded with the aid of several sensor systems (NVMS), as shown in FIGS. 32 and 33. On the one hand, they can be analyzed, but on the other hand, they can also be used to recognize will expressions of the wearer of the cap (KP) of FIG. 32. In principle, it is not important whether an expression of will by the wearer or a temporal-spatial structure of the brain waves is to be detected for medical purposes.

Such a device preferably comprises a sensor system or, more preferably, a plurality of sensor systems (NVMS).

Thereby, each of these sensor systems (NVMS) comprises one or more paramagnetic centers (NV1) or a plurality (NVC) of paramagnetic centers (NV1). Preferably, each of the sensor systems (NVMS) comprises a pump radiation source (PL1) that irradiates the one or more paramagnetic centers (NV1) or the plurality (NVC) of paramagnetic centers (NV1) with a pump radiation (LB), thus causing the emission of fluorescence radiation (FL). This emission of pump radiation (LB) occurs in response to a transmission signal (S5). A first radiation receiver (PD1) converts a signal portion of the signal of the fluorescence radiation (FL) into a receiver output signal (S0). An evaluation circuit preferably generates the transmission signal (S5). The evaluation circuit preferably correlates the receiver output signal (S0) with the transmission signal (S5) or with a previous signal of the transmission signal (S5) from which the transmission signal (S5) may have been generated, or with a signal derived from the transmission signal (S5), and thus generates a value which reflects, for example, the value of the intensity of the fluorescence radiation (FL) or the value of the fluorescence phase shift time ($\Delta$TFL). This value can be output via a first output signal (out) of the sensor system (NVMS). However, it is useful if the value is passed on in digitized form via a data bus (DB), for example by means of a microcomputer ($\mu$C), which may be part of the sensor system (NVMS).

The device therefore preferably also comprises one or more data buses (DB) that forward the data acquired by the sensor systems (NVMS) to an interface of a control and conditioning unit (IF) of the device.

The device preferably comprises a holding device that mechanically fixes the sensor systems (NVMS) to the biological object to be measured in a substantially sufficiently stable manner. In the case of a human brain to be measured, this holding device is preferably a cap (KP). If animals are to be measured, other holding devices are conceivable and useful, which can be adapted functionally equivalent to the head shape of the respective animal.

For the said pattern recognition, measured values of the magnetic flux density (B) or of the said other physical parameters are recorded at the respective location of the paramagnetic center (NV1) or of the plurality (NVC) of paramagnetic centers (NV1) of the respective sensor system (NVMS) with the aid of a cap (KP) or of a corresponding functionally equivalent device with a plurality of sensor systems (NVMS) which each have at least one sensor element (NVMS) with in each case at least one or more paramagnetic centers (NV1) or a plurality (NVC) of paramagnetic centers (NV1). of the plurality (NVC) of paramagnetic centers (NV1) of the respective sensor system (NVMS).

Preferably, this is done discretely in time at synchronized measuring points. For this purpose, the control and conditioning unit (IF) of the device sends a start or synchronization command to all sensor systems (NVMS) of the cap (KP) via the preferably common data bus (DB), for example by means of a so-called broad cast command. For this purpose, the sensor systems (NVMS) preferably have said own microcomputer ($\mu$C), which is connected to the data bus (DB) and controls and, if necessary, monitors the other devices of the sensor system (NVMS) belonging to this microcomputer ($\mu$C). After these microcomputers ($\mu$C) of the associated sensor systems (NVMS) have received the synchronization or start command via said data bus (DB), all sensor systems (NVMS) preferably measure at the same times the respective magnetic flux density (B) or the respective physical parameter at the location of their respective paramagnetic centers (NV1) or at the location of the plurality (NVC) of paramagnetic centers (NV1) of their respective sensor elements.

The microcomputers ($\mu$C) of the sensor systems (NVMS) then transmit their respective determined measured value of the magnetic flux density (B) or the respective detected physical parameters via the preferably common data bus (DB) to the control and conditioning unit (IF). We now describe the acquisition of the magnetic flux density (B) as an example of the acquisition of a physical parameter. Other physical parameters besides the magnetic flux density (B), which may be measured by means of the intensity (In) of the fluorescence radiation (FL) of the paramagnetic center (NV1) or the plurality (NVC) of paramagnetic centers and/or a value of the fluorescence phase shift time ($\Delta$TFL) of the fluorescence radiation (FL) of the paramagnetic center (NV1) or of the plurality (NVC) of paramagnetic centers could be measured in the manner described in the present disclosure would be, for example, electric flux density D, acceleration a, gravitational field strength g, pressure P, temperature $\vartheta$, rotation speed w, oscillation frequency of mechanical parts (bars), position, ionizing radiation intensity, etc. Thus, by detecting a value corresponding to the intensity (In) of fluorescence radiation (FL) and/or a value of fluorescence phase shift time ($\Delta$TFL), a value can be obtained as a measurement for a value of one or more of these physical quantities. In the following, the detection of the magnetic flux density (B) is described as an example for these physical parameters, without the following description thereby being limited to this physical parameter. Express reference is made to the technical teachings of PCT DE 2020 100 648, which was still unpublished at the time of the application. With n sensor systems (NVMS) and, for example, one recorded physical parameter, an n-dimensional measured value vector of the values of the magnetic flux densities (B) is thus transmitted by the sensor systems (NVMS) of the cap (KP) at the respective measuring time. By presetting a temporal sequence of measurement time points by the control and conditioning unit (IF), the sensor systems (NVMS) of the cap (KP) thus transmit a temporal sequence of measured value vectors of the values of the magnetic flux densities (B) or other physical parameters, which were detected by means of the paramagnetic centers (NV1) of the sensor systems (NVMS), to the control and conditioning unit (IF) at the measurement time points of this temporal sequence of measurement time points. The control and conditioning unit (IF) typically performs processing of this temporal sequence of measurement vectors. This may include integrations, differentiation, and other more complex filtering known from signal theory and communications engineering, as well as artificial intelligence. These operations of the control and conditioning unit (IF) unit can increase the dimensionality of the data then transmitted to the pattern recognition unit. In this way, the control and conditioning unit (IF) generates a new data stream of processed, vectored, actual data from the temporal sequence of measured value vectors. These vectors are also referred to as feature vectors in the pattern recognition literature. Thus, feature vectors are generated from multiple measurement data obtained using one or more paramagnetic centers (NV1) of the sensor systems (NVMS). The control and conditioning unit (IF) transmits this new data stream of processed, vectorial, actual data in the form of a stream of feature vectors by means of a vectorial output data stream (VDS) of the control and conditioning unit (IF) to a pattern recognizer (NN). The pattern recognizer (NN) can be part of the control computer (CTR).

The pattern recognizer (NN), which can for example execute a neural network model (neural network) on a computer system of the pattern recognizer (NN) for the recognition of patterns (English: Pattern) in the received feature vectors, preferably assigns the vectorial current data, i.e. the feature vectors, transmitted from the control and conditioning unit (IF) to the pattern recognizer (NN) and processed in this way, to pre-recorded or predetermined vectorial prototype data sets of prototypes from a prototype database of the pattern recognizer (NN). The prototypes are preferably feature vectors obtained by classification, for example, using classification programs from previously recorded feature vector datasets of known manually evaluated situations. In this regard, reference should be made to the book Francisco Herrera, Francisco Charte, Antonio J. Rivera, Maria J. del Jesus, "Multilabel Classification: Problem Analysis, Metrics and Techniques", Springer, Apr. 22, 2018, ISBN-13: 978-3319822693. This prototype database preferably includes the processed, vector, previously recorded data of the prototypical situations whose pre-recorded feature vectors in the prototype database represent the prototypes. Each prototype, i.e., each prototypical feature vector, is assigned a symbol specific to that prototype in the prototype database. The control and conditioning unit (IF) transmits the current feature vectors as prepared, vectorial and current data. The prepared, vectorial and current data are available as feature vectors. The prototypes are in the form of prototypical feature vectors as previously recorded prototypical vectorial data. If a prototype, i.e., a prototypical feature vector, is recognized by the pattern recognizer (NN) in these prepared, vectorial and current data by means of the comparison of these prepared, vectorial, current data with these prototypical, vectorial, previously recorded data, a symbol for this recognized prototype, i.e., the recognized prototypical vectorial and previously recorded data vector, is transferred by the pattern recognizer (NN) to a control computer (CTR). This transfer to the control computer (CTR) is done, for example, by means of an output data stream (MDS) of the prototypes recognized by the pattern recognizer (NN). The symbols for the recognized prototypes can also be used to transfer parameters such as the probability of the presence of such a prototype.

The pattern recognizer (NN) preferably executes a program of pattern recognition with a computer system of the pattern recognizer (NN). This can be a neural network or an HMM recognizer or a Petri net.

The control computer (CTR) preferably controls the control and conditioning unit (IF) by means of a line and/or a data bus (IFL) for controlling the control and conditioning unit (IF) and, if necessary, receives status data and other data from the control and conditioning unit (IF) via this path.

The control computer (CTR) preferably controls the pattern recognizer (NN) by means of a line and/or a data bus (NNL) for controlling the pattern recognizer (NN) and, if necessary, receives status data and other data from the pattern recognizer (NN) via this path.

Depending on the symbol representing the recognized prototype, the control computer (CTR) can now, for example, produce outputs, e.g., via loudspeakers (LS), displays and screens (DSP), or actuators (AKT), such as motors, heaters, solenoids, etc., or devices, such as vehicles, robots, missiles, swimming and diving bodies, weapon systems, computer interfaces, etc., can be controlled. or, for example, devices, such as vehicles, robots, missiles, floating and submersible bodies, weapon systems, computer interfaces, etc., control. The control computer (CTR) can of course be controlled via input devices not shown for simplicity, such as keyboards, etc. Also, the control computer (CTR) may again have additional data interfaces, which may be wired and/or wireless. In particular, the control computer (CTR) can be connected to the Internet or another data network or another computer, if necessary, also via a quantum cryptographically encrypted data transmission link. This means that the exemplary output units such as loudspeakers (LS), displays (DSP) and actuators (AKT) or controlled devices may be located wholly or partially locally remote from the cap (KP) carrier.

For example, it is conceivable to control robots and/or other devices in this way in the immediate vicinity of the cap (KP) carrier or at a distance from it.

It is conceivable that several persons generate control commands for a device in this way. Before the control commands are passed on to the device, a further higher-level computing unit can detect and evaluate these control commands. One possibility of evaluation is, for example, averaging or blocking of further control commands for the time of execution of the first detected control command. After the evaluation, the higher-level computing unit passes on the control command it has selected by whatever method to the device to be controlled, which then executes this command.

Figure 34:
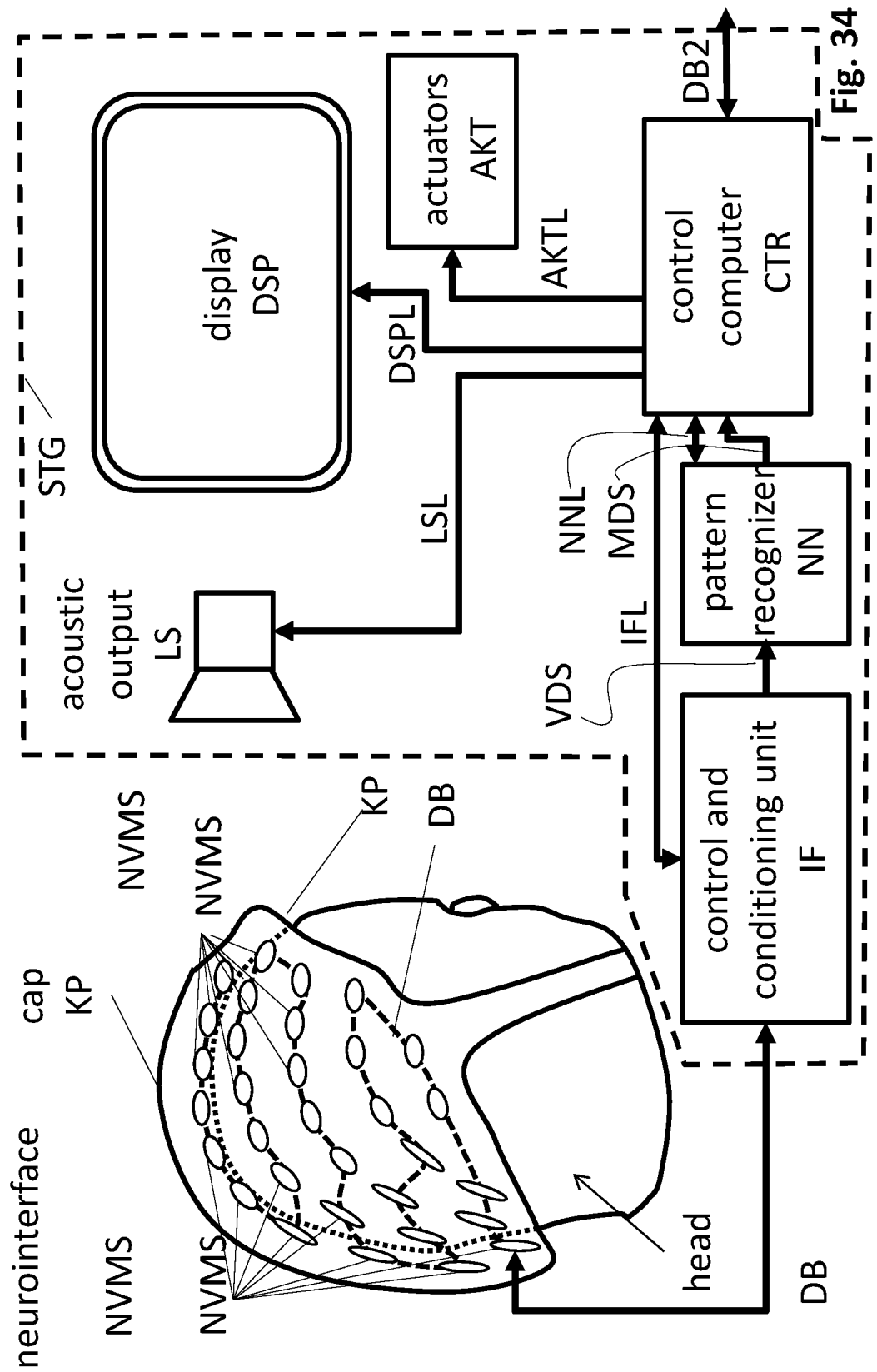
FIG. 34 shows the recording of brain waves with the aid of several example sensor systems (NVMS).

The system of FIG. 34 thus represents, in the broadest sense, a neuro-interface for controlling computer systems and devices and their outputs, whereby the computer system can be integrated into a computer system network with computers, which in turn have input and output devices and actuators and sensors.

Instead of controlling computer systems, a system of the same topology can be used to record the reaction of the brain of the wearer of the cap (KP) to typically given stimuli, which act on the wearer of the cap (KP), for example, through a loudspeaker (LS) or a display screen (DSP) or another actuator (AKT), and to display them on a second display screen, if necessary, in processed form, to transmit them to other computers of a computer network or to classify them by means of a pattern recognizer (NN). Thus, this system is also suitable for medical examinations. In principle, it is a magnetoencephalograph, whereby instead of the SQUID sensors usual in the state of the art, sensor systems (NVMS) with one or more sensor elements each with one or more paramagnetic centers (NV1) are used here. Preferably, the sensor elements and the paramagnetic centers are one or more diamonds with one or more NV centers. Provided that the sensor elements each comprise several paramagnetic centers (NV1), these paramagnetic centers (NV1) are preferably coupled to each other within a sensor element. A coupling of the paramagnetic centers (NV1) across sensor elements is conceivable.

FIG. 35

Figure 35:
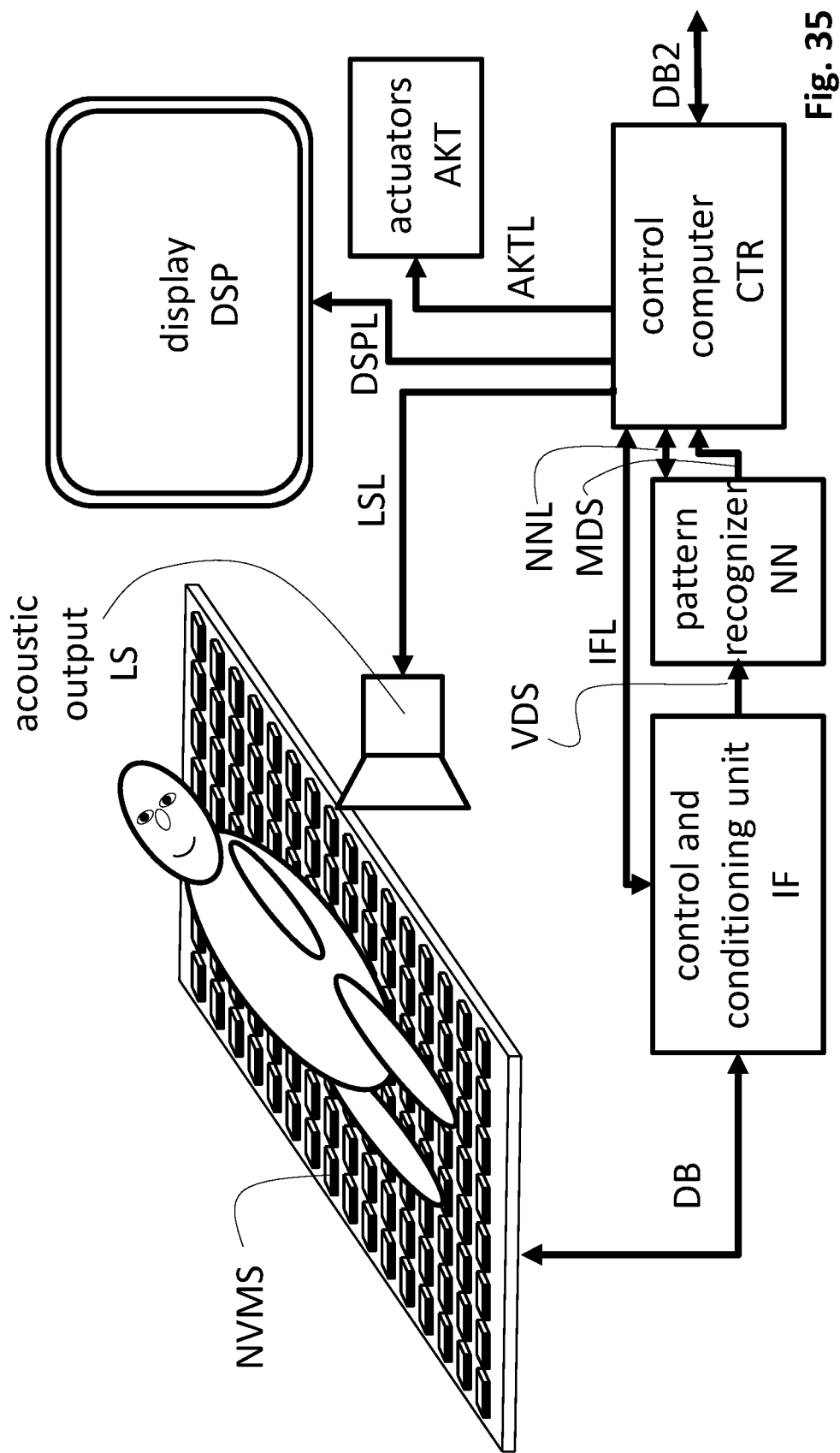
FIG. 35 shows an example of the proposed sensor systems (NVMS) arranged on an exemplary surface.

In FIG. 35, the proposed sensor systems (NVMS) are arranged on an exemplary surface instead of on a cap (KP). The sensor systems (NVMS) can be arranged, for example, within a roll-out mat, a stretcher or a bed or a couch or a chair, etc. The example of FIG. 35 is only intended to show that other body parts of humans or animals, the whole human body, whole animal bodies and/or other objects can be examined and/or classified with the methodology of FIG. 34 and arrangements according to FIG. 34.

The actuators (AKT) can be designed to interact with the animal, or human, or other devices, if necessary.

For example, it is conceivable to detect biological currents in the body of an animal, to evaluate them, to relate them to the results of other sensors and other data, if necessary, and to act on the animal as a function of this by means of the actuators (AKT) in order to induce suitable behavior. For example, with the aid of GPS data and mobile data communication (e.g., by means of cell phones), animals can thus be induced to travel a certain distance and/or to remain at a certain location, which enables the delivery of objects from a location A to a location B. A similar intervention based on brain states is possible with humans, for example, to alert them to danger or to administer medication fully automatically. Thus, it is conceivable to perform a fully automatic drug administration depending on these magnetically sensed biological currents, for example to prevent seizures.

FIG. 36

Figure 36:
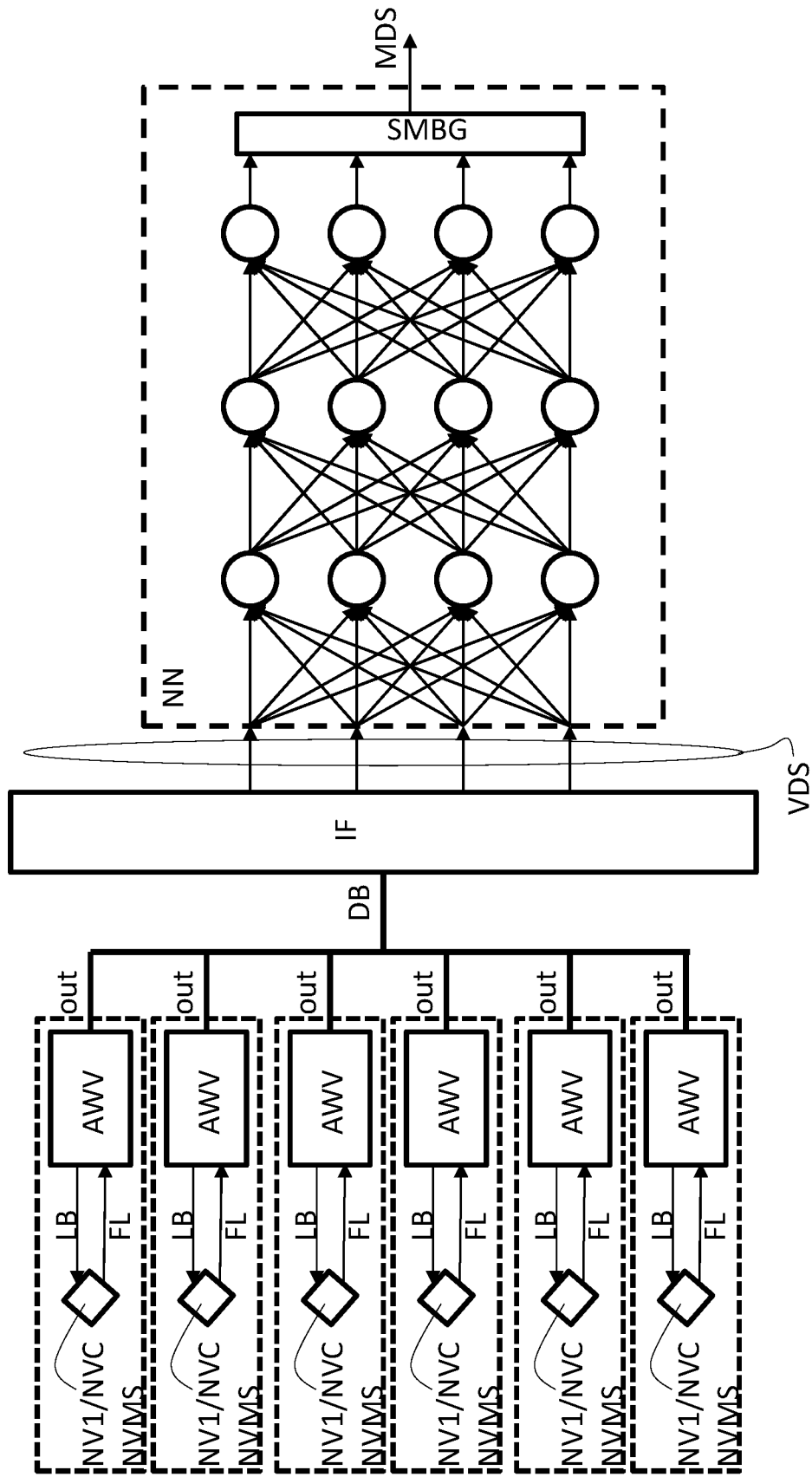
FIG. 36 shows an example simplified device for the recognition of patterns with the help of paramagnetic centers (NV1).

FIG. 36 shows a simplified device for the recognition of patterns with the help of paramagnetic centers (NV1) or with the help of clusters of paramagnetic centers (NV1), whereby here by cluster a plurality (NVC) of paramagnetic centers (NV1) is understood. In the example of FIG. 36, six sensor systems (NVMS) each with one or more paramagnetic centers (NV1) or a plurality (NVC) of paramagnetic centers (NV1) are coupled by their first output signal (out) via a data bus (DB) to a control and conditioning unit (IF). Preferably, the sensor systems (NVMS) comprise a microcomputer (μC) for this purpose, which is connected to the data bus (DB) with an interface. In the case, the first output signal (out) is preferably a digital signal. Each sensor system (NVMS) comprises in the example of FIG. 36 a control and evaluation device (AWV). The control and evaluation device (AWV) generates pump radiation (LB) with which it irradiates the one or more paramagnetic centers (NV1) or irradiates the plurality (NVC) of paramagnetic centers (NV1). The one or more paramagnetic centers (NV1) or the plurality (NVC) of paramagnetic centers (NV1) emit fluorescence radiation (FL), which the control and evaluation device (AWV) detects and evaluates. In doing so, the control and evaluation device (AWV) generates a first output signal (out) with a value as a function of the fluorescence radiation (FL). The value is sent via the data bus (DB) from the respective sensor system (NVMS) to the control and conditioning unit (IF). This generates a vectorial output data stream (VDS) of the control and conditioning unit (IF) from the received multiple measured values. In the example of FIG. 36, this vector data stream is only four-dimensional. In general, the data stream is likely to have a different dimensionality, typically a higher dimensionality. In the example of FIG. 36, the pattern recognizer (NN) runs a neural network model with three layers of neural network nodes. In reality, the number of layers and the number of nodes in the layers will differ. Preferably, a computer system within the pattern recognizer (NN) executes an artificial intelligence program as a higher-level computer system. Most preferably, the higher-level computer system of the pattern recognizer (NN) executes an emulation of a neural network model. In this context, reference is again made to the as yet unpublished international property right application PCT/EP2020/056727, the disclosure content of which is fully part of the disclosure presented here.

Thus, a higher-level computer system is proposed that executes a neural network model. The neural network model comprises network nodes that are organized in network layers. Each network node of the neural network has input and output parameters. At least one, preferably multiple, input parameters of network nodes are either an input parameter of the neural network model or an output parameter of another network node of the neural network model. At least one, preferably more, output parameters of a network node are an output parameter of the neural network model or an input parameter of another neural network node. A network node where an output parameter is an output parameter of the neural network model does not have an input parameter that is an input parameter of the neural network model. A network node where an input parameter is an input parameter of the neural network model does not have an output parameter that is an output parameter of the neural network model. No network node of the neural network where an output parameter is an output parameter of the neural network model has an input parameter that is an output parameter of another network node where an input parameter of that other network node is an input parameter of the neural network model. The input parameters of a network node of the neural network model are linked within a network node to the output parameters of this neural network node by means of a linking function for the neural network node in question. Preferably, this link function is strongly nonlinear. The properties of the linking function thereby depend on linking function parameters that are preferably specific to the network node in question. The link function may vary from network node to network node. The link function parameters are determined and trained in a training process. The description here describes an at least three-layer neural network with at least three network layers, as symbolically shown in FIG. 36 as a neural network model within the pattern recognizer (NN).

It is now proposed that at least one, preferably several, input parameters of the neural network model that the higher-level computer unit of the pattern recognizer (NN) executes depend on a parameter of the paramagnetic centers (NV1) or the plurality (NVC) of paramagnetic centers (NV1) in the respective sensor systems (NVMS). Such a parameter can be, for example, the value of the intensity of the fluorescence radiation (FL) and/or the value of the fluorescence phase shift time (ΔTFL).

The use of such artificial intelligence methods and procedures is of particular importance for autonomous driving and/or the operation of complex systems and/or the operation of devices in possibly complex environments or, as in FIGS. 32 to 35, for the realization of a neuro-interface. A symbol generator (SMBG), which may be part of the program executed by the computer system of the pattern recognizer (NN), generates a sequence of symbols in the form of an output data stream (MDS) of the prototypes recognized by the pattern recognizer (NN), depending on the output parameters of the neural network model. Here, the pattern recognizer (NN) preferably transmits only the symbols as representatives of the recognized prototypical feature vectors of the prototype database.

To enable the neural network of the pattern recognizer (NN) to recognize these prototypical feature vectors of the prototype database, the neural network model is stimulated in a training mode with these prototypical feature vectors as input vectors of the neural network. The output parameters of the neural network model are compared with default values, and the linkage parameters of the neural network nodes' linkage function are modified according to the learning algorithm until the training dataset recognition error score falls below a predetermined level. The neural network thus trained can then be used for pattern recognition. Similarly, machine learning and deep learning methods can be used. Here, as an example, we refer to the textbook by Charu C. Aggarwal, "Neural Networks and Deep Learning: A Textbook" Springer; 1st ed. 2018 edition (Sep. 13, 2018). The methods described therein are fully part of the disclosure provided herein.

FIG. 37

Figure 37:
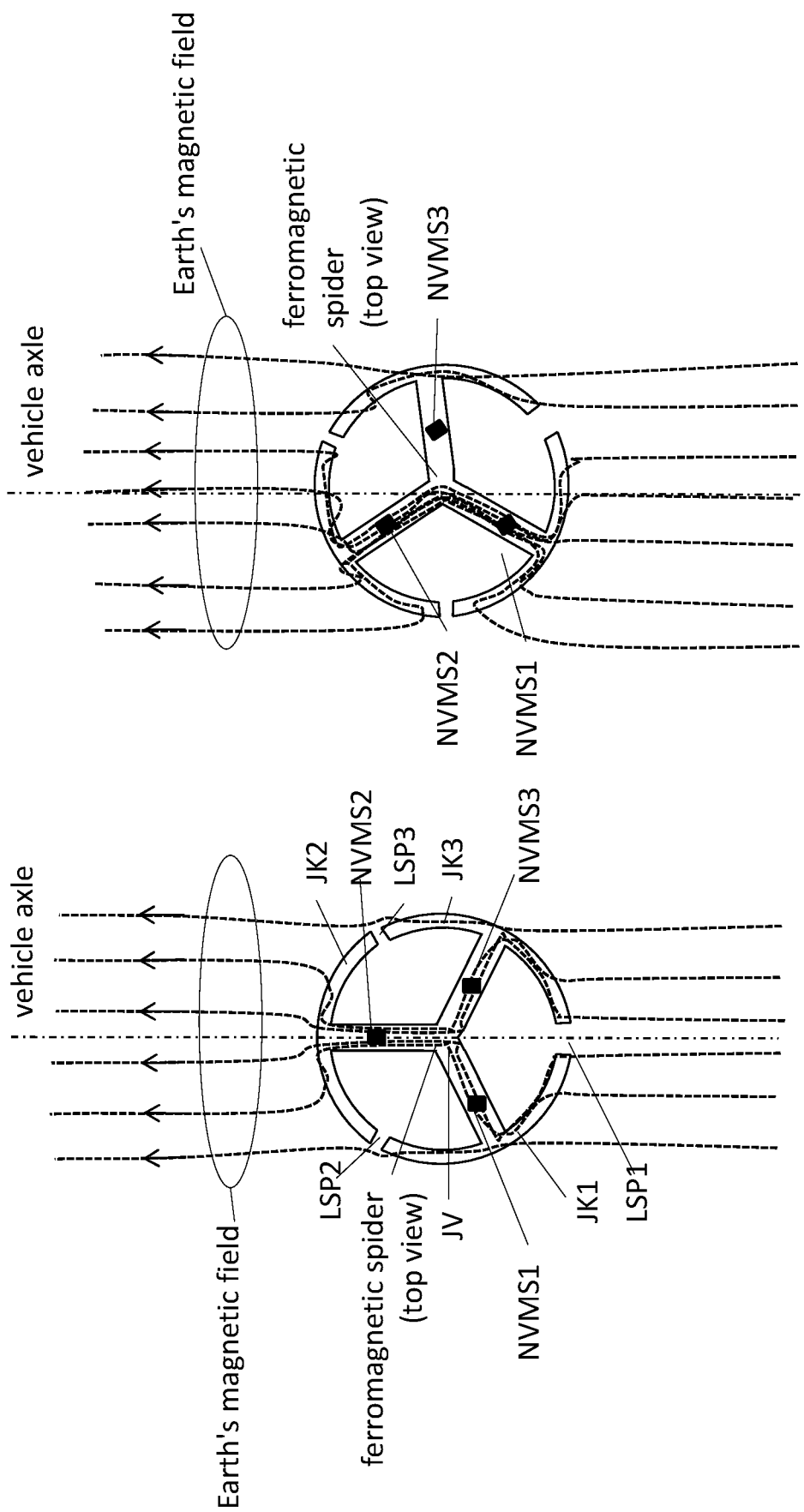
FIG. 37 shows an example simple device for detecting the orientation of the earth's magnetic field using three sensor systems (NVMS1, NVMS2, NVMS3).

FIG. 37 shows a simple device for detecting the orientation of the earth's magnetic field using three sensor systems (NVMS1, NVMS2, NVMS3) with paramagnetic centers (NV1) or a respective plurality (NVC) of paramagnetic centers (NV1).

FIG. 37 shows a rotationally symmetrical yoke (JK1, JK2, JK3, JV), preferably ferromagnetic, as the core of the device, with a rotational symmetry that is preferably odd-numbered. FIG. 37 shows an example of a three-count rotational symmetry.

The exemplary yoke (JK1, JK2, JK3, JV) comprises an annular partial yoke (JK1, JK2, JK3). This annular partial yoke (JK1, JK2, JK3) is subdivided in the example of FIG. 37 by exemplary three air gaps (LSP1, LSP2, LSP3) into a first yoke segment (JK1) and into a second yoke segment (JK2) and into a third yoke segment (JK3).

The first air gap (LSP1) is located between the first yoke segment (JK1) and the third yoke segment (JK3). The second air gap (LSP2) is located between the second yoke segment (JK2) and the first yoke segment (JK1). The third air gap (LSP3) is located between the third yoke segment (JK3) and the second yoke segment (JK2). In the example of FIG. 37, the three air gaps (LSP1, LSP2, LSP3) cause a three-fold rotational symmetry of the annular partial yoke (JK1, JK2, JK3).

A connecting yoke (JV) has the same rotational symmetry about the same axis of rotation as the partial yoke (JK1, JK2, JK3). In the example of FIG. 37, the Y-shaped connecting yoke (JV) has a triple rotational symmetry about the same axis of rotation as the triple rotationally symmetric partial yokes (JK1, JK2, JK3). In the example of FIG. 37, the connecting yoke (JV) consists of exemplarily three webs which establish a magnetic connection between the exemplarily three partial yokes (JK1, JK2, JK3), whereby this magnetic connection preferably extends over the location of the axis of symmetry of the rotational symmetry.

Each of the three partial yokes (JK1, JK2, JK3) is assigned a bar. This preferably establishes the magnetic contact at a point of symmetry of the respective partial yoke (JK1, JK2, JK3) so that the magnetic path within the partial yoke is the same in both directions away from the contact point. Preferably, three sensor systems (NVMS1, NVMS2, NVMS3) with sensor elements with paramagnetic centers (NV1) are now inserted into each of the three webs in such a way that the magnetic flux (B) within the respective webs flows through the respective paramagnetic centers (NV1), or the respective clusters of paramagnetic centers (NV1) in the form of a plurality (NVC) of paramagnetic centers (NV1) of the corresponding sensor systems (NVMS1, NVMS2, NVMS3). This can be ensured, for example, by an air gap in each of the three webs, in which one of the three sensor systems (NVMS1, NVMS2, NVMS3) and/or the paramagnetic center (NV1) or the plurality (NVC) of paramagnetic centers (NV1) of the respective sensor system (NVMS1, NVMS2, NVMS3) is inserted in each case.

This enables the respective sensor systems (NVMS1, NVMS2, NVMS3) to detect the magnetic flux (B) within the respective bar of the three bars. The exemplary three sensor systems (NVMS1, NVMS2, NVMS3) then determine three measured values of the respective magnetic flux density (B) at each measuring time.

Depending on the orientation of this arrangement to an external magnetic field with an external magnetic flux density (B), for example the earth's magnetic field, the resulting ferromagnetic spider, which is formed by the ferromagnetic, rotationally symmetrical yoke (JK1, JK2, JK3, JV), is fluxed differently by the magnetic field in the form of the external magnetic flux density (B). As a result, the three values of the exemplary three-dimensional vectorial measurement signals of the three sensor systems (NVMS1, NVMS2, NVMS3) differ depending on the orientation of the device in the magnetic field. Such a vectorial measurement signal can be used, for example, to control vehicles, robots, missiles, hulls, etc., and for navigation.

FIG. 38

Figure 38:
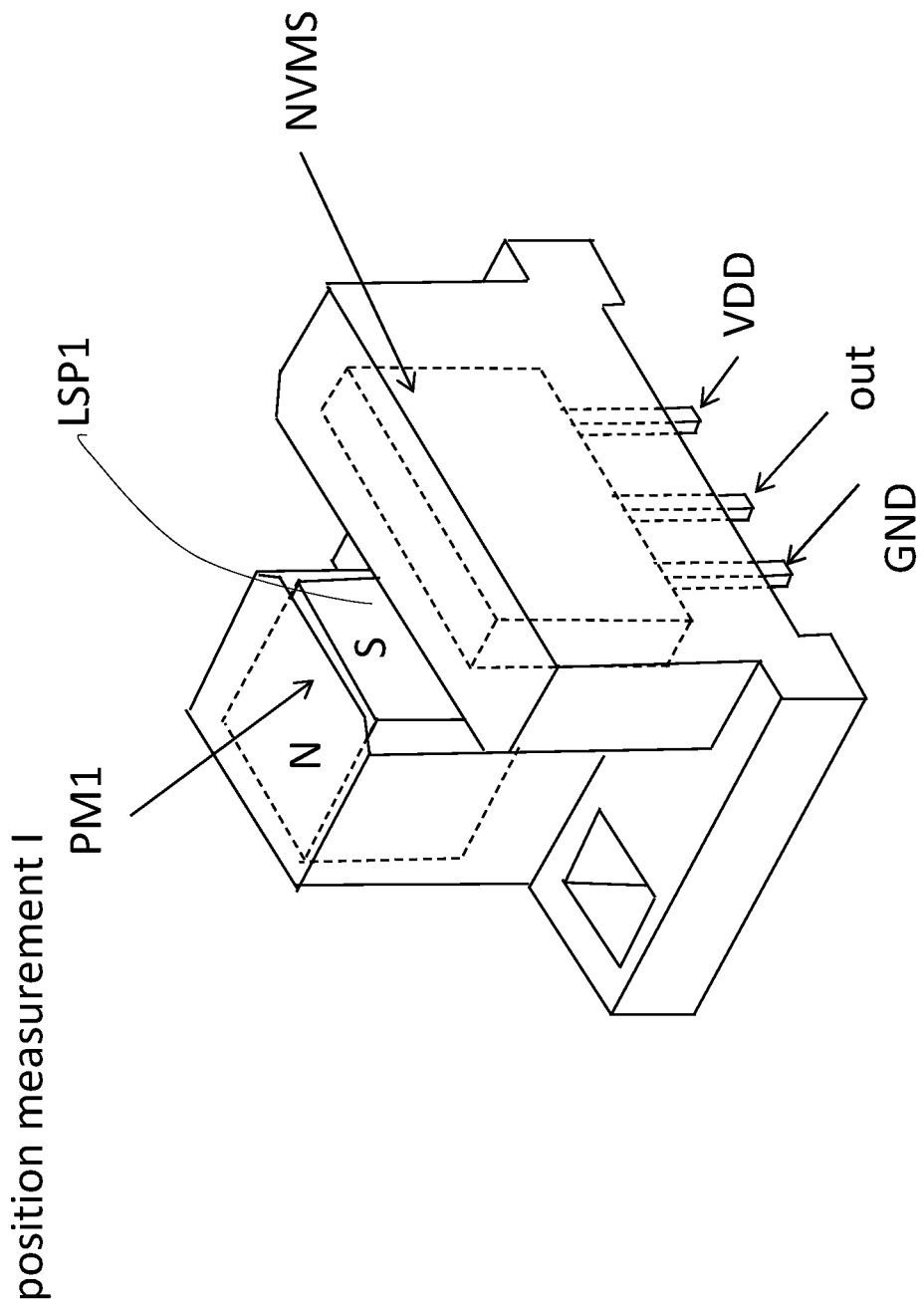
FIG. 38 shows an example slot sensor including a magnetic circuit with a first air gap (LSP1).

FIG. 38 shows an exemplary slot sensor. The exemplary slot sensor has a magnetic circuit with a first air gap (LSP1). A sensor system (NVMS) and a first permanent magnet (PM1) for exciting the magnetic circuit are inserted in the magnetic circuit as an example. The sensor system (NVMS) has at least one sensor element with at least one paramagnetic center (NV1) or a plurality (NVC) of paramagnetic centers (NV1). The paramagnetic centers (NV1) are preferably NV centers in one or more diamonds.

The magnetic flux (B) generated by the first permanent magnet (PM1) also flows through the sensor system (NVMS) and thus through the paramagnetic center (NV1) or the plurality (NVC) of paramagnetic centers (NV1).

If now a material of an object or a device part of an application device is introduced into the first air gap (LSP1), the magnetic flux (B) changes at the location of the paramagnetic center (NV1) resp. at the location of the plurality (NVC) of paramagnetic centers (NV1) of the sensor element of the sensor system (NVMS), which is detected by the sensor system (NVMS) as a result of the changing fluorescence radiation (FL) of the paramagnetic center (NV1) or the plurality (NVC) of paramagnetic centers (NV1) and can be reported to higher-level computer systems, for example via a data bus (DB) or another first output signal (out). Preferably, a sensor system (NVMS) therefore has only three connections: A connection to an operating voltage line (VDD) at operating voltage potential, a connection to a reference potential line (GND) at reference potential, and a first output signal (out), which can be an analog or digital signal, or can be a uni- or bidirectional data bus connection.

FIG. 39

Figure 39:
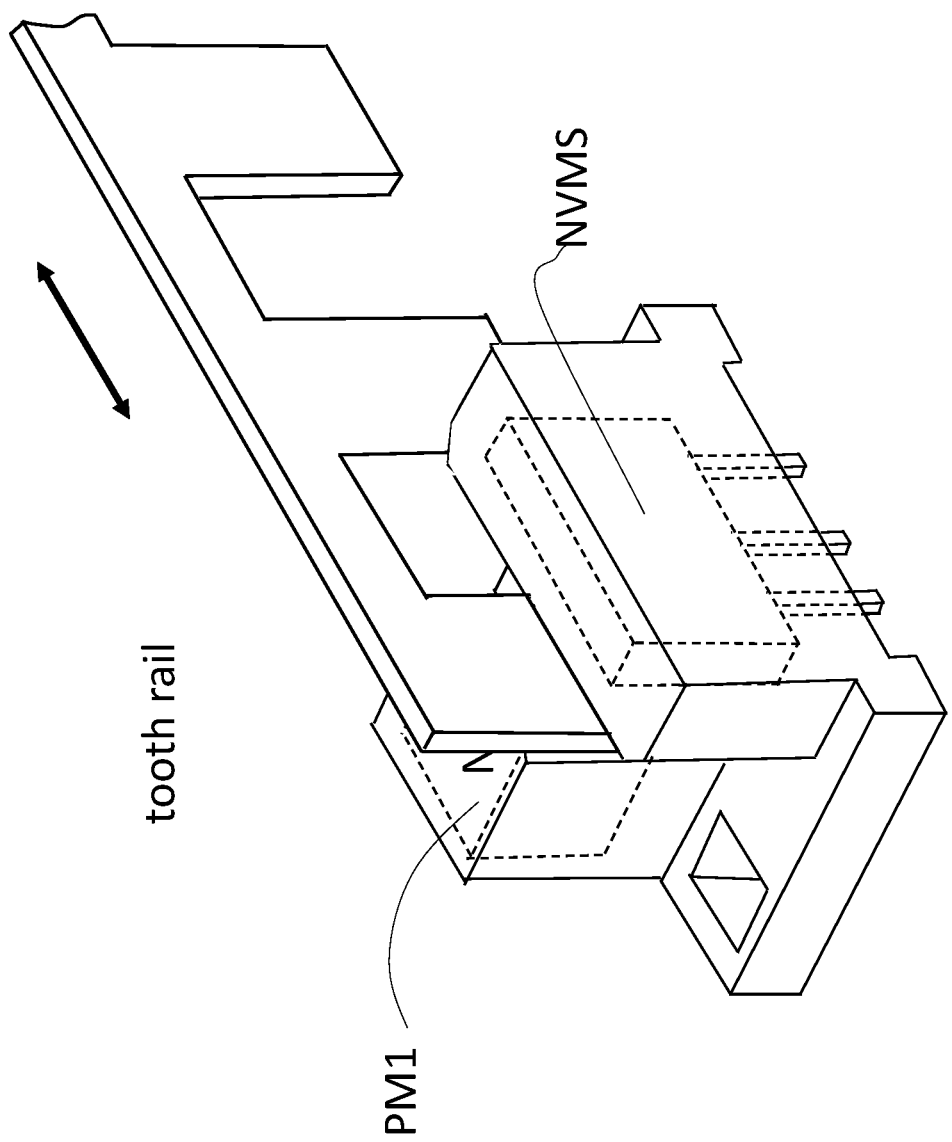
FIG. 39 shows the example slot sensor of FIG. 38 with a toothed rail inserted into the first air gap (LSP1).

FIG. 39 shows the slot sensor of FIG. 38 with a toothed rail of preferably ferromagnetic material as a device part inserted into the first air gap (LSP1). If the toothed rail is moved forward or backward, the magnetic flux (B) at the location of the paramagnetic center (NV1) or at the location of the plurality (NVC) of paramagnetic teeth changes more or less periodically with the entry and exit of the teeth of the toothed rail from the first air gap (LSP1) at the location of the plurality (NVC) of paramagnetic centers (NV1) of the sensor system (NVMS) of the slot sensor, which is detected by the associated sensor system (NVMS) as a result of the changing fluorescence radiation (FL), and, if necessary, transmitted to a higher-level computer system. In this way, a position can be determined, e.g., by counting the teeth.

FIG. 40

Figure 40:
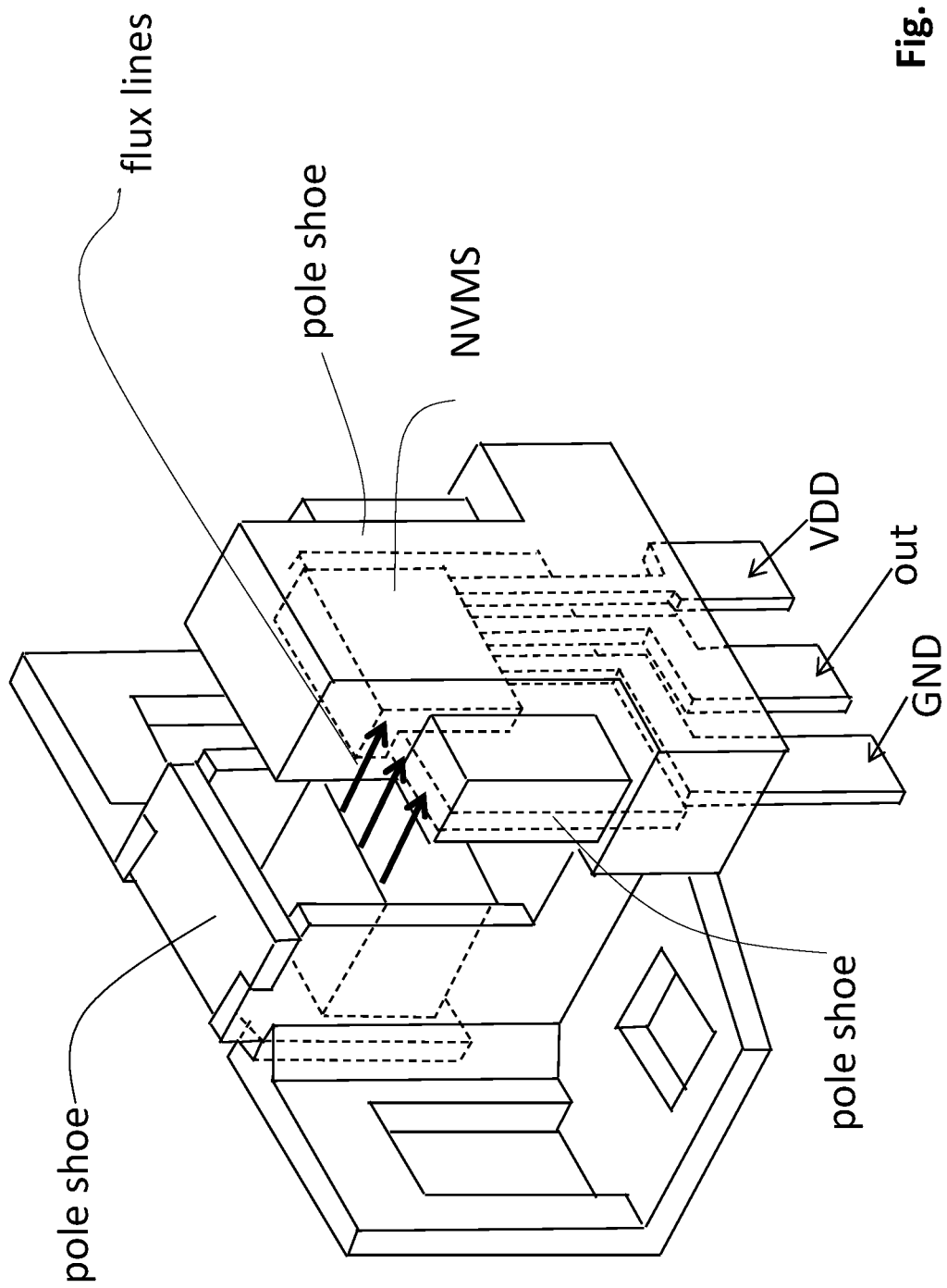
FIG. 40 shows further details of the example slot sensor of FIGS. 38 and 39 and its magnetic circuit with a toothed rail of ferromagnetic material.

FIG. 40 shows further details of the slot sensor of FIGS. 38 and 39 and its magnetic circuit with a toothed rail of ferromagnetic material.

FIG. 41

FIG. 41 again shows the slot sensor with a toothed rail made of ferromagnetic material.

FIG. 42

Figure 42:
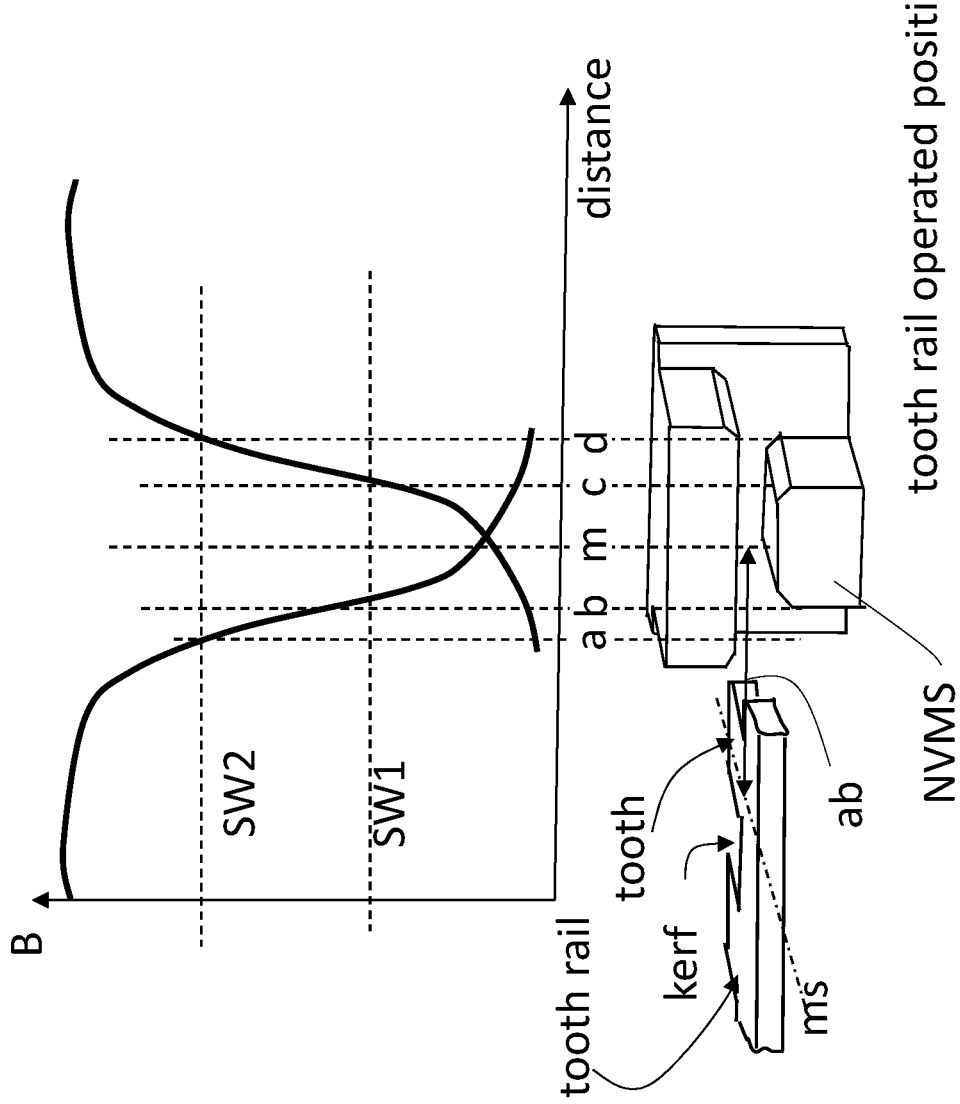
FIG. 42 shows in simplified form an example dependence of the magnetic flux density (B) in the air gap at the location of the paramagnetic center (NV1) as a function of the distance (ab) of the axis of symmetry (ms) of the tooth of a toothed rail from a point of symmetry (m) of an example slot sensor.

FIG. 42 shows in simplified form the dependence of the magnetic flux density (B) in the air gap at the location of the paramagnetic center (NV1) or at the location of the plurality (NVC) of paramagnetic centers (NV1) of the sensor element of the sensor system (NVMS) as a function of the distance (ab) of the axis of symmetry (ms) of the tooth of a toothed rail of ferromagnetic material from the point of symmetry (m) of an exemplary otherwise symmetrically constructed slot sensor. In this example, the slot sensor is intended to serve as an exemplary switching element that enables position detection as a function of the position of a toothed rail relative to the slot sensor by means of switching signals. For this purpose, the output signal of the sensor system (NVMS) is preferably amplified or modified by means of a non-linear function prior to output, so that a more or less digital switching function results therefrom, and the first output signal (out) has substantially only a first state and a second state, the second state of the first output signal (out) being in turn different from the aforementioned first state of the first output signal (out). For example, the first state may be assigned a first voltage level on the first output signal (out) with respect to a reference potential line (GND) at reference potential, while the second state of the first output signal (out) may be assigned a second voltage level of the first output signal (out) with respect to the reference potential line (GND) at reference potential, which is different from the first potential.

We now assume that the toothed rail is moved, for example, from left to right by the slot sensor. We also assume that more than one output signal is generated by the nonlinear switching function.

If the axis of symmetry (ms) of the tooth of the toothed rail is at point a, the value falls below a preferably adjustable second threshold value (SW2) and the sensor system (NVMS) outputs an exemplary first switching signal, for example on a first output signal (out).

If the axis of symmetry (ms) of the tooth of the toothed rail is at point b, the value falls below a preferably adjustable first threshold value (SW1) and the sensor system (NVMS) outputs an exemplary second switching signal, for example on a second output signal (out").

If the axis of symmetry (ms) of the tooth of the toothed rail is at point c, the preferably adjustable first threshold value (SW1) is exceeded and the sensor system (NVMS) outputs an exemplary third switching signal, for example on a third output signal.

If the axis of symmetry (ms) of the tooth of the toothed rail is at point d, the preferably adjustable second threshold value (SW2) is exceeded and the sensor system (NVMS) outputs an exemplary fourth switching signal, for example on a fourth output signal.

To distinguish the direction of movement, the sensor system (NVMS) preferably determines the time derivative of the magnetic flux density (B) and determines the direction of movement and the position of the toothed rail from the magnetic flux density (B) and the time rate of change of the magnetic flux density dB/dt and preferably outputs these via a data bus (DB), via which the output signals are also signaled, for example in time division multiplex.

FIG. 43

Figure 43:
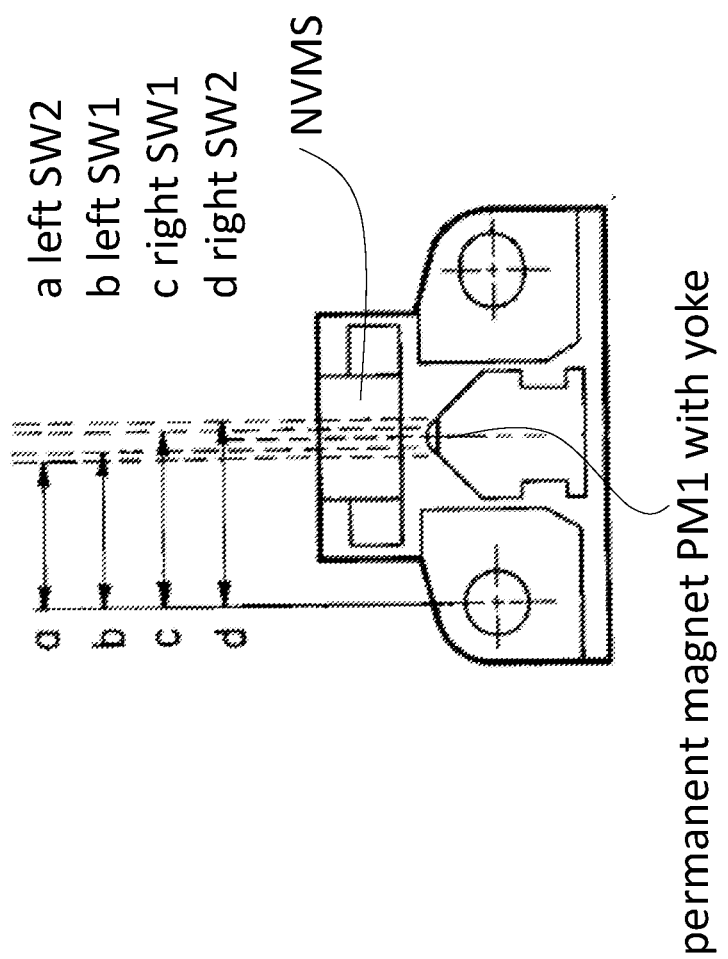
FIG. 43 shows a top view of an example slot sensor with an example sensor system (NVMS).

FIG. 43 shows a top view of an exemplary slot sensor with a sensor system (NVMS) with a sensor element with a paramagnetic center (NV1) or a plurality (NVC) of paramagnetic centers (NV1). The pointed shape of the first permanent magnet (PM1) (possibly with a yoke) increases the resolution of the sensor.

FIG. 44

Figure 44:
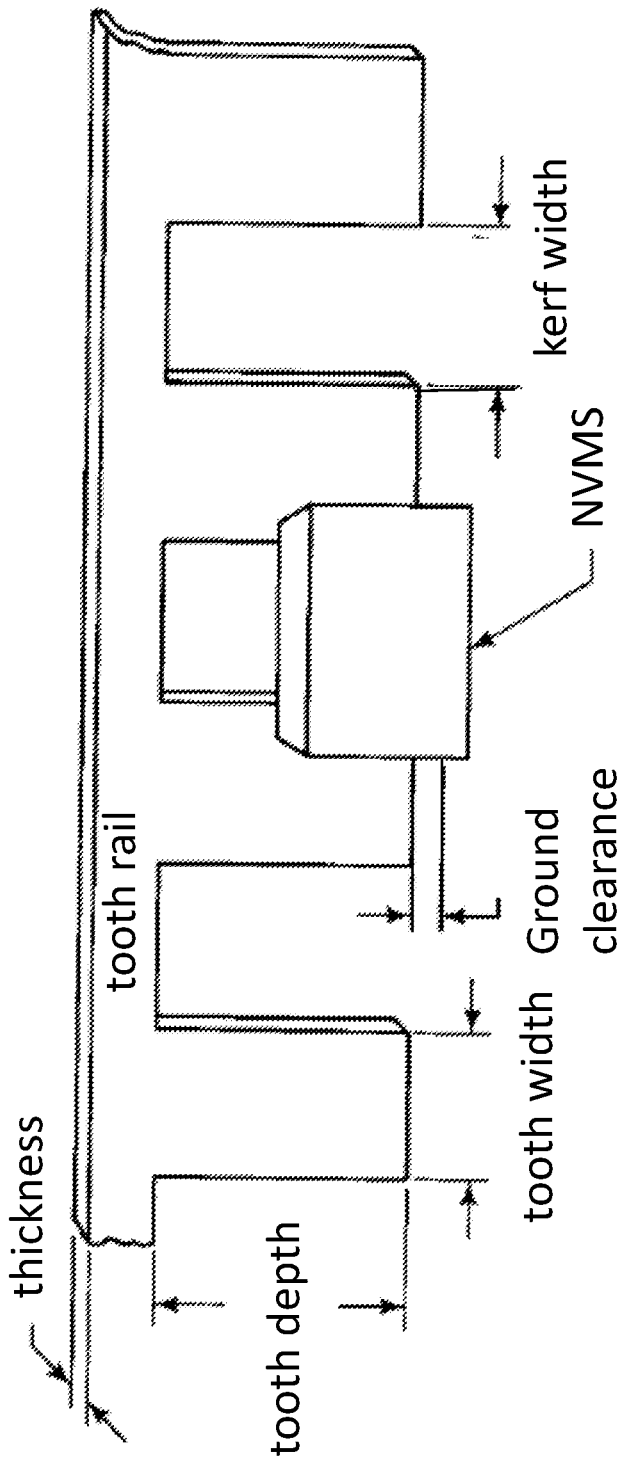
FIG. 44 shows the positioning of the toothed rail within an example slot sensor.

FIG. 44 shows the positioning of the toothed rail made of ferromagnetic material within a slot sensor with a sensor system (NVMS) with a sensor element with a paramagnetic center (NV1) or a plurality (NVC) of paramagnetic centers (NV1).

FIG. 45

Figure 45:
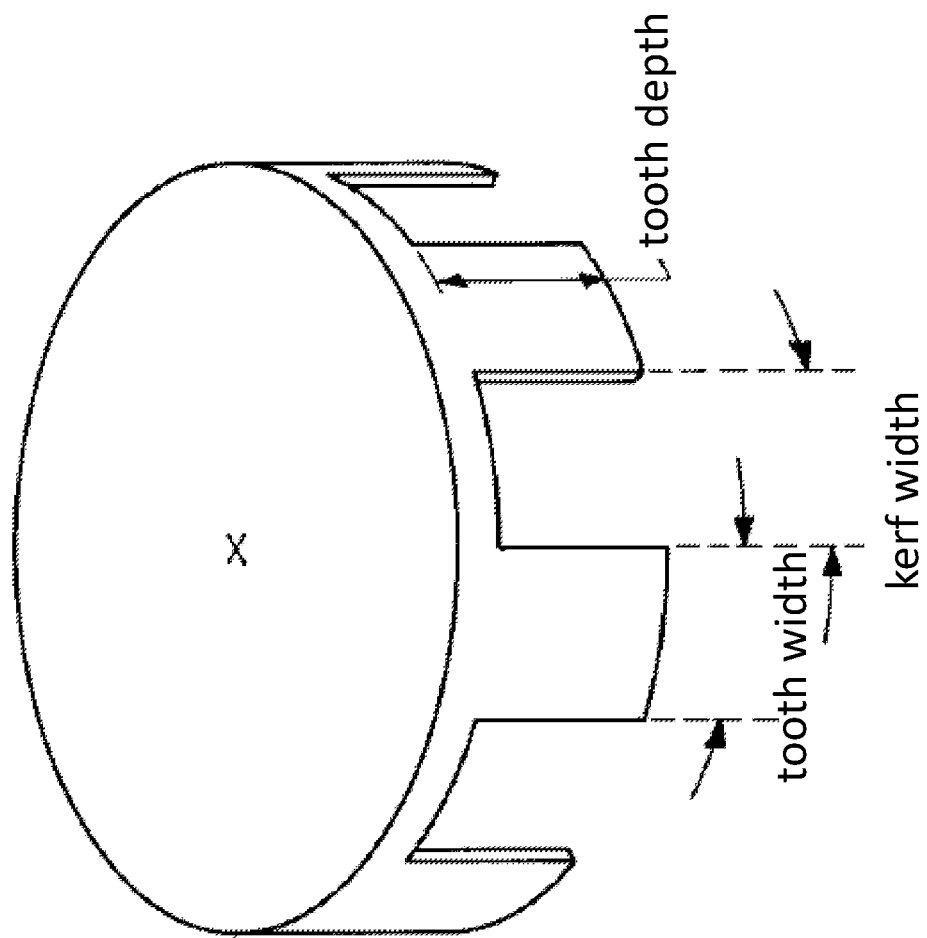
FIG. 45 shows an example rotationally symmetrical toothed rail.

FIG. 45 shows a rotationally symmetrical toothed rail made of ferromagnetic material for use in a slot sensor with a sensor system (NVMS) with a sensor element with a paramagnetic center (NV1) or a plurality (NVC) of paramagnetic centers (NV1). In this toothed rail, the teeth are arranged perpendicular to the disk plane. With the aid of this toothed rail, angles of rotation of the rotationally symmetrical toothed rail relative to a sensor system (NVMS) with a sensor element with a paramagnetic center (NV1) or a plurality (NVC) of paramagnetic centers (NV1) can be determined with the aid of such a sensor system (NVMS) with a sensor element with a paramagnetic center (NV1) or a plurality (NVC) of paramagnetic centers (NV1).

FIG. 46

Figure 46:
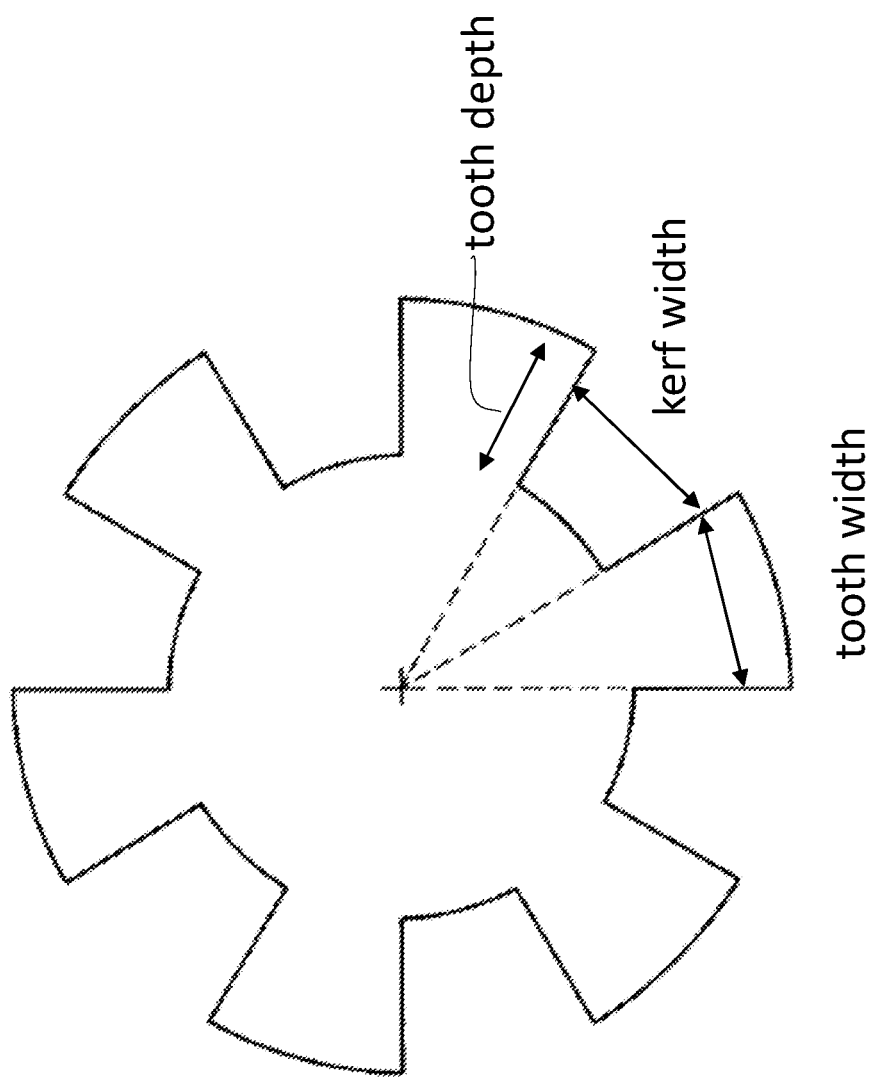
FIG. 46 shows an example rotationally symmetrical toothed rail.

FIG. 46 shows a rotationally symmetrical toothed rail made of ferromagnetic material for use in a slot sensor with a sensor system (NVMS) with a sensor element with a paramagnetic center (NV1) or a plurality (NVC) of paramagnetic centers (NV1). In this toothed rail, the teeth are arranged in the disk plane. With the aid of this toothed rail, angles of rotation of the rotationally symmetrical toothed rail relative to a sensor system (NVMS) with a sensor element with a paramagnetic center (NV1) or a plurality (NVC) of paramagnetic centers (NV1) can be determined with the aid of such a sensor system (NVMS) with a sensor element with a paramagnetic center (NV1) or a plurality (NVC) of paramagnetic centers (NV1).

FIG. 47

Figure 47:
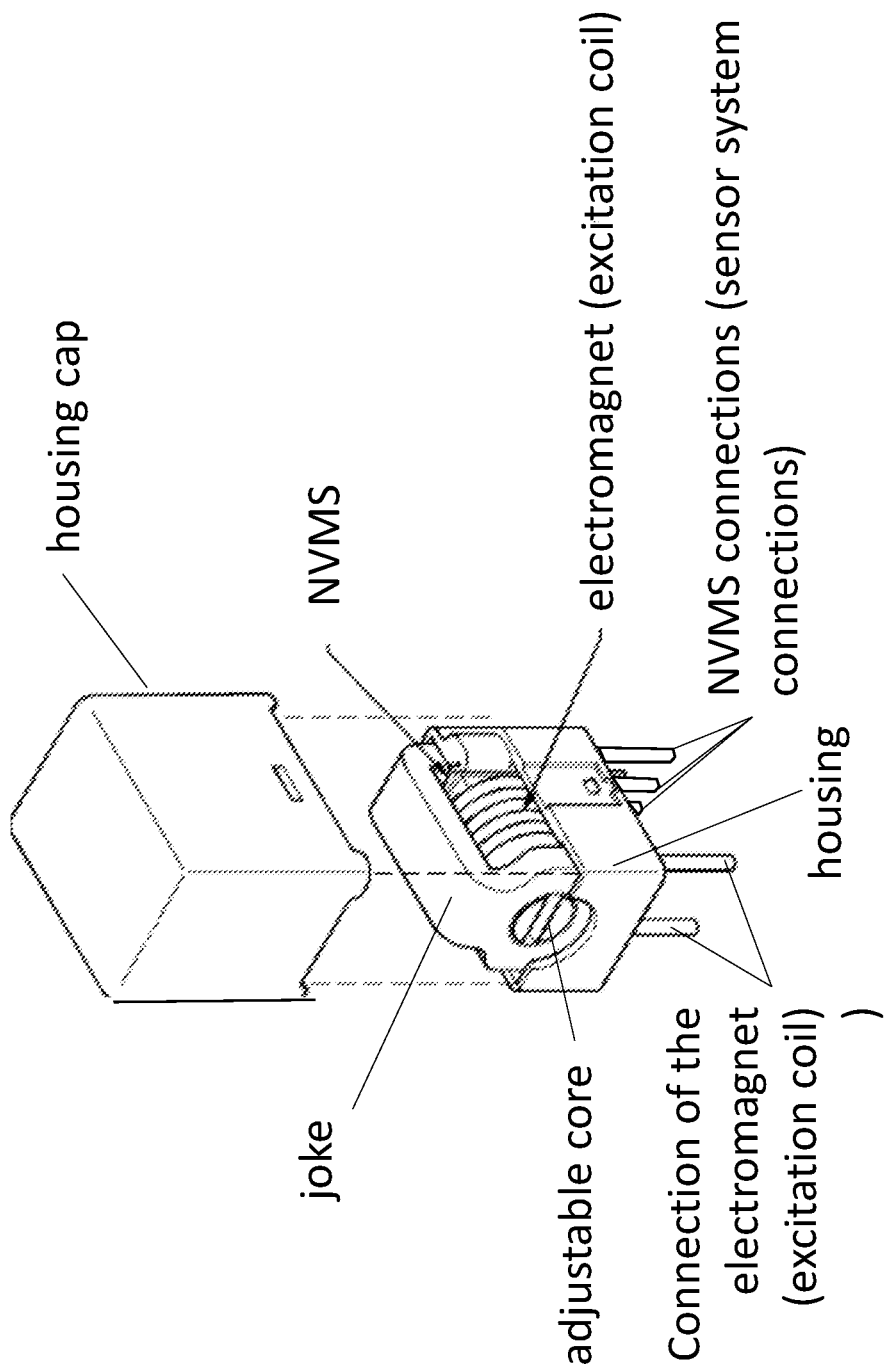
FIG. 47 shows an example current measuring device.

FIG. 47 shows an exemplary current measuring device for very small currents.

An electromagnet is energized via the associated terminals with the current to be detected and generates a magnetic excitation H which excites a magnetic circuit. In the example, the magnetic circuit includes the exemplary adjustable core of the electromagnet, a yoke, and an air gap. The yoke is used to close the magnetic circuit. A sensor system (NVMS) having a sensor element with a paramagnetic center (NV1) or a plurality (NVC) of paramagnetic centers (NV1) is inserted into the air gap, which provides an output signal whose value corresponds to the magnetic flux density (B) at the location of the paramagnetic center (NV1) or at the location of the plurality (NVC) of paramagnetic centers (NV1) of the sensor element of the sensor system (NVMS). Instead of the sensor system (NVMS), only the sensor element with the paramagnetic center (NV1) or the plurality (NVC) of paramagnetic centers (NV1) can also be inserted into the air gap, in which case the paramagnetic center (NV1) or the plurality (NVC) of paramagnetic centers (NV1) is coupled optically, for example via optical functional means, such as optical waveguides, mirrors, lenses, and the like, to a control and evaluation device (AWV) elsewhere. Such a separation has the advantages of better galvanic isolation and possibly better thermal isolation. However, we assume here as an example that the sensor system (NVMS) is completely housed in the air gap. The connections (NVMS connections) of the sensor system (NVMS) supply the sensor system (NVMS) with electrical energy and enable the communication of a not drawn superior computer system with the sensor system (NVMS) with the sensor element with the paramagnetic center (NV1) or the plurality (NVC) of paramagnetic centers (NV1). Hereby, the sensor system (NVMS) can output sensed values of the magnetic flux density (B) and/or values derived therefrom, such as a value of the electric current through the windings of the electromagnet calculated therefrom. Since the inductance of the electromagnet is known due to its known construction, the sensor system (NVMS) and/or the higher-level computer system can determine the value of the electric current through the electromagnet based on the detected value of the magnetic flux density (B). To exclude interference, the housing is preferably closed with a housing cap. Preferably, this housing and the housing cap for magnetic field shielding are made of a soft magnetic material, e.g., µ-metal. A magnetic, adjustable core designed as a screw enables calibration of the energizing electromagnet during manufacture.

FIG. 48

Figure 48:
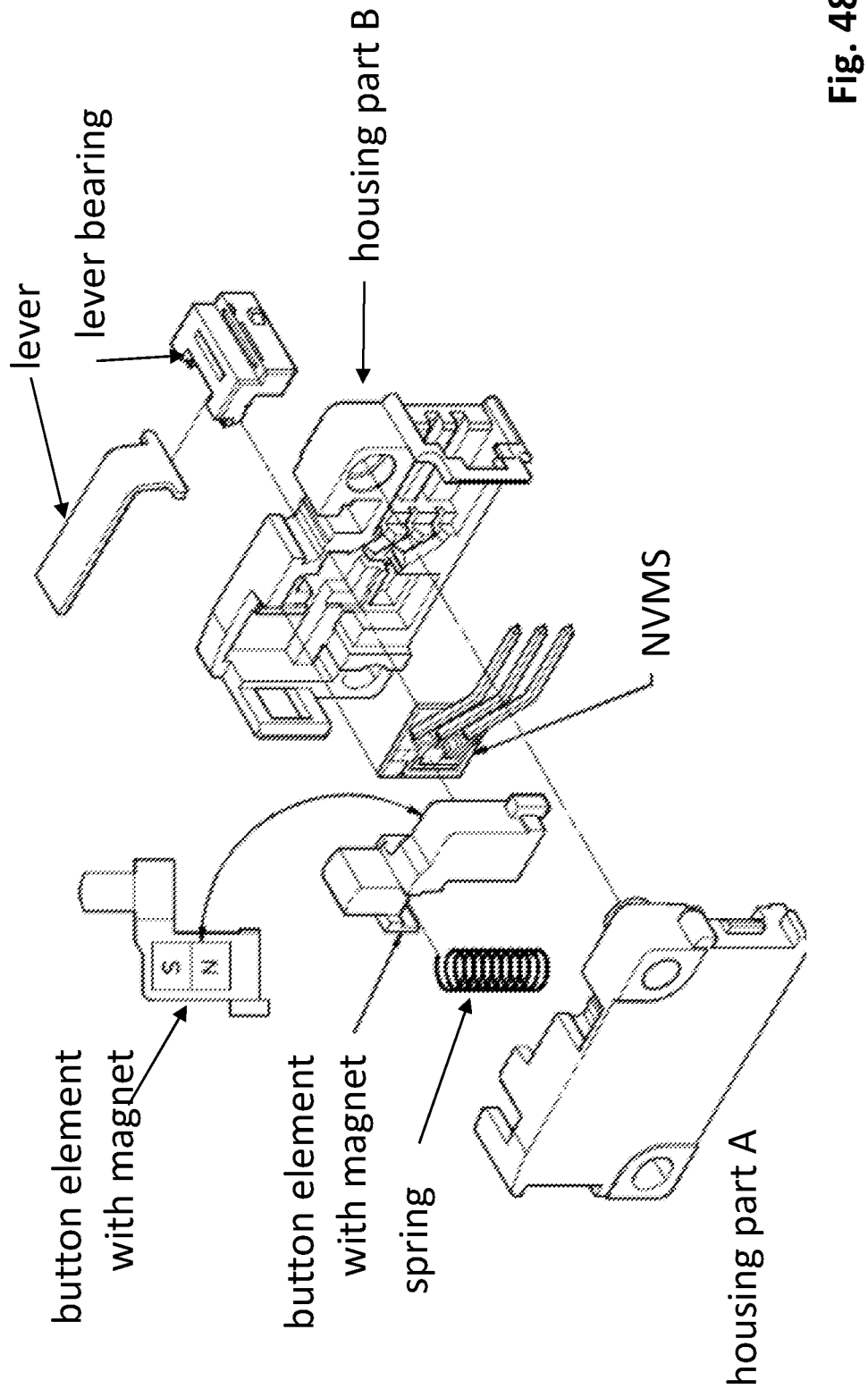
FIG. 48 shows an example application of the sensor system (NVMS) in a microswitch.

FIG. 48 shows the use of the sensor system (NVMS) in a microswitch. As an example, a sensing element is mounted in the housing part A of the microswitch and in the housing part B so as to be rotatable about an axis of rotation. The housing part A and the housing part B together form the housing for accommodating the mechanism. A spring returns the button element to its original or rest position after actuation. A lever with a lever bearing transmits the mechanical sensing movement to the sensing element, which thereby performs a rotational movement through a small angle about the axis of rotation when actuated. A permanent magnet is incorporated in the sensing element. The magnetic field of the permanent magnet of the feeler element is detected by the sensor system (NVMS). Preferably, the sensor system (NVMS) again has three connections: A first connection for the positive supply voltage, a second connection for the negative supply voltage and a connection for a first output signal (out) or, alternatively, a uni- or bidirectional data bus (DB) for outputting the measured values, or a switching signal derived therefrom.

FIG. 49

Figure 49:
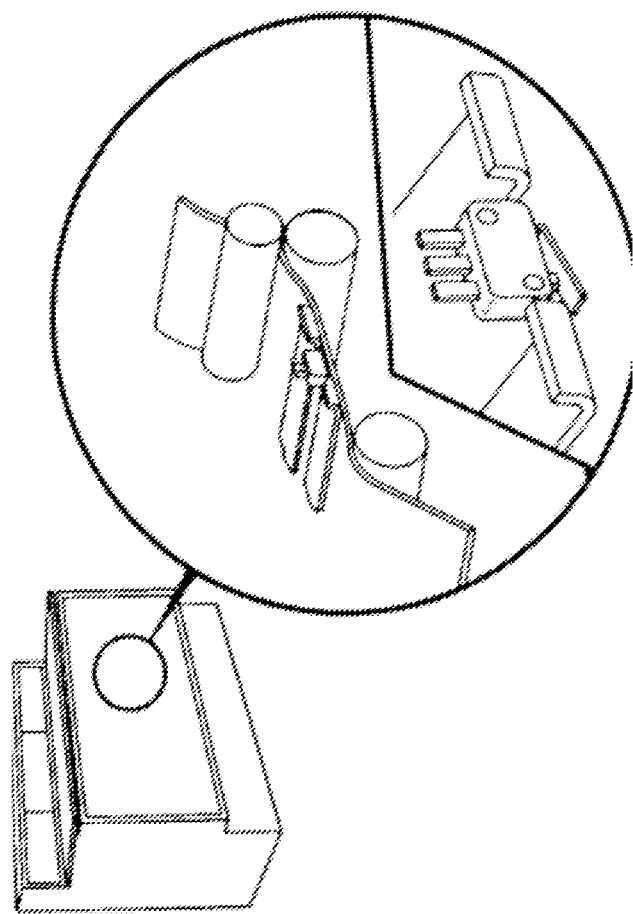
FIG. 49 shows an example application of the microswitch according to FIG. 48.

FIG. 49 shows an exemplary use of a microswitch according to FIG. 48. A machine, for example a copier, a printing press, an automatic packaging machine, or the like, monitors the presence of an exemplary foil, a sheet, a paper web, a textile material, or the like, in the machine at a predetermined position by means of the micro switch of FIG. 48. The switch is actuated in the absence of this material and an error process, for example a shutdown or signaling, is initiated.

FIG. 50

Figure 50:
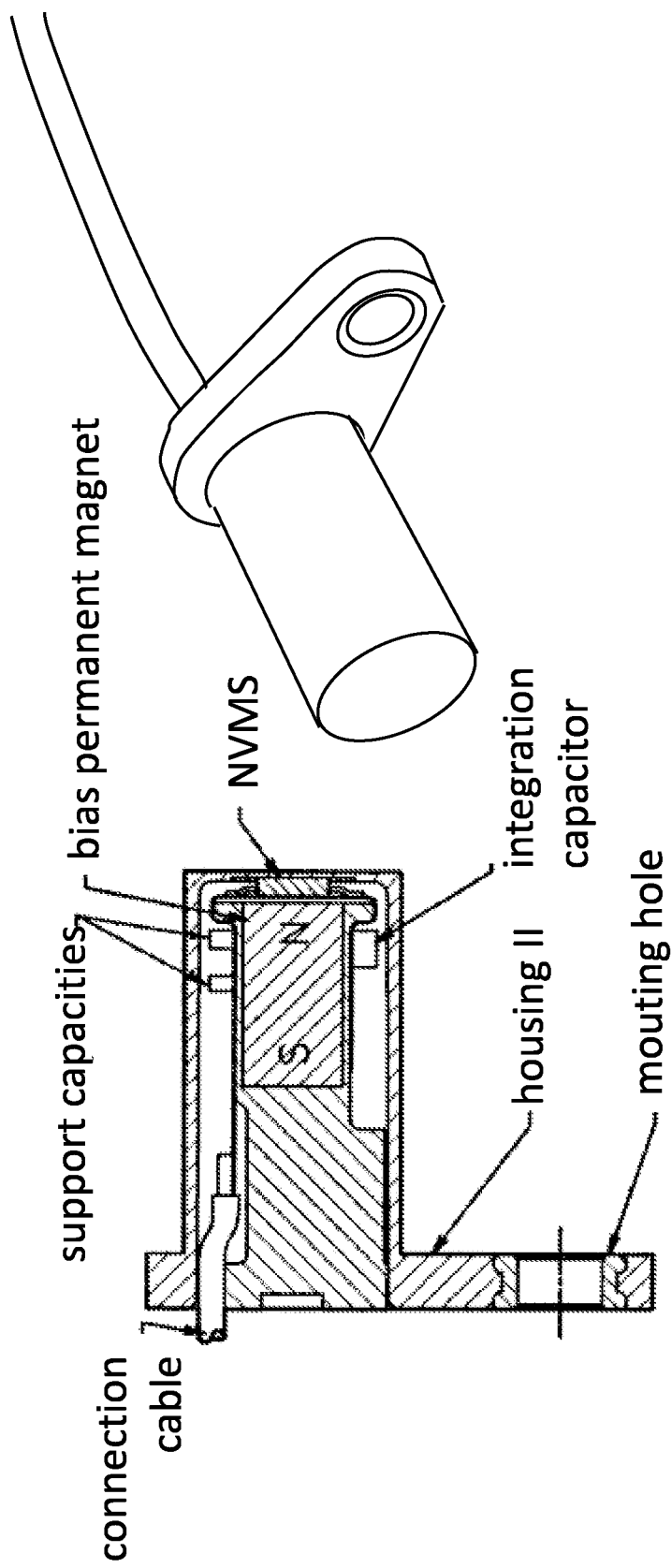
FIG. 50 shows an example application wherein the example sensor system (NVMS) is housed together with a bias permanent magnet in a cylinder.

FIG. 50 shows another usage situation. The sensor system (NVMS) is housed together with a bias permanent magnet in a cylinder, for example made of thermoplastic or thermoset. Also housed there are auxiliary components, such as support capacitors, and filter components, such as integration capacitors, etc. Preferably, a—not shown—flexible circuit board—preferably, for example, a Kapton foil with conductor tracks—is used for mounting the sensor system (NVMS) and the auxiliary components. Preferably, the housing is sealed against moisture, etc. A ferromagnetic body in the vicinity of the sensor system thus formed distorts the magnetic field lines and thus leads to a change in the magnetic flux density (B) through the paramagnetic center (NV1) or the plurality (NVC) of paramagnetic centers (NV1) of the sensor system (NVMS), which can be detected by this sensor system (NVMS) and can be transmitted to a higher-level computer system via the connections.

FIG. 51

Figure 51:
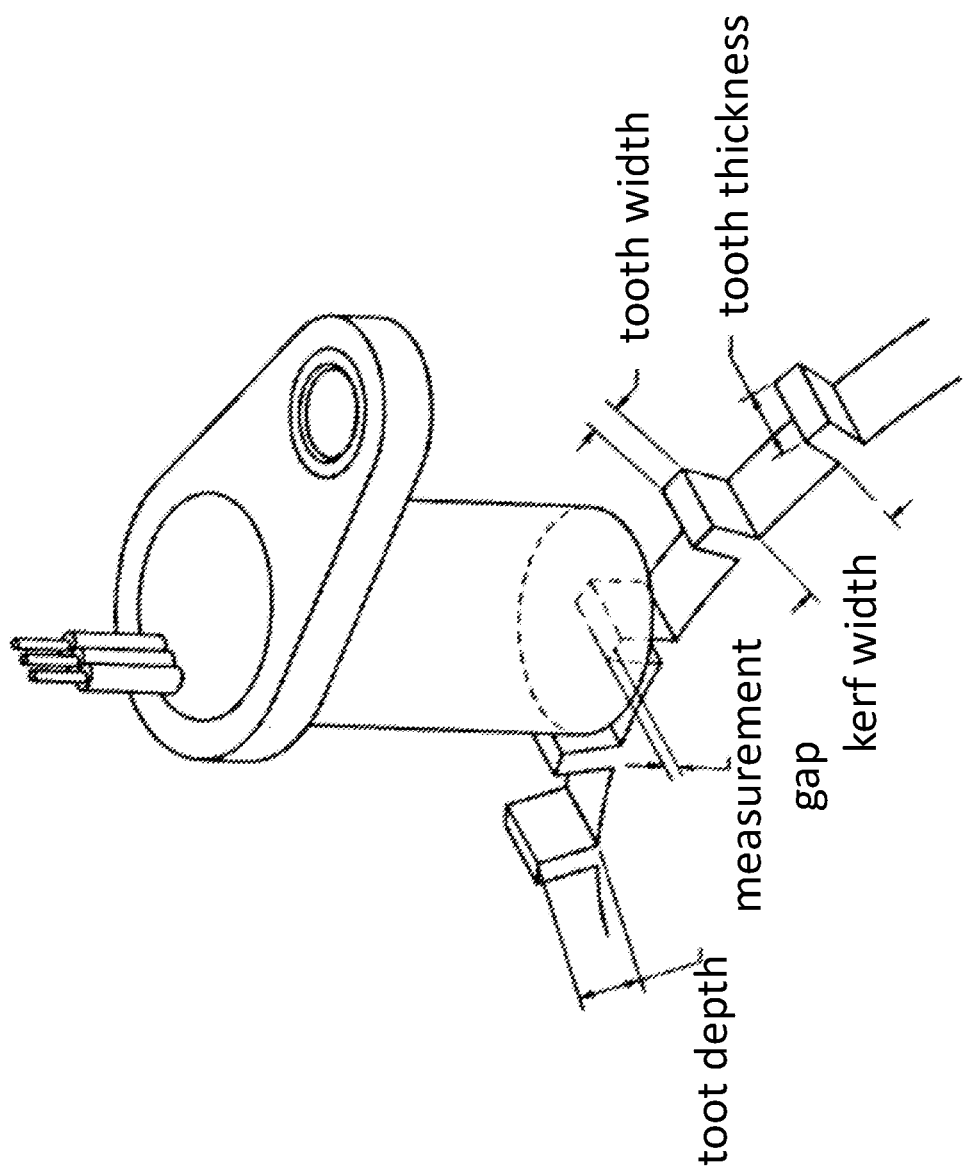
FIG. 51 shows an example application of the sensor system (NVMS) of FIG. 50 for measuring the angle of rotation and/or the position of the angle of rotation with the aid of a gear wheel.

FIG. 51 shows the use of the sensor system (NVMS) of FIG. 50 for measuring the angle of rotation and/or the position of the angle of rotation with the aid of a gear wheel.

FIG. 52

Figure 52:
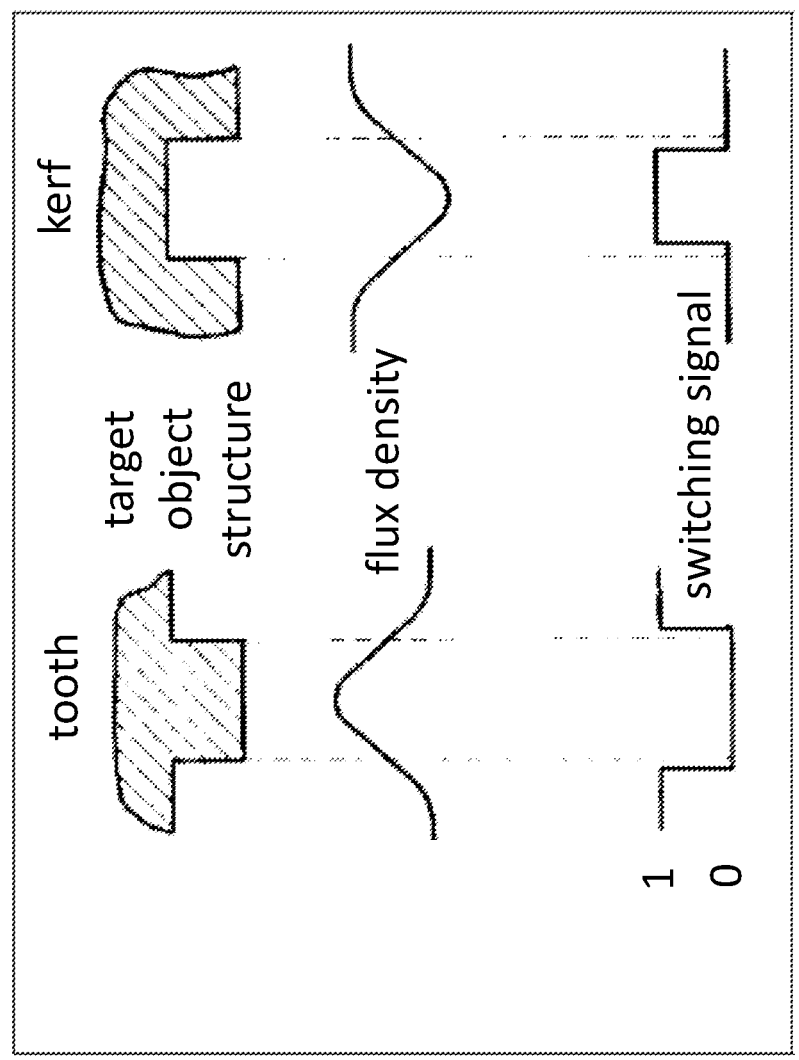
FIG. 52 illustrates the measurement of the position or angle of rotation through teeth and grooves with a sensor according to FIG. 50.

FIG. 52 illustrates the measurement of the position or angle of rotation through teeth and grooves with a sensor according to FIG. 50. In the example of FIG. 52 it is assumed that the sensor system (NVMS) of the sensor performs a non-linear output signal shaping of the first output signal (out). If the measured value of the sensor system (NVMS) exceeds a predetermined and/or programmable threshold value, the sensor system (NVMS) switches its output signal between a first logical value (1) and a second logical value (0), which is different from the first logical value (1), and signals this switching via the first output signal (out) or via a data bus (DB).

FIG. 53

Figure 53:
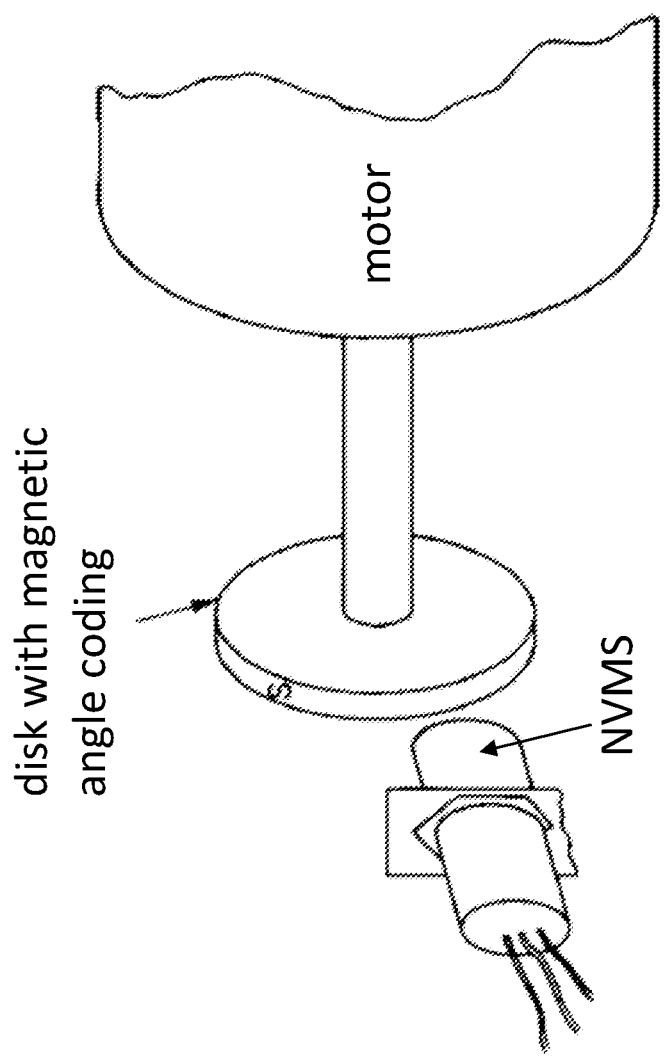
FIG. 53 shows an angle-of-rotation encoder based on a use of the sensor system (NVMS) of FIG. 50.
Figure 54:
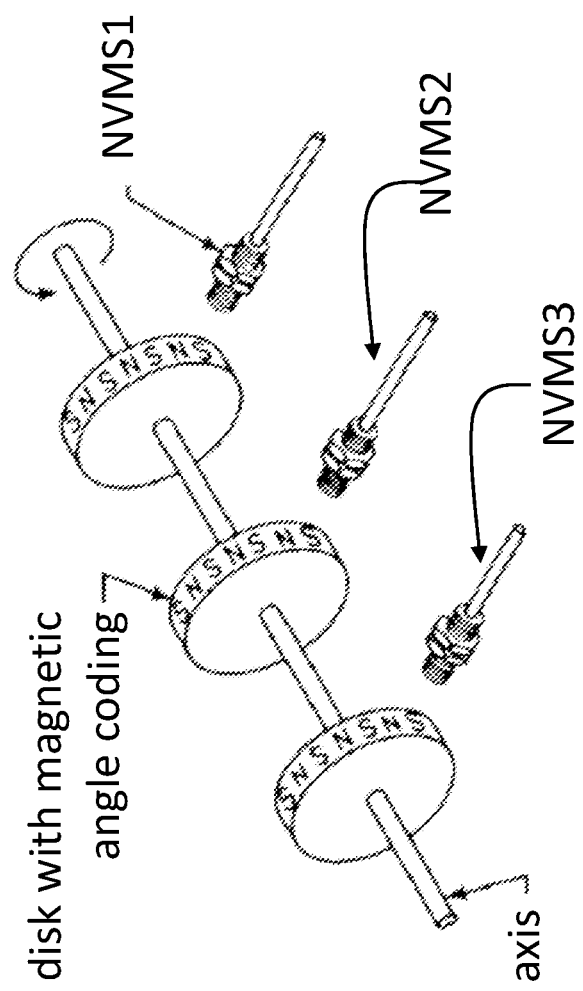
FIG. 54 shows an example device including redundancy to improve angular resolution and operational reliability.

FIG. 53 shows an angle-of-rotation encoder based on a use of the sensor system (NVMS) of FIG. 50, whereby the permanent magnet of FIG. 50 is not absolutely necessary here.

A magnetized encoding disk is applied to the axis of the electric motor to be monitored. The encoding disk is now not mechanically, but magnetically encoded by preferably sectored permanent magnetization. The changes in magnetic flux density (B) due to a change in the angle of rotation of the motor are detected by the sensor system (NVMS) and, if necessary, counted with respect to an arbitrary or otherwise determined zero point. In the simplest case, the sensor system (NVMS) outputs only one counting pulse when the direction of the magnetic flux (B) changes.

FIG. 54

By redundancy and a different angular frequency of the permanent magnetization of the magnetized encoding disks of several systems of encoding disk and sensor system (NVMS1, NVMS2, NVMS3) the angular resolution and the operational reliability can be improved. This is shown in FIG. 5.4

Figure 55:
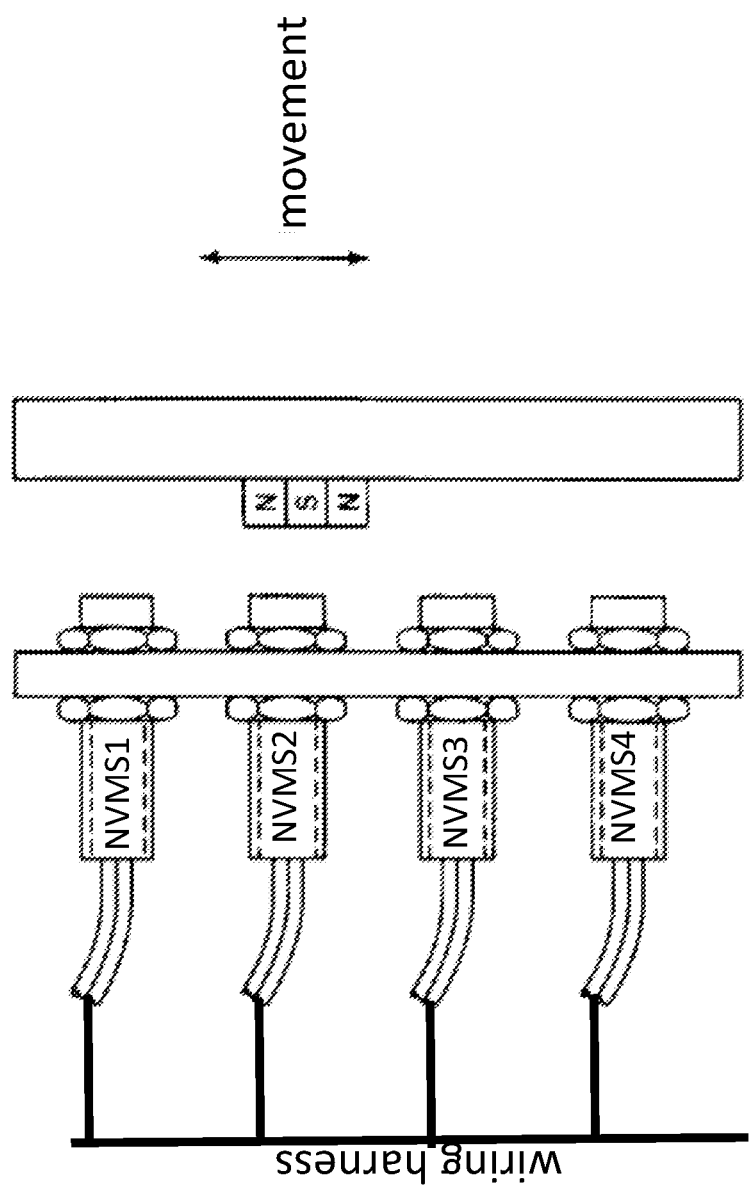
FIGS. 55 and 56 show examples for monitoring translational movement.
Figure 56:
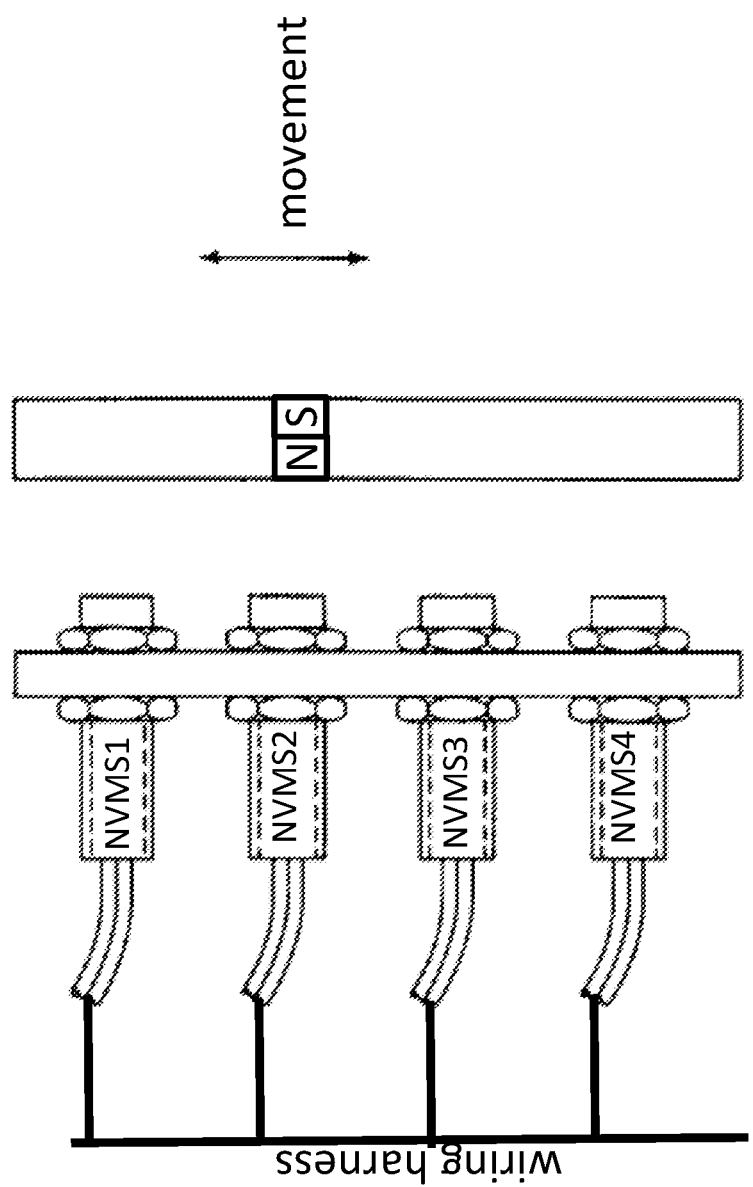

FIGS. 55 and 56

Instead of a rotational movement, a translational movement can also be monitored. A group of permanent magnets is mounted on a preferably non-ferromagnetic base, the translational direction of which is to be detected. In the example of FIG. 55, several sensor systems (NVMS1, NVMS2, NVMS3, NVMS4) monitor the position of these permanent magnets. In the simplest case of FIG. 56, one permanent magnet and one sensor system (NVMS) (not shown in the figures) is already sufficient for many applications. Due to the large range of the quantum dot based measurement method of the sensor systems (NVMS1, NVMS2, NVMS3, NVMS4) much less permanent magnets and much less sensor systems are necessary than in case of using Hall sensors instead of the sensor systems (NVMS1, NVMS2, NVMS3, NVMS4).

FIG. 57

Figure 57:
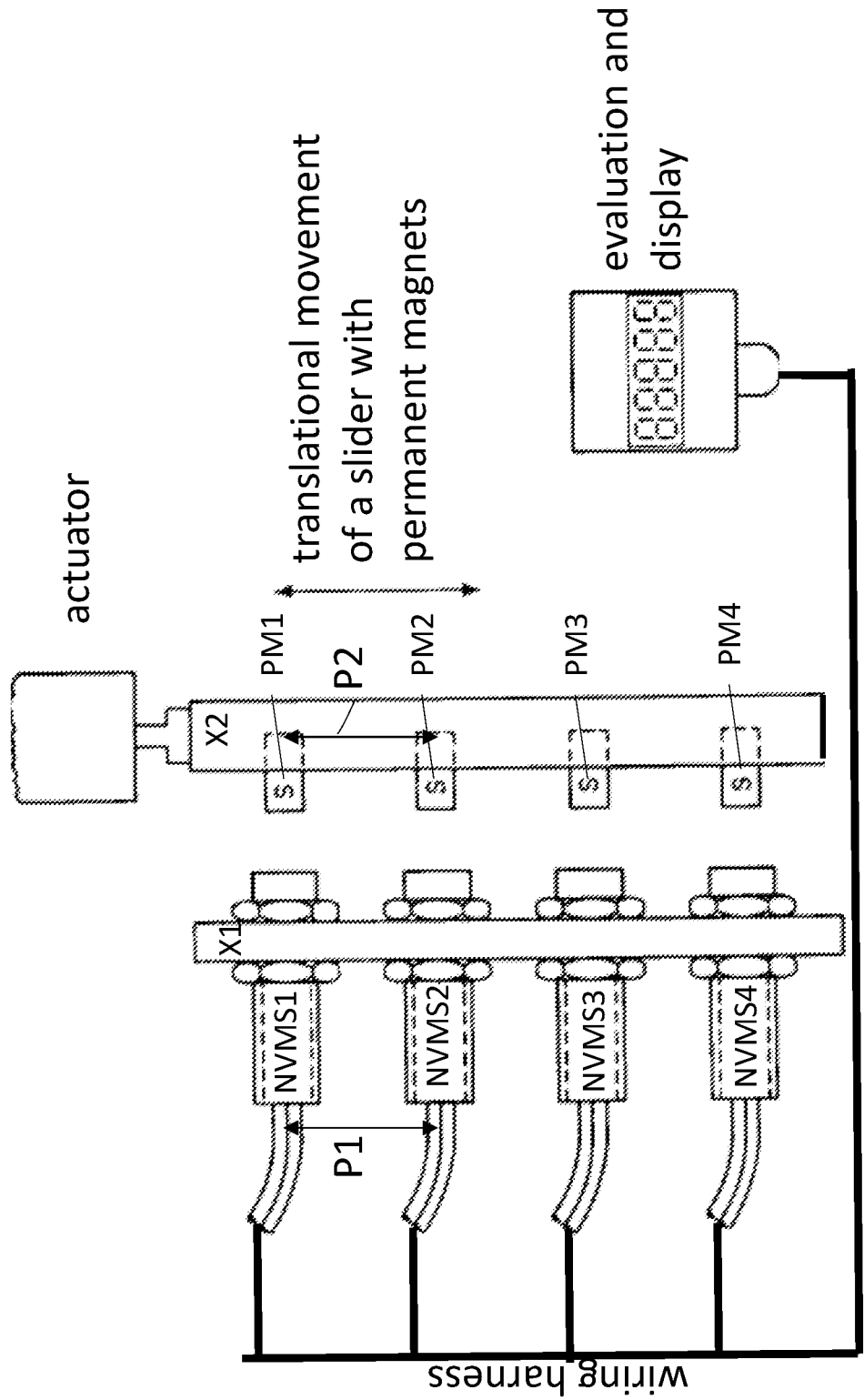
FIG. 57 shows an example application of the position measuring principle of FIG. 55.

FIG. 57 shows an application of the position measuring principle of FIG. 55. Preferably, the sensor systems (NVMS1 to NVMS4) and thus the periodicity of the locations of the paramagnetic centers (NV1) or the periodicity of the clusters each consisting of a plurality (NVC) of paramagnetic centers (NV1) have a first periodicity (P1) along a first straight or uniformly curved line. Preferably, the permanent magnets on the slider whose position is to be determined have a second periodicity (P2) along a second straight or uniformly curved line. Preferably, the first periodicity (P1) deviates slightly from the second periodicity (P2)—e.g. by 0.1% to 5%—so that a moiré figure is created and the resolution of the system is thus increased.

It is thus a device for measuring a position along a line, the line being re-mapped to itself in a substantial part when displaced along the line. The device comprises a first body (X1) and a second body (X2). On the first body (X1), paramagnetic centers (NV1) or clusters of a plurality (NVC) of paramagnetic centers (NV1) each are arranged along and parallel to said line with a first periodicity (P1). Preferably, these paramagnetic centers (NV1) or clusters of a plurality (NVC) of paramagnetic centers (NV1), respectively, are sub-devices of associated sensor systems (NVMS1 to NVMS4), respectively. On the second body (X2) permanent magnets (PM1 to PM4) are arranged along and parallel to said line with a second periodicity (P2). Due to the different second periodicity (P2) compared to the first periodicity (P1), the fluorescence radiation (FL) of the paramagnetic centers (NV1) or clusters of respectively a plurality (NVC) of paramagnetic centers (NV1) of the different sensor systems (NVMS1 to NVMS4) at the different locations of the paramagnetic centers (NV1) or of the clusters of a plurality (NVC) of paramagnetic centers (NV1), respectively, is influenced in different ways by a displacement of the second body (X2) relative to the first body (X1) along said line in predictably different ways. This redundancy can then be used to calculate the exact position. An evaluation then determines the real displacement based on the measured values of the sensor systems (NVMS1 to NVMS4). Preferably, the translational movement is performed by an actuator along a third straight or uniformly curved line. Preferably, the first straight or uniformly curved line and the second straight or uniformly curved line and the third straight or uniformly curved line are substantially parallel to each other. Preferably, the first periodicity (P1) deviates from the second periodicity (P2) so that a vernier effect results. An evaluation unit evaluates the output signals of the sensor systems (NVMS1 to NVMS4). If necessary, a display or a transmission to a higher-level data processing unit, for example via a data bus (DB), takes place as here.

FIG. 58

Figure 58:
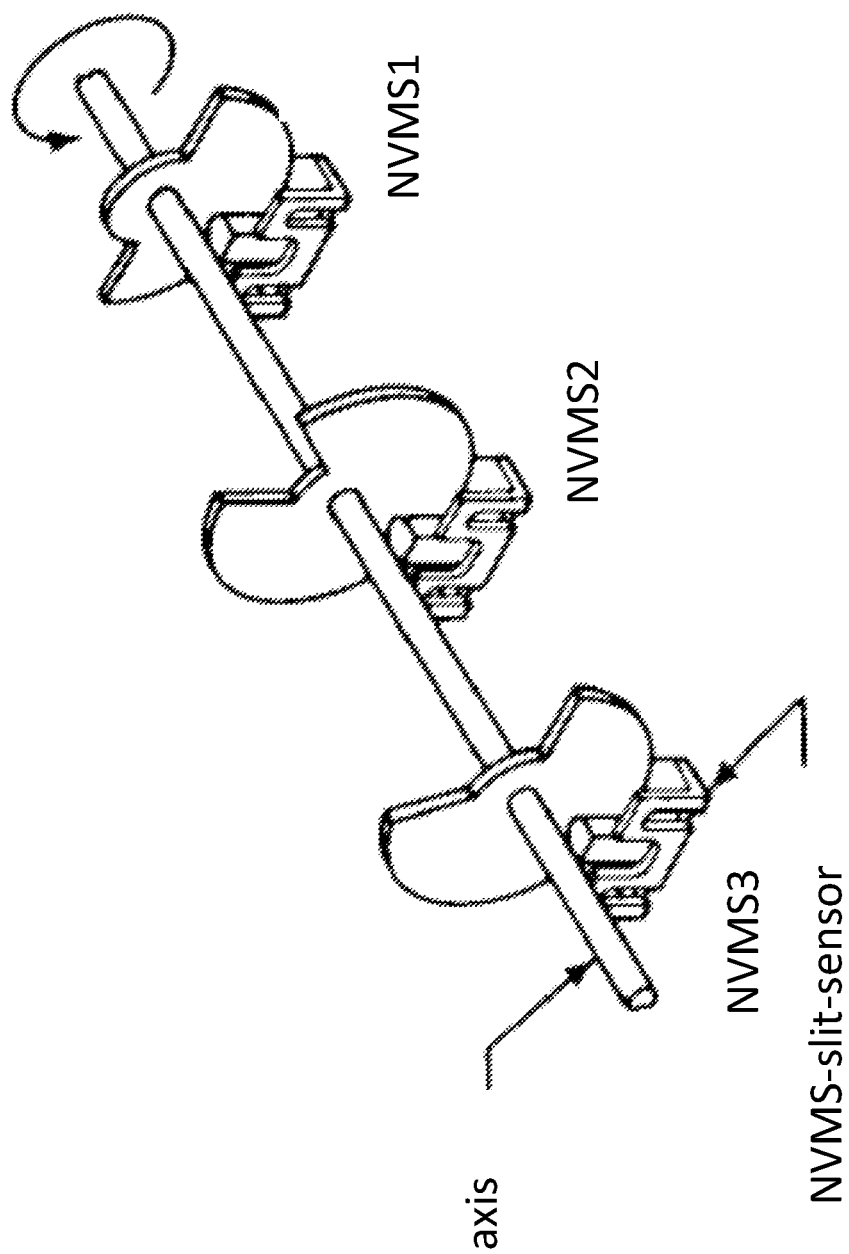
FIG. 58 shows an example application of an exemplary slot sensor corresponding to one or more of FIGS. 37 to 42 for measuring an angle of rotation.

FIG. 58 shows an application of an exemplary slot sensor corresponding to one or more of FIGS. 37 to 42 for measuring the angle of rotation by means of differently designed encoding disks with windows and teeth of different angular width and/or angular modulation.

FIG. 59

Figure 59:
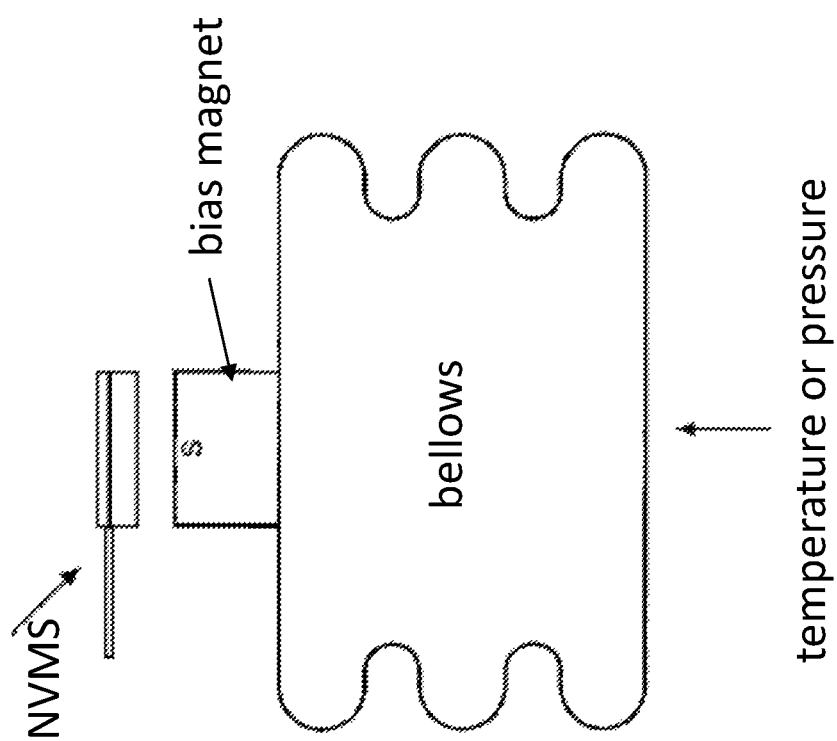
FIG. 59 shows a temperature and/or pressure measurement by means of an example mechanical functional element whose dimensions depend on the pressure and/or temperature.

FIG. 59 shows a temperature and/or pressure measurement by means of an exemplary mechanical functional element whose dimensions depend on the pressure and/or temperature. In the example of FIG. 59, the bellows can be filled with a measuring gas, for example, which expands or contracts characteristically with a change in temperature. This changes the dimensions of the bellows with a change in temperature and thus the magnetic flux (B) through the paramagnetic center (NV1) or the plurality (NVC) of paramagnetic centers (NV1) of the sensor system (NVMS). Likewise, a change in the external pressure and/or a change in the internal pressure of the bellows—for example, via a pressure line not shown—leads to a dimensional change of the bellows and thus to a change in the magnetic flux (B) through the paramagnetic center (NV1) or the plurality (NVC) of paramagnetic centers (NV1) of the sensor system (NVMS). This change of the magnetic flux (B) through the paramagnetic center (NV1) or the plurality (NVC) of paramagnetic centers (NV1) of the sensor system (NVMS) leads to a change of the fluorescence radiation (FL) of the paramagnetic center (NV1) or the plurality (NVC) of paramagnetic centers (NV1). This change is detected by the control and evaluation device (AWV) of the sensor system (NVMS) and preferably passed on to a higher-level system, for example a computer system, for example via a data bus (DB).

FIG. 60

Figure 60:
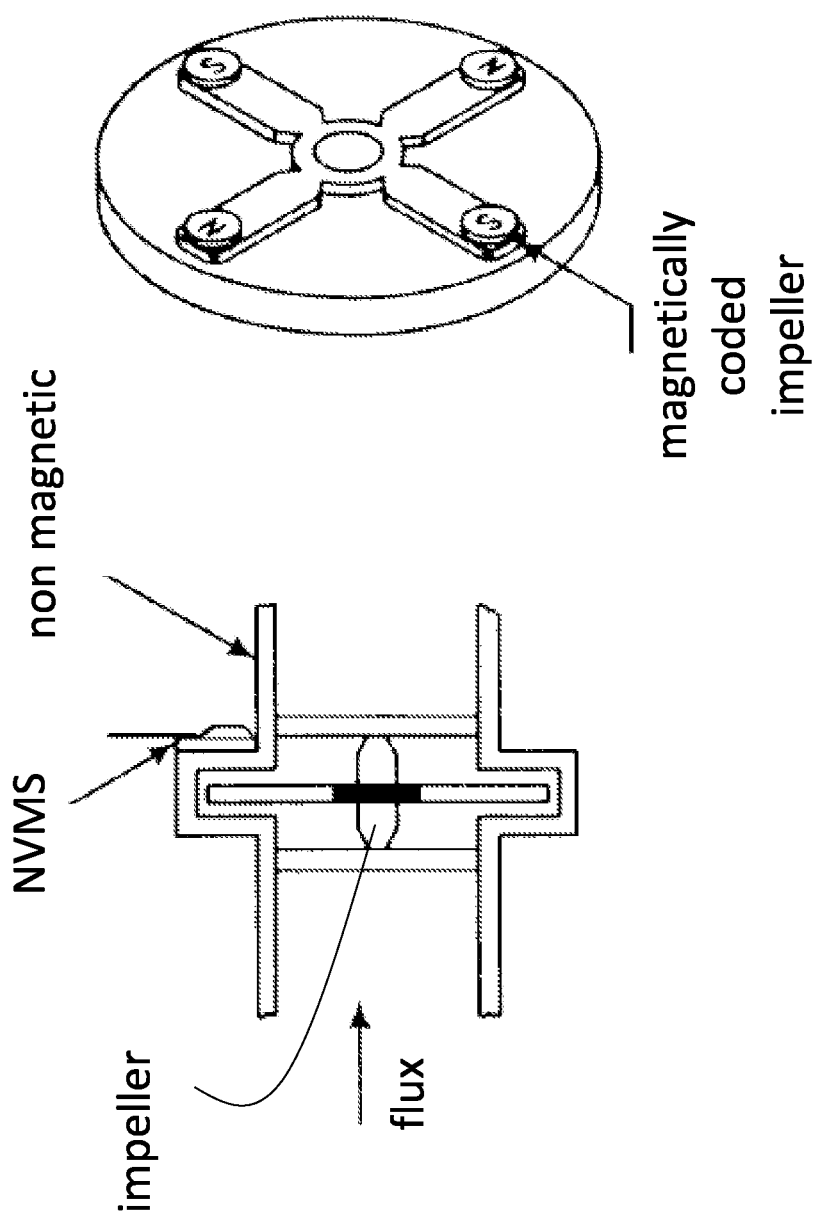
FIG. 60 shows an example application of a proposed sensor system (NVMS) for flow measurement.

FIG. 60 shows an application of a proposed sensor system (NVMS) for flow measurement. An impeller with magnetic encodings is placed in a transport device for a fluid. The impeller is preferably shaped such that the flow of the fluid in the transport device, such as a tube, causes the impeller to rotate. As the impeller rotates, the permanent magnet-based magnetic encodings on the impeller generate an alternating magnetic field that can be sensed by the sensor system (NVMS), and preferably can be communicated to a higher-level system, such as a computer system.

FIG. 61

Figure 61:
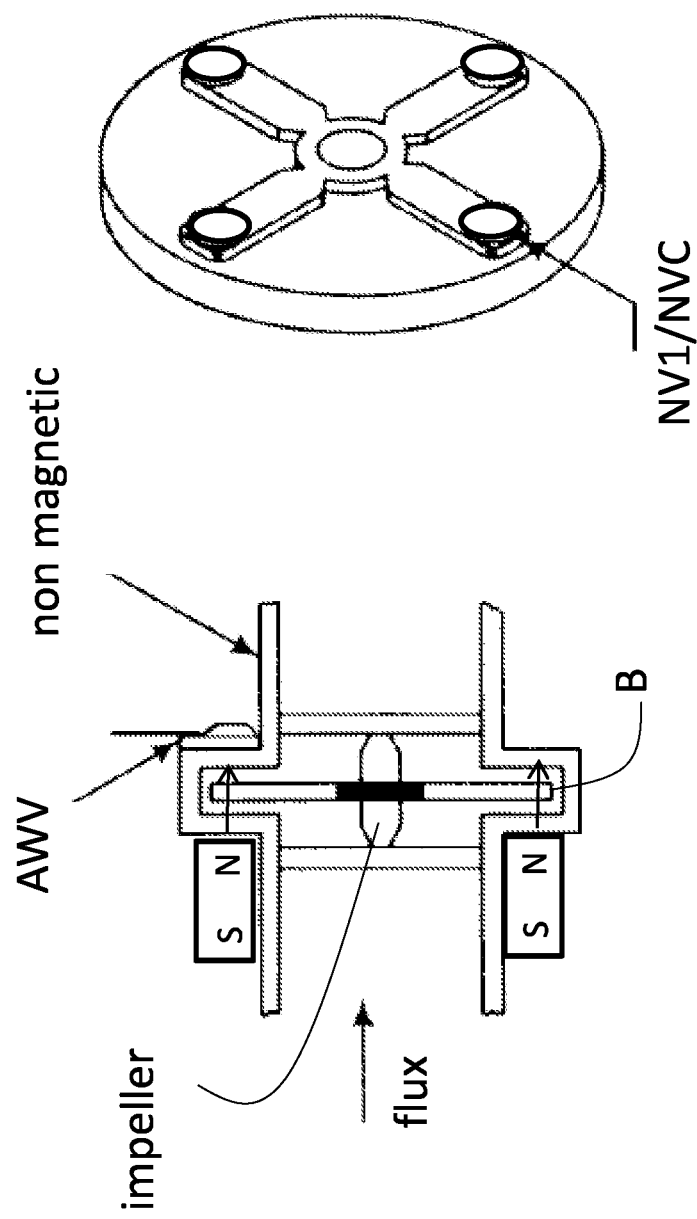
FIG. 61 shows an example application of a proposed sensor system (NVMS) for flow measurement.

FIG. 61 shows another application of a proposed sensor system (NVMS) for flow measurement. Now a movable body with paramagnetic centers (NV1) is moved in a magnetic field with a flux density (B). By moving the movable body, the magnetic flux density (B) for the paramagnetic centers (NV1) is decreased. If the paramagnetic centers (NV1) are irradiated with pump radiation (LB) by a control and evaluation device (AWV), the fluorescence radiation (FL) of the paramagnetic centers (NV1) changes due to a change in the movement speed of the movable body in the magnetic field. It is preferred that the paramagnetic centers (NV1) are distributed homogeneously along the direction of movement of the body on the body or that the fluorescence radiation (FL) is detected during the movement with the same sensitivity by the control and evaluation device (AWV) and the pump radiation (LB) reaches the paramagnetic centers (NV1) during the movement with the same intensity. In the example of FIG. 61, an impeller with paramagnetic centers (NV1) is shown as an example of an exemplary device of this type. The impeller is placed in a transport device for a fluid. The impeller is preferably shaped such that the flow of the fluid in the transport device, for example a tube, causes the impeller, and thus the paramagnetic centers (NV1) on the impeller, to rotate about the axis of rotation of the impeller. The rotation of the impeller reduces the magnetic flux density (B) of the magnetic field of the permanent magnets. The impellers provide a pulsed modulation of the fluorescence radiation (FL) emitted when a paramagnetic center (NV1) is irradiated with the pump radiation (LB) of the control and evaluation device (AWV) of the sensor system (NVMS). This is the case whenever a wing blade passes the position of the control and evaluation device (AWV) in the example of FIG. 61. Typically, the rotation speed modulates the amplitude of the modulation of the intensity of the fluorescence radiation (FL). This amplitude and its frequency can be detected by the control and evaluation device (AWV) of the sensor system (NVMS), and preferably passed on to a higher-level system, for example a computer system.

FIG. 62

Figure 62:
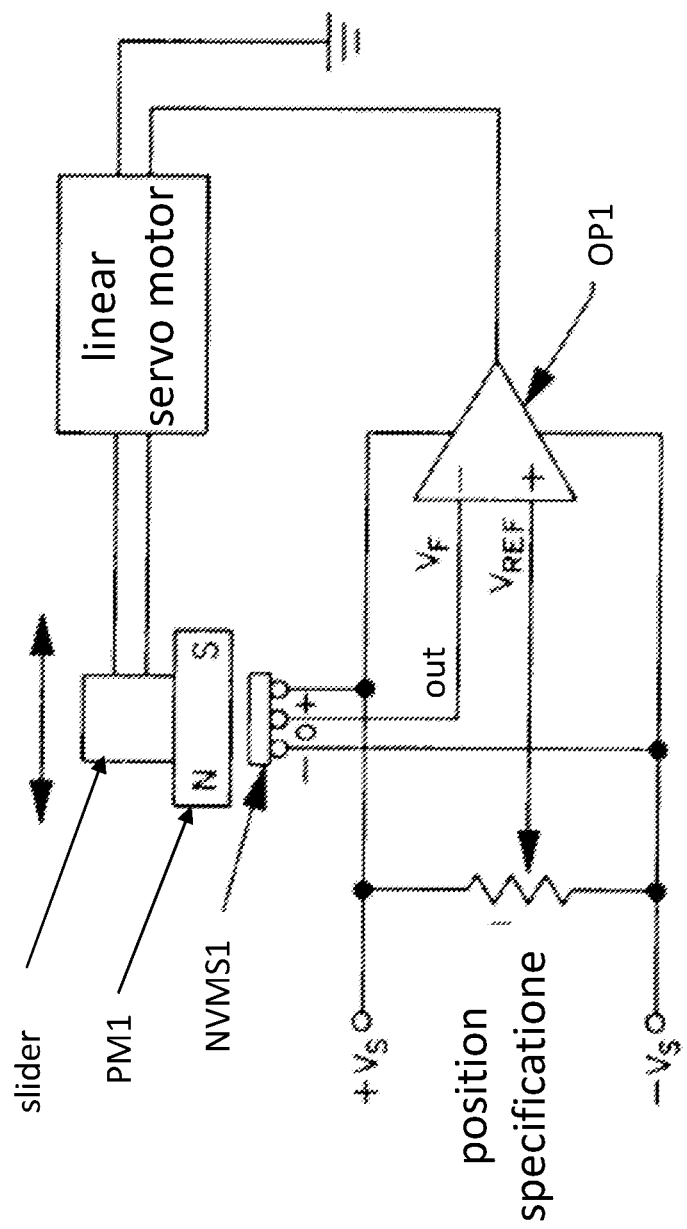
FIG. 62 is a schematic showing example of position control of a slider relative to a first sensor system (NVMS1).

FIG. 62 shows a schematic example of the position control of a slider relative to a first sensor system (NVMS1). Depending on the position of the slider, a first permanent magnet (PM1), which is preferably permanently connected to the slider, generates a position-dependent magnetic flux density (B) at the location of the paramagnetic center (NV1) or the plurality (NVC) of paramagnetic centers (NV1) of the first sensor system (NVMS1). A first operational amplifier (OP1) compares the analog voltage output signal of the first sensor system (NVMS1), which is preferably exemplary here, with a reference voltage value generated by a potentiometer, for example, and generates a drive signal for the linear servomotor, which then readjusts the slider as an actuator of the control loop until the voltage difference at the inputs of the first operational amplifier (OP1) is zero.

FIG. 63

Figure 63:
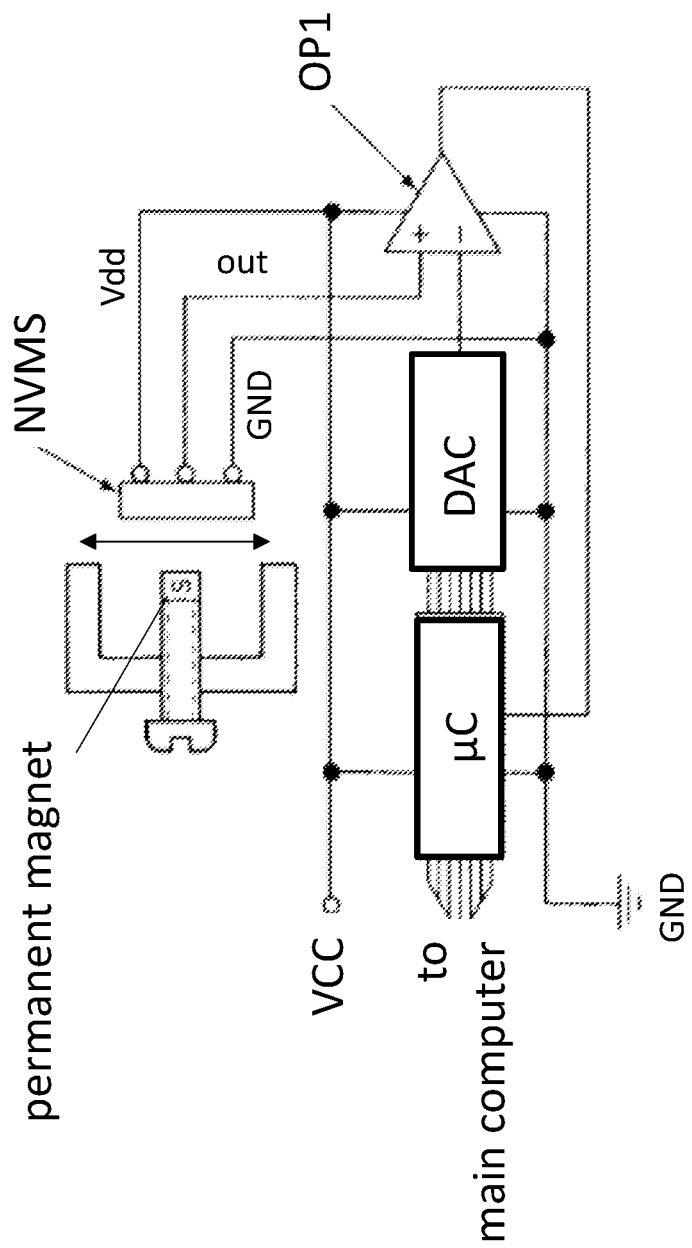
FIG. 63 is a schematic showing an example method for digitizing an exemplary analog first output signal (out) of an example sensor system (NVMS).

FIG. 63 shows an exemplary method for digitizing an exemplary analog first output signal (out) of a sensor system (NVMS) with a paramagnetic center (NV1) or a plurality (NVC) of paramagnetic centers (NV1). For example, the exemplary microcomputer (µC) increases the input value of a digital-to-analog converter (DAC) until the value of the output signal of a first operational amplifier (OP1), which compares the output signal of the digital-to-analog converter with the output signal of the sensor system (NVMS) and serves as a comparator here, crosses a threshold value. The input value increased up to this point corresponds exactly then at the moment of this crossing process essentially to the measured value which the microcomputer (µC) can pass on.

FIG. 64

Figure 64:
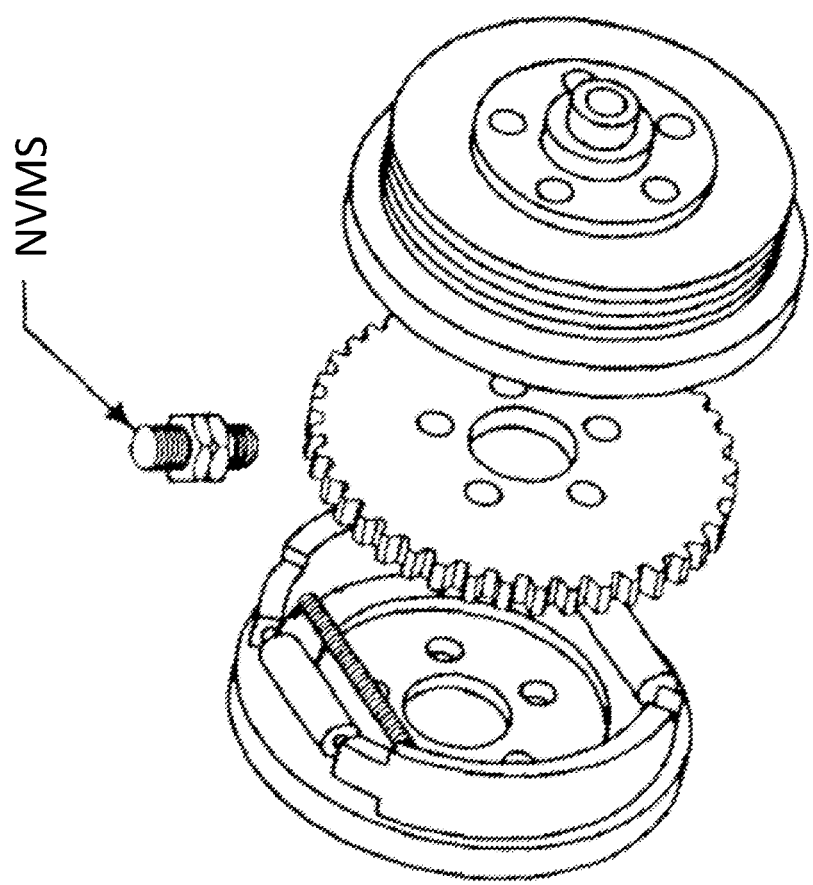
FIG. 64 shows an example application of the position measurement principle of FIG. 51 for a drum brake in a motor vehicle.

FIG. 64 shows the application of the position measurement principle of FIG. 51 to an example wheel hub with a drum brake in a motor vehicle.

Figure 65:
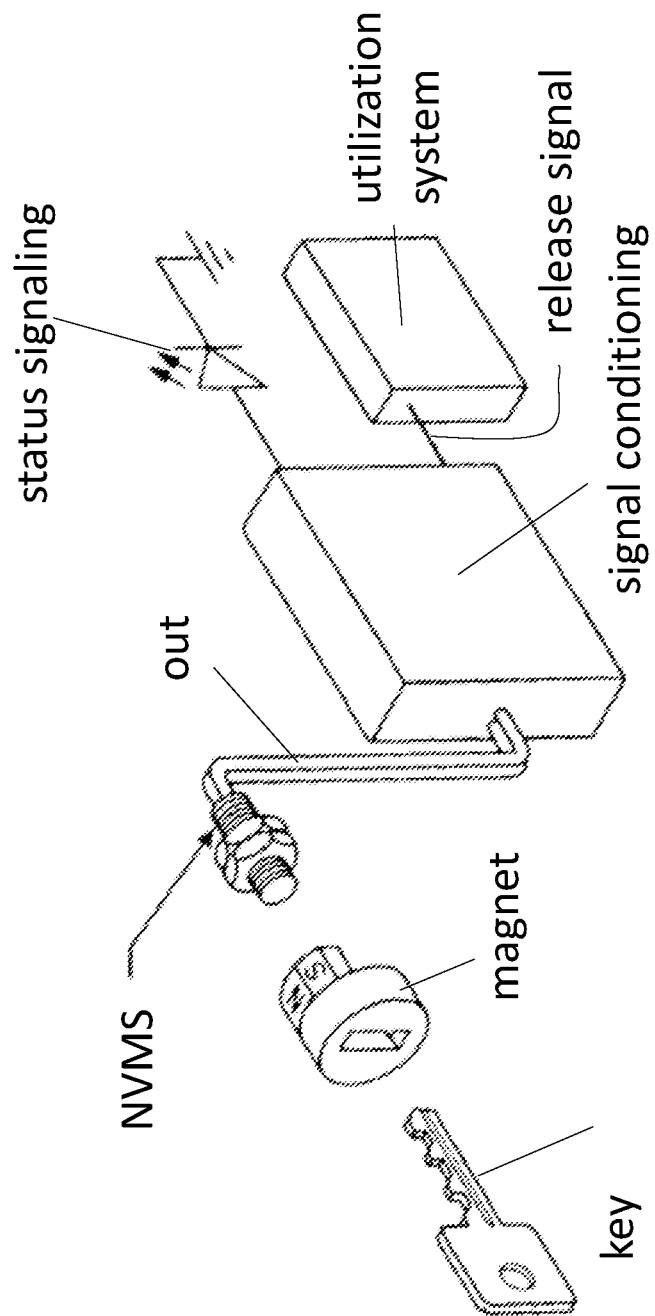
FIG. 65 shows an example application of a sensor system (NVMS) for a locking system.
Figure 66:
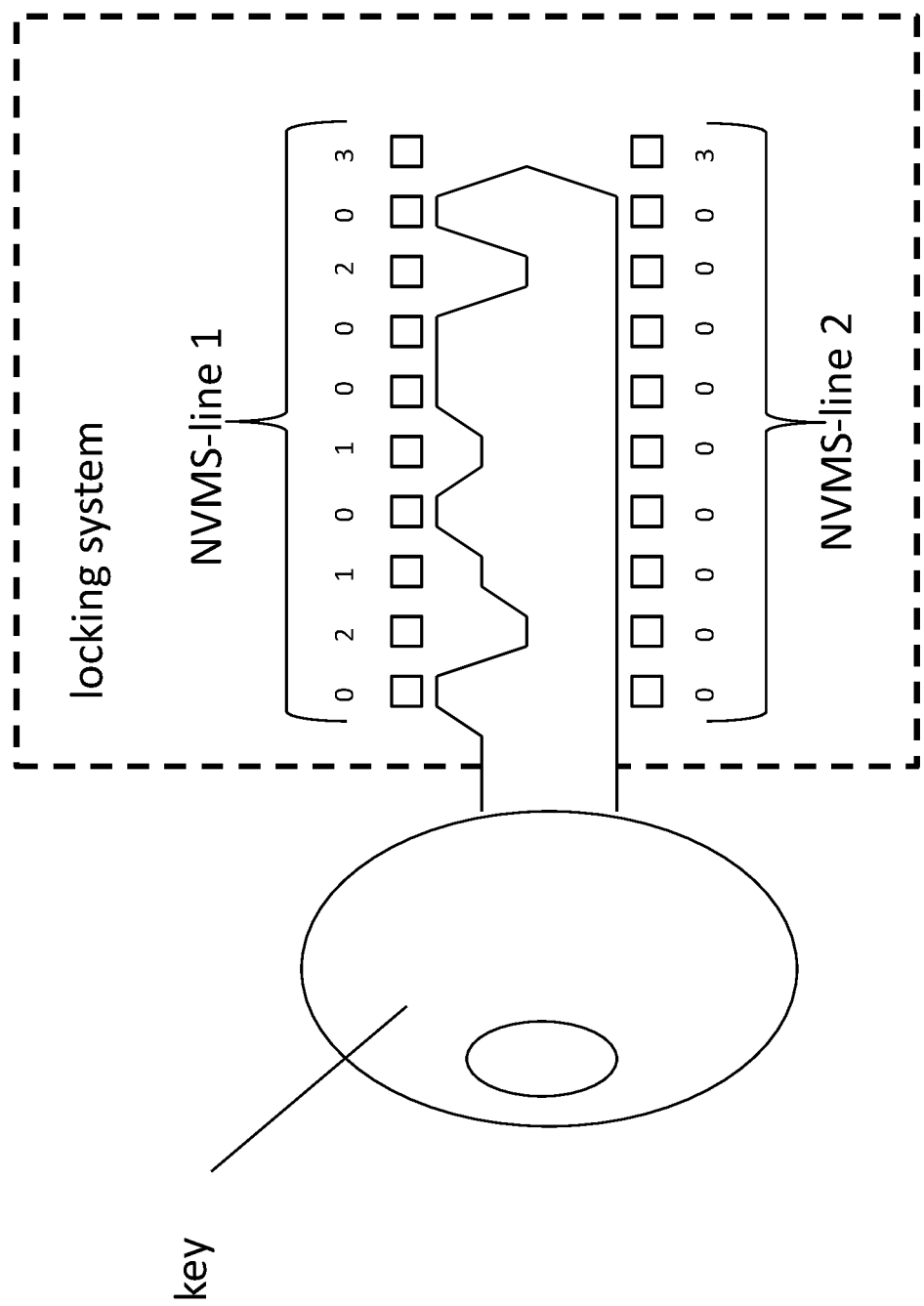
FIG. 66 shows an example locking system with two lines of sensor systems for detecting the spatial modulation of a permanently magnetically excited key.
Figure 67:
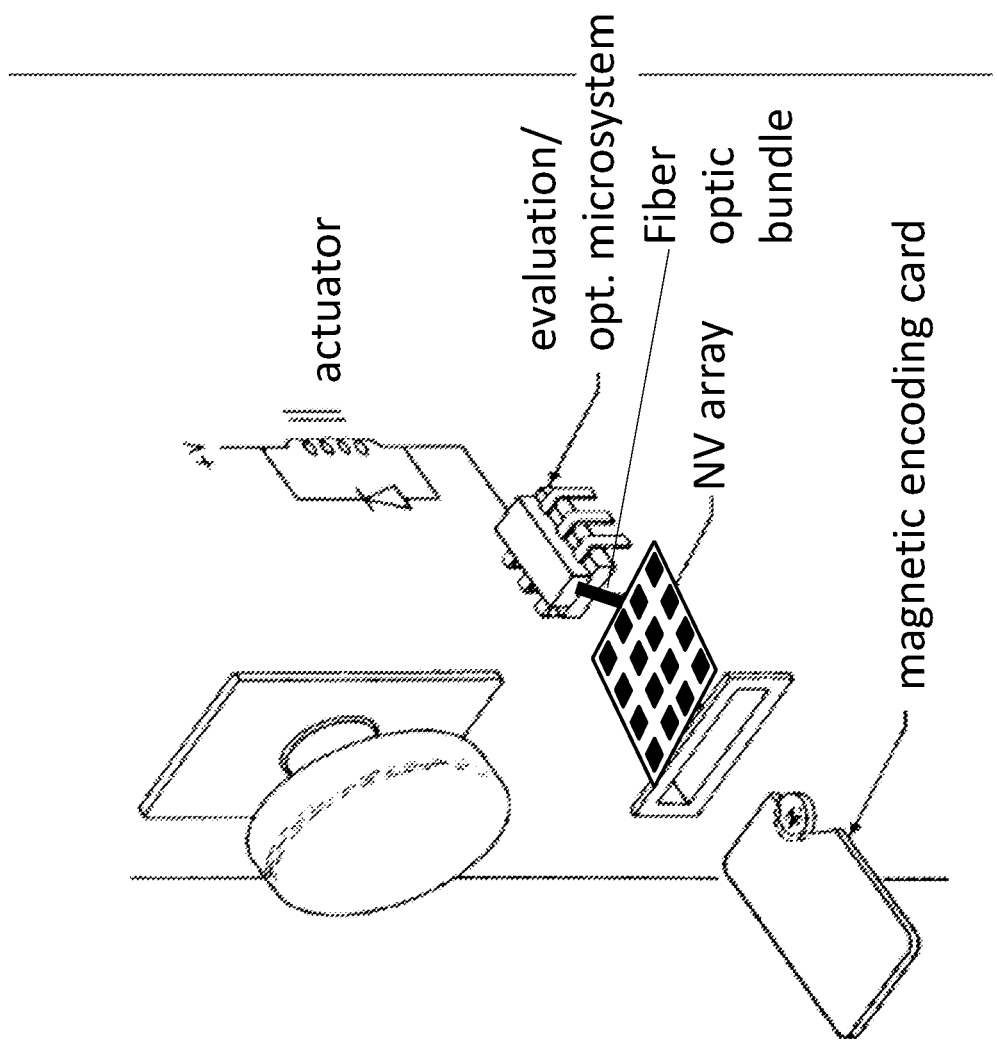
FIG. 67 shows quantum dots in the form of the paramagnetic centers (NV array) or clusters (NVC) arranged in a diamond plate in a one- or two-dimensional lattice.

FIGS. 65, 66 and 67

FIG. 65 shows the application of a sensor system (NVMS) for a locking system. The key can have a spatial coding by shaping and/or magnetization, which is detected by a sensor system (NVMS) with a paramagnetic center (NV1) or a plurality (NVC) of paramagnetic centers (NV1). The spatial encoding can be transformed into a temporal encoding if the speed at which the key is inserted into the device is detected at each time point. This can be achieved if the key has a carrier spatial frequency for the actual locking information in addition to a base spatial frequency. This is particularly advantageous because magnetic coding is not immediately recognizable without knowledge of it. In FIG. 66, therefore, two lines of sensor systems are provided which detect the spatial modulation of a permanently magnetically excited key. However, the magnetic excitation can also be fed in by a coil only in the lock system. It is also conceivable to provide a more complex sensor system with multiple paramagnetic centers (NV1) or multiple clusters, each in the form of a plurality (NVC) of paramagnetic centers (NV1), as quantum dots. For example, when diamond is used as the substrate material, the key can be inserted between two diamond plates having NV centers as paramagnetic centers (NV1), or clusters in the form of a respective plurality (NVC) of paramagnetic centers (NV1). The magnetic and mechanical encoding then results in a scannable fluorescence image of the paramagnetic centers (NV1), which can be compared to a predetermined image. If the deviations are smaller than a predetermined threshold, the lock can be unlocked. This situation is shown in FIG. 67. In the example of FIG. 67, the quantum dots in the form of the paramagnetic centers (NV array) or clusters (NVC) are arranged in a diamond plate in a one- or two-dimensional lattice and are stimulated and read out by optical fibers, for example. An evaluation unit (control and evaluation device (AWV)) processes the different fluorescence signals of the fluorescence radiation (FL) of the different paramagnetic centers (NV1) or the different clusters in the form of a respective plurality (NVC) of paramagnetic centers (NV1) and, if necessary, actuates the closing mechanism.

FIG. 68

Figure 68:
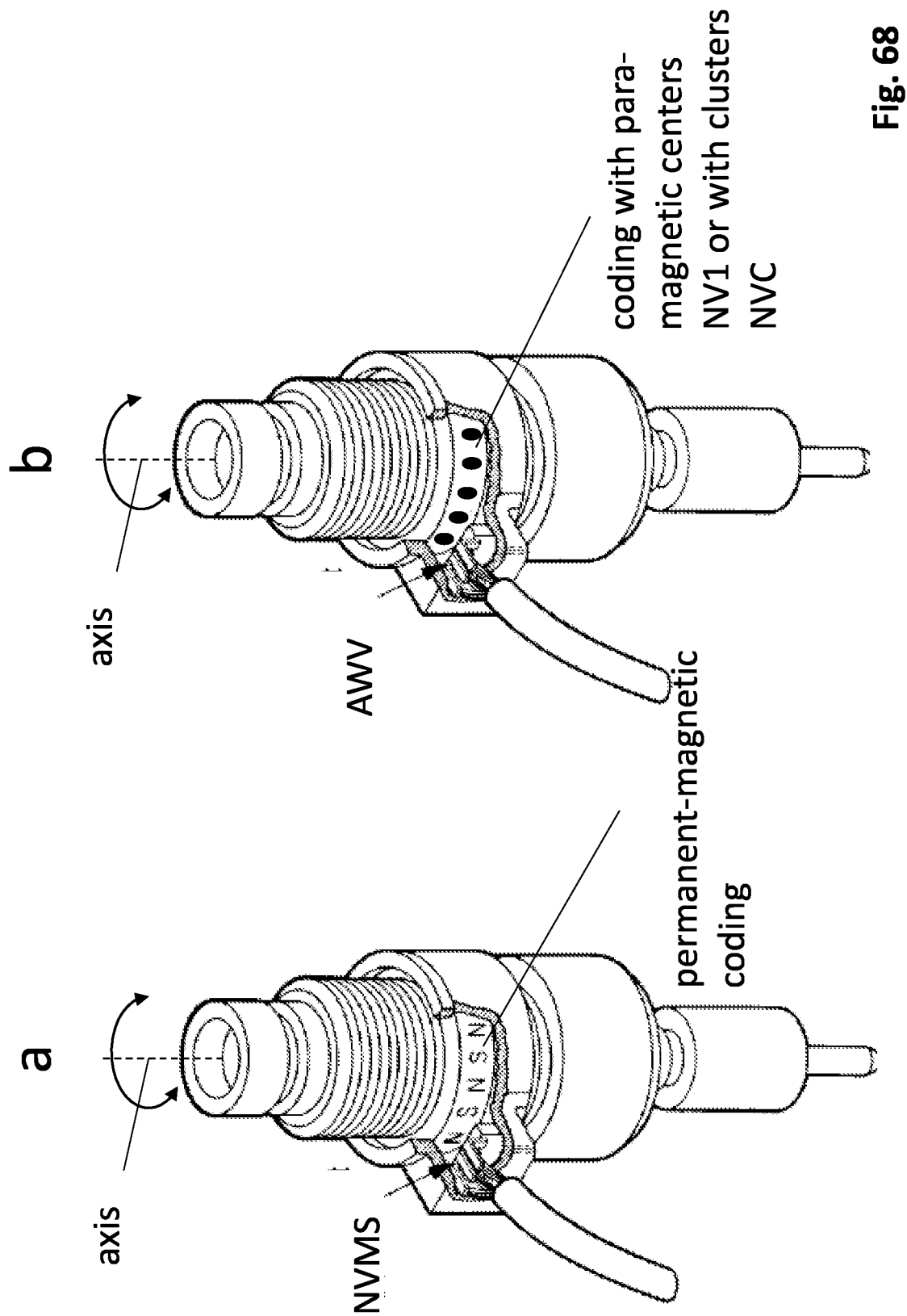
FIG. 68a shows an exemplary rotation angle sensor with a permanently magnetized encoding disk and a sensor system (NVMS).
FIG. 68b shows an exemplary rotation angle sensor with an encoding disk encoded with paramagnetic centers (NV1) or clusters of a plurality (NVC) of paramagnetic centers (NV1) and a control and evaluation device (AWV).

FIG. 68a again shows an exemplary rotation angle sensor with a permanently magnetized encoding disk and a sensor system (NVMS). FIG. 68b shows an exemplary rotation angle sensor with an encoding disk encoded with paramagnetic centers (NV1) or clusters of a plurality (NVC) of paramagnetic centers (NV1) and a control and evaluation device (AWV). The control and evaluation device (AWV) irradiates the paramagnetic centers (NV1) or the clusters of a respective plurality (NVC) of paramagnetic centers. Preferably, the device comprises a permanent magnet which generates a magnetic flux density of defined magnitude.

Both the intensity of the pump radiation (LB) and the strength of the magnetic flux density depend on the angle of rotation. By evaluating the fluorescence radiation (FL), the control and evaluation device (AWV) can conclude the rotation angle position.

FIG. 69

Figure 69:
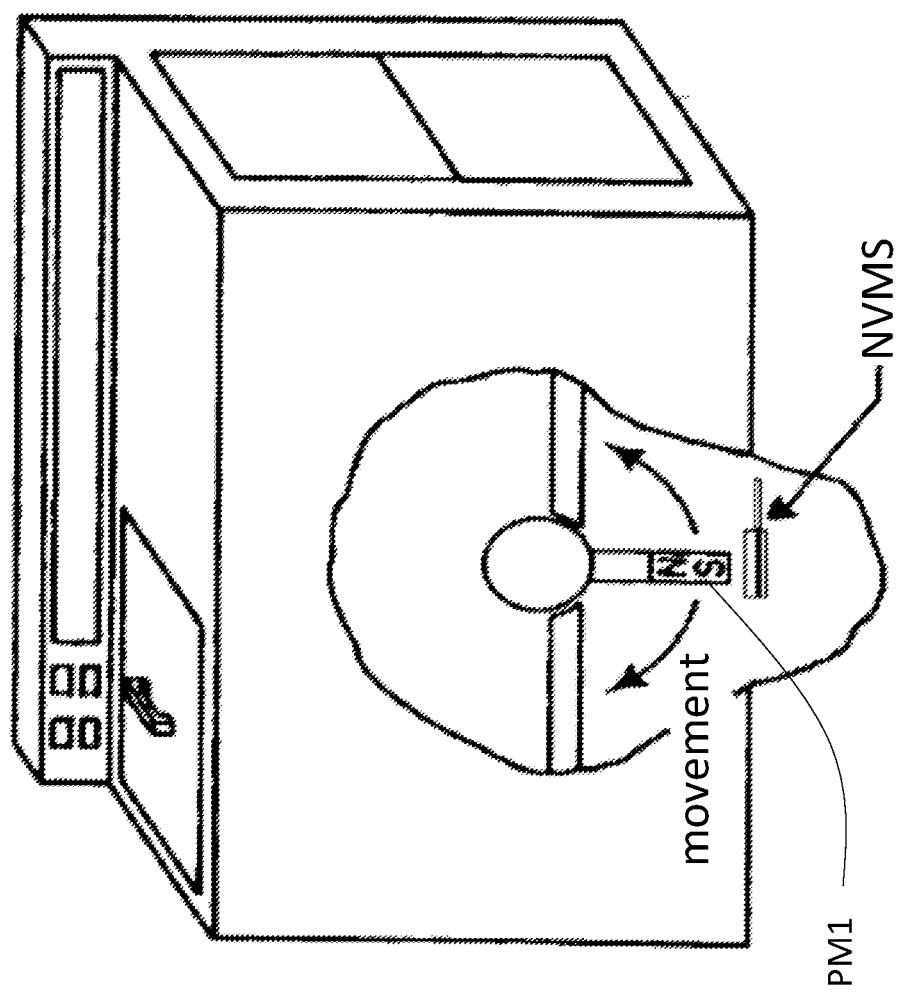
FIG. 69 shows an example inclination sensor, in which a first permanent magnet (PM1) is attached to a pendulum suspended above a sensor system (NVMS).

FIG. 69 shows an exemplary inclination sensor, in which a first permanent magnet (PM1) is attached to a preferably damped pendulum at the end of the pendulum and is suspended above a sensor system (NVMS) with a paramagnetic center (NV1) or a plurality (NVC) of paramagnetic centers (NV1). Since the magnetic flux density (B) at the location of the sensor system (NVMS) changes as a function of the inclination of the system—in this case the exemplary suspension of a washing drum of an exemplary washing machine—a tilt angle sensor can be realized by this.

FIG. 70

Figure 70:
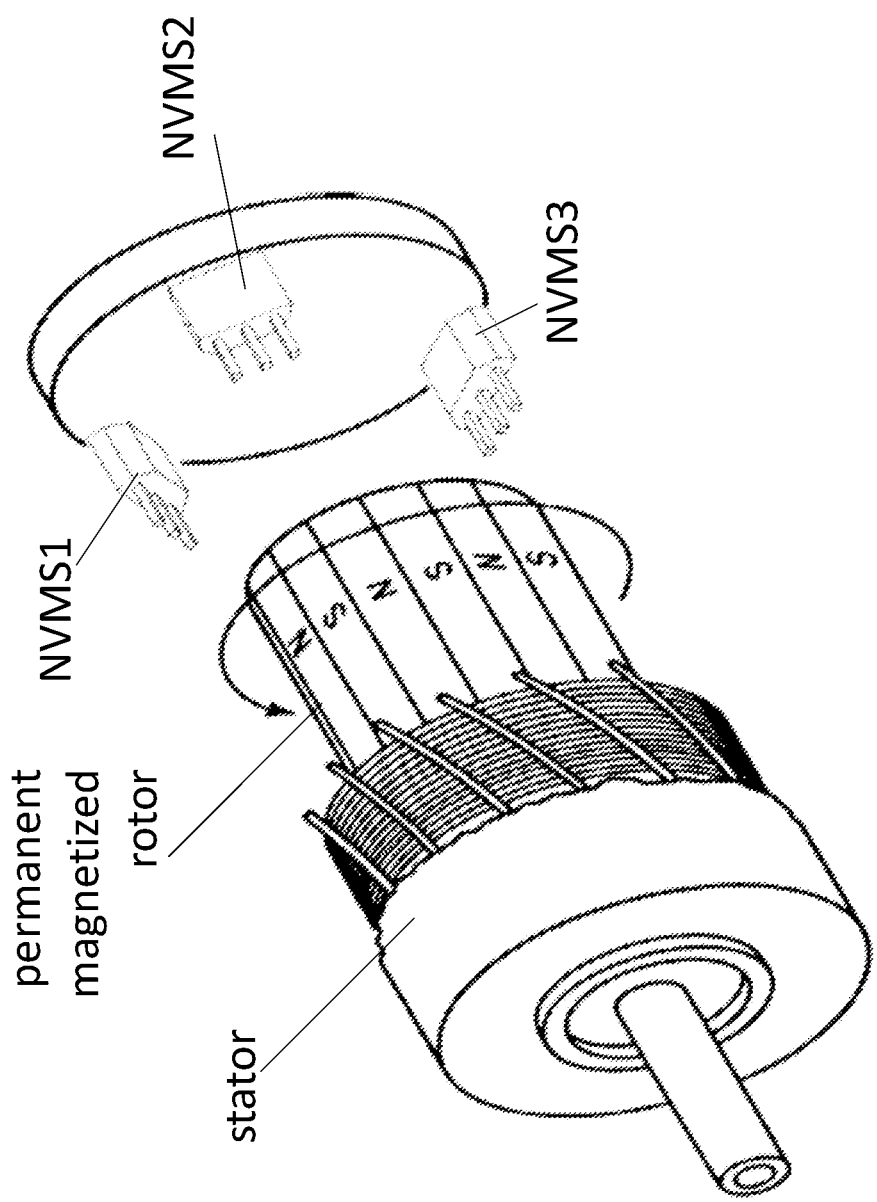
FIG. 70 shows an example application of sensor systems (NVMS1, NVMS2, NVMS3) for rotor position determination in electric motors.

FIG. 70 shows an exemplary application of sensor systems (NVMS1, NVMS2, NVMS3) for rotor position determination in electric motors. The exemplary electric motor is shown as a roughly simplified exploded view. A so-called brushless electric motor is shown as an example. Not shown is the control of the commutation of the exemplary stator coils of the exemplary electric motor. In the example of the figure, three sensor systems (NVMS1, NVMS2, NVM3) each with paramagnetic centers (NV1) or each with clusters of a plurality (NVC) of paramagnetic centers (NV1) are exemplarily provided to detect the position of the permanently magnetized rotor of the exemplary BLDC motor. Theoretically, however, a sensor system (NVMS) is already sufficient for this purpose if the starting position is known, and absolute values of the magnetic flux density (B) and its time derivative are recorded. A control device, which is not drawn, processes the measured values of the exemplary three sensor systems (NVMS1, NVMS2, NVM3) and generates the commutation signals for the motor drivers, which are typically half bridges, from these after comparison with nominal values. These half-bridges, which are not drawn, then supply the stator coils of the stator of the motor with electrical energy as a function of these commutation signals and thus as a function of the magnetic flux at the location of the paramagnetic center (NV1) or the plurality (NVC) of paramagnetic centers (NV1) of the respective sensor system (NVMS1, NVMS2, NVMS3). Importantly, the paramagnetic centers (NV1) or clusters of a plurality (NVC) of paramagnetic centers (NV1) can be separated again from the respective control and evaluation devices (AWV) of the respective sensor systems (NVMS1, NVMS2, NVMS3) by optical functional means, such as optical fibers, to provide galvanic isolation between the respective sensor element (NVMS1, NVMS2, NVMS3) with the paramagnetic center (NV1) or the cluster of a plurality (NVC) of paramagnetic centers (NV1).

Such a drive system then comprises an electrical machine with a stator and with a rotor, in particular a rotor, mounted movably relative to the stator along at least one degree of freedom. Therein the stator has a first magnetic field generating device. Therein the rotor has a second magnetic field generating device. Therein at least the first magnetic field generating device or the second magnetic field generating device generate, in dependence on a control signal, an advancing magnetic field with a direction of movement along the degree of freedom of the rotor. Therein the machine comprises a paramagnetic center (NV1) and/or a plurality (NVC) of paramagnetic centers (NV1). Therein a control and evaluation device (AWV) irradiates the paramagnetic center and/or the plurality (NVC) of paramagnetic centers (NV1) with pump radiation (LB). Therein the paramagnetic center and/or the plurality (NVC) of paramagnetic centers (NV1) emit fluorescence radiation (FL) as a function of the magnetic flux density (B) at the location of the paramagnetic center (NV1) and/or the plurality (NVC) of paramagnetic centers (NV1). Therein the paramagnetic center (NV1) and/or the plurality (NVC) of paramagnetic centers (NV1) are located on the rotor or the stator. Therein the control and evaluation device (AWV) detects the fluorescence radiation (FL). Therein the control and evaluation device (AWV) generates the control signal as a function of the detected fluorescence radiation (FL). The control and evaluation device (AWV) can thereby consist of several evaluation devices. An evaluation device can be coupled by optical function means, for example optical waveguides, with a paramagnetic center (NV1) and/or a plurality (NVC) of paramagnetic centers (NV1).

FIG. 71

Figure 71:
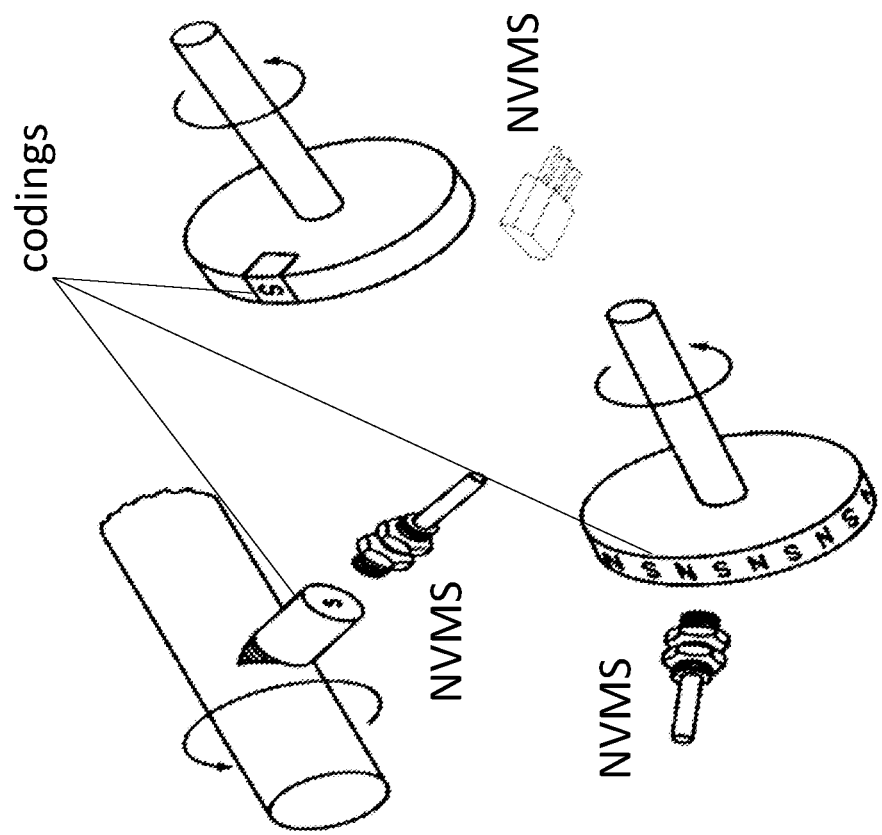
FIG. 71 shows example possibilities for coding via permanently magnetized coding disks or rotating bodies.

FIG. 71 shows further coding possibilities for coding via permanently magnetized coding disks or rotating bodies for angle of rotation measurement and/or revolution counting.

FIG. 72

Figure 72:
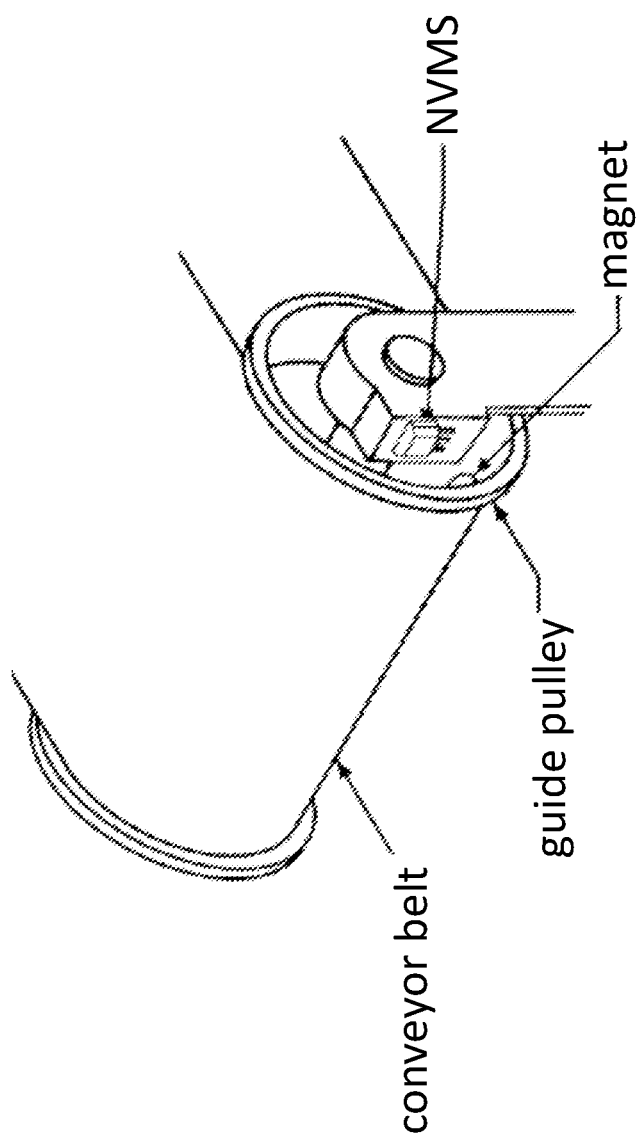
FIG. 72 shows an example application of a sensor system for speed measurement of a conveyor belt.

FIG. 72 shows the application of a sensor system for rotational speed measurement of the transport roller of a conveyor belt and thus for speed measurement. The necessary encoding disk is not explicitly drawn here, as it has been mentioned several times before.

FIG. 73

Figure 73:
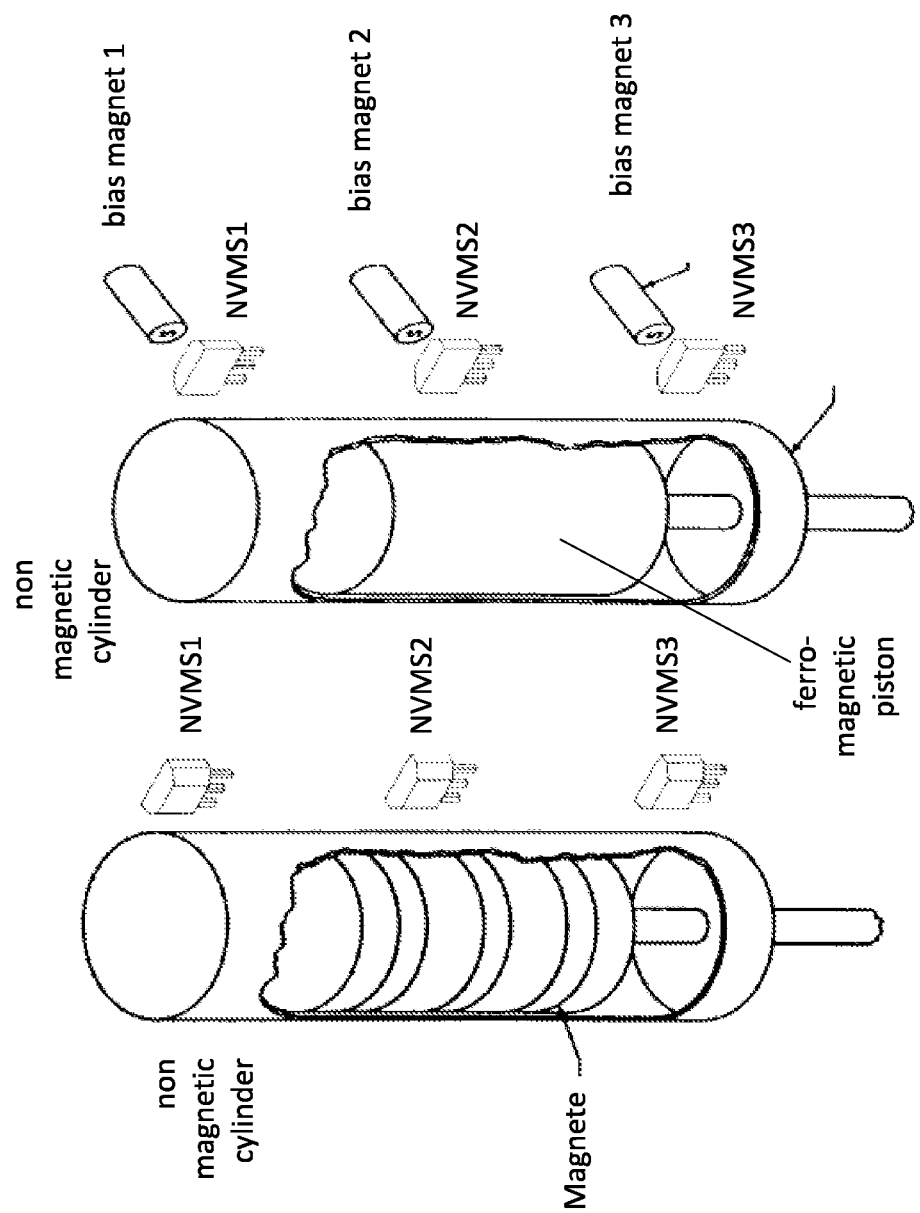
FIG. 73 shows tan example sensor systems (NVMS1, NVMS2, NVMS3) for determining a position of a piston in a cylinder.

FIG. 73 shows the use of proposed sensor systems (NVMS1, NVMS2, NVMS3) for determining the position of a piston in a cylinder. For this purpose, either the piston can be encoded permanently magnetically, or the magnetic excitation is supplied from outside, for example by permanent magnets, and the piston is ferromagnetic, for example. Depending on the position of the piston in the cylinder, the magnetic flux through the sensor systems (NVMS1, NVMS2, NVMS3) changes. These transmit the measured values to an evaluation system, which determines the position and, if necessary, passes it on or processes it in some other way.

FIG. 74

Figure 74:
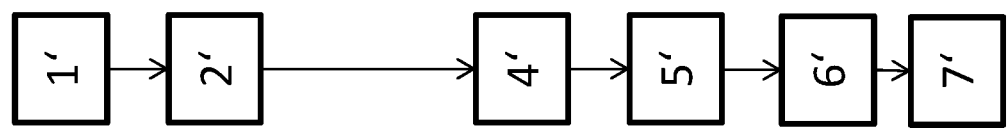
FIG. 74 shows an example process for measuring electromagnetic waves (HFW) with a sensor system (NVMS).

FIG. 74 shows a typical procedure for operating a measuring system for measuring electromagnetic waves (HFW) with a sensor system (NVMS) with at least one sensor element with at least one paramagnetic center (NV1) and/or at least one cluster of a plurality (NVC) of paramagnetic centers (NV1). The method can in principle also be used for other waves, if in a third step not used here a conversion into an electromagnetic wave (HFW) takes place.

In a first step (1'), an electromagnetic transmission wave is transmitted by a transmitter. In a second step (2'), the electromagnetic transmission wave is reflected by one or more objects (Obj) as an electromagnetic wave (HFW) and/or the electromagnetic transmission wave is modified by one or more objects (Obj) or the transmission channel to form an electromagnetic wave (HFW). The third step of converting an ultrasonic signal into an electromagnetic signal is not necessary here and is therefore skipped here. Here, reference is made to FIG. 24 and the third step (3) there as an example. In the fourth step (4'), the electromagnetic wave (HFW) causes a modulation of the magnetic flux density (B) at the location of the quantum dot (NV1) or the paramagnetic center (NV1) or the plurality (NVC) of paramagnetic centers (NV1) or the NV center of the sensor system (NVMS). In a fifth step (5') the modulation of the magnetic flux density (B) at the location of the quantum dot (NV1) or at the location of the paramagnetic center (NV1) or the plurality (NVC) of paramagnetic centers (NV1) or at the location of the NV center (NV1) of the sensor system (NVMS) modulates the fluorescence radiation (FL) of the quantum dot (NV1) or of the paramagnetic center (NV1) or of the plurality (NVC) of paramagnetic centers (NV1) or of the NV center (NV1) of the sensor system (NVMS). In a sixth step (6'), a first radiation receiver (PD1) of the sensor system (NVMS) detects this modulation of the fluorescence radiation (FL), e.g., as receiver output signal (S0). In a seventh step (7'), an evaluation circuit and/or evaluation unit generates one or more measured values, preferably a time sequence of measured values, from the receiver output signal (S0), which are then preferably output, for example as a first output signal (out) or via a data bus (DB) and are preferably used in whole or in part.

FIG. 75

Figure 75:
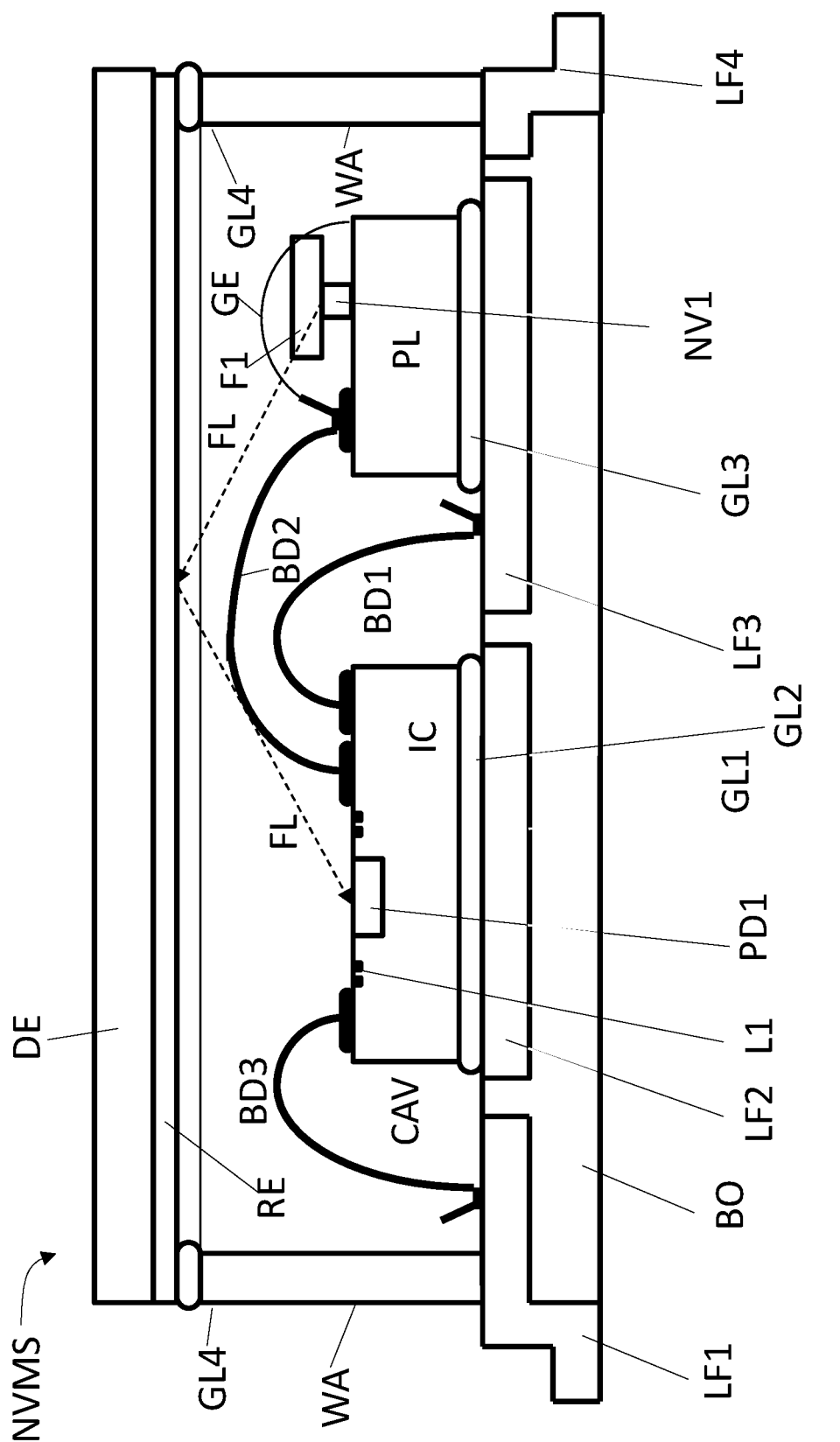
FIG. 75 corresponds to FIG. 1, with the difference that the example sensor element is now attached directly to the first pump radiation source (PL1).

FIG. 75 corresponds essentially to FIG. 1, with the difference that the sensor element with the quantum dot (NV1), for example a paramagnetic center (NV1) or a plurality (NVC) of paramagnetic centers (NV1) or preferably an NV center (NV1) in diamond as the sensor element, is now attached directly to the first pump radiation source (PL1). This has the advantage that now the pump radiation power is maximized, which maximizes the contrast. The fluorescence radiation (FL) is now redirected to the first radiation receiver (PD1) via optical functional means, in this case the reflector (RE). Experiments have shown that by maximizing the pump power density in the sensing element, for example in the diamond, the contrast in the curve of FIG. 15 can be maximized.

FIG. 76

Figure 76:
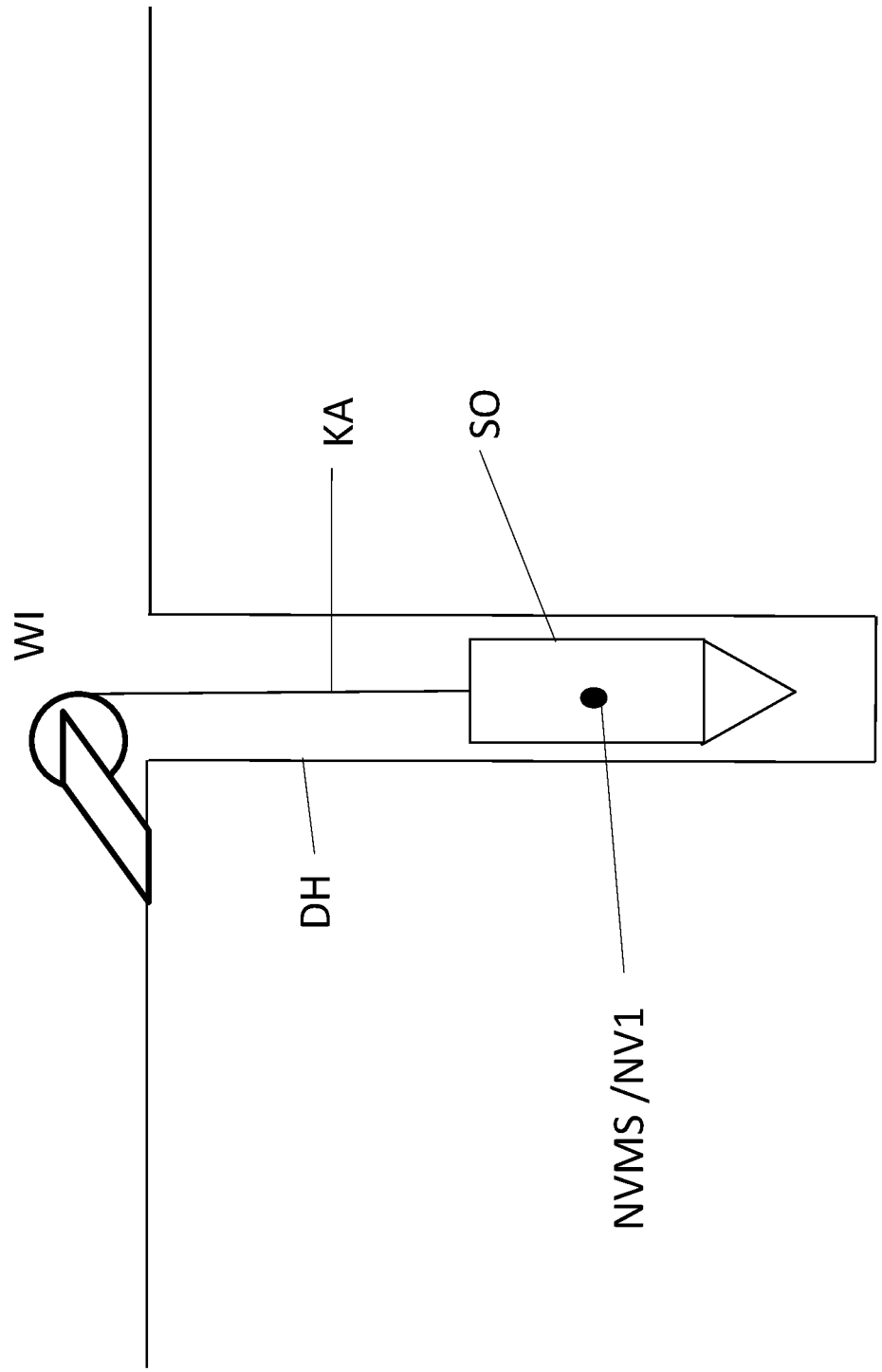
FIG. 76 shows a probe (SO) for measuring a wellbore (DH) or for measuring properties of a fluid in the wellbore (DH).

FIG. 76 shows a probe (SO) for measuring a wellbore (DH) or for measuring the properties of the fluid, if any, in the wellbore (DH). The probe (SO) can, for example, have one or more permanent magnets that generate a magnetic field that is deformed by substances in the wall of the borehole (DH) or in the fluid in the borehole near the probe (SO). The earth's magnetic field can also be used for this purpose, if necessary. A winch (WI) lowers the probe (SO) into the borehole (DH) on a cable (KA). The cable (KA) holds the probe (SO) mechanically. The cable (KA) may comprise one or more optical fibers connecting a sensing element, e.g., a diamond, with a quantum dot (NV1), preferably comprising a paramagnetic center (NV1) or a plurality (NVC) of paramagnetic centers (NV1), to a remaining sensing system preferably in the form of a control and evaluation device (AWV) on the surface. At this point, reference is made to FIGS. 27 to 30. Also, an entire sensor system (NVMS) can be accommodated in the probe (SO) at once. Such a sensor system (NVMS) then communicates preferably via lines in the cable (KA) or wirelessly acoustically or by radio with a higher-level computer system on the surface. In this way, measurement of the said physical parameters, in particular the magnetic flux density (B) in the borehole (DH) is possible even at very high temperatures and/or in aggressive environments.

Characteristics of the Proposal

The characteristics of the proposal reflect various features of possible characteristics. The characteristics can be combined with each other as far as it makes sense. The stress results in each case from the claims.

Characteristic 1. Method (FIG. 3) for detecting the magnetic-field-dependent fluorescence of a quantum dot, in particular of a paramagnetic center (NV1) and/or in particular of a plurality (NVC) of paramagnetic centers (NV1) and/or in particular of a NV center and/or in particular of a plurality of NV centers, in the form of a fluorescence radiation (FL), comprising the following steps pumping the quantum dot, in particular the paramagnetic center (NV1) and/or in particular the plurality (NVC) of paramagnetic centers (NV1) and/or in particular the NV center and/or in particular the plurality of NV centers, with pump radiation (LB, LB1a, LB1b) at first times (T1) and non-pumping of the quantum dot, in particular the paramagnetic center (NV1) and/or in particular the plurality (NVC) of paramagnetic centers (NV1) and/or in particular the NV center and/or in particular the plurality of NV centers, at second times (T2) different from the first times (T1), wherein the first times (T1) and the second times (T2) alternate in their temporal order and do not overlap, and wherein the first times (T1) and the second times (T2) may be periods of time, and simultaneous modulation of the intensity of the pump radiation (LB, LB1a, LB1b) with a first modulation and wherein the quantum dot, in particular the paramagnetic center (NV1) and/or in particular the plurality (NVC) of paramagnetic centers (NV1) and/or in particular the NV center and/or in particular the plurality of NV centers, emits a fluorescence radiation (FL) as a function of the magnetic flux density (B) and of the pump radiation (LB, LB1a, LB1b), and wherein the fluorescence radiation (FL) is modulated with a second modulation, and wherein the second modulation comprises first modulation components of the first modulation, and wherein the first modulation components are shifted by a fluorescence phase shift time ($\Delta TFL$) with respect to the first modulation;

Detection of the fluorescence radiation (FL) in the form of a receiver output signal (S0) at first times (T1)

detecting the modulation component of the receiver output signal (S0), which is synchronous with the first modulation, at first times (T1) in the form of a correlation value, and use and/or provision and/or dissemination of this correlation value as a measured value for the magnetic flux density (B) at the location of the quantum dot (NV1), in particular at the location of the paramagnetic center (NV1) and/or in particular at the location of the plurality (NVC) of paramagnetic centers (NV1) and/or in particular at the location of the NV center and/or in particular at the location of the plurality of NV centers.

Characteristic 2. Method according to characteristic [0395]

wherein a compensation signal (KS) with a third modulation, which is complementarily proportional to the first modulation and whose proportionality factor depends on the correlation value, is combined with the receiver output signal (S0) before its correlation with the first modulation, in particular by addition or in particular by substantially summing superposition.

Characteristic 3. Method (FIG. 4) for detecting the magnetic-field-dependent fluorescence of a quantum dot, in particular of a paramagnetic center (NV1) and/or in particular of a plurality (NVC) of paramagnetic centers (NV1) and/or in particular of a NV center and/or in particular of a plurality of NV centers, in the form of a fluorescence radiation (FL), comprising the following steps pumping the quantum dot, in particular the paramagnetic center (NV1) and/or in particular the plurality (NVC) of paramagnetic centers (NV1) and/or in particular the NV center and/or in particular the plurality of NV centers, with pump radiation (LB, LB1a, LB1b) at first times (T1) and non-pumping of the quantum dot, in particular the paramagnetic center (NV1) and/or in particular the plurality (NVC) of paramagnetic centers (NV1) and/or in particular the NV center and/or in particular the plurality of NV centers, at second times (T2) different from the first times (T1), wherein the first times (T1) and the second times (T2) alternate in their temporal order and do not overlap, and wherein the first times (T1) and the second times (T2) may be periods of time, and simultaneous modulation of the intensity of the pump radiation (LB, LB1a, LB1b) with a first modulation, wherein the quantum dot, in particular the paramagnetic center (NV1) and/or in particular the plurality (NVC) of paramagnetic centers (NV1) and/or in particular the NV center and/or in particular the plurality of NV centers, emits a fluorescence radiation (FL) in dependence on the magnetic flux density (B) or another physical parameter and on the pump radiation (LB, LB1a, LB1b), and wherein the fluorescence radiation (FL) is modulated with a second modulation, and wherein the second modulation comprises first modulation components of the first modulation, and wherein the first modulation components are shifted by a fluorescence phase shift time ($\Delta TFL$) with respect to the first modulation;

detecting the fluorescence radiation (FL) in the form of a receiver output signal (S0) at second times (T2);
detecting the modulation component of the receiver output signal (S0), which is synchronous with a modulation complementary to the first modulation, at second times (T2) in the form of a correlation value;
use and/or provision and/or dissemination of this correlation value as a measured value for the magnetic flux density (B) or another physical parameter at the location of the quantum dot (NV1), in particular at the location of the paramagnetic center (NV1) and/or in particular at the location of the plurality (NVC) of paramagnetic centers (NV1) and/or in particular at the location of the NV center and/or in particular at the location of the plurality of NV centers.

Characteristic 4. Method according to characteristic [0397]
wherein a compensation signal (KS) with a third modulation, which is complementarily proportional to the first modulation and whose proportionality factor depends on the correlation value, is combined with the receiver output signal (S0) before its correlation with the first modulation, in particular by addition and/or in particular by substantially summing superposition.

Characteristic 5. Method (FIG. 5) for detecting the magnetic field-dependent fluorescence of a quantum dot, in particular of a paramagnetic center (NV1) and/or in particular of a plurality (NVC) of paramagnetic centers (NV1) and/or in particular of a NV center and/or in particular of a plurality of NV centers, in the form of a fluorescence radiation (FL)
pumping the quantum dot, in particular the paramagnetic center (NV1) and/or in particular the plurality (NVC) of paramagnetic centers (NV1) and/or in particular the NV center and/or in particular the plurality of NV centers, with pump radiation (LB, LB1a, LB1b) at first times (T1) and
non-pumping of the quantum dot, in particular the paramagnetic center (NV1) and/or in particular the plurality (NVC) of paramagnetic centers (NV1) and/or in particular the NV center and/or in particular the plurality of NV centers, at second times (T2) different from the first times (T1), and
non-pumping of the quantum dot, in particular the paramagnetic center (NV1) and/or in particular the plurality (NVC) of paramagnetic centers (NV1) and/or in particular the NV center and/or in particular the plurality of NV centers, at third times (T3) different from the first times (T1) and the second times (T2), and
wherein the first times (T1) and the second times (T2) and the third times (T3) immediately follow one another in the temporal order first time (T1), second time (T2), third time (T3), and
wherein a third time (T3) is immediately followed by a first time (T1) and
wherein the first times (T1) and the second times (T2) and the third times (T3) may be periods of time, and
simultaneous modulation of the intensity of the pump radiation (LB, LB1a, LB1b) with a first modulation and
wherein the quantum dot, in particular the paramagnetic center (NV1) and/or in particular the plurality (NVC) of paramagnetic centers (NV1) and/or in particular the NV center and/or in particular the plurality of NV centers, emits a fluorescence radiation (FL) in dependence on the magnetic flux density (B) or another physical parameter and on the pump radiation (LB, LB1a, LB1b), and wherein the fluorescence radiation (FL) is modulated with a second modulation, and
wherein the second modulation comprises first modulation components of the first modulation, and
wherein the first modulation components are shifted by a fluorescence phase shift time (ΔTFL) with respect to the first modulation,
detecting the fluorescence radiation (FL) in the form of a receiver output signal (S0) at second times (T2);
detecting the modulation component of the receiver output signal (S0), which is synchronous with a modulation complementary to the first modulation, at second times (T2) in the form of a correlation value,
combining the receiver output signal (S0) with a compensation signal which has a third modulation which is proportional to the first modulation at third times (T3) to the first time (T1) respectively preceding the third time (T3) in question and whose proportionality factor depends on the correlation value, in particular by addition and/or in particular by substantially summing superimposition,
wherein the first times (T1) and the second times (T2) and the third times (T3) immediately follow one another in the temporal order first time (T1), second time (T2), third time (T3), and
wherein a third time (T3) is immediately followed by a first time (T1), and
wherein the first times (T1) and the second times (T2) and the third times (T3) do not overlap in their temporal order, and
wherein the first times (T1) and the second times (T2) and the third times (T3) may be periods of time, and
wherein the merging is performed before determining the correlation between the receiver output signal (S0) and first modulation, and
use and/or provision and/or dissemination of this correlation value as a measured value for the magnetic flux density (B) or another physical parameter at the location of the quantum dot, in particular at the location of the paramagnetic center (NV1) and/or in particular at the location of the plurality (NVC) of paramagnetic centers (NV1) and/or in particular at the location of the NV center and/or in particular the plurality of NV centers.

Characteristic 6. Method (FIG. 6) for detecting the magnetic field-dependent fluorescence of a quantum dot, in particular of a paramagnetic center (NV1) and/or in particular of a plurality (NVC) of paramagnetic centers (NV1) and/or in particular of a NV center and/or in particular of a plurality of NV centers, in the form of a fluorescence radiation (FL) with the steps:
pumping the quantum dot, in particular the paramagnetic center (NV1) and/or in particular the plurality (NVC) of paramagnetic centers (NV1) and/or in particular the NV center and/or in particular the plurality of NV centers, with pump radiation (LB, LB1a, LB1b) at first times (T1) and
non-pumping of the quantum dot, in particular the paramagnetic center (NV1) and/or in particular the plurality (NVC) of paramagnetic centers (NV1) and/or in particular the NV center and/or in particular the plurality of NV centers, at second times (T2) different from the first times (T1), wherein the first times (T1) and the second times (T2) alternate in their temporal order and do not overlap, and
wherein the first times (T1) and the second times (T2) can be periods of time, and simultaneous modulation of the intensity of the pump radiation (LB, LB1a, LB1b) with a first modulation, and wherein the quantum dot, in particular the paramagnetic center (NV1) and/or in particular the plurality (NVC) of paramagnetic centers (NV1) and/or in particular the NV center and/or in particular the plurality of NV centers, emits a fluorescence radiation (FL) in dependence on the magnetic flux density (B) or another physical parameter and on the pump radiation (LB, LB1a, LB1b) and wherein the fluorescence radiation (FL) is modulated with a second modulation, and wherein the second modulation comprises first modulation components of the first modulation, and wherein the first modulation components are shifted by a fluorescence phase shift time (ΔTFL) with respect to the first modulation, detecting fluorescence radiation (FL) in the form of a receiver output signal (S0) at shifted first times (T1') that are shifted by a fluorescence phase shift time (ΔTFL) relative to the first times (T1), wherein the second times (T2) are different from the first times (T1), and wherein the first times (T1) and the second times (T2) alternate in their temporal order and do not overlap, and wherein the first times (T1) and the second times (T2) can be periods of time;

detection of the modulation component of the receiver output signal (S0), which is synchronous with a modulation complementary to the first modulation, at shifted first times (T1') in the form of a correlation value, use and/or provision and/or dissemination of this correlation value as a measured value for the magnetic flux density (B) or another physical parameter at the location of the quantum dot (NV1), in particular at the location of the paramagnetic center (NV1) and/or in particular at the location of the plurality (NVC) of paramagnetic centers (NV1) and/or in particular at the location of the NV center and/or in particular at the location of the plurality of NV centers.

Characteristic 7. Method according to characteristic [0397]

wherein a compensation signal with a third modulation, which is complementarily proportional to the first modulation and whose proportionality factor depends on the correlation value, is combined with the receiver output signal (S0) before its correlation with the first modulation, in particular by addition and/or in particular by substantially summing superposition.

Characteristic 8. Method (FIG. 7) for detecting the magnetic field-dependent fluorescence of a quantum dot, in particular of a paramagnetic center (NV1) and/or in particular of a plurality (NVC) of paramagnetic centers (NV1) and/or in particular of a NV center and/or in particular of a plurality of NV centers, in the form of a fluorescence radiation (FL) with the steps:

pumping the quantum dot, in particular the paramagnetic center (NV1) and/or in particular the plurality (NVC) of paramagnetic centers (NV1) and/or in particular the NV center and/or in particular the plurality of NV centers, with pump radiation (LB, LB1a, LB1b) at first times (T1) and non-pumping of the quantum dot, in particular the paramagnetic center (NV1) and/or in particular the plurality (NVC) of paramagnetic centers (NV1) and/or in particular the NV center and/or in particular the plurality of NV centers, at second times (T2), wherein the second times (T2) are different from the first times (T1), and wherein the second times (T2) and the first times (T1) alternate in the time sequence, and wherein the first times (T1) do not overlap with the second times (T2), and wherein the first times (T1) and the second times (T2) may be periods of time, and non-pumping of the quantum dot (NV1), in particular the paramagnetic center (NV1) and/or in particular the plurality (NVC) of paramagnetic centers (NV1) and/or in particular the NV center and/or in particular the plurality of NV centers, at third times (T3) different from the first times (T1) and the second times (T2), wherein the first times (T1) and the second times (T2) and the third times (T1) immediately follow one another in the temporal order first time (T1), second time (T2), third time (T3), and wherein a third time (T3) is immediately followed by a first time (T1), and wherein the first times (T1) and the second times (T2) and the third times (T3) may be periods of time, and simultaneous modulation of the intensity of the pump radiation (LB, LB1a, LB1b) with a first modulation, and wherein the quantum dot, in particular the paramagnetic center (NV1) and/or in particular the plurality (NVC) of paramagnetic centers (NV1) and/or in particular the NV center and/or in particular the plurality of NV centers, emits a fluorescence radiation (FL) in dependence on the magnetic flux density (B) or another physical parameter and the pump radiation (LB, LB1a, LB1b) and wherein the fluorescence radiation (FL) is modulated with a second modulation, and wherein the second modulation comprises first modulation components of the first modulation, and wherein the first modulation components are shifted by a fluorescence phase shift time (ΔTFL) with respect to the first modulation, detecting fluorescence radiation (FL) in the form of a receiver output signal (S0) at shifted first times (T1') which are shifted by a fluorescence phase shift time (ΔTFL) with respect to the first times (T1), and detecting the modulation component of the receiver output signal (S0), which is synchronous with a modulation complementary to the first modulation, at shifted first times (T1') in the form of a correlation value, and combining the receiver output signal (S0) with a compensation signal having a third modulation which is proportional to the first modulation at third times (T3) to the first time (T1) respectively preceding the respective third time (T3) and whose proportionality factor depends on the correlation value, wherein the merging is performed before determining the correlation between the receiver output signal (S0) and first modulation, and use and/or provision and/or dissemination of this correlation value as a measured value for the magnetic flux density (B) or another physical parameter at the location of the quantum dot, in particular at the location of the paramagnetic center (NV1) and/or in particular at the location of the plurality (NVC) of paramagnetic centers (NV1) and/or in particular at the location of the NV center and/or in particular at the location of the plurality of NV centers.

Characteristic 9. Sensor system (NVMS) characterized in that,
it comprises means and/or apparatus parts which are intended or set up for carrying out a method according to one or more of the characteristics [0395] to [0402] to be carried out.

Characteristic 10. Sensor system (NVMS) (FIG. 8)
with a correlator (CORR),
with a first pump radiation source (PL1),
with a first radiation receiver (PD1),
having at least one quantum dot, in particular in the form of a paramagnetic center (NV1) and/or a plurality (NVC) of paramagnetic centers (NV1) and/or an NV center and/or a plurality of NV centers, in at least one sensor element and/or in particular in the form of at least one NV center (NV1) or a plurality of NV centers in at least one diamond or a plurality of diamonds,
wherein the first pump radiation source (PL1) emits pump radiation (LB) in response to a transmission signal (S5), and
wherein the quantum dot (NV1), in particular the paramagnetic center (NV1) and/or in particular the plurality (NVC) of paramagnetic centers (NV1) and/or in particular the NV center and/or in particular the plurality of NV centers, emit fluorescence radiation (FL) as a function of the magnetic flux density (B) or another physical parameter at the location of the quantum dot, in particular at the location of the paramagnetic center (NV1) and/or in particular at the location of the plurality (NVC) of paramagnetic centers (NV1) and/or in particular at the location of the NV center and/or in particular at the location of the plurality of NV centers, and as a function of the pump radiation (LB), in particular as a function of the intensity of the pump radiation (LB), and
wherein the first radiation receiver (PD1) receives the fluorescence radiation (FL) and converts it into a receiver output signal (S0), and
wherein the correlator (CORR) correlates the receiver output signal (S0) with the transmission signal (S5) and as a result of this correlation generates a measured value signal in the form of an output signal (out) with a measured value for the magnetic flux density (B) or the other physical parameter.

Characteristic 11. Sensor system (NVMS) (FIG. 9)
with a correlator (CORR),
with a first pump radiation source (PL1),
with a first radiation receiver (PD1),
with a measuring phase shift unit (ΔTm),
with at least one quantum dot (NV1), in particular a paramagnetic center (NV1) and/or in particular a plurality (NVC) of paramagnetic centers (NV1) and/or in particular an NV center and/or in particular a plurality of NV centers, in at least one sensor element and/or in particular in the form of at least one NV center (NV1) or a plurality of NV centers in at least one or more diamonds,
wherein the first pump radiation source (PL1) emits pump radiation (LB) in response to a transmission signal (S5), and
wherein the measurement phase shift unit (ΔTm) delays the transmission signal (S5) by a measurement phase shift time (ATM) with respect to the measured value signal (MES), and wherein the quantum dot, in particular the paramagnetic center (NV1) and/or in particular the plurality (NVC) of paramagnetic centers (NV1) and/or in particular the NV center and/or in particular the plurality of NV centers, emit fluorescence radiation (FL) as a function of the magnetic flux density (B) or as a function of another physical parameter at the location of the quantum dot, in particular at the location of the paramagnetic center (NV1) and/or in particular at the location of the plurality (NVC) of paramagnetic centers (NV1) and/or in particular at the location of the NV center and/or in particular at the location of the plurality of NV centers, and as a function of pump radiation (LB), in particular as a function of the intensity of the pump radiation (LB), is emitted and
wherein the first radiation receiver (PD1) receives the fluorescence radiation (FL) and converts it into a receiver output signal (S0), and
wherein the correlator (CORR) correlates the receiver output signal (S0) with the measured value signal (MES) and as a result of this correlation generates a measured value signal in the form of an output signal (out) with a measured value, in particular for the magnetic flux density (B) or for another physical parameter.

Characteristic 12. Sensor system (NVMS) (FIG. 10)
with a correlator (CORR),
with a first pump radiation source (PL1);
with a first radiation receiver (PD1),
with a measuring phase shift unit (ΔTm),
with at least one quantum dot, in particular the paramagnetic center (NV1) and/or in particular the plurality (NVC) of paramagnetic centers (NV1) and/or in particular the NV center and/or in particular the plurality of NV centers, in at least one sensor element and/or in particular in the form of at least one or more NV centers (NV1) in at least one or more diamonds,
wherein the first pump radiation source (PL1) emits pump radiation (LB) in response to a transmission signal (S5), and
wherein the measuring phase shift unit (ΔTm) delays and inverts the transmission signal (S5) by a measuring phase shift time (ATM) with respect to the measured signal (MES), or wherein the measuring phase shift unit (ΔTm) generates a measured value signal (MES) from the transmission signal (S5) which is complementary to the transmission signal (S5), and
wherein the quantum dot, in particular the paramagnetic center (NV1) and/or in particular the plurality (NVC) of paramagnetic centers (NV1) and/or in particular the NV center and/or in particular the plurality of NV centers, emits fluorescence radiation (FL) as a function of the magnetic flux density (B) or as a function of another physical parameter, at the location of the quantum dot, in particular at the location of the paramagnetic center (NV1) and/or in particular at the location of the plurality (NVC) of paramagnetic centers (NV1) and/or in particular at the location of the NV center and/or in particular at the location of the plurality of NV centers, and as a function of the pump radiation (LB), in particular as a function of the intensity of the pump radiation (LB), emitted and
wherein the first radiation receiver (PD1) receives the fluorescence radiation (FL) and converts it into a receiver output signal (S0), and
wherein the correlator (CORR) correlates the receiver output signal (S0) with the measurement signal (MES)

to form a first output signal (out) and, as a result of this correlation, generates a measured value signal, which depends on the first output signal (out), with a measured value, in particular for the magnetic flux density (B) or for another physical parameter.

Characteristic 13. Sensor system (NVMS) according to one or more of the characteristics [0403] to [0406] (FIG. 75)
wherein the at least one quantum dot, in particular the paramagnetic center (NV1) and/or in particular the plurality (NVC) of paramagnetic centers (NV1) and/or in particular the NV center and/or in particular the plurality of NV centers, is part of a sensor element which divides the shortest optical path from the first pump radiation source (PL1) to the first radiation receiver (PD1) in such a way, that the at least one quantum dot, in particular the paramagnetic center (NV1) and/or in particular the plurality (NVC) of paramagnetic centers (NV1) and/or in particular the NV center and/or in particular the plurality of NV centers, is optically closer to the first pump radiation source (PL1) than to the first radiation receiver (PD1).

Characteristic 14. Sensor system (NVMS) according to one or more of the characteristics [0403] to [0407]
wherein a first optical filter (F1) prevents pump radiation (LB) from the first pump radiation source (PL1) from reaching the first radiation receiver (PD1), and
wherein the first optical filter (F1) is transparent to fluorescence radiation (FL) of the quantum dot, in particular the paramagnetic center (NV1) and/or in particular the plurality (NVC) of paramagnetic centers (NV1) and/or in particular the NV center and/or in particular the plurality of NV centers.

Characteristic 15. Sensor system (NVMS) according to one or more of the characteristics [0403] to [0407]
with a compensating radiation source (PLK),
the compensation radiation (KS) of which also radiates into the first radiation receiver (PD1) in a summing superimposed manner, and
which is controlled by the correlator (CORR) so that the receiver output signal (S0) has essentially no more components of the transmission signal (S5).

Characteristic 16. Sensor system (NVMS) (FIG. 14) according to characteristics [0409] and characteristics [0406]
wherein the first optical filter (F1) is transparent for the radiation with the fluorescence wavelength (4) of the fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers, and is passed by this and
wherein the first optical filter (F1) is transparent to and passed by radiation having the compensating radiation wavelength ($\lambda_{ks}$) of the compensating radiation (KS) of the compensating radiation source (PLK), and
wherein the first optical filter (F1) is not transparent to, and is not passed by, radiation having the pump radiation wavelength ($\lambda_{pump}$) of the pump radiation (LB) from the first pump radiation source (PL1).

Characteristic 17. Sensor system (NVMS) (FIG. 13) according to one or more of the characteristics [0403] to [0407]
with a compensating radiation source (PLK),
which also radiates summing superimposed into the first radiation receiver (PD1), and
wherein the irradiation of the compensating radiation source (PLK) into the first radiation receiver (PD1) depends on the transmission signal (S5), and
wherein the emission of the pump radiation source (PL1) depends only indirectly on the transmission signal (S5), and
wherein here indirect means that the emission of the first pump radiation source (PL1) is controlled by the correlator (CORR) in such a way that the receiver output signal (S0) has essentially no more components of the transmission signal (S5).

Characteristic 18. Sensor element
wherein the sensing element comprises a plurality of crystals, at least a first crystal and a second crystal, and
wherein the sensing element comprises a plurality of quantum dots, at least a first quantum dot and a second quantum dot, and
wherein the first crystal comprises the first quantum dot, in particular a first paramagnetic center (NV1) and/or in particular a first plurality (NVC) of paramagnetic centers (NV1) and/or in particular a first NV center and/or in particular a first plurality of NV centers, and
wherein the second crystal comprises the second quantum dot, in particular a second paramagnetic center (NV2) and/or in particular a second plurality (NVC2) of paramagnetic centers (NV2) and/or in particular a second NV center and/or in particular a second plurality of NV centers, and
wherein the crystallographic axes of the first crystal and the second crystal of the sensing element are oriented differently (FIG. 15).

Characteristic 19. Sensor element according to characteristics [0412]
wherein the sensing element comprises more than 5 crystals and/or better than 10 crystals and/or better than 20 crystals and/or better than 50 crystals and/or better than 100 crystals and/or better than 200 crystals and/or better than 500 crystals and/or better than 1000 crystals and/or better than 2000 crystals and/or better than 5000 crystals having quantum dots.

Characteristic 20. Use of a plurality of diamonds as a sensor element having a plurality of NV centers and/or having clusters of a respective plurality of NV centers as paramagnetic centers (NV1) and/or as a plurality (NVC) of paramagnetic centers (NV1) and/or as quantum dots (NV1), in particular in a sensor system (NVMS) according to one or more of the characteristics [0403] to [0411] and/or in a method of the features [0395] to [0402]
wherein the crystallographic axes of at least two diamonds of the sensor element or elements and/or at least two crystals of the sensor element or elements are oriented differently (FIG. 15).

Characteristic 21. Sensor system (NVMS) (FIG. 16) according to one or more of the features [0403] to [0412]
wherein the sensor system (NVMS) comprises at least one sub-device, in particular a compensation coil (LC), and
wherein the sub-device is set up and/or provided to generate a magnetic field in the form of a magnetic flux density (B) as a function of a control signal, in particular an operating point control signal (S9) or a filter output signal (S4) or a first output signal (out) of the correlator (CORR), and
said magnetic field acting on a quantum dot, in particular a paramagnetic center (NV1) and/or in particular a plurality (NVC) of paramagnetic centers (NV1) and/or in particular a NV center and/or in particular a plurality of NV centers, and wherein the correlator (CORR) determines the magnetic flux density (B) at the location of the quantum dot, in particular at the location of the paramagnetic center (NV1) and/or in particular at the location of the plurality (NVC) of paramagnetic centers (NV1) and/or in particular at the location of the NV center and/or in particular at the location of the plurality of NV centers, which is generated by the sub-device, in particular a compensation coil (LC), is controlled by means of the control signal, in particular the operating point control signal (S9), or the filter output signal (S4) or the first output signal (out), and thus readjusted, in such a way that the receiver output signal (S0) no longer has any component of the transmission signal (S5), except for signal noise and control errors.

Characteristic 22. Sensor system (NVMS) (FIG. 17)
with a microcomputer (μC)
with a first pump radiation source (PL1),
with a quantum dot, in particular with a paramagnetic center (NV1) and/or in particular with a plurality (NVC) of paramagnetic centers (NV1) and/or in particular with one NV center and/or in particular with a plurality of NV centers in a sensor element and/or in particular with one or more NV centers in one or more diamonds,
with a first radiation receiver (PD1) of the fluorescence radiation (FL) of the quantum dot (NV1), in particular of the paramagnetic center (NV1) and/or in particular of the plurality (NVC) of paramagnetic centers (NV1) and/or in particular of the NV center and/or in particular of the plurality of NV centers, and substantially not receiving the pump radiation (LB),
with an analog-to-digital converter (ADC) that converts the receiver output signal (S0) of the first radiation receiver (PD1) into a digitized signal that is evaluated by the microcomputer (μC),
wherein the quantum dot, in particular the paramagnetic center (NV1) and/or in particular the plurality (NVC) of paramagnetic centers (NV1) and/or in particular the NV center and/or in particular the plurality of NV centers, emits fluorescence radiation (FL) as a function of the pump radiation (LB) and of the magnetic field (B) or another physical parameter at the location of the quantum dot, in particular the paramagnetic center (NV1) and/or in particular the plurality (NVC) of paramagnetic centers (NV1) and/or in particular the NV center and/or in particular the plurality of NV centers, and
wherein the first pump radiation source (PL1) is controlled by the microcomputer (μC), and
wherein the first pump radiation source (PL1) emits the pump radiation (LB), and
wherein the microcomputer (μC) determines and provides or passes on a measured value for the magnetic flux density (B) or the other physical parameter as a function of its control signal for the first pump radiation source (PL1) and of the digitized signal of the analog-to-digital converter (ADC).

Characteristic 23. Sensor system (NVMS) (FIG. 20, FIG. 16) according to one or more of the characteristics [0403] to [0416],
with one, two or three Helmholtz coil pairs ((L7, L3); (L2, L4); (L5, L6)) with a respective axis (AS1 to AS6) and/or a coil (LC) and/or another magnetic field generating partial device,
wherein the quantum dot (NV1), in particular the paramagnetic center (NV1) and/or in particular the plurality (NVC) of paramagnetic centers (NV1) and/or in particular the NV center and/or in particular the plurality of NV centers, of the sensor system (NVMS) according to one or more of the characteristics [0403] to [0416] interacting with the magnetic flux density (B) of the magnetic field of the one, two or three Helmholtz coil pairs ((L7, L3); (L2, L4); (L5, L6)) and/or of the coil (LC) and/or of the other magnetic field generating sub-device, and
with means, in particular a 1D or a 2D or 3D B field generation and/or one or more coil drivers, for energizing the one, two or three or more Helmholtz coil pairs ((L7, L3); (L2, L4); (L5, L6)) and/or the coil (LC) and/or the other magnetic field generating sub-device and
wherein the energization of the Helmholtz coil pairs ((L7, L3); (L2, L4); (L5, L6)) and/or of the coil (LC) and/or of the other magnetic field generating sub-device depends on the fluorescence radiation (FL) of the quantum dot (NV1), in particular of the paramagnetic center (NV1) and/or in particular with the plurality (NVC) of paramagnetic centers (NV1) and/or in particular of the NV center and/or in particular of the plurality of NV centers.

Characteristic 24. Sensor system (NVMS) (FIG. 20) according to characteristics [0417],
with a microcomputer (μC) and/or a correlator (CORR) and
wherein the means, in particular the 1D or 2D or 3D B field generating means and/or the one or more coil drivers, energize the one, two or three or more Helmholtz coil pairs ((L7, L3); (L2, L4); (L5, L6)) and/or the coil (LC) and/or the other magnetic field generating sub-device in response to one or more control signals from the microcomputer (μC) and/or the correlator (CORR), and
wherein the energization of the Helmholtz coil pairs ((L7, L3); (L2, L4); (L5, L6)) and/or the coil (LC) and/or the other magnetic field generating sub-device is controlled by the microcomputer (μC) and/or a correlator (CORR) by means of said control signal(s).

Characteristic 25. Sensor system (FIG. 19 & FIG. 16) according to feature [0418]
wherein the microcomputer (μC) and/or the correlator (CORR) controls the energization of a Helmholtz coil pair of the Helmholtz coil pairs ((L7, L3); (L2, L4); (L5, L6)) or a coil (LC) in such a way that the quantum dot, in particular the paramagnetic center (NV1) and/or in particular the plurality (NVC) of paramagnetic centers (NV1) and/or in particular the NV center and/or in particular the plurality of NV centers, behaves in such a way as if along the axis of said pair of Helmholtz coils the vector of the magnetic flux density (B) had no directional component in said direction of the axis (AS1 to AS6) of said pair of Helmholtz coils or, respectively, of said coil (LC), which is different from an amount of the flux density (B), the magnetic field value amount, of zero of this coil (LC).

Characteristic 26. Sensor system (FIG. 19) according to one or more of the characteristics [0417] to [0419]
with coil drivers for energizing a 1D or 2D or 3D B field generating device, which may comprise in particular Helmholtz coil pairs ((L7, L3); (L2, L4); (L5, L6)) and/or a coil (LC) and/or which may comprise another magnetic field generating sub-device,
wherein the energization of the 1D or 2D or 3D B field generation by the coil drivers is controlled by a microcomputer (μC) or by the microcomputer (μC) as a function of its control signal for the first pump radiation source (PL1) and of the digitized signal or of another signal dependent on the fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers.

Characteristic 27. Sensor system (NVMS) (FIG. 18b) according to one or more of the characteristics [0403] to [0420]
wherein a permanent magnetic field of a permanent magnet (PM1, PM2) or at least temporarily permanently energized electromagnet acts on the quantum dot, in particular the paramagnetic center (NV1) and/or in particular the plurality (NVC) of paramagnetic centers (NV1) and/or in particular the NV center and/or in particular the plurality of NV centers.

Characteristic 28. A method for detecting a ferromagnetic or a magnetic field modifying object (FOB) and for generating an associated measured value (FIG. 20), comprising the steps of
providing a sensor system (NVMS) according to one or more of the characteristics [0403] to [0421]
detection of the magnetic field or the magnetic flux density (B) or the magnetic field disturbance of the object (FOB) by a quantum dot, in particular a paramagnetic center (NV1) and/or in particular a plurality (NVC) of paramagnetic centers (NV1) and/or in particular a NV center and/or in particular a plurality of NV centers of the sensor system (NVMS) and generation of a measurement signal (out) representing the measured value at least temporarily,
the measured value being formed as a function of the magnetic flux density (B) or another physical parameter at the location of the quantum dot, in particular at the location of the paramagnetic center (NV1) and/or in particular at the location of the plurality (NVC) of paramagnetic centers (NV1) and/or in particular at the location of the NV center and/or in particular at the location of the plurality of NV centers.

Characteristic 29. Method according to characteristic [0422] (FIG. 20) with the step
Inferring the position of the object (FOB) as a function of the measured value of the measurement signal (out) in the form of position information, and
if necessary, use of this position information, in particular for the control of a device, especially a mobile device.

Characteristic 30. Position sensor
with a sensor system (NVMS) according to one or more of the characteristics [0403] to [0421],
wherein the position sensor comprises a method according to one or more of the characteristics [0422] to [0423] and generates and/or holds and/or outputs a measured value for position information.

Characteristic 31. Position sensor
with a sensor system (NVMS) according to one or more of the characteristics [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers.

Characteristic 32. Microphone (FIG. 21)
with a quantum dot, in particular with a paramagnetic center (NV1) and/or in particular with a plurality (NVC) of paramagnetic centers (NV1) and/or in particular with a NV center and/or in particular with a plurality of NV centers,
with means, in particular a ferromagnetic membrane (ME) and/or a magnetic field modifying membrane (ME), for coupling the signal of the fluorescence radiation (FL) of the quantum dot (NV1), in particular of the paramagnetic center (NV1) and/or in particular of the plurality (NVC) of paramagnetic centers (NV1) and/or in particular of the NV center and/or in particular of the plurality of NV centers, to an incident acoustic wave (AW) and
with means, in particular one or more sensor systems (NVMS), for detecting the fluorescence radiation (FL) of the quantum dot (NV1), in particular of the paramagnetic center (NV1) and/or in particular of the plurality (NVC) of paramagnetic centers (NV1) and/or in particular of the NV center and/or in particular of the plurality of NV centers, and converting the signal of the fluorescence radiation (FL) of the quantum dot (NV1), in particular of the paramagnetic center (NV1) and/or in particular of the plurality (NVC) of paramagnetic centers (NV1) and/or in particular of the NV center and/or in particular of the plurality of NV centers, and, in particular converting the time course of the value of the intensity (In) of the fluorescence radiation (FL) of the quantum dot and/or in particular converting the time course of the value of the fluorescence phase shift time ($\Delta$TFL) of the fluorescence radiation (FL) of the quantum dot into a microphone output signal, in particular in the form of the first output signal (out), or a functionally equivalent signaling,
wherein the microphone output signal, in particular in the form of the first output signal (out), or the function-equivalent signaling depend on the fluorescence radiation (FL) of the quantum dot (NV1), in particular of the paramagnetic center (NV1) and/or in particular of the plurality (NVC) of paramagnetic centers (NV1) and/or in particular of the NV center and/or in particular of the plurality of NV centers.

Characteristic 33. Microphone (FIG. 21)
with a ferromagnetic or magnetic field modifying, deflectable and oscillating diaphragm (ME) and
with a position sensor according to characteristics [0424] or [0425],
wherein the membrane (ME) covers the object (FOB) of the position sensor according to characteristics [0424] or [0425] and
wherein the position sensor generates and/or provides and/or outputs one or more measured values, in particular a time sequence of measured values, of position information for the deflection of the diaphragm (ME), and
wherein this position information represents the time course of the deflection of the membrane (ME) and thus the received sound signal of the acoustic wave (AW).

Characteristic 34. Microphone (FIG. 21)
with a sensor system (NVMS) according to one or more of the characteristics [0403] to [0421] and/or with a quantum dot (NV1), in particular with a paramagnetic center (NV1) and/or in particular with a plurality (NVC) of paramagnetic centers (NV1) and/or in particular with an NV center and/or in particular with a plurality of NV centers.

Characteristic 35. Method (FIG. 22) for distance measurement or other measurement of an object (Obj) comprising the steps of
- providing one or more microphones according to one or more of the characteristics [0426] to [0427];
- providing one or more sound transmitters, in particular one or more ultrasonic transmitters (USS);
- transmitting a sound wave, in particular an acoustic transmission wave (ASW), by one or more sound transmitters of the sound transmitters or the sound transmitters, in particular one or more ultrasonic transmitters (USS);
- modification of the sound wave, in particular an acoustic transmission wave (ASW), to a modified sound wave, in particular an acoustic wave (AW), by one or more objects (Obj) or an acoustic transmission path between the transmitting sound transmitters and a microphone of the possibly several microphones at the end of the acoustic transmission path;
- reception of the respective modified sound wave, in particular the acoustic wave (AW), by at least this microphone of the possibly several microphones;
- processing the microphone output signal of said microphone(s) at the end of the acoustic transmission path and inferring one or more characteristics of the one object (Obj) and/or one or more characteristics of the plurality of objects and/or one or more characteristics of the transmission path, in particular by a signal evaluation device,
- wherein inference to one or more properties of the one object (Obj) and/or the plurality of objects may comprise, in particular, any of the following properties of the one object and/or the plurality of objects:
  - distance of one or more of the objects (Obj) from the sound transmitter and/or microphone;
  - reflectivity of one or more of the objects (Obj);
  - object class of one or more of the objects (Obj);
  - integrity of one or more of the objects (Obj);
  - internal acoustic structure of one or more of the objects (Obj);
  - orientation of one or more of the objects (Obj);
  - direction of movement of one or more of the objects (Obj);
  - movement pattern of one or more of the objects (Obj);
  - flow velocity and/or flow direction of one or more of the objects (Obj);
  - density of one or more of the objects (Obj);
  - material of one or more of the objects (Obj);
  - temperature of one or more of the objects (Obj);
- and wherein closing on one or more characteristics of the transmission link may include, in particular, any of the following characteristics of the transmission link:
  - length of the transmission path between the sound transmitter and the microphone;
  - attenuation in the transmission path;
  - delay in the transmission path classification of the transmission path;
  - integrity of the transmission path;
  - internal acoustic structure of the transmission line;
  - orientation of the main intensity of the transmitted sound wave in the transmission path;
  - direction of movement of one or more of the objects (Obj) and/or media in the transmission path;
  - movement patterns of one or more of the objects (Obj) and/or one or more media or fluids in the transmission path;
  - flow velocity and/or flow direction of one or more of the objects (Obj) and/or media and/or fluids in the transmission path;
  - density of one or more of the objects (Obj) and/or media and/or fluids in the transmission path;
  - material of one or more of the objects (Obj) and/or media and/or fluids in the transmission path;
  - temperature of one or more of the objects (Obj) and/or media and/or fluids in the transmission path.

Characteristic 36. Distance measuring system (FIG. 22)
- with a sensor system (NVMS) according to one or more of the features [0403] to [0421] and/or with a quantum dot (NV1), in particular with a paramagnetic center (NV1) and/or in particular with a plurality (NVC) of paramagnetic centers (NV1) and/or in particular with an NV center and/or in particular with a plurality of NV centers.

Characteristic 37. Vehicle or mobile device (FIG. 22, 23)
- with one or more means which are intended and/or designed to carry out a process according to characteristic [0429] to be carried out.

Characteristic 38. Vehicle (motor vehicle) or mobile device (FIG. 22)
- with at least one quantum dot, in particular with a paramagnetic center (NV1) and/or in particular with a plurality (NVC) of paramagnetic centers (NV1) and/or in particular with a NV center and/or in particular with a plurality of NV centers, and
- wherein the quantum dot, in particular the paramagnetic center (NV1) and/or in particular the plurality (NVC) of paramagnetic centers (NV1) and/or in particular the NV center and/or in particular the plurality of NV centers, has a quantum dot state, and
- with means, in particular a sensor system (NVMS) or a control and evaluation device (AWV), for detecting the quantum dot state of the quantum dot, in particular of the paramagnetic center (NV1) and/or in particular of the plurality (NVC) of paramagnetic centers (NV1) and/or in particular of the NV center and/or in particular of the plurality of NV centers, and
- wherein the quantum dot state of the quantum dot, in particular of the paramagnetic center (NV1) and/or in particular of the plurality (NVC) of paramagnetic centers (NV1) and/or in particular of the NV center and/or in particular of the plurality of NV centers, depends on at least one operating state of the vehicle (motor vehicle), in particular the distance of the vehicle (motor vehicle) or of the mobile device from an object (Obj).

Characteristic 39. Vehicle (motor vehicle) or mobile device (FIG. 22)
- with at least one quantum dot, in particular with a paramagnetic center (NV1) and/or in particular with a plurality (NVC) of paramagnetic centers (NV1) and/or in particular with a NV center and/or in particular with a plurality of NV centers, and
- wherein the quantum dot, in particular the paramagnetic center (NV1) and/or in particular the plurality (NVC) of paramagnetic centers (NV1) and/or in particular the NV center and/or in particular the plurality of NV centers, has a quantum dot state, and
- having means, in particular a sensor system (NVMS) and/or a control and evaluation device (AWV), for detecting the quantum dot state of the quantum dot, in particular the paramagnetic center (NV1) and/or in particular the plurality (NVC) of paramagnetic centers (NV1) and/or in particular the NV center and/or in particular the plurality of NV centers, and wherein the operating state of the vehicle (motor vehicle) or of the mobile device, in particular the speed of the vehicle (motor vehicle) or of the mobile device, depends on the quantum dot state of the quantum dot, in particular of the paramagnetic center (NV1) and/or in particular of the plurality (NVC) of paramagnetic centers (NV1) and/or in particular of the NV center and/or in particular of the plurality of NV centers.

Characteristic 40. Vehicle (motor vehicle) or mobile device (FIG. 22)
  with at least one quantum dot, in particular with a paramagnetic center (NV1) and/or in particular with a plurality (NVC) of paramagnetic centers (NV1) and/or in particular with a NV center and/or in particular with a plurality of NV centers,
  wherein the quantum dot, in particular the paramagnetic center (NV1) and/or in particular the plurality (NVC) of paramagnetic centers (NV1) and/or in particular the NV center and/or in particular the plurality of NV centers, has a quantum dot state, and
  with means, in particular a sensor system (NVMS) or a control and evaluation device (AWV), for detecting the quantum dot state of the quantum dot, in particular of the paramagnetic center (NV1) and/or in particular of the plurality (NVC) of paramagnetic centers (NV1) and/or in particular of the NV center and/or in particular of the plurality of NV centers, and
  wherein the quantum dot state of the quantum dot, in particular of the paramagnetic center (NV1) and/or in particular of the plurality (NVC) of paramagnetic centers (NV1) and/or in particular of the NV center and/or in particular of the plurality of NV centers, depends on at least one parameter of the operating state of the vehicle (motor vehicle) or of the mobile device, in particular on the distance of the vehicle (motor vehicle) or of the mobile device from an object (Obj).

Characteristic 41. Vehicle (motor vehicle) or mobile device (FIG. 22)
  with at least one quantum dot, in particular with a paramagnetic center (NV1) and/or in particular with a plurality (NVC) of paramagnetic centers (NV1) and/or in particular with a NV center and/or in particular with a plurality of NV centers,
  wherein the quantum dot, in particular the paramagnetic center (NV1) and/or in particular the plurality (NVC) of paramagnetic centers (NV1) and/or in particular the NV center and/or in particular the plurality of NV centers, has a quantum dot state, and
  with means, in particular a sensor system (NVMS) or a control and evaluation device (AWV), for detecting the quantum dot state of the quantum dot, in particular of the paramagnetic center (NV1) and/or in particular of the plurality (NVC) of paramagnetic centers (NV1) and/or in particular of the NV center and/or in particular of the plurality of NV centers, and
  wherein at least one parameter of the operating state of the vehicle (motor vehicle) or of the mobile device, in particular the speed of the vehicle (motor vehicle) or of the mobile device, depends on the quantum dot state of the quantum dot (NV1), in particular of the paramagnetic center (NV1) and/or in particular of the plurality (NVC) of paramagnetic centers (NV1) and/or in particular of the NV center and/or in particular of the plurality of NV centers.

Characteristic 42. Vehicle (motor vehicle) or mobile device (FIG. 22)
  with at least one quantum dot, in particular with a paramagnetic center (NV1) and/or in particular with a plurality (NVC) of paramagnetic centers (NV1) and/or in particular with a NV center and/or in particular with a plurality of NV centers, and
  wherein the quantum dot, in particular the paramagnetic center (NV1) and/or in particular the plurality (NVC) of paramagnetic centers (NV1) and/or in particular the NV center and/or in particular the plurality of NV centers, has a quantum dot state, and
  with means, in particular a sensor system (NVMS) or a control and evaluation device (AWV), for detecting the quantum dot state of the quantum dot, in particular of the paramagnetic center (NV1) and/or in particular of the plurality (NVC) of paramagnetic centers (NV1) and/or in particular of the NV center and/or in particular of the plurality of NV centers, and
  wherein the fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers, depends on at least one parameter of the operating state of the vehicle (motor vehicle) or of the mobile device, in particular the distance of the vehicle (motor vehicle) or of the mobile device from an object (Obj).

Characteristic 43. Vehicle (motor vehicle) or mobile device (FIG. 22) according to characteristic [0432]
  wherein at least one operating parameter of the vehicle (motor vehicle) of the mobile device, in particular its speed or acceleration, is regulated or controlled as a function of the fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers, in particular by a control device of the vehicle (motor vehicle) or of the mobile device.

Characteristic 44. Vehicle (motor vehicle) or mobile device (FIG. 22)
  with a sensor system (NVMS) with at least one quantum dot, in particular with at least one paramagnetic center (NV1) and/or in particular with a plurality (NVC) of paramagnetic centers (NV1) and/or with at least one NV center and/or in particular with a plurality of NV centers.

Characteristic 45. Vehicle (motor vehicle) or mobile device (FIG. 22)
  with at least one quantum dot, in particular with at least one paramagnetic center (NV1) and/or in particular with a plurality (NVC) of paramagnetic centers (NV1) and/or with at least one NV center and/or in particular with a plurality of NV centers.

Characteristic 46. Method (FIG. 24) for receiving a sound wave
  first step (1): emission of an acoustic transmission wave (ASW) by a sound transmitter, in particular an ultrasonic transmitter (US1);
  second step (2): reflecting the acoustic transmission wave (ASW) by one or more objects (Obj) as an acoustic wave (AW) and/or modifying the acoustic transmission wave (ASW) by one or more objects (Obj) or the transmission channel to an acoustic wave (AW);

third step (3): vibrating a membrane (ME) with a ferromagnetic or magnetic field modifying sub-device by means of the reflected acoustic wave (AW);

fourth step (4): modulation of the magnetic flux density (B) at the location of a quantum dot, in particular at the location of a paramagnetic center (NV1) and/or in particular at the location of a plurality (NVC) of paramagnetic centers (NV1) and/or in particular at the location of a NV center and/or in particular at the location of a plurality of NV centers (NV1), of a sensor system (NVMS) by means of the oscillating membrane (ME);

fifth step (5): modulation of the fluorescence radiation (FL) of the quantum dot of the sensor system (NVMS) due to the modulation of the magnetic flux density (B) at the location of the quantum dot of the sensor system (NVMS);

sixth step (6): detecting the modulation of the fluorescence radiation (FL), in particular as a receiver output signal (S0) and in particular by a first radiation receiver (PD1) of the sensor system (NVMS);

seventh step (7): generation of one or more measured values and/or a time sequence of measured values, in particular by an evaluation circuit and/or evaluation unit, as a function of the receiver output signal (S0) and, if appropriate, use of these measured values, in particular for controlling vehicles (motor vehicles) or other mobile devices.

Characteristic 47. Receiver with a sensor system according to one or more of the characteristics [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers.

Characteristic 48. Receiver (FIG. 25)

with at least one quantum dot, in particular with a paramagnetic center (NV1) and/or in particular with a plurality (NVC) of paramagnetic centers (NV1) and/or in particular with a NV center and/or in particular with a plurality of NV centers, and having means, in particular an RF window, for coupling the signal of the fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers, to an incident electromagnetic wave (HFW), and with means, in particular a sensor system (NVMS) or a control and evaluation device (AWV), for detecting the fluorescence radiation (FL) of the quantum dot (NV1), in particular of the paramagnetic center (NV1) and/or in particular of the plurality (NVC) of paramagnetic centers (NV1) and/or in particular of the NV center and/or in particular of the plurality of NV centers, and conversion of the signal of the fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers, into a receiver output signal (S0) or a first output signal (out), wherein the receiver output signal (S0) and/or the first output signal (out) depends on the fluorescence radiation (FL) of the quantum dot, in particular the paramagnetic center (NV1) and/or in particular the plurality (NVC) of paramagnetic centers (NV1) and/or in particular the NV center and/or in particular the plurality of NV centers.

Characteristic 49. Method for receiving an electromagnetic wave (HFW) comprising the steps:

Reception of the electromagnetic wave (HFW), in particular by one or more receivers according to feature [0442], by means of the fluorescence radiation (FL) of a quantum dot, in particular of a paramagnetic center (NV1) and/or in particular of a plurality (NVC) of paramagnetic centers (NV1) and/or in particular of a NV center and/or in particular of a plurality of NV centers, and generation of a receiver output signal (S0) or of a first output signal (out) as a function of the fluorescence radiation (FL);

processing the receiver output signal (S0) and/or the first output signal (out), in particular of the one or more receivers according to characteristic and inferring one or more properties of the source of the received electromagnetic wave (HFW) or one or more properties of the electromagnetic wave (HFW) and/or one or more properties of the transmission channel between the source of the received electromagnetic wave and the quantum dot and/or possibly the receiver according to characteristic [0442], in particular by a signal evaluation device.

Characteristic 50. Method for distance measurement or other measurement of an object (Obj) or a transmission path comprising the steps of emitting an electromagnetic wave (HFW) by one or more transmitters or by the object (Obj);

modification of electromagnetic wave (HFW) to a modified electromagnetic wave (HFW) by one or more objects (Obj);

reception of the modified electromagnetic wave (HFW) and/or of the electromagnetic wave (HFW) by means of the fluorescence radiation (FL) of a quantum dot, in particular of a paramagnetic center (NV1) and/or in particular of a plurality (NVC) of paramagnetic centers (NV1) and/or in particular of a NV center and/or in particular of a plurality of NV centers, in particular by one or more receivers according to characteristic [0442];

processing the fluorescence radiation (FL) or signals which depend on the fluorescence radiation (FL), in particular possibly the output signals of the one or more receivers according to characteristic [0442], and inferring one or more characteristics of the one object (Obj) and/or of the plurality of objects (Obj) and/or of the transmission path between transmitter and quantum dot, in particular by a signal evaluation device, wherein inferring one or more properties of the one object (Obj) and/or the plurality of objects (Obj) may comprise, in particular, one of the following properties of the one object (Obj) and/or the plurality of objects (Obj):

distance of one or more of the objects (Obj) to the transmitter or distances of one or more of the objects (Obj) to the transmitters of the electromagnetic wave (HFW) and/or to the receiver according to characteristic [0442] or to the receivers according to characteristic [0442];

reflectivity of one or more of the objects (Obj) for the electromagnetic wave (HFW);

object class of one or more of the objects (Obj);

integrity of one or more of the objects (Obj);

internal dielectric and/or other electromagnetic structure of one or more of the objects (Obj);
orientation of one or more of the objects (Obj);
direction of movement of one or more of the objects (Obj);
movement pattern of one or more of the objects (Obj);
flow velocity and/or flow direction of one or more of the objects (Obj);
density of one or more of the objects (Obj);
material of one or more of the objects (Obj);
temperature of one or more of the objects (Obj);
wherein inferring one or more characteristics of the transmission link may include, in particular, any of the following characteristics of the transmission link:
length of the transmission distance between transmitter and quantum dot;
transmission characteristics of the transmission path between transmitter and quantum dot;
classification of the transmission path between transmitter and quantum dot in particular in classes according to predefined or determined prototypical feature vectors in particular by means of current feature vectors determined from the fluorescence radiation (FL), in particular by means of the emulation of a neural network or another artificial intelligence method, such as the emulation of a Markov or Hidden Markov Model (HMM model), machine learning, deep learning, Viterbi decoders, etc.;
integrity of the transmission path between transmitter and quantum dot;
internal dielectric and/or other electromagnetic structure of the transmission path between transmitter and quantum dot;
direction of movement of one or more of the objects (Obj) and or media or fluids within the transmission path between the transmitter and the quantum dot;
movement pattern of one or more of the objects (Obj) and or media or fluids within the transmission path between the transmitter and the quantum dot;
flow velocity and/or flow direction of media or fluids within the transmission path between transmitter and quantum dot;
density of one or more of the objects (Obj) and or media or fluids within the transmission path between the transmitter and the quantum dot;
material of one or more of the objects (Obj) and or media or fluids within the transmission path between the transmitter and the quantum dot;
temperature of one or more of the objects (Obj) and or media or fluids within the transmission path between the transmitter and the quantum dot.

Characteristic 51. Vehicle (motor vehicle) or mobile device
with one or more means which are intended and/or designed to carry out a process according to characteristics [0443] and/or [0444] to be carried out.

Characteristic 52. Vehicle (motor vehicle) (FIG. 22) or mobile device
with a sensor system (NVMS) according to one or more of the characteristics [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers.

Characteristic 53. Vehicle (motor vehicle) or mobile device (FIG. 22)
with at least one quantum dot, in particular with a paramagnetic center (NV1) and/or in particular with a plurality (NVC) of paramagnetic centers (NV1) and/or in particular with a NV center and/or in particular with a plurality of NV centers, and
wherein the quantum dot, in particular the paramagnetic center (NV1) and/or in particular the plurality (NVC) of paramagnetic centers (NV1) and/or in particular the NV center and/or in particular the plurality of NV centers, has a quantum dot state, and
having means, in particular a sensor system (NVMS) and/or a control and evaluation device (AWV), for detecting the quantum dot state of the quantum dot, in particular the paramagnetic center (NV1) and/or in particular the plurality (NVC) of paramagnetic centers (NV1) and/or in particular the NV center and/or in particular the plurality of NV centers, and
wherein the quantum dot state of the quantum dot, in particular of the paramagnetic center (NV1) and/or in particular of the plurality (NVC) of paramagnetic centers (NV1) and/or in particular of the NV center and/or in particular of the plurality of NV centers, depends on at least one operating state and/or parameter of the environment of the vehicle (motor vehicle) or of the mobile device, in particular of an electromagnetic radiation or field acting from outside on the vehicle (motor vehicle) or the mobile device,
wherein, in particular, the vehicle (motor vehicle) may be a motor vehicle or a missile or a drone or a robot or an airship or a balloon or an airplane or a rocket or a ship or a submarine or a submersible or a sea mine or a floating body or a floating device or a floating platform or a living being with an electronic guidance device which controls the living being or transmits data to it and/or receives data from it, or another device (motor vehicle) which is mobile at least temporarily.

Characteristic 54. Vehicle (motor vehicle) or mobile device (FIG. 22)
with at least one quantum dot, in particular with a paramagnetic center (NV1) and/or in particular with a plurality (NVC) of paramagnetic centers (NV1) and/or in particular with a NV center and/or in particular with a plurality of NV centers, and
wherein the quantum dot, in particular the paramagnetic center (NV1) and/or in particular the plurality (NVC) of paramagnetic centers (NV1) and/or in particular the NV center and/or in particular the plurality of NV centers, has a quantum dot state, and
having means, in particular a sensor system (NVMS) and/or a control and evaluation device (AWV), for detecting the quantum dot state of the quantum dot, in particular the paramagnetic center (NV1) and/or in particular the plurality (NVC) of paramagnetic centers (NV1) and/or in particular the NV center and/or in particular the plurality of NV centers, and
wherein the quantum dot state of the quantum dot, in particular of the paramagnetic center (NV1) and/or in particular of the plurality (NVC) of paramagnetic centers (NV1) and/or in particular of the NV center and/or in particular of the plurality of NV centers, is influenced by at least one parameter of the ambient state and/or at least one operating state parameter of the vehicle (motor vehicle) or of the mobile device, in particular by an electromagnetic radiation acting on the vehicle (motor vehicle) or the mobile device and/or an electromagnetic field occurring in the vehicle and/or in the mobile device and/or an electric current occurring in the vehicle (motor vehicle) and/or in the vicinity of the vehicle (motor vehicle) and/or in the mobile device and/or in the vicinity of the mobile device, in particular, for example, an inductive current and/or an inductive charging current and/or the like, and wherein, in particular, the vehicle (motor vehicle) may be a motor vehicle or a missile or a drone or a robot or an airship or a balloon or an airplane or a rocket or a ship or a submarine or a submersible or a sea mine or a floating body or a floating device or a floating platform or a living being with an electronic guidance device which controls the living being or transmits data to it and/or receives data from it, or another device (motor vehicle) which is mobile at least temporarily.

Characteristic 55. Vehicle (motor vehicle) or mobile device (FIG. 22)

with at least one quantum dot, in particular with a paramagnetic center (NV1) and/or in particular with a plurality (NVC) of paramagnetic centers (NV1) and/or in particular with a NV center and/or in particular with a plurality of NV centers, and wherein the quantum dot, in particular the paramagnetic center (NV1) and/or in particular the plurality (NVC) of paramagnetic centers (NV1) and/or in particular the NV center and/or in particular the plurality of NV centers, has a quantum dot state, and having means, in particular a sensor system (NVMS) and/or a control and evaluation device (AWV), for detecting the quantum dot state of the quantum dot (NV1), in particular the paramagnetic center (NV1) and/or in particular the plurality (NVC) of paramagnetic centers (NV1) and/or in particular the NV center and/or in particular the plurality of NV centers, and wherein the fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers, depends on at least one parameter of the environmental state of the vehicle (motor vehicle) or of the mobile device, in particular on an electromagnetic field acting on the vehicle (motor vehicle) or on the mobile device or on an electromagnetic wave acting on the vehicle or on the mobile device, and wherein in particular the vehicle (motor vehicle) may be a motor vehicle or a missile or a drone or a robot or an airship or a balloon or an aircraft or a rocket or a ship or a submarine or a submersible or a sea mine or a floating body or a floating device or a floating platform or a living being with an electronic guidance device which controls the living being and/or transmits data to it and/or receives data from it, or any other at least temporarily mobile device (motor vehicle).

Characteristic 56. mobile device (motor vehicle) (FIG. 22)

with a sensor system (NVMS) with at least one quantum dot, in particular with a paramagnetic center (NV1) and/or in particular with a plurality (NVC) of paramagnetic centers (NV1) and/or in particular with an NV center and/or in particular with a plurality of NV centers and wherein in particular the vehicle (motor vehicle) may be a motor vehicle or a missile or a drone or a robot or an airship or a balloon or an aircraft or a rocket or a ship or a submarine or a submersible or a sea mine or a floating body or a floating device or a floating platform or a living being with an electronic guidance device which controls the living being and/or transmits data to it and/or receives data from it, or any other at least temporarily mobile device (motor vehicle).

Characteristic 57. mobile device (motor vehicle) (FIG. 22)

with at least one quantum dot, in particular with a paramagnetic center (NV1) and/or in particular with a plurality (NVC) of paramagnetic centers (NV1) and/or in particular with a NV center and/or in particular with a plurality of NV centers and wherein in particular the vehicle may be a motor vehicle or a missile or a drone or a robot or an airship or a balloon or an airplane or a rocket or a ship or a submarine or a submersible or a sea mine or a floating body or a floating device or a floating platform or a living being with an electronic guidance device which controls the living being and/or transmits data to it and/or receives data from it, or another at least temporarily mobile device (motor vehicle).

Characteristic 58. Component (FIG. 23) of a mobile device and/or a vehicle (motor vehicle), in particular a bumper, wherein the device comprises a quantum dot and/or wherein the component comprises a paramagnetic center (NV1) and/or wherein the component comprises a plurality (NVC) of paramagnetic centers (NV1) and/or wherein the component comprises a NV center and/or wherein the component comprises a plurality of NV centers and/or wherein the component is a sensor system (NVMS) according to one or more of the characteristics [0403] to [0421] or a control and evaluation device (AWV) for a quantum dot, in particular for a paramagnetic center (NV1) and/or in particular for a plurality (NVC) of paramagnetic centers (NV1) and/or in particular for an NV center and/or in particular for a plurality of NV centers, and/or wherein the component comprises a position sensor according to characteristics [0424] and/or [0425] and/or wherein the component is a microphone according to one or more of the characteristics [0426] to [0428] and/or wherein the component comprises a receiver according to characteristics [0441] or [0442] and wherein in particular the component is a position sensor or a microphone or a receiver or an acoustic receiver or an impedance spectrometer or a distance measuring system or a current measuring device or a current density meter or a magnetic compass or a monitoring device, in particular a medical monitoring device, or a switch or a button or an actuator or a rotary angle sensor or a pressure measuring device or a flow measuring device or an inclination angle sensor or a commutation device for an electric motor or a commutation device for an electric machine, which may also comprise and/or be a nanoscale device and/or one or more molecules, or a component of a mobile device (motor vehicle) or of a vehicle (motor vehicle) or of a motor vehicle or of a missile or of a drone or of a robot or of an airship or of a balloon or of an aircraft or of a rocket or of a ship or of a submarine or of a submersible or of a sea mine or of a floating body or of a floating device or of a floating platform or of an electronic guidance device, which controls a living being and/or transmits data to the living being and/or receives data from the living being, or any other at least temporarily mobile device (motor vehicle).

Characteristic 59. Component (FIG. 23) for a vehicle (motor vehicle) or mobile device
- with a sensor system (NVMS) according to one or more of the characteristics [0403] to [0421] and/or with a quantum dot (NV1), in particular with a paramagnetic center (NV1) and/or in particular with a plurality (NVC) of paramagnetic centers (NV1) and/or in particular with an NV center and/or in particular with a plurality of NV centers,
- wherein in particular the component is a position sensor or a microphone or a receiver or an acoustic receiver or an impedance spectrometer or a distance measuring system or a current measuring device or a current density meter or a magnetic compass or a monitoring device, in particular a medical monitoring device, or a switch or a button or an actuator or a rotary angle sensor or a pressure measuring device or a flow measuring device or an inclination angle sensor or a commutation device for an electric motor or a commutation device for an electric machine, which may also comprise and/or consist of a nanoscale device and/or one or more molecules, or a component of a mobile device (motor vehicle) or of a vehicle (motor vehicle) or of a motor vehicle or of a missile or of a drone or of an airship or of a balloon or of a plane or of a rocket or of a ship or of a submarine or of a submersible or of a sea mine or of a floating body or of a floating device or of a floating platform or of an electronic guidance device which guides a living being, e.g. by means of electrical pulses via electrodes whose electrical potential is controlled, for example, by said microcomputer (μC) as a function of a state of one or more quantum dots, for example as part of a neuro-interface, and/or transmits data to and/or receives data from the living being, or any other at least temporarily mobile device.

Characteristic 60. Current measuring device (FIG. 26)
- with a ladder (CON),
- with a sensor system (NVMS) according to one or more of the characteristics [0403] to [0421],
- with a compensation system (L7, AMP, LC),
- with a magnetic circuit (J1),
- wherein the sensor system (NVMS) outputs a first measured value signal (MS1), for example a first output signal (out), and
- wherein the magnetic circuit (J1), apart from air gaps, comprises at least one opening, i.e., has a topological gender greater than 0, and
- wherein the conductor (CON) is passed through said at least one opening, and
- wherein the sensor system (NVMS) and/or a sensor element with a paramagnetic center (NV1) and/or a sensor element with a plurality (NVC) of paramagnetic centers (NV1) and/or a sensor element with an NV center and/or a sensor element with a plurality of NV centers of the sensor system (NVMS) is inserted into the magnetic circuit (J1), in particular into a first air gap (LSP1) of the magnetic circuit (J1), and
- wherein the compensation system (L7, AMP) having means (L7) for readjusting the magnetic excitation H of the magnetic circuit (J1) as a function of the first measured value signal (MS1) of the sensor system (NVMS) in such a way that the magnetic flux (B) at the location of the quantum point of the sensor system (NVMS), in particular at the location of the paramagnetic center (NV1) and/or in particular at the location of the plurality (NVC) of paramagnetic centers (NV1) and/or in particular at the location of this NV center and/or in particular at the location of the plurality of NV centers of the sensor system (NVMS), is constant, and
- wherein the first measured value signal (MS1) represents a measure of an electric current ($I_m$) through the conductor (CON).

Characteristic 61. Current measuring device (FIG. 26)
- with a ladder (CON),
- with a sensor system (NVMS) according to one or more of the characteristics [0403] to [0421], with a compensation system (L7, AMP, LC),
- wherein the sensor system (NVMS) outputs a first measured value signal (MS1), for example a first output signal (out), and
- wherein the conductor (CON) is arranged relative to the sensor system (NVMS) and/or relative to the sensor element of the sensor system (NVMS) with a paramagnetic center (NV1) and/or relative to the sensor element of the sensor system (NVMS) with a plurality (NVC) of paramagnetic centers (NV1) and/or relative to the sensor element of the sensor system (NVMS) with an NV center and/or relative to the sensor element of the sensor system (NVMS) with a plurality of NV centers such that that an electric current through the conductor (CON) changes the magnetic flux (B) at the location of the quantum point, in particular at the location of the paramagnetic center (NV1) and/or in particular at the location of the plurality (NVC) of paramagnetic centers (NV1) and/or in particular at the location of this NV center and/or in particular at the location of the plurality of NV centers, of the sensor element of the sensor system (NVMS), and
- wherein the compensation system (L7, AMP, LC) having means (L7) for readjusting the magnetic flux (B) at the location of the quantum dot, in particular at the location of the paramagnetic center (NV1) and/or in particular at the location of the multiplicity (NVC) of paramagnetic centers (NV1) and/or in particular at the location of this NV center and/or in particular at the location of the multiplicity of NV centers, of the sensor element of the sensor system (NVMS) as a function of the first measured value signal (MS1) in such a way that this is constant, and
- wherein the first measured value signal (MS1) represents a measure of an electric current ($I_m$) through the conductor (CON).

Characteristic 62. Current measuring device (FIG. 27)
- with a sensor system (NVMS) according to one or more of the characteristics [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers.

Characteristic 63. Current measuring device (FIG. 26)
- with a ladder (CON),
- with a quantum dot, in particular with a paramagnetic center (NV1) and/or in particular with a plurality (NVC) of paramagnetic centers (NV1) and/or in particular with an NV center and/or in particular with a plurality of NV centers, and
- with a compensation system (L8, AMP, LC),
- with a yoke (J1), in particular made of a ferromagnetic material, and with a control and evaluation device (AWV) and
wherein the yoke (J1) has a first air gap (LSP1) and
where the quantum dot is located in the first air gap (LSP1) and
wherein the control and evaluation device (AWV) causes the quantum dot
wherein the fluorescence radiation (FL) depends on the electric current ($I_m$) through the conductor (CON), and
wherein the control and evaluation device (AWV) generates a first measured value signal (MS1), for example a first output signal (out), at least secondarily as a function of the fluorescence radiation (FL), and
wherein the conductor (CON) is arranged relative to the quantum dot such that an electric current ($I_m$) through the conductor (CON) changes the magnetic flux (B) at the location of the quantum dot, and
wherein the yoke (J1), neglecting the first air gap (LSP1), has a topological gender greater than 0 (I.e., has a hole or opening (OE). So, for example it is a torus), and
wherein the conductor (CON) is placed in the opening (OE), and
wherein the compensation system (L8, AMP, LC) having means (L8), in particular a compensation coil (L8, LC), for readjusting the magnetic flux (B) at the location of the quantum dot as a function of the first measured value signal (MS1) in such a way that it is constant, and
wherein in particular these means preferably comprising a coil (L8) generating a magnetic excitation in the form of a magnetic field strength H in the yoke (J1) in such a way that the magnetic flux (B) at the location of the quantum dot depends on this magnetic excitation in the form of a magnetic field strength H, and
wherein the first measured value signal (MS1) represents a measure of an electric current ($I_m$) through the conductor (CON).

Characteristic 64. Current measuring device (FIG. 47)
with a magnetic circle and
with an excitation coil which, when energized, floods the magnetic circuit with a magnetic excitation in the form of a magnetic field strength H and
with an air gap,
having a sensor system (NVMS) with a quantum dot and a control and evaluation device (AWV) according to one or more of the characteristics [0403] to [0421] or with a control and evaluation device (AWV) with a quantum dot, and
wherein the sensor system (NVMS) is a sensor system (NVMS) according to one or more of the characteristics [0403] to [0421], and
wherein the quantum dot can be in particular a paramagnetic center (NV1) and/or in particular a plurality (NVC) of paramagnetic centers (NV1) and/or in particular a NV center and/or in particular a plurality of NV centers, and
wherein in the air gap is the quantum dot and
wherein the quantum dot emits fluorescence radiation (FL) at least secondarily, and
wherein the fluorescence radiation (FL) depends on the magnetic flux density (B) and/or other physical parameters, and
wherein the control and evaluation device (AWV) detects the fluorescence radiation (FL) of the quantum dot and generates and/or signals and/or provides a measured value for the magnetic flux density (B) at the location of the quantum dot in the air gap or a parameter of the other physical parameters, and
wherein the measured value is a measure of the electric current through the excitation coil.

Characteristic 65. Sensor system (NVMS) (FIG. 28)
with a sensor system (NVMS) according to one or more of the characteristics [0403] to [0421]
wherein the sensor system (NVMS) comprises a housing (WA, DE; BO) in which all components of the sensor system (NVMS) are arranged except for a quantum dot which can be in particular a paramagnetic center (NV1) and/or in particular a plurality (NVC) of paramagnetic centers (NV1) and/or in particular an NV center and/or in particular a plurality of NV centers, and
wherein the quantum dot of the sensor system (NVMS) is located outside the housing (WA, DE; BO), and
wherein the quantum dot of the sensor system (NVMS) is coupled to functional elements of the sensor system (NVMS) by means of an optical system of optical functional elements, in particular preferably comprising one or two optical waveguides (LWL1, LWL2) or lenses or mirrors etc.

Characteristic 66. Measuring system (FIG. 29 and FIG. 30)
with a sensor system (NVMS), in particular according to one or more of the characteristics [0403] to [0421] and optionally in particular according to characteristic [0459],
wherein the sensor system (NVMS) comprises a control and evaluation device (AWV) and a quantum dot, and
wherein the quantum dot can be in particular a paramagnetic center (NV1) and/or in particular a plurality (NVC) of paramagnetic centers (NV1) and/or in particular a NV center and/or in particular a plurality of NV centers, and
with a fluidic functional element, in particular a tube or in particular a fluidic conduit (RO), or a vessel or a reactor or a plasma chamber or a combustion chamber, and
wherein the quantum dot is arranged within the fluidic functional element, i.e. in particular the tube or in particular the fluidic conduit (RO), and
wherein, if necessary, a fluid (FLU), in particular a liquid and/or in particular a liquid colloidal mixture and/or in particular a gas and/or in particular an aerosol and/or in particular a gas-dust mixture and/or in particular dust and particle clouds and/or in particular a plasma and/or in particular mixtures of the like, can be located within the fluidic functional element, in particular the tube or in particular the fluidic conduit (RO), and
wherein the quantum dot, in particular the paramagnetic center (NV1) and/or in particular the plurality (NVC) of paramagnetic centers (NV1) and/or in particular the NV center and/or in particular the plurality of NV centers, of the sensor system (NVMS) is effectively coupled to the other functional elements of the sensor system (NVMS), in particular to the control and evaluation device (AWV), by means of an optical system of optical functional elements, in particular one or two optical waveguides (LWL1, LWL2), and
wherein the remaining functional components of the sensor system (NVMS), in particular the control and evaluation device (AWV) of the sensor system (NVMS), with the exception of the quantum dot and said optical functional elements for coupling the quantum dot, are arranged outside the fluidic functional element, in particular the tube or in particular the fluidic line (RO), and
wherein the quantum dot is located within the electromagnetic field, in particular an electric field and/or a magnetic field, of a field generating device (EL1, EL2), in particular one or more electrically charged electrodes (EL1, EL2) or a current-carrying coil or a pair of coils.

Characteristic 67. Measuring system (FIG. 29 and FIG. 30)
- with a control and evaluation device (AWV) and a quantum dot, and
- with a fluidic functional element, in particular a tube or in particular a fluidic conduit (RO), or a vessel or a reactor or a plasma chamber or a combustion chamber,
- wherein the quantum dot can be in particular a paramagnetic center (NV1) and/or in particular a plurality (NVC) of paramagnetic centers (NV1) and/or in particular a NV center and/or in particular a plurality of NV centers, and
- wherein the quantum dot generates fluorescence radiation (FL) that depends on the magnetic flux density (B) at the location of the quantum dot or another physical parameter at the location of the quantum dot, and
- wherein the control and evaluation device (AWV) generates a measured value as a function of the fluorescence radiation (FL), which is a value for the magnetic flux density (B) at the location of the quantum dot or a value for the other physical parameter at the location of the quantum dot, and
- wherein the quantum dot is arranged within the fluidic functional element, in particular the tube or in particular the fluidic conduit (RO), and
- wherein, if necessary, a fluid (FLU), in particular a liquid and/or in particular a liquid colloidal mixture and/or in particular a gas and/or in particular an aerosol and/or in particular a gas-dust mixture and/or in particular dust and particle clouds and/or in particular a plasma and/or in particular mixtures of the like, can be located within the fluidic functional element, in particular the tube or in particular the fluidic conduit (RO), and
- wherein the quantum dot, in particular the paramagnetic center (NV1) and/or in particular the plurality (NVC) of paramagnetic centers (NV1) and/or in particular the NV center and/or in particular the plurality of NV centers, of the sensor system (NVMS) is coupled to the control and evaluation device (AWV) by means of an optical system of optical functional elements, in particular one or two optical waveguides (LWL1, LWL2), and
- wherein the control and evaluation device (AWV) is arranged outside the fluidic functional element, in particular the tube or in particular the fluidic conduit (RO), and
- wherein the quantum dot is located within the electromagnetic field, in particular an electric field and/or a magnetic field, of a field generating device (EL1, EL2), in particular one or more electrically charged electrodes (EL1, EL2) or one or more current-carrying coils (L0) or a pair of coils.

Characteristic 68. Measuring system (FIG. 31 and FIG. 37)
- with a first sensor system (NVMS1) according to one or more of the characteristics [0403] to [0421],
- with a second sensor system (NVMS2) according to one or more of the characteristics [0403] to [0421]
- wherein the first sensor system (NVMS1) comprises a first quantum dot, in particular a first paramagnetic center (NV1) and/or in particular a first plurality (NVC) of first paramagnetic centers (NV1) and/or in particular a first NV center and/or in particular a first plurality of NV centers, and
- wherein the second sensor system (NVMS2) comprises a second quantum dot, in particular a second paramagnetic center (NV2) and/or in particular a second plurality (NVC2) of second paramagnetic centers (NV2) and/or in particular a second NV center and/or in particular a second plurality of NV centers, and
- wherein the first quantum dot (NV1) is spaced from the second quantum dot (NV2) by a distance, and
- wherein the measuring system determines a first measured value by means of the first sensor system (NVMS1) and
- wherein the measuring system determines a second measured value by means of the second sensor system (NVMS2), and
- wherein the measuring system determines a final measured value as a function of the first measured value and the second measured value and/or generates a final measured signal representing such a final measured value which is a measure of the magnitude and/or the direction and/or a direction component and/or the magnitude of a direction component of the mean gradient of the magnetic flux density (B) or of another physical parameter at the location of the measuring system.

Characteristic 69. Magnetic compass (FIG. 37),
- comprising a device according to characteristic [0462] and
- wherein an operating parameter, in particular the direction of movement and/or in particular a display and/or in particular the display of a representation of the measured value, in particular a direction, of a vehicle (motor vehicle) or a mobile device, depends on the measured value.

Characteristic 70. Magnetic compass (FIG. 36)
- with a sensor system (NVMS) according to one or more of the characteristics [0403] to [0421] and/or having a quantum dot, in particular a paramagnetic center (NV1) and/or in particular a plurality (NVC) of paramagnetic centers (NV1) and/or in particular an NV center and/or in particular a plurality of NV centers.

Characteristic 71. Medical examination and/or monitoring device (FIGS. 32 to 35)
- with a sensor system (NVMS) with at least one quantum dot, in particular a paramagnetic center (NV1) and/or in particular a plurality (NVC) of paramagnetic centers (NV1) and/or in particular an NV center and/or in particular a plurality of NV centers.

Characteristic 72. Medical examination and/or monitoring device (FIGS. 32 to 35)
- with at least one quantum dot (NV1), in particular a paramagnetic center (NV1) and/or in particular a plurality (NVC) of paramagnetic centers (NV1) and/or in particular an NV center and/or in particular a plurality of NV centers.

Characteristic 73. Medical examination and/or monitoring device (FIGS. 32 to 35)
- with a plurality of sensor systems (NVMS) each with a quantum dot, in particular according to one or more of the characteristics [0403] to [0421];
- wherein in particular the respective quantum dot can preferably be in particular a paramagnetic center (NV1) and/or in particular a plurality (NVC) of paramagnetic centers (NV1) and/or in particular an NV center and/or in particular a plurality of NV centers, and
- wherein the sensor systems (NVMS) are arranged by means of a holding device, in particular a cap (KP), in such a way that their position relative to the examined body part(s) and/or to the body of a patient and/or to a biological examination object, in particular to an animal, is fixed at least temporarily, and wherein the positions of the sensor systems (NVMS) are different.

Characteristic 74. Medical examination and/or monitoring device (FIGS. 32 to 35)

with a plurality of quantum dots, in particular in a plurality of sensor systems (NVMS) according to one or more of the characteristics [0403] to [0421], said quantum dots each comprising a paramagnetic center (NV1) and/or a plurality (NVC) of paramagnetic centers (NV1) and/or a NV center and/or a plurality of NV centers, and wherein these quantum dots are arranged by means of a holding device, in particular a cap (KP), in such a way that their position relative to the examined body part(s) and/or to the body of a patient and/or to a biological examination object, in particular to an animal, is fixed at least temporarily, and wherein the positions of the quantum dots are different.

Characteristic 75. Medical examination and/or monitoring device (FIG. 34, FIG. 35)

having a sub-device which is a medical examination and/or monitoring device according to one or more of the characteristics [0465] to [0468] and with a control and evaluation device (AWV)

for controlling the driving of the quantum dots, in particular of the paramagnetic center (NV1) and/or in particular of the plurality (NVC) of paramagnetic centers (NV1) and/or in particular of the NV center and/or in particular of the plurality of NV centers, and for detecting and evaluating the measured values of the respective quantum dots, in particular of the paramagnetic center (NV1) and/or in particular of the plurality (NVC) of paramagnetic centers (NV1) and/or in particular of the NV center and/or in particular of the plurality of NV centers, which are dependent on the respective fluorescence radiation (FL) of the respective quantum dots, in particular of the paramagnetic center (NV1) and/or in particular of the plurality (NVC) of paramagnetic centers (NV1) and/or in particular of the NV center and/or in particular of the plurality of NV centers, and wherein the control and evaluation device (AWV) generates said measured values, and with a control computer (CTR).

Characteristic 76. Medical examination and/or monitoring device (FIG. 34, FIG. 35) according to characteristic 75 wherein measurement results are displayed graphically and/or wherein an acoustic signal is output in dependence on a measured value and/or wherein an actuator (AKT) (e.g., a drug pump and/or a gas supply and/or a heater and/or a cooler and/or a dweller and/or a mixer and/or a reactor) is actuated in response to a measured value.

Characteristic 77. Medical examination and/or monitoring device (FIG. 34, FIG. 35, FIG. 36) according to one or more of the characteristics [0469] to 76 with a pattern recognition device (NN), which classifies the measured values into pattern classes, and/or recognizes patterns according to predetermined pattern classes.

Characteristic 78. Medical examination and/or monitoring device (FIG. 34, FIG. 35, FIG. 36) according to characteristic [0471]

wherein a recognized pattern class is graphically represented and/or wherein an acoustic signal is output in dependence on a recognized pattern class and/or wherein an actuator (AKT) (e.g., a drug pump and/or a gas supply and/or a heater and/or a cooler and/or a dweller and/or a mixer and/or a reactor) is actuated in response to a detected pattern class.

Characteristic 79. Position sensor (FIG. 38) according to characteristic [0424]

wherein the position sensor comprises a magnetic circuit with a first air gap (LSP1).

Characteristic 80. Position sensor (FIG. 38-46) according to characteristic [0473]

wherein the first air gap (LSP1) in cooperation with the other device parts of the position sensor is provided and adapted to detect the presence or non-presence of a ferromagnetic and/or a magnetic field modifying object (FOB), in particular the tooth of a tooth rail or the tooth of a tooth rail-like device, in the first air gap (LSP1) and/or the degree of presence or non-presence, e.g. how deep the tooth has penetrated into the first air gap (LSP1), thereof.

Characteristic 81. Switch or pushbutton or actuator (FIG. 48)

with a mechanical function element and with a sensor system (NVMS) according to one or more of the characteristics [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers, wherein the position of the mechanical functional element within the device is non-reversible or reversible self-resetting to an initial position or not independently reversible resetting to an initial position can be changed and wherein the mechanical function element changes the magnetic flux density (B) at the location of the quantum dot, in particular at the location of the paramagnetic center (NV1) and/or in particular at the location of the plurality (NVC) of paramagnetic centers (NV1) and/or in particular at the location of the NV center and/or in particular at the location of the plurality of NV centers, and wherein the device comprises means, in particular the remaining functional elements of the sensor system (NVMS), for evaluating the fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers, and for generating a switching signal as a function of the fluorescence radiation (FL).

Characteristic 82. Switch or pushbutton or actuator (FIG. 48)

with a sensor system (NVMS) according to one or more of the characteristics [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers.

Characteristic 83. Rotary encoder (FIG. 53 and FIG. 54 and FIG. 58 and FIG. 68)
- with a sensor system (NVMS) according to one or more of the characteristics [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers,
- with at least one encoding disk with an axis of rotation,
- wherein in particular on the at least one encoding disk angular positions are encoded magnetically and/or by teeth of a ferromagnetic material and/or by teeth of a material which influences the magnetic flux density (B) at the location of the quantum dot, in particular at the location of the paramagnetic center (NV1) and/or in particular at the location of the plurality (NVC) of paramagnetic centers (NV1) and/or in particular at the location of the NV center and/or in particular at the location of the plurality of NV centers, and
- wherein the at least one encoding disk changes the magnetic flux density (B) at the location of the quantum dot, in particular at the location of the paramagnetic center (NV1) and/or in particular at the location of the plurality (NVC) of paramagnetic centers (NV1) and/or in particular at the location of the NV center and/or in particular at the location of the plurality of NV centers, as a function of the angle of rotation about the axis of rotation of the encoding disk, and
- wherein the device comprises means, in particular the remaining functional elements of the sensor system (NVMS), for evaluating the fluorescence radiation (FL) of the quantum dot, in particular the paramagnetic center (NV1) and/or in particular the plurality (NVC) of paramagnetic centers (NV1) and/or in particular the NV center and/or in particular the plurality of NV centers, and to generate a measurement signal as a function of the fluorescence radiation (FL) which represents the detected rotational angle position about the rotational axis or a rotational angle range about the rotational axis or a rotational angle step about the rotational axis.

Characteristic 84. Position encoder (FIG. 55 to FIG. 57)
- with a sensor system (NVMS) according to one or more of the features [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers,
- with at least one coding slider,
- wherein in particular on the at least one encoding slider positions are encoded magnetically and/or by teeth of a ferromagnetic material and/or by teeth of a material which influences the magnetic flux density (B) at the location of the quantum dot, in particular at the location of the paramagnetic center (NV1) and/or in particular at the location of the plurality (NVC) of paramagnetic centers (NV1) and/or in particular at the location of the NV center and/or in particular at the location of the plurality of NV centers, and
- wherein the at least one encoding slider changes the magnetic flux density (B) at the location of the quantum dot, in particular at the location of the paramagnetic center (NV1) and/or in particular at the location of the plurality (NVC) of paramagnetic centers (NV1) and/or in particular at the location of the NV center and/or in particular at the location of the plurality of NV centers, as a function of its encoding slider position, and
- wherein the device comprises means, in particular the remaining functional elements of the sensor system (NVMS), for evaluating the fluorescence radiation (FL) of the quantum dot (NV1), in particular of the paramagnetic center (NV1) and/or in particular of the plurality (NVC) of paramagnetic centers (NV1) and/or in particular of the NV center and/or in particular of the plurality of NV centers, as a function of the fluorescence radiation (FL), to generate a measurement signal which represents the detected code slide position or a code slide position range or a code slide positioning step.

Characteristic 85. Position encoder (FIG. 55 to FIG. 57)
- with a sensor system (NVMS) according to one or more of the characteristics [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers.

Characteristic 86. Pressure measuring device (FIG. 59)
- with a sensor system (NVMS) according to one or more of the characteristics [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers, and
- with a dividing device, in particular a bellows,
- wherein the sub-device is provided with means, in particular a permanent magnet, generating a magnetic field with a magnetic flux density (B), and
- the sub-device being designed in such a way that the magnetic flux density (B) of the means, in particular of the permanent magnet, which generate a magnetic field, at the location of the quantum point, in particular of the paramagnetic center (NV1) and/or in particular of the plurality (NVC) of paramagnetic centers (NV1) and/or in particular of the NV center and/or in particular of the plurality of NV centers, changes as a function of the ambient pressure of the sub-device or of the pressure on a region of the sub-device, and
- the pressure measuring device comprising means, in particular the other functional elements of the sensor system (NVMS), for evaluating the fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers and, as a function of the fluorescence radiation (FL), to generate a measurement signal which represents a value of the pressure which depends on the magnetic flux (B) at the location of the quantum dot, in particular of the paramagnetic center (NV1) and/or in particular of the plurality (NVC) of paramagnetic centers (NV1) and/or in particular of the NV center and/or in particular of the plurality of NV centers.

Characteristic 87. Pressure measuring device (FIG. 59)
- with a sensor system (NVMS) according to one or more of the characteristics [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers.

Characteristic 88. Flow measuring device (FIG. 60)
with a sensor system (NVMS) according to one or more of the characteristics [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers, and
with a magnetically marked partial device provided with magnetic markings, in particular an impeller, and
with a fluidic functional element, in particular a pipe or a container, in which a fluid (FLU) can move,
wherein the magnetic markers, generate a magnetic field with a magnetic flux density (B) which is in particular preferably spatially modulated, and
wherein the movement of the fluid (FLU) results in movement of the magnetically encoded sub-device, and
wherein the fluid (FLU) can be in particular a liquid and/or in particular a liquid colloidal mixture and/or in particular a gas and/or in particular an aerosol and/or in particular a gas-dust mixture and/or in particular dust and particle clouds and/or in particular a plasma and/or in particular mixtures of the like, and
wherein the magnetically marked sub-device is designed in such a way that the magnetic flux (B) of the means, in particular the magnetic markings, which generate a magnetic field with the magnetic flux density (B), at the location of the quantum dot (NV1), in particular at the location of the paramagnetic center (NV1) and/or in particular at the location of the plurality (NVC) of paramagnetic centers (NV1) and/or in particular at the location of the NV center and/or in particular at the location of the plurality of NV centers, changes as a function of the movement of the magnetically marked sub-device, and
wherein the flow measuring device comprises means, in particular the other functional elements of the sensor system (NVMS), for evaluating the fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers, and for generating, as a function of the fluorescence radiation (FL), a measurement signal which represents a value for the movement of the magnetically marked sub-device and/or the movement of the fluid (FLU), which depends on the magnetic flux (B) at the location of the quantum dot (NV1), in particular at the location of the paramagnetic center (NV1) and/or in particular at the location of the plurality (NVC) of paramagnetic centers (NV1) and/or in particular at the location of the NV center and/or in particular at the location of the plurality of NV centers.

Characteristic 89. Flow measuring device (FIG. 60)
with a sensor system (NVMS) according to one or more of the characteristics [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers.

Characteristic 90. Closing device (FIGS. 65 to 67)
with at least one sensor system (NVMS) according to one or more of the characteristics [0403] to [0421] and/or having at least one quantum dot, in particular having a paramagnetic center (NV1) and/or in particular having a plurality (NVC) of paramagnetic centers (NV1) and/or in particular having an NV center and/or in particular having a plurality of NV centers, and
for use with a magnetically marked key provided with magnetic first coding and/or with a ferromagnetic key provided with mechanical second coding, and
with a mechanical keyhole for the key,
wherein the magnetic markers and/or an optionally additional magnet generate a magnetic field with a magnetic flux density (B) and/or modify a magnetic field with a magnetic flux density (B), and
the key and the key receptacle being designed in such a way that the magnetic flux (B) at the location of the quantum dot, in particular at the location of the paramagnetic center (NV1) and/or in particular at the location of the plurality (NVC) of paramagnetic centers (NV1) and/or in particular at the location of the NV center and/or in particular at the location of the plurality of NV centers, is expressed as a function of the first coding and/or the second coding of the key, and
wherein the closing device comprises means, in particular the remaining functional elements of the sensor system (NVMS), for evaluating the fluorescence radiation (FL) of the at least one quantum dot, in particular of the paramagnetic center (NV1) and/or in particular of the plurality (NVC) of paramagnetic centers (NV1) and/or in particular of the NV center and/or in particular of the plurality of NV centers, and for generating a closing signal, in particular for controlling an actuator (AKT), as a function of the first coding and/or the second coding of the key.

Characteristic 91. Closing device (FIGS. 65 to 67)
with at least one sensor system (NVMS) according to one or more of the characteristics [0403] to [0421] and/or having at least one quantum dot, in particular having a paramagnetic center (NV1) and/or in particular having a plurality (NVC) of paramagnetic centers (NV1) and/or in particular having an NV center and/or in particular having a plurality of NV centers.

Characteristic 92. Inclination encoder (FIG. 69)
with a sensor system (NVMS) according to one or more of the characteristics [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers,
with at least one encoding disk with an axis of rotation whose position is influenced by the gravitational field,
wherein in particular on the at least one encoding disk angular positions are encoded magnetically and/or by teeth of a ferromagnetic material and/or a material influencing the surrounding magnetic field, and
wherein the at least one encoding disk changes the magnetic flux density (B) at the location of the quantum dot, in particular of the paramagnetic center (NV1) and/or in particular of the plurality (NVC) of paramagnetic centers (NV1) and/or in particular of the NV center and/or in particular of the plurality of NV centers, as a function of an angle of rotation about the axis of rotation, and
wherein the device comprises means, in particular the other functional elements of the sensor system (NVMS) and/or in particular an control and evaluation device (AWV) as well as optionally optical functional elements, in order to detect and evaluate the fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers, and to generate, as a function of the fluorescence radiation (FL), a measurement signal which represents the detected angular position about the axis of rotation or an angular range about the axis of rotation or an angular step about the axis of rotation.

Characteristic 93. Electric motor or electric machine (FIG. 70)
  with one or more sensor systems (NVMS) according to one or more of the characteristics [0403] to [0421] and/or having one or more quantum dots (NV1), in particular having one or more paramagnetic centers (NV1) and/or in particular having one or more clusters of in each case a multiplicity (NVC) of paramagnetic centers (NV1) and/or in particular having one or more NV centers and/or in particular having one or more clusters of in each case a multiplicity of NV centers, where, in the case of a cluster, such a cluster preferably has a density at least locally of more than 200 ppm of paramagnetic centers, and
  with a rotor and a stator on the one hand or a rotor and a stator on the other hand,
  wherein the rotor and/or the stator change the magnetic flux density (B) at the location of the quantum point, in particular the paramagnetic center (NV1) and/or in particular the plurality (NVC) of paramagnetic centers (NV1) and/or in particular the NV center and/or in particular the plurality of NV centers, and
  wherein the device comprises means, in particular the other functional elements of the sensor system (NVMS) and/or in particular an control and evaluation device (AWV) as well as optionally optical functional elements, in order to evaluate the fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers, and in particular to infer a rotor position or rotor position and/or a rotor movement or rotor movement for controlling the commutation and thus to generate a measurement signal at least as a function of the fluorescence radiation (FL), and in particular to infer a rotor position or rotor movement for controlling the commutation. rotor position and/or to a rotor movement or rotor movement for controlling the commutation and thus to generate, at least as a function of the fluorescence radiation (FL), a measurement signal which represents the detected magnetic flux density (B) at the location of the one or more quantum points, in particular of the paramagnetic center (NV1) and/or in particular of the plurality (NVC) of paramagnetic centers (NV1) and/or in particular of the NV center and/or in particular of the plurality of NV centers.

Characteristic 94. Electric motor or electric machine (FIG. 70)
  with one or more sensor systems (NVMS) according to one or more of the characteristics [0403] to [0421] and/or with one or more quantum dots, in particular with a paramagnetic center (NV1) and/or in particular with a plurality (NVC) of paramagnetic centers (NV1) and/or in particular with an NV center and/or in particular with a plurality of NV centers,
  with a rotor and a stator on the one hand or a rotor and a stator on the other hand,
  wherein the rotor and/or the stator change the magnetic flux density (B) at the location of the quantum dot, in particular at the location of the paramagnetic center (NV1) and/or in particular at the location of the plurality (NVC) of paramagnetic centers (NV1) and/or in particular at the location of the NV center and/or in particular at the location of the plurality of NV centers, and
  the device comprising means for commutating the electrical energization of stator coils and/or commutating the electrical energization of rotor coils of the motor, and
  wherein the device comprises means, in particular the other functional elements of the sensor system (NVMS) and/or in particular a control and evaluation device (AWV) as well as possibly optical functional elements, in order to evaluate and detect the fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers, and to conclude on a rotor position or rotor position for controlling the commutation and
  wherein thus the commutation of the motor, in particular the commutation of the energization of one or more stator coils and/or the commutation of the energization of one or more rotor coils or rotor coils depends on the detected fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers.

Characteristic 95. Electric motor
  with a sensor system (NVMS) according to one or more of the characteristics [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers.

Characteristic 96. Method for commutating the current of the stator coils and/or for commutating the rotor coils of an electric motor
  wherein the commutation of the electric motor, in particular the commutation of the energization of the stator coils and/or the commutation of the rotor coils or rotor coils, depends on the fluorescence radiation (FL) of a quantum dot, in particular of a paramagnetic center (NV1) and/or in particular of a plurality (NVC) of paramagnetic centers (NV1) and/or in particular of a NV center and/or in particular of a plurality of NV centers.

Characteristic 97. Hydraulic ram or hydraulic system (FIG. 73)
  with a sensor system (NVMS) according to one or more of the characteristics [0403] to [0421] and/or with a quantum dot, in particular with a paramagnetic center (NV1) and/or in particular with a plurality (NVC) of paramagnetic centers (NV1) and/or in particular with an NV center and/or in particular with a plurality of NV centers.

Characteristic 98. Computer system (FIG. 36)
wherein the computer system executes a neural network model, and
wherein the neural network model comprises neural network nodes and
wherein neural network nodes are organized into at least three neural network layers, and
wherein each neural network node of the neural network has input parameters and output parameters, and
wherein at least one, preferably more, input parameters of each neural network node are either are an input parameter of the neural network model or are an output parameter of another neural network node of the neural network model and
wherein at least one, preferably more, output parameters of a neural network node is either an output parameter of the neural network model or are an input parameter of another neural network node and
wherein a neural network node in which an output parameter of that neural network node is an output parameter of the neural network model does not have an input parameter that is an input parameter of the neural network model, and
wherein a neural network node in which an input parameter is an input parameter of the neural network model does not have an output parameter that is an output parameter of the neural network model, and
wherein no neural network node of the neural network having an input parameter that is an output parameter of the neural network model has an input parameter that is an output parameter of a neural network node having an input parameter that is an input parameter of the neural network model, and
wherein input parameters of each neural network node of the neural network model within that particular neural network node are linked to the output parameters of that particular neural network node by means of a link function for that particular neural network node, and
wherein preferably this linkage function of the neural network node in question is nonlinear, and
wherein the properties of the link function of a neural network node depend on link function parameters that are preferably specific to the particular network node, and
wherein the linkage function may vary from neural network node to neural network node, and
wherein in particular the linkage function parameters of the neural network nodes are determined and trained in a training process, and
wherein at least one, preferably several, input parameters of the neural network model that the superordinate computer unit executes depend on a parameter of a quantum dot, in particular of a paramagnetic center (NV1) and/or in particular of a plurality (NVC) of paramagnetic centers (NV1) and/or in particular of an NV center and/or in particular of a plurality of NV centers,
wherein, in particular, such a parameter may be, for example, the value of the fluorescence radiation intensity (FL) and/or the value of the fluorescence phase shift time (ΔTFL).

Characteristic 99. Reactor or nuclear reactor or fusion reactor or plasma reactor or hypersonic engine or plasma engine
with a plasma chamber or reactor chamber and
with a magnetic field generating device and/or
with a generating device for an electromagnetic field,
wherein the magnetic field generating device and/or the electromagnetic field generating device generates a magnetic flux density (B) within the plasma chamber or the reactor chamber, respectively, and
wherein a sensor element with a quantum dot, in particular with a paramagnetic center (NV1) and/or in particular with a plurality (NVC) of paramagnetic centers (NV1) and/or in particular with a NV center and/or in particular with a plurality of NV centers, is arranged inside the plasma chamber or reactor chamber within the magnetic flux density (B) of the magnetic field generating device or the electromagnetic field generating device, and
the sensor element being coupled to a control and evaluation device (AWV) by means of an optical functional element, in particular by means of a waveguide or an optical transmission path, and
wherein the control and evaluation device (AWV) comprises a first pump radiation source (PL1), and
wherein the first pump radiation source (PL1) is capable of generating pump radiation (LB), and
wherein the first pump radiation (LB) can excite the quantum dot, in particular the paramagnetic center (NV1) and/or in particular the plurality (NVC) of paramagnetic centers (NV1) and/or in particular the NV center and/or in particular the plurality of NV centers, of the sensor element within the plasma chamber or reactor chamber to emit a fluorescence radiation (FL), and
wherein the fluorescence radiation (FL) depends on at least one physical parameter, in particular the magnetic flux density (B), within the plasma chamber or reactor chamber, and
wherein the control and evaluation device (AWV) detects, in particular by means of a first radiation receiver (PD1), the fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers, of the sensor element and
wherein the control and evaluation device (AWV) generates one or more measured values for the relevant physical parameter as a function of the detected fluorescence radiation (FL), and
wherein preferably in particular one or more operating parameters of the reactor and/or the nuclear reactor or the hypersonic engine or the fusion reactor or the plasma chamber or the reactor chamber depend on one or more of these measured values.

Characteristic 100. Electrochemical cell, especially an accumulator or battery or an electrolysis device,
with a cell chamber or reactor chamber and
with a magnetic field generating device and/or
with a generating device for an electromagnetic field,
wherein the magnetic field generating device and/or the electromagnetic field generating device generates a magnetic flux density (B) inside in the cell chamber or in the reactor chamber, respectively, and
wherein a sensor element with a quantum dot, in particular with a paramagnetic center (NV1) and/or in particular with a plurality (NVC) of paramagnetic centers (NV1) and/or in particular with a NV center and/or in particular with a plurality of NV centers, is arranged within the cell chamber or within the reactor chamber within the magnetic flux density (B) of the magnetic field generating device or the electromagnetic field generating device, and wherein the sensor element is coupled to a control and evaluation device (AWV) by means of optical functional elements, in particular by means of optical waveguides and/or optical transmission paths, and wherein the control and evaluation device (AWV) comprises a first pump radiation source (PL1), and wherein the first pump radiation source (PL1) is capable of generating pump radiation (LB), and wherein the first pump radiation (LB) can excite the quantum dot, in particular the paramagnetic center (NV1) and/or in particular the plurality (NVC) of paramagnetic centers (NV1) and/or in particular the NV center and/or in particular the plurality of NV centers, of the sensor element within the cell chamber or within the reactor chamber to emit a fluorescence radiation (FL), and wherein the fluorescence radiation (FL) depends on at least one physical parameter, in particular the magnetic flux density (B), within the cell chamber or reactor chamber, and wherein the control and evaluation device (AWV) detects, in particular by means of a first radiation receiver (PD1), the fluorescence radiation (FL) of the quantum dot, in particular of the paramagnetic center (NV1) and/or in particular of the plurality (NVC) of paramagnetic centers (NV1) and/or in particular of the NV center and/or in particular of the plurality of NV centers, and wherein the control and evaluation device (AWV) generates one or more measured values as a function of the detected fluorescence radiation (FL), and wherein in particular preferably one or more operating parameters of the electrochemical cell, in particular of the accumulator or the battery or the electrolysis device, or of the cell chamber or the reactor chamber depend on one or more of these measured values, and whereby in particular preferably the cell chamber or the reactor chamber is completely or partially filled
with an electrolyte or
with a melt or
with a corrosive fluid (FLU) or
with a fluid hotter than 100° C. or hotter than 200° C. or hotter than 300° C. or less than −50° C. or less than −70° C. or less than −80° C. or less than −100° C. or less than −150° C. cold fluid (FLU) or
with a radioactive fluid (FLU),
and wherein in particular, the magnetic field generating device may also be the electrolyte or other fluid within the cell chamber through which an electric current may flow and thus generate a magnetic field.

Characteristic 101. Device for recognizing patterns with the aid of paramagnetic centers (NV1) or with the aid of clusters of paramagnetic centers (NV1), where cluster is understood to mean a plurality (NVC) of paramagnetic centers (NV1) here
with multiple sensor systems (NVMS)
wherein the sensor systems (NVMS) each comprise a quantum dot, in particular a paramagnetic center (NV1) and/or in particular a plurality (NVC) of paramagnetic centers (NV1) and/or in particular an NV center and/or in particular a plurality of NV centers, and the sensor systems (NVMS) being coupled with their first output signal (out) via a data bus (DB) to a control and conditioning unit (IF), and wherein the signaling of the sensor systems (NVMS) via the data bus (DB) depends at least temporarily and/or partially on the fluorescence radiation (FL) of their respective quantum dots, in particular of the respective paramagnetic centers (NV1) and/or in particular of the respective clusters in the form of the respective plurality (NVC) of paramagnetic centers (NV1) and/or in particular of the respective NV center and/or in particular of the respective clusters in the form of the respective plurality of NV centers, and wherein in particular preferably the sensor systems (NVMS) can each comprise a microcomputer (µC) which is preferably connected with an interface to the data bus (DB) and wherein preferably the first output signal (out) in the case is preferably a digital signal, and wherein in particular preferably the sensor systems (NVMS) comprise a respective control and evaluation device (AWV), and wherein the respective control and evaluation device (AWV) of each sensor system (NVMS) generates a respective pump radiation (LB) with which the control and evaluation device (AWV) irradiates the respective quantum dot of the sensor system (NVMS), in particular the respective paramagnetic center (NV1) and/or in particular the respective cluster in the form of the respective plurality (NVC) of paramagnetic centers (NV1) and/or in particular the respective NV center and/or in particular the respective cluster in the form of the respective plurality of NV centers, and wherein the respective quantum dot of the sensor system (NVMS), in particular the respective paramagnetic center (NV1) and/or in particular the respective cluster in the form of the respective plurality (NVC) of paramagnetic centers (NV1) and/or in particular the respective NV center and/or in particular the respective cluster in the form of the respective plurality of NV centers, emit fluorescence radiation (FL) which the respective control and wherein the evaluation device (AWV) respectively detects and respectively evaluates, and wherein the respective control and evaluation device (AWV) generates a respective first output signal (out) with a respective value as a function of the respectively detected and respectively evaluated fluorescence radiation (FL), and wherein the respective control and evaluation device (AWV) preferably sends the respective value via the data bus (DB) from the respective sensor system (NVMS), of which the respective control and evaluation device (AWV) is a part, to the c control and conditioning unit (IF), and wherein the c control and conditioning unit (IF) generates a vectorial output data stream (VDS) of the control and conditioning unit (IF) from the received plurality of measured values, and wherein a pattern recognizer (NN) comprises a computer system, and wherein the computer system executes a pattern recognition program or an artificial intelligence program; and wherein the pattern recognition program may be an emulation of a neural network model having multiple network layers of neural network nodes;
and wherein the neural network model comprises network nodes, and where the network nodes are organized in network layers and wherein each network node of the neural network has input parameters and output parameters, and wherein at least one, preferably more, input parameters of network nodes are either.
are an input parameter of the neural network model or
are an output parameter of another neural network node of the neural network model and wherein at least one, preferably a plurality, of output parameters of a network node is either
an output parameter of the neural network model or
are an input parameter of another neural network node and wherein a network node in which an output parameter is an output parameter of the neural network model does not have an input parameter that is an input parameter of the neural network model, and wherein a network node having an input parameter that is an input parameter of the neural network model does not have an output parameter that is an output parameter of the neural network model, and wherein no network node of the neural network in which an output parameter is an output parameter of the neural network model has an input parameter that is an output parameter of a network node in which an input parameter is an input parameter of the neural network model, and wherein the input parameters of a network node of the neural network model are linked within a network node to the output parameters of that neural network node by means of a link function for that neural network node, and wherein this link function is preferably nonlinear, and wherein the properties of the link function of a neural network node depend on link function parameters, and wherein the link function parameters of a link function of a neural network node are preferably specific to the respective network node, and where the link function may vary from network node to network node, and wherein in particular the link function parameters are determined and trained in a training process, and wherein at least one, preferably several, input parameters of the neural network model which the computer unit of the pattern recognizer (NN) executes depend on a parameter of the respective quantum dots of the sensor system (NVMS), in particular of the respective paramagnetic center (NV1) and/or in particular of the respective cluster in the form of the respective plurality (NVC) of paramagnetic centers (NV1) and/or in particular of the respective NV center and/or in particular of the respective cluster in the form of the respective plurality of NV centers, in the respective sensor systems (NVMS), and wherein, in particular, such a parameter may be, for example, the value of the intensity of the fluorescence radiation (FL) and/or the value of the fluorescence phase shift time (ΔTFL).

Characteristic 102. Neurointerface
with multiple sensor systems (NVMS),
wherein the sensor systems (NVMS) each comprise a quantum dot, in particular a paramagnetic center (NV1) and/or in particular a plurality (NVC) of paramagnetic centers (NV1) and/or in particular an NV center and/or in particular a plurality of NV centers.

Characteristic 103. Neurointerface by characteristic [0496]
with a control and conditioning unit (IF) and
with a pattern connoisseur (NN),
wherein the sensor systems (NVMS) each detect and evaluate the respective fluorescence radiation (FL) of their respective quantum dots, in particular of the respective paramagnetic centers (NV1) and/or in particular of the respective plurality (NVC) of paramagnetic centers (NV1) and/or in particular of the respective NV centers and/or in particular of the respective plurality of NV centers, and generate a respective measured value and wherein the control and conditioning unit (IF) receives the respective measured values of the sensor systems (NVMS) and generates a vectorial output data stream (VDS) of the control and conditioning unit t (IF) in dependence on the respective measured values of the sensor systems (NVMS), and wherein the pattern recognizer (NN) generates an output data stream of symbols for the prototypes recognized by the pattern recognizer (NN) from the vectorial output data stream (VDS) of the control and conditioning unit (IF), and wherein in particular the pattern recognizer (NN) may comprise a computer system emulating a neural network model whose input parameters are information of the vectorial output data stream (VDS) of the control and conditioning unit (IF), and wherein the computer system of the pattern recognizer (NN) can emulate a symbol generator (SMBG) which, depending on the output parameters of the neural network model, can generate a sequence of symbols in the form of an output data stream (MDS) of the symbols of the prototypes recognized by the pattern recognizer (NN), wherein here the pattern recognizer (NN) preferably transmits only the symbols as representatives of the recognized prototypical feature vectors of the prototype database, and wherein in particular the neural network model of the pattern recognizer (NN) is stimulated in a training mode with prototypical feature vectors as input vectors of the neural network and the output parameters of the neural network model are compared with default values and the linkage parameters of the linkage functions of the neural network nodes are modified in accordance with the learning algorithm until the evaluation of the errors in the recognition of the training data sets falls below a predetermined level and wherein the neural network thus trained can then be used for the recognition of the patterns, and wherein especially methods of "machine learning" and "deep learning" can be used in the pattern recognizer (NN).

Characteristic 104. Explosive device
with an explosive and
with a detonator and
with a quantum dot and
with a control and evaluation device (AWV),
wherein in particular the quantum dot may comprise in particular a paramagnetic center (NV1) and/or in particular a plurality (NVC) of paramagnetic centers (NV1) and/or in particular a NV center and/or in particular a plurality of NV centers, and where the quantum dot emits fluorescence radiation (FL), and wherein the fluorescence radiation (FL) of the quantum dot depends on the magnetic flux density (B) and/or on another physical parameter, and wherein the control and evaluation device (AWV) detects and evaluates the fluorescence radiation (FL) and at least temporarily generates or outputs or holds ready a measured value which depends on the fluorescence radiation (FL), and wherein the control and evaluation device (AWV) ignites the explosive by means of the igniter when the measured value lies in a predetermined measured value range.

| \ | LIST OF REFERENCE SYMBOLS |
|---|---|
| 1 | first step: emission of an acoustic transmission wave (ASW) by a sound transmitter, in particular an ultrasonic transmitter (USS). |
| 1' | first step: emission of an electromagnetic transmission wave by a transmitter. |
| 2 | second step: reflecting the acoustic transmission wave (ASW) by one or more objects (Obj) as an acoustic wave (AW) and/or modifying the acoustic transmission wave (ASW) by one or more objects (Obj) or the transmission channel to an acoustic wave (AW). |
| 2' | second step: reflecting the electromagnetic transmission wave by one or more objects (Obj) as an electromagnetic wave (HFW) and/or modifying the electromagnetic transmission wave by one or more objects (Obj) or the transmission channel to an electromagnetic wave (HFW). |
| 3 | third step: The reflected acoustic wave (AW), vibrates a diaphragm (ME) with a ferromagnetic part device in the third step (3); |
| 4 | fourth step: The oscillating membrane (ME) with the ferromagnetic sub-device causes in the fourth step (4) a modulation of the magnetic flux density (B) at the location of the quantum dot (NV1) or the paramagnetic center (NV1) or the NV center of the sensor system (NVMS). |
| 4' | fourth step: The electromagnetic wave (HFW) causes in the fourth step (4') a modulation of the magnetic flux density (B) at the location of the quantum dot (NV1) or the paramagnetic center (NV1) or the NV center of the sensor system (NVMS); |
| 5 | fifth step: the modulation of the magnetic flux density (B) at the location of the quantum dot (NV1) or at the location of the paramagnetic center (NV1) or at the location of the NV center (NV1) of the sensor system (NVMS) modulates the fluorescence radiation (FL) of the quantum dot (NV1) or the paramagnetic center (NV1) or the NV center (NV1) of the sensor system (NVMS). |
| 5' | fifth step: the modulation of the magnetic flux density (B) at the location of the quantum dot (NV1) or at the location of the paramagnetic center (NV1) or at the location of the NV center (NV1) of the sensor system (NVMS) modulates the fluorescence radiation (FL) of the quantum dot (NV1) or the paramagnetic center (NV1) or the NV center (NV1) of the sensor system (NVMS). |
| 6 | sixth step: In a sixth step (6), a first radiation receiver (PD1) of the sensor system (NVMS) detects this modulation of the fluorescence radiation (FL), for example, as a receiver output signal (S0). |
| 6' | sixth step: In a sixth step (6'), a first radiation receiver (PD1) of the sensor system (NVMS) detects this modulation of the fluorescence radiation (FL), for example, as a receiver output signal (S0). |
| 7 | seventh step: In a seventh step (7), an evaluation circuit and/or evaluation unit generates one or more measured values from the receiver output signal (S0), preferably a time sequence of measured values, which are then preferably used in whole or in part. |
| 7' | seventh step: In a seventh step (7'), an evaluation circuit and/or evaluation unit generates one or more measured values from the receiver output signal (S0), preferably a time sequence of measured values, which are then preferably used in whole or in part. |
| 2D or 3D B-field generation | the 2D or 3D B-field generation includes all means for generating a two-dimensional or three-dimensional magnetic field. Typically, these are Helmholtz coils (L2 to L7). However, it is conceivable to use other coil configurations, in particular segmented flat coils, instead of Helmholtz coils (L2 to L7) in order to compensate for and/or influence the magnetic flux (B) or at least predetermined components of the magnetic flux (B) at the location of the quantum dot (NV1) or the paramagnetic center (NV1) or the NV center (NV1). |
| a | point at which the toothed rail just lowers the magnetic flux (B) in the air gap of the slot sensor so that the value falls below the second threshold value (SW2) when the toothed rail moves from left to right in FIG. 41. |
| A1 | subtractor. |
| Ab | Distance (ab) of the axis of symmetry (ms) of the tooth of a tooth rail from the point of symmetry (m) of an exemplary otherwise symmetrically constructed slot sensor in FIG. 41. |

LIST OF REFERENCE SYMBOLS

Figure 41:
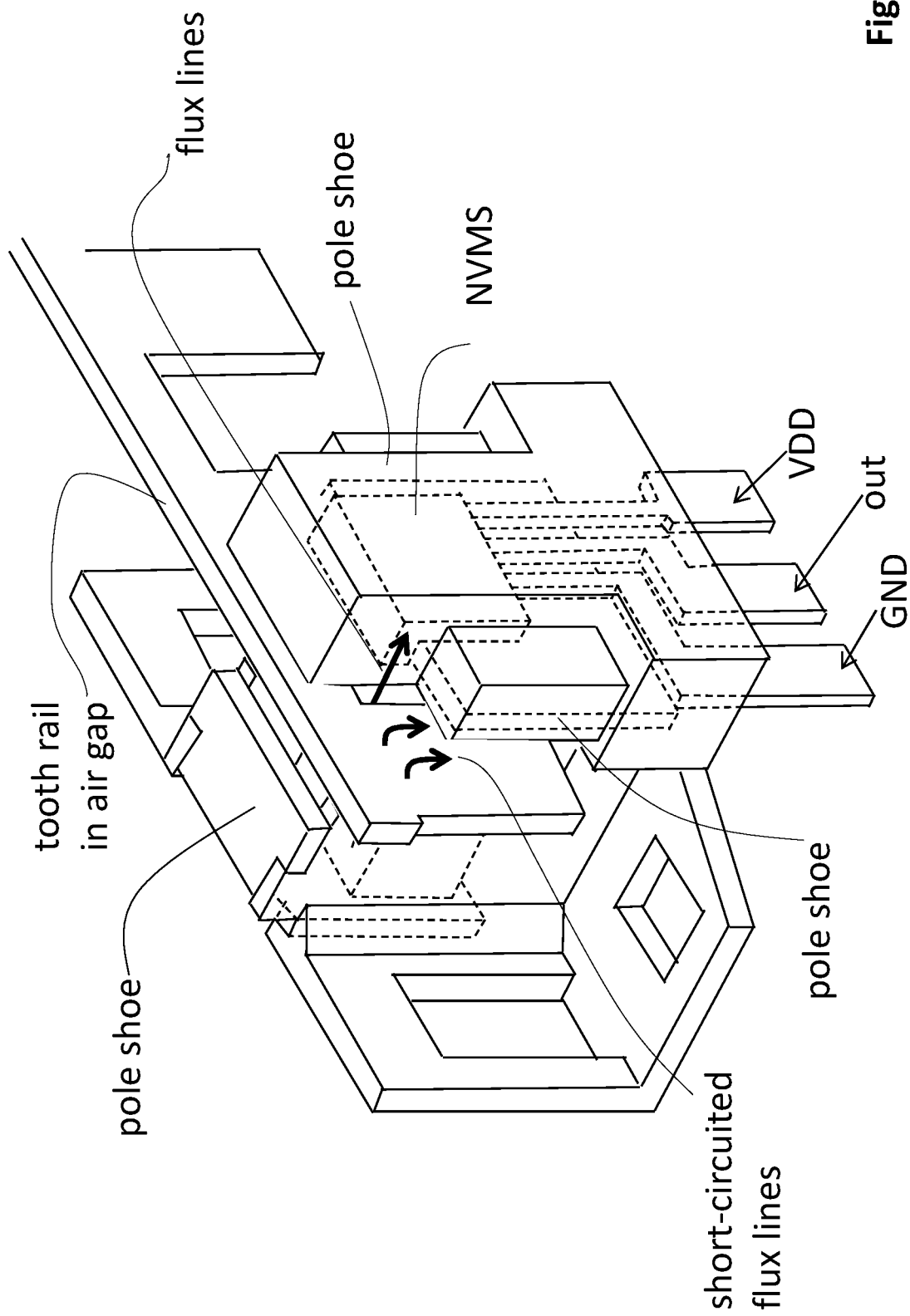
FIG. 41 again shows the example slot sensor with a toothed rail made of ferromagnetic material.

| | |
|---|---|
| ADC | analog-to-digital converter. |
| AKT | actuator(s). |
| AKTL | line/data bus for controlling the actuator(s). |
| AMP | amplifier. |
| bPoint | at which the toothed rail just lowers the magnetic flux (B) in the air gap of the slot sensor so that the flux falls below the first threshold value (SW1) when the toothed rail moves from left to right in FIG. 41. |
| AS1 | first axis (AS1) of the first Helmholtz coil, the seventh coil (L7). |
| AS2s | second axis (AS2) of the second Helmholtz coil, the second coil (L2). |
| AS3 | third axis (AS3) of the third Helmholtz coil, the third coil (L3). |
| AS4 | fourth axis (AS4) of the fourth Helmholtz coil, the fourth coil (L4). |
| AS | 5fifth axis (AS5) of the fifth Helmholtz coil, the fifth coil (L5). |
| AS6 | sixth axis (AS6) of the sixth Helmholtz coil, the sixth coil (L6); |
| ASW | acoustic transmit wave. The ultrasonic transmitter (USS) emits an exemplary acoustic transmission wave (ASW), which is modified to an acoustic wave (AW), for example at an object (Obj) or in the transmission channel and is then received by the proposed microphone (FIG. 21). |
| AW | acoustic wave. In the example of FIG. 21, the acoustic wave (AW) sets a membrane (ME) with a ferromagnetic sub-device in vibration, so that the oscillation of the magnetic flux density (B) thus generated at the location of the quantum dot (NV1) or the paramagnetic center (NV1) or the NV center (NV1) can be detected by the resulting fluorescence radiation fluctuation of the fluorescence radiation (FL). |
| AWV | drive and evaluation device. |
| B | magnetic flux density. |
| BA | barrier or aperture. In FIG. 31, the exemplary barrier (BA) prevents crosstalk of the first fluorescence radiation (FL1) of the first quantum dot (NV1) or first paramagnetic center (NV1) or first NV center (NV1) to the second radiation receiver (PD2). first NV center (NV1) to the second radiation receiver (PD2) and a crosstalk of the second fluorescence radiation (FL22) of the second quantum dot (NV2) or the second paramagnetic center (NV2) or the second NV center (NV2) to the first radiation receiver (PD1). |
| BA1 | first aperture or barrier. In the example of FIG. 12, the first aperture (BA1) prevents the direct irradiation of the compensating radiation source (PLK) into the quantum dot (NV1) or into the paramagnetic center (NV1) or into the NV center. |
| BA2 | second aperture or barrier. In the examples of FIGS. 11 and 12, the second aperture (BA2) prevents direct radiation from the first pump radiation source (PL1) into the first radiation receiver (PD1). |
| BD | Bottom/Roadway Surface. |
| BD1 | first bond wire. |
| BD2 | second bond wire. |
| BD3 | third bond wire. |
| BO | housing bottom. |
| C | point at which the toothed rail just lowers the magnetic flux (B) in the air gap of the slot sensor so that the first threshold value (SW1) is exceeded when the toothed rail moves from left to right in FIG. 41. |
| CAV | cavity. |
| CON | electric conductor. |
| CORR | correlator. The correlator (CORR) compares a first signal with a second signal and outputs a result signal whose value is a measure of the extent to which the first signal matches the second signal. In the simplest case, the correlator (CORR) performs a mathematical function corresponding to a linear form. The two signals are considered as infinite dimensional vectors whose index is continuous time. The linear form links these two signals together and produces a signal that is itself again preferably an element of the vector space from which the signals originate. Preferably, the linear form is a scalar product. In the case of signals, the scalar product can be formed in such a way that over a predefined period of time, for example the period duration of the transmission signal (S5), the respective instantaneous value of the first signal is multiplied by the corresponding instantaneous value of the second signal at the same point in time for all points in time within the period and the multiplication result is integrated for the period. In the example of FIG. 8. this is done by a first multiplier (M1) which multiplies the reduced receiver output signal (S1) by the transmission signal (S5). A filter (TP), which is preferably a low-pass filter, performs the integration. Actually, at the output of the filter (TP), a sample and hold circuit would still be necessary, which at the end preferably of each period of the transmission |

LIST OF REFERENCE SYMBOLS

-continued

| | |
|---|---|
| | signal (S5) buffer-stores the output signal of the filter (TP) preferably until the end of the next period of the transmission signal (S5) and thus makes the integration unambiguously period-related. However, it has been shown that in practice this sample-and-hold circuit is not always necessary and the error it causes can often be neglected. The filter output signal (S4) of FIG. 8 is thus the signal whose signal represents the correlation value. Preferably, the filter (TP) of FIG. 8 is provided with a large gain in order to linearize the system. By means of a second multiplier (M2), in the example of FIG. 8 the reduced receiver output signal (S1), as far as it contained pails of the transmission signal (S5), is reconstructed and subtracted from the receiver output signal (S0). In the stable state, the reduced receiver output signal (S1) then contains almost no components of the transmission signal (S5), while the filter output signal (S4) represents the correlation value between the receiver output signal (S0) and the transmission signal (S5). The correlator (CORR) can also be implemented differently. It is important that it determines the proportion of the transmission signal (S5) in the receiver output signal (S0) as a correlation value. Optimal filters and/or matched filters are also suitable for this purpose, for example. |
| CTRS | control computer. |
| d | point at which the toothed rail just lowers the magnetic flux (B) in the air gap of the slot sensor so that the second threshold value (SW2) is exceeded when the toothed rail moves from left to right in FIG. 41. |
| d2 | distance. |
| DE | housing cover. |
| DB | Data bus. |
| DB2 | if applicable, second data bus (DB2) to a higher-level system and/or a computer network and/or for connection to the Internet. |
| $d_{FOB}$ | Distance from the sensor system (NVMS) to a magnetized object, here preferably to a ferromagnetic object (FOB); |
| DH | Borehole. The wellbore (DH) is a fluidic functional element in the broadest sense. It may involve fluids, colloidal solutions, mixtures of fluids, solid materials such as sands and/or dusts, and gases. |
| DSP | screen. |
| DSPL | line/data line (DSPL) for controlling the screen (DSP) or for controlling the display on the screen (DSP) or objects on the screen (DSP). |
| ΔTFL | Fluorescence phase shift time of the temporal phase shift between the signal of the modulation of the pump radiation (LB, LB1a) and the signal of the modulation of the fluorescence radiation (FL, FL1). The fluorescence phase shift time thus approximately describes the afterglow of the fluorescence radiation (FL) of the quantum dots (NV1) or the paramagnetic centers (NV1) or the NV centers (NV1) after the decay of the pump radiation (LB, LB1a). |
| ΔTm | Measurement phase shift unit. The optional measurement phase shift unit delays the transmission signal (S5) by a measurement phase shift time (ΔTM) to the measurement signal (MES), which is preferably used for the analysis of the receiver output signal (S0); |
| ΔTM | Measurement phase shift time (ΔTM) of the temporal phase shift between the signal of the modulation of the pump radiation (LB, LB1a) and the temporal periods or time points of the evaluation of the receiver output signal (S0) of the first radiation receiver (PD1), which depends on the fluorescence radiation (FL, FL1) received by the first radiation receiver (PD1), by the evaluation circuit, for example by the integrated circuit (IC). In FIGS. 3 to 7, this corresponds to the time shift between the edges of the signal of the pump radiation (LB, LB1a) on the one hand and the exemplary measurement signal (MES) serving for clarification on the other hand. |
| EL1 | first electrode. |
| EL2 | second electrode. |
| F1 | first optical filter. The first optical filter (F1) is only necessary if the fluorescence radiation (FL) is to be evaluated at first times (T1) at which the pump radiation source (PL1) also emits pump radiation (LB, LB1a). If the fluorescence radiation (FL) is evaluated at third times (T3) or second times (T2) at which the pump radiation source (PL1) does not emit pump radiation (LB, LB1a) by taking advantage of the afterglow of the fluorescence radiation (FL), this first optical filter (F1) is not absolutely necessary. The first optical filter (F1) is preferably designed to not allow radiation with the pump radiation wavelength ($\lambda_{pmp}$) of the pump radiation (LB, LB1a) and/or the reflected pump radiation (LB1b) to pass and to allow radiation with the fluorescence radiation wavelength ($\lambda_{fl}$) of the fluorescence radiation (FL) to pass. If a compensation radiation |

| | |
|---|---|
| | source (PLK) is provided, which radiates compensation radiation (KS) into the first radiation receiver (PD1) also in a summing superimposed manner and whose compensation radiation (KS) is to pass the first optical filter (F1) before impinging on the first radiation receiver (PD1), then the first optical filter (F1) is preferably designed in such a way that it does not attenuate or does not substantially attenuate the light of the compensating radiation source (PLK) for the intended purpose, i.e. allows radiation with the compensating radiation wavelength ($\lambda_{ks}$) of the compensating radiation (KS) to pass substantially. Preferably, in the case of using NV centers as quantum dots, the first optical filter (F1) blocks radiation with wavelengths shorter than 600 nm and allows radiation with wavelengths above 600 nm, i.e., shorter than 600 nm, to pass. When using other types of paramagnetic interference points (NV1), these wavelengths are functionally equivalent adjusted if necessary. The wavelength limit is preferably chosen as a function of the pump radiation wavelength ($\lambda_{pmp}$) of the pump radiation (LB) of the first pump radiation source (PL1), the fluorescence wavelength ($\lambda_{fl}$) of the fluorescence radiation (FL) of the quantum dot(s) and the compensation radiation wavelength ($\lambda_{ks}$) of the compensation radiation (KS) of the compensation radiation source (PLK). The wavelength limit is preferably selected such that the pump radiation wavelength ($\lambda_{pmp}$) of the pump radiation (LB) of the first pump radiation source (PL1) is not transmitted through the first optical filter (F1) and the fluorescence wavelength ($\lambda_{fl}$) of the fluorescence radiation (FL) of the quantum dot or of the quantum dot(s) is transmitted through the first optical filter (F1) and the compensation radiation wavelength ($\lambda_{ks}$) of the compensation radiation (KS) of the compensation radiation source (PLK) is transmitted through the first optical filter (F1). |
| FL | fluorescence radiation (FL) which the quantum dot, i.e., in particular the paramagnetic center (NV1) or the plurality (NVC) of paramagnetic centers (NV1) or the NV center or the plurality of NV centers, emit when they are irradiated with pump radiation (LB, LB1a) of the first pump radiation source (PL1) and/or by reflected pump radiation (LB1b) with a pump radiation wavelength ($\lambda_{pmp}$). In the case of a NV center in a diamond as a paramagnetic center (NV1), the pump radiation (LB1a) and thus preferably the reflected pump radiation (LB1b) is green. The fluorescence radiation (FL) is then typically red in the case of a NV center in a diamond as a paramagnetic center (NV1). The intensity of the fluorescence radiation (FL) of the quantum dot typically depends on the magnitude of the magnetic flux density (B). Provided the quantum dot is a paramagnetic center (NV1), for example in the form of a single defect center in a single crystal, or a plurality (NVC) of paramagnetic centers (NV1), the intensity of the fluorescence radiation (FL) at certain magnetic flux densities (B) at the location of the paramagnetic center (NV1) or the plurality (NVC) of paramagnetic centers (NV1) also depends on the direction of the magnetic flux density (B) relative to the crystal axis of the crystal in question and thus relative to the orientation of the defect center (NV1). Preferably, in the case of an NV center in diamond as a paramagnetic center (NV1), the fluorescent radiation is red light with a wavelength of 600 nm to 700 nm, which is longer than the wavelength of the pump radiation (LB, LB1a) and shorter than the wavelength of the compensating radiation (KS, KS1). |
| FL1 | first fluorescence radiation which the quantum dot, i.e., in particular the paramagnetic center (NV1) or the plurality (NVC) of paramagnetic centers (NV1) or the NV center or the plurality of NV centers, emits when it is irradiated by pump radiation (LB, LB1a) of the pump radiation source (PL1) and/or by reflected pump radiation (LB1b) with a pump radiation wavelength ($\lambda_{pmp}$). In the case of a NV center in a diamond as a paramagnetic center (NV1) or in the case of a plurality of NV centers in a diamond as a plurality (NVC) of paramagnetic centers (NV1), the pump radiation (LB1a) and thus preferably the reflected pump radiation (LB1b) is green. The fluorescence radiation (FL) is then typically red. The intensity ($I_{fl}$) of the fluorescence radiation (FL) typically depends on the magnitude of the magnetic flux density (B). Provided that the quantum dot is a paramagnetic center (NV1) in the form of a single defect center in a single crystal and/or a plurality (NVC) of paramagnetic centers (NV1) in the form of multiple defect centers in a single crystal, the intensity ($I_{fl}$) of the fluorescence radiation (FL) also depends on the direction of the magnetic flux density (B) relative to the crystal axis at certain magnetic flux densities (B). If a plurality of crystals of different, preferably stochastically distributed orientation is used, this dependence can be suppressed. |

LIST OF REFERENCE SYMBOLS -continued

|  |  |
|---|---|
|  | Preferably, the first fluorescence radiation (FL1) is red light with a wavelength of 600 nm to 700 nm, which is typically longer than the pump radiation wavelength ($\lambda_{pmp}$) of the pump radiation (LB, LB1a) (e.g., 520 nm for NV centers) and often shorter than the compensation radiation wavelength ($\lambda_{ks}$) of the compensation radiation (KS), in the case of a NV center in diamond as a paramagnetic center (NV1). |
| FL2 | reflected fluorescence radiation. For example, the reflector (RE) possibly reflects the fluorescence radiation (FL, FL1) of the quantum dot, i.e., for example, of the paramagnetic center (NV1) or the plurality (NVC) of paramagnetic centers (NV1) or the NV center or of the plurality of NV centers, as reflected fluorescence radiation (FL2) preferably in the direction of the first radiation receiver (PD1), which then preferably receives the fluorescence radiation (FL, FL1) as reflected fluorescence radiation (FL2). Instead of the reflector (RE), other optical functional elements can also be used for optical coupling of the first radiation receiver (PD1) with the quantum dot, e.g. in the form of the paramagnetic center (NV1) or the plurality of paramagnetic centers (NV1) or the NV center or the plurality of NV centers, for example by focusing and/or redirecting the fluorescence radiation (FL, FL1) or, for example, by filtering the fluorescence radiation (FL, FL1) by means of a first optical filter (F1), can be used to generate the reflected fluorescence radiation (FL2) from the fluorescence radiation (FL, FL1) and to receive it by the first radiation receiver (PD1). Preferably, in the case of NV centers as paramagnetic centers (NV1), the reflected fluorescence radiation (FL2) is red light with a wavelength of 600 nm to 700 nm, which is typically longer than the pump radiation wavelength ($\lambda_{pmp}$) of the pump radiation (LB, LB1a) and often shorter than the compensation radiation wavelength ($\lambda_{ks}$) of the compensation radiation (KS). |
| FL22 | second fluorescence radiation (FL22) emitting the second quantum dot, in particular in the form of the second paramagnetic center (NV2) or in the form of the second plurality (NVC2) of second paramagnetic centers (NV2) or in the form of the second NV center resp. in the form of a second plurality of NV centers, when irradiated by pump radiation (LB, LB1a) from the pump radiation source (PL, PL1) and/or from reflected pump radiation (LB1b) having pump radiation wavelength ($\lambda_{pmp}$). In the case of a second NV center in a diamond as a second paramagnetic center (NV2) in a diamond as a second paramagnetic center (NV2) or in the case of a second plurality of NV centers in one or more diamonds as a second plurality (NVC2) of second paramagnetic centers (NV2), the pump radiation (LB1a) and thus preferably the reflected pump radiation (LB1b) is green. The second fluorescence radiation (FL22) is then typically red. The intensity of the second fluorescence radiation (FL22) typically depends on the magnitude of the magnetic flux density (B). Provided that the second paramagnetic center (NV2) is a single second defect center in a single crystal, the intensity of the second fluorescence radiation (FL22) at certain magnetic flux densities (B) typically also depends on the direction of the magnetic flux density(B) relative to the crystal axis and thus on the orientation of the second paramagnetic center (NV2) relative to the direction of the magnetic flux density (B). Provided that the second plurality (NVC2) of second paramagnetic centers (NV2) is a plurality of second defect centers in multiple, preferably differently and preferably randomly oriented single crystals, this directional dependence can be suppressed. Preferably, the second fluorescence radiation (FL22) is a second paramagnetic center (NV) in the case of an NV2 center in diamond or in the case of a plurality of NV centers in diamond as a second plurality (NVC2) of second paramagnetic centers (NV2) is red light with a wavelength of 600 nm to 700 nm, which is typically longer than the pump radiation wavelength ($\lambda_{pmp}$) of the pump radiation (LB, LB1a) and shorter than the compensation radiation wavelength ($\lambda_{ks}$) of the compensation radiation (KS); |
| FLU | fluid. The fluid (FLU) may be a gas or a liquid or a liquid mixture (e.g., a gas/oil/sand/water mixture as in wells (DH)) or a quasi-gaseous mixture (e.g., a gas interspersed with dusts). In particular, it may be the electrolyte of an electrochemical device, for example, an electrolytic cell, a fuel cell, a battery or accumulator, etc. |
| FOB | ferromagnetic object. |
| G | signal generator. The signal generator (G) preferably generates the transmission signal (S5). |
| GE | mounting means (GE) with which the sensor element with the quantum dot (NV1), or the paramagnetic center (NV1), or the NV center (NV1) is mounted. |

LIST OF REFERENCE SYMBOLS

| | |
|---|---|
| GL1 | first adhesive. In the example of FIG. 1, the first optical filter (F1) is mechanically connected to the integrated circuit (IC) by means of the radiation-transparent first adhesive (GL1). In this case, the first adhesive (GL1) is substantially transparent to fluorescence radiation (FL). This means that the first adhesive (GL1) attenuates the fluorescence radiation (FL), if at all, only to the extent that it is insignificant for the intended purpose of the device. In the example of FIG. 1, the first adhesive (GL1) optically couples the paramagnetic center (NV1) to the first radiation receiver (PD1). This coupling refers in the example of FIG. 1 to the fluorescence radiation (FL). Provided that compensating radiation (KS) is used, the first glue (Gl1) couples the compensating radiation source (PLK) to the first radiation receiver (PD1) as an optical element in the optical coupling path between the compensating radiation source (PLK) and the first radiation receiver (PD1). The first adhesive (GL1) is therefore preferably sufficiently transparent for the wavelength of the compensating radiation (KS) in case of using a compensating radiation (KS). |
| GL2 | second adhesive (GL2) for attaching the integrated circuit (IC) to the second lead frame island (LF2). Preferably, this second adhesive (GL2) is electrically conductive. However, systems with electrically insulating second adhesive (GL2) are also conceivable. |
| GL3 | third adhesive (GL3) for attaching the first pump radiation source (PL1) to the third lead frame island (LF3). Preferably, this third adhesive (GL3) is electrically conductive. However, systems with electrically insulating third adhesive (GL3) are also conceivable. |
| GL4 | fourth adhesive (GL4) for fixing the housing cover (DE) to the housing wall (WA). |
| GND | reference potential line (GND) on reference potential. |
| H | magnetic field strength or excitation. The magnetic field strength (H) is related to the magnetic flux density (B) via the well-known material equation of Maxwell's equations. |
| RF window | specific cover (DE) of the housing, which allows the entry of electromagnetic radiation, for example in the form of an electromagnetic wave (HFW) into the housing. The electromagnetic wave (HFW) modulates the fluorescence radiation (FL) of the quantum dot, for example in the form of the paramagnetic center (NV1) or the plurality (NVC) of paramagnetic centers (NV1) or the NV center (NV1) or the plurality of NV centers, which is detected and evaluated by the sensor system (NVMS). |
| HFW | electromagnetic wave. |
| IC | integrated circuit. |
| IF | control and conditioning unit. |
| IFL | line/data bus (IFL) for controlling the control and conditioning unit (IF). |
| $I_{fl}$ | Intensity ($I_{fl}$) of the fluorescence radiation (FL) of the quantum dot. |
| $I_{ks}$ | Intensity ($I_{ks}$) of the compensating radiation (KS). |
| INV | inversion unit. In the simplest case, the optional inversion unit (INV) inverts the transmission signal (S5) to the measurement signal (MES), which is preferred for the analysis of the receiver output signal (S0). The formation of a measurement signal (MES) complementary to the transmission signal (S5) corresponding to MES = c − S5 with c as a constant value is also conceivable. |
| $I_m$ | electric current ($I_m$) flowing through the conductor (CON) at least partially in such a way that the magnetic flux density (B) at the location of the quantum point, i.e., the paramagnetic center (NV1) or the plurality (NVC) of paramagnetic centers (NV1) or the NV center or the plurality of NV centers, is modified as a function of this electric current. |
| $L_{L8}$ | eighth coil current. The eighth coil current flows through the control signal line (SS1) into an eighth coil (L8). |
| $I_{pmp}$ | intensity ($I_{pmp}$) of the pump radiation (LB). |
| IS1 | first electrical insulation. |
| IS2 | second electrical insulation. |
| J1 | toroidal or annular yoke. |
| JK1 | first yoke segment. |
| JK2 | second yoke segment. |
| JK3 | third yoke segment. |
| JV | connecting yoke. |
| KA | cable. The cable (KA) may include electrical lines for powering electrical and electronic and electro-optical equipment of the probe (SO) and for signaling between the probe (SO) and a higher-level system at the surface. The cable (KA) may also comprise optical systems such as optical fibers. Also, the cable (KA) may comprise mechanical conductors whose sole purpose is to mechanically hold the probe. |

-continued

| LIST OF REFERENCE SYMBOLS | |
|---|---|
| Kfz | vehicle and/or mobile device. This can include any non-locally fixed device such as, but not limited to, cars, trucks, construction equipment, moving machinery, robots, locomotives, tractors, aircraft, satellites, missiles, projectiles, missiles, ships, submarines, space stations, etc. as well as non-mandatory locally fixed devices such as portable or transportable medical equipment, cell phones and smartphones, laptops, desk-top PCs, read/write heads for data storage devices, magnetometers, measuring equipment, measuring equipment for material examination and detection of material defects and malfunctions, measuring equipment for well logging, geomagnetic measuring equipment for prospecting, gyrocompasses, compasses and navigation equipment, portable equipment for measuring chemical parameters such as ph-value or electrochemical potentials, gas sensors, etc. |
| Head | Exemplary body part for the application of the magnetoencephalographic device. |
| KP | Cap. The cap (KP) is an exemplary device for predictably arranging multiple sensor systems (NVMS) in a predefined geometry. This arrangement enables magnetoencephalographic analysis of sensor data from the sensor systems (NVMS). Instead of a cap (KP), similar devices can be used to examine other body parts or whole human and animal bodies. Implantation of the sensor systems (NVMS) into a body part at predefined locations is also conceivable. In that case, the role of the cap (KP) is taken over by a body part, for example a bone. |
| KS | compensation radiation. The compensation radiation (KS) is emitted by the compensation radiation source (PLK). Preferably, this occurs at second times (T2) which are different from the first times (T1) at which the pump radiation source (PL, PL1) preferably emits pump radiation (LB, LB1a). Provided that the evaluation of the fluorescence radiation (FL) is carried out at third times (T3), then preferably these second times (T2) are also different from these third times (T3). Preferably, this is infrared light with a wavelength greater than the wavelength of the fluorescence radiation (FL) and greater than the wavelength of the pump radiation (LB, LB1a). |
| KS2 | reflected compensation radiation. The reflector (RE) preferably reflects the compensation radiation (KS) of the compensation radiation source (PLK) as reflected compensation radiation in the direction of the first radiation receiver (PD1), which then preferably receives the compensation radiation (KS) as reflected compensation radiation (KS2). Instead of the reflector (RE), other optical functional elements can also be used for optical coupling of the first radiation receiver (PD1) with the compensation radiation source (PLK), for example by redirecting and/or focusing/defocusing and/or scattering the compensation radiation (KS), in order to generate the reflected compensation radiation (KS2) from the compensation radiation (KS) and to receive it by the first radiation receiver (PD1). Preferably, the reflected compensation radiation (KS2) is infrared light with a wavelength greater than the wavelength of the fluorescence radiation (FL) and greater than the wavelength of the pump radiation (LB, LB1a). |
| Plastic bumper | The plastic bumper is an example of a component of a vehicle (motor vehicle) in which a sensor system (NVMS) can be installed. Preferably, the component is made of a non-magnetic, i.e., preferably diamagnetic material. Installation in other vehicle components such as steering wheel, mirror housing, seats, dashboard, battery, wiring harness, window regulator, airbag system, air conditioning system, air conditioning flaps, control elements, navigation system, trunk, doors and flaps, filler necks, level measuring devices, locking systems, etc. is conceivable. |
| $\lambda_{fl}$ | fluorescence radiation wavelength ($\lambda_{fl}$) of the fluorescence radiation (FL) of the quantum dot when irradiated with pump radiation (LB) of the pump radiation wavelength ($\lambda_{pmp}$). |
| $\lambda_{ks}$ | compensation radiation wavelength ($\lambda_{ks}$) of the compensation radiation (KS) of the compensation radiation source (PLK). |
| $\lambda_{pmp}$ | Pump radiation wavelength ($\lambda_{pmp}$) of the pump radiation (LB, LB1a) of the pump radiation source (PL1). |
| L0 | coil. In the example of FIG. 30, a current source (SQ) generates a magnetic flux density (B) by means of the coil (L0). |
| L1 | first coil. In FIG. 1, the first coil (L1) is integrated into the integrated microelectronic circuit (IC) as an exemplary flat coil. |
| L2 | second coil. The second coil (L2) is the first coil of the second pair of Helmholtz coils (L2, L4). |
| L3 | third coil. The third coil (L3) is the second coil of the first pair of Helmholtz coils (L7, L3). |

-continued

| | LIST OF REFERENCE SYMBOLS |
|---|---|
| L4 | fourth coil. The fourth coil (L4) is the second coil of the second pair of Helmholtz coils (L2, L4). |
| L5 | fifth coil. The fifth coil (L5) is the first coil of the third pair of Helmholtz coils (L5, L6). |
| L6 | sixth coil. The sixth coil (L6) is the second coil of the third pair of Helmholtz coils (L5, L6). |
| L7 | seventh coil. The seventh coil (L7) is the first coil of the first pair of Helmholtz coils (L7, L3). |
| L8 | eighth coil. |
| LB | pump radiation emitted by the first pump radiation source (PL1). The wavelength of the pump radiation (LB) is preferably chosen such that the pump radiation (LB) can excite the paramagnetic center (NV1) used to emit fluorescence radiation (FL). For example, in the case of a NV center in diamond as the paramagnetic center (NV1), the wavelength is preferably chosen such that the pump radiation (LB) is green light. In this context, supplementary reference is made to the relevant literature and the cited German unpublished patent applications. Preferably, in the case of an NV center in diamond as a paramagnetic center (NV1), the pump radiation (LB) is green light with a wavelength of 500 nm to 600 nm, better 520 nm to 540 nm, better 530 nm +/− 5 nm, which is shorter than the wavelength of the fluorescence radiation (FL, FL1) and shorter than the wavelength of the compensation radiation (KS). |
| LB1a | pump radiation emitted by the first pump radiation source (PL1). The pump radiation wavelength ($\lambda_{pmp}$) of the pump radiation (LB1a) is preferably selected such that the pump radiation (LB1a) can excite the used quantum dot, e.g., the used paramagnetic center (NV1) or plurality (NVC) of paramagnetic centers (NV1) or NV center or plurality of NV centers, to emit fluorescence radiation (FL) having a fluorescence wavelength ($\lambda_{fl}$). For example, in the case of a NV center in diamond as a paramagnetic center (NV1), or in the case of a plurality of NV centers in diamond as a plurality (NVC) of paramagnetic centers (NV1), the pump radiation wavelength ($\lambda_{pmp}$) is preferably selected so that the pump radiation (LB1a) is green light. In this context, supplementary reference is made to the relevant literature and the cited German unpublished patent applications. Preferably, the pump radiation (LB1a) is in the case of a NV center in diamond as a paramagnetic center (NV1) resp. in the case of a plurality of NV centers in diamond as a plurality (NVC) of paramagnetic centers (NV1), is green light having a pump radiation wavelength ($\lambda_{pmp}$) of 500 nm to 600 nm, preferably 520 nm to 540 nm, preferably 530 nm +/− 5 nm, which is preferably shorter than the fluorescence wavelength ($\lambda_{fl}$) of the fluorescence radiation (FL, FL1) and often shorter than the compensation radiation wavelength ($\lambda_{ks}$) of the compensation radiation (KS). |
| LB1b | reflected pump radiation. The reflector (RE) reflects the pump radiation (LB, LB1a) of the first pump radiation source (PL1) as reflected pump radiation (LB1b) preferably in the direction of the paramagnetic center (NV1). Instead of the reflector (RE), other optical functional elements can also be used for optical coupling of the paramagnetic center (NV1) with the first pump radiation source (PL1), for example by redirecting and/or focusing and/or scattering the pump radiation (LB, LB1a), in order to generate the reflected pump radiation (LB1b) from the pump radiation (LB, LB1a) and to transmit it through the quantum dot, e.g., in the form of the paramagnetic center (NV1). e.g. in the form of the paramagnetic center (NV1) or in the form of the plurality (NVC) of paramagnetic centers (NV1) or in the form of the NV center or in the form of the plurality of NV centers, and to excite the quantum dot, if necessary, to fluoresce by emitting fluorescence radiation (FL) having a fluorescence wavelength ($\lambda_{fl}$). Preferably, the reflected pump radiation (LB1b) is a paramagnetic center (NV1) in the case of a NV center in diamond or in the case of a plurality of NV centers in diamond as a plurality (NVC) of paramagnetic centers (NV1), is green light with a wavelength of 500 nm to 600 nm, more preferably 520 nm to 540 nm, more preferably 530 nm +/− 5 nm, which is typically shorter than the fluorescence radiation wavelength ($\lambda_{fl}$) of the fluorescence radiation (FL, FL1) and often shorter than the compensation radiation wavelength ($\lambda_{ks}$) of the compensation radiation (KS). |
| LC | compensation coil. |
| LF1 | first lead frame island. This serves as the connection pin in the example in FIG. 1. |
| LF2 | second lead frame island This serves as the die paddle for the integrated circuit (IC) in the example of FIG. 1. |

Figure 3:
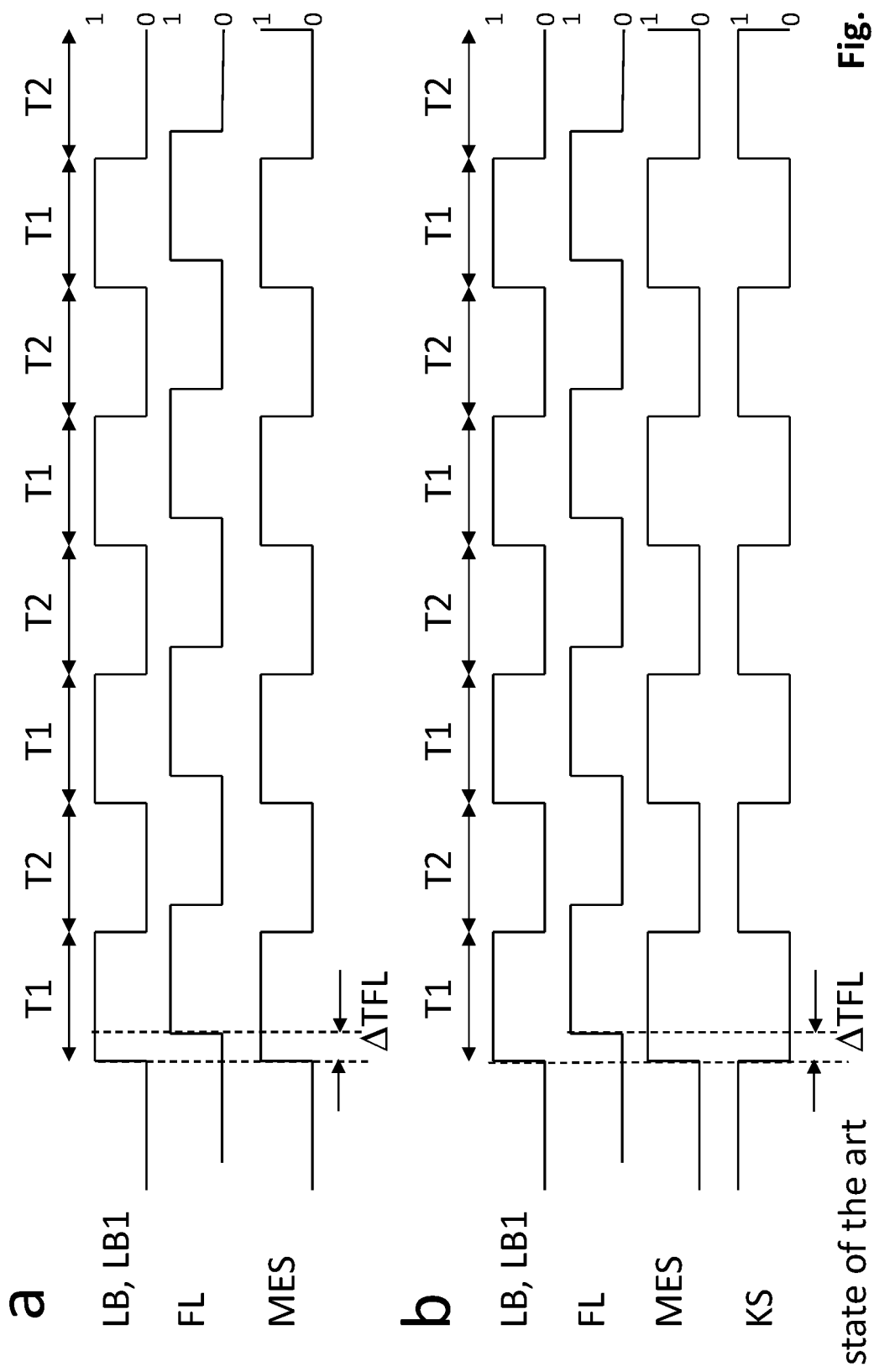
FIG. 3a is a diagram of an example timing for a first radiation receiver (PD1) relative to a first pump radiation source (PL1).
FIG. 3b is a diagram of an example timing for the first radiation receiver (PD1) relative to the first pump radiation source (PL1) and the compensation radiation source (PLK).
Figure 4:
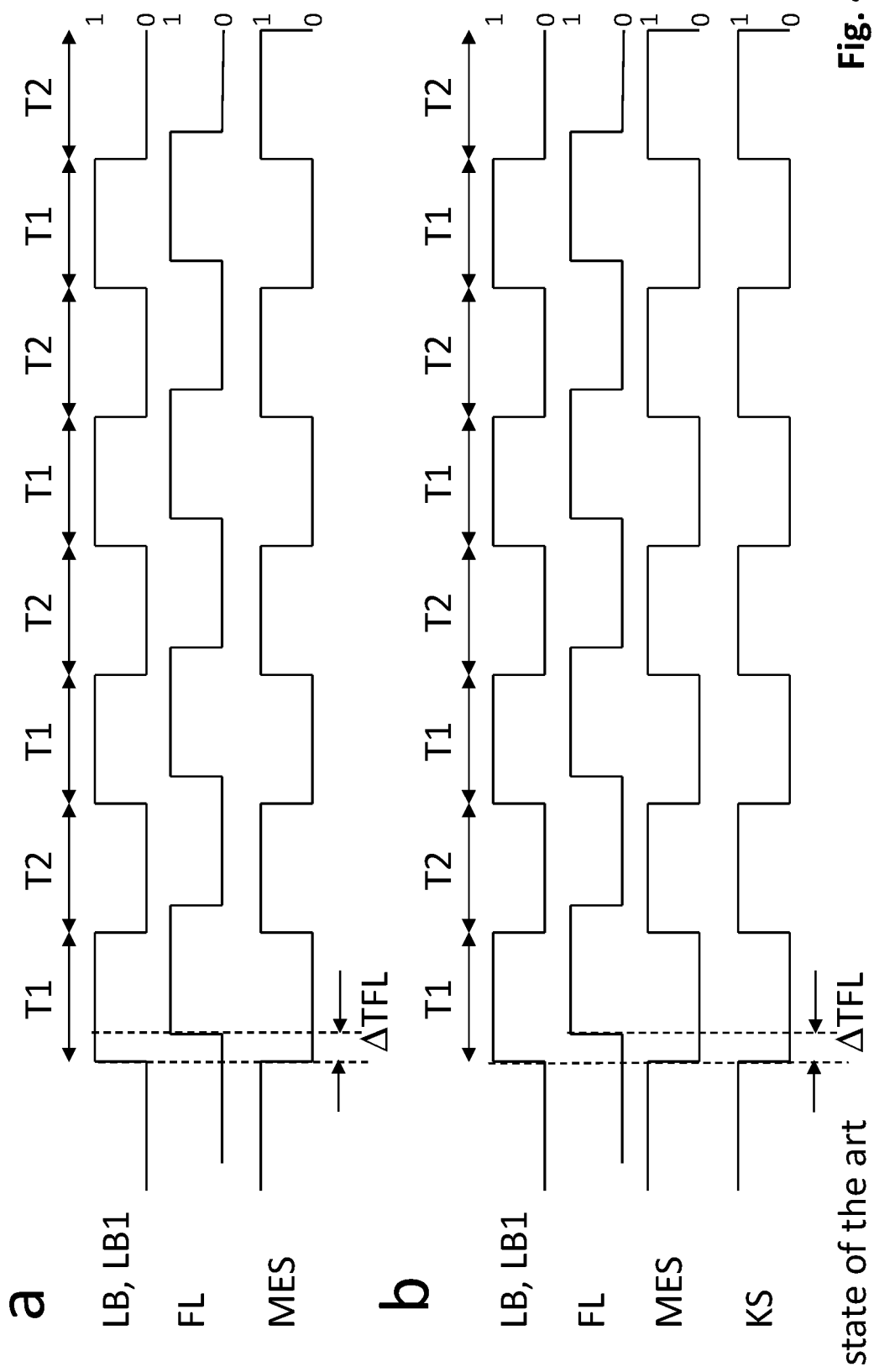
FIG. 4a is a diagram of an example timing of the first radiation receiver (PD1) relative to the first pump radiation source (PL1).
FIG. 4b is a diagram of an example timing of the first radiation receiver (PD1) relative to the first pump radiation source (PL1) and the compensation radiation source (PLK).

| | LIST OF REFERENCE SYMBOLS |
|---|---|
| LF3 | third lead frame island. In the example of FIG. 1, this serves as the die paddle for the pump radiation source (PL1). |
| LF4 | fourth lead frame island. This serves as the connection pin in the example in FIG. 1. |
| LS | loudspeaker/acoustic output unit. |
| LSL | line/data bus for controlling the acoustic output unit (LS). |
| LSP1 | first air gap. |
| LSP2 | second air gap. |
| LSP3 | third air gap. |
| LWL1 | first optical fiber. |
| LWL2 | second optical fiber. |
| µC | Microcomputer. |
| m | symmetry point. The point of symmetry (m) is the point to which the toothed rail in FIG. 41 has just lowered the magnetic flux (B) in the air gap of the slot sensor in such a way that when the toothed rail moves further from left to right, the flux density (B) increases again from this point. In this case, the symmetry axis (ms) of the tooth of the toothed rail in FIG. 41 is located at the symmetry point of the slot sensor. |
| M1 | first multiplier. |
| M2 | second multiplier. |
| MDS | output data stream of the prototypes recognized by the pattern recognizer (NN) (prototype = prototypical feature vector of the database). |
| ME | membrane. |
| MES | exemplary measurement signal (MES) to illustrate when the receiver output signal (S0) of the first radiation receiver (PD1) is preferably evaluated. In FIGS. 3 and 4, an exemplary measurement signal logical value of 1 is to exemplify that the receiver output signal (S0) is evaluated, and an exemplary measurement signal logical value of 0 is to exemplify that the receiver output signal (S0) of the first radiation receiver (PD1) is not evaluated at those times. |
| Measured value | measured value that the computer (µC) generates and/or provides and/or transmits. |
| ms | axis of symmetry (ms) of the tooth of the toothed rail in FIG. 41. |
| MS1 | first measured value signal. |
| N | magnetic north pole. |
| NN | pattern recognizer. The pattern recognizer (NN) is preferably a computer system that executes an algorithm for recognizing patterns in the vector output data stream (VDS) of the control and conditioning unit (IF). This may be, for example, a neural network, an HMM recognizer or the like from pattern recognition. |
| NNL | line and/or data bus (NNL) for controlling the pattern recognizer (NN). |
| NV1 | at least one paramagnetic center (NV1) or at least one quantum dot in a sensor element. Preferably, the quantum dot is a paramagnetic center (NV1) or a plurality (NVC) of paramagnetic centers (NBV1) or a NV center or a plurality of NV centers. Preferably, the paramagnetic center (NV1) is one or more defect centers in a crystal, the crystal being the sensing element as defined herein. Preferably, the crystal, i.e., the sensor element, is a diamond crystal. Preferably, the defect center is a NV center in a diamond crystal. For the purposes of this writing, it may also be multiple defect centers in a crystal and/or an assembly of multiple crystals with multiple defect centers. For example, it may be multiple NV centers coupled together in a diamond crystal and/or multiple diamonds with multiple NV centers, preferably interacting and preferably coupled together, e.g., by stimulated emission and absorption. Preferably, in the case of the use of NV centers in diamond as paramagnetic centers (NV1), the sensor element is a diamond with high NV density and, more preferably, a diamond artificially produced by means of high-pressure high-temperature with preferably a content of NV centers as paramagnetic centers (NV1) in a concentration range of 0.1 ppm to 500 ppm relative to the atoms of the diamond. However, in addition to the preferred combination of NV center as paramagnetic center and diamond as sensing element, it may also be one or more other paramagnetic centers in diamond. For example, a SiV center or a ST1 center or a L2 center in diamond. The quantum dot (NV1) can also have these defect centers mixed in diamond, if necessary. Also, other crystals with other defect centers can be used if they exhibit the magnetic field-dependent fluorescence. |
| NV2 | second quantum dot (NV2) and/or second paramagnetic center (NV2) and/or NV center. It is at least one second paramagnetic center (NV2) or at least one second quantum dot (NV2) in a sensor element. Preferably, the paramagnetic center is one or more defect |

-continued

LIST OF REFERENCE SYMBOLS

|  | |
|---|---|
|  | centers in a crystal, the crystal being the sensor element as defined herein. Preferably, the crystal, i.e., the sensor element, is a diamond crystal. Preferably, the defect center is a NV center in a diamond crystal. For the purposes of this writing, it may also be multiple defect centers in a crystal and/or an assembly of multiple crystals with multiple defect centers. For example, it may be multiple NV centers coupled together in a diamond crystal and/or multiple diamonds with multiple NV centers, preferably interacting and preferably coupled together, e.g., by stimulated emission and absorption. Preferably, in the case of using NV centers in diamond as paramagnetic centers (NV2), the sensor element is a diamond with high NV density, and preferably a diamond artificially produced by means of high-pressure high-temperature with preferably a content of NV centers as second paramagnetic centers (NV2) in a concentration range of 0.1 ppm to 500 ppm relative to the atoms of the diamond. However, in addition to the preferred combination of NV center as defect center and diamond as sensing element, it may also be one or more other defect centers in diamond. For example, a SiV center or a ST1 center or a L2 center in diamond. The second quantum dot (NV2) can have these defect centers mixed in diamond if necessary. Also, other crystals with other defect centers can be used if they exhibit the magnetic field-dependent fluorescence. |
| NVC | plurality (NVC) of paramagnetic centers (NV1). Preferably, it is a cluster of paramagnetic centers (NV1), which may also comprise an entire crystal of a material of the sensor element. |
| NVC2 | second plurality (NVC2) of second paramagnetic centers (NV2). Preferably, it is a cluster of second paramagnetic centers (NV2), which may also comprise an entire crystal of a material of the sensor element. |
| NVMS | sensor system. The proposed sensor system comprises at least one sensor element having at least one paramagnetic center (NV1). The sensor system has means for stimulating fluorescence radiation (FL) of this paramagnetic center (NV1) typically as a function of the respective magnetic flux density (B) at the location of the quantum dot of the sensor element in question, thus for example at the location of the respective paramagnetic center (NV1) of the respective sensor element. Thereby the sensor system has means for detecting the respective fluorescence radiation (FL) and means for processing the value of the detected fluorescence radiation (FL), in particular the intensity ($I_{fl}$) of the fluorescence radiation (FL), and/or for transmitting it to a higher-level system. |
| NVMS1 | first sensor system. The proposed first sensor system (NVMS1) comprises at least one sensor element having at least one quantum dot, for example having at least one paramagnetic center (NV1). Thereby the first sensor system has means for stimulating fluorescence radiation (FL) of this paramagnetic center (NV1) typically as a function of the respective magnetic flux density (B) at the location of the respective quantum dot of the sensor element in question, for example at the location of the respective paramagnetic center (NV1) of the sensor element in question. Thereby the first sensor system has means for detecting the respective fluorescence radiation (FL), for example the intensity ($I_{fl}$) of the fluorescence radiation (FL). Thereby the first sensor system has means for processing the value of the detected fluorescence radiation (FL) and/or transmitting it to a higher-level system. |
| NVMS2 | second sensor system. The proposed second sensor system (NVMS2) comprises at least one sensor element having at least one quantum dot, for example having at least one paramagnetic center (NV1). Thereby the second sensor system (NVMS2) has means for stimulating a fluorescence radiation (FL) of this paramagnetic center (NV1) typically as a function of the respective magnetic flux density (B) at the location of the respective quantum dot of the sensor element in question, for example at the location of the respective paramagnetic center (NV1) of the sensor element in question. Thereby the second sensor system has means for detecting the respective fluorescence radiation (FL), for example the intensity ($I_{fl}$) of the fluorescence radiation (FL). Thereby the second sensor system has means for processing the value of the detected fluorescence radiation (FL) and/or transmitting it to a higher-level system. |
| NVMS3 | third sensor system. The proposed third sensor system (NVMS3) comprises at least one sensor element having at least one quantum dot, for example having at least one paramagnetic center (NV1). Thereby the third sensor system (NVMS3) has means for stimulating fluorescence radiation (FL) of this paramagnetic center |

-continued

LIST OF REFERENCE SYMBOLS

| | |
|---|---|
| | (NV1) typically as a function of the respective magnetic flux density (B) at the location of the respective quantum dot of the sensor element in question, for example at the location of the respective paramagnetic center (NV1) of the sensor element in question. Thereby the third sensor system has means for detecting the respective fluorescence radiation (FL), for example the intensity ($I_{fl}$) of the fluorescence radiation (FL). Thereby the third sensor system has means for processing the value of the detected fluorescence radiation (FL) and/or transmitting it to a higher-level system. |
| NVMS4 | fourth sensor system. The proposed fourth sensor system (NVMS4) comprises at least one sensor element having at least one quantum dot, for example, having at least one paramagnetic center (NV1). Thereby the fourth sensor system (NVMS4) has means for stimulating fluorescence radiation (FL) of this paramagnetic center (NV1) typically as a function of the respective magnetic flux density (B) at the location of the respective quantum dot of the sensor element in question, for example, at the location of the respective paramagnetic center (NV1) of the sensor element in question. Thereby the fourth sensor system has means for detecting the respective fluorescence radiation (FL), for example the intensity ($I_{fl}$) of the fluorescence radiation (FL). Thereby the fourth sensor system has means for processing the value of the detected fluorescence radiation (FL) and/or transmitting it to a higher-level system. |
| OE | opening in the yoke (J1) of the current measuring device of figure 26 (flux gate). |
| Obj | object. |
| OF | offset device. The offset device adds a typically positive DC component to the feedback signal (S6) and thus generates the offset feedback signal (S7). |
| OP1 | first operational amplifier. |
| out | first output signal. |
| out" | second output signal. |
| P1 | first periodicity. |
| P2 | second periodicity. |
| PCB | printed circuit board. |
| PD1 | first radiation receiver. Preferably, it is a photosensitive device, for example a photodiode and/or a PIN diode and/or an avalanche photodiode and/or a SPAD photodiode or the like. The first radiation receiver (PD1) may further comprise other amplifiers and/or filters and/or other signal conditioning, which for simplicity are not discussed further here. Thus, it may also be a radiation receiver system. |
| PD2 | second radiation receiver. Preferably, this is a photosensitive device, for example a photodiode and/or a PIN diode and/or an avalanche photodiode and/or a SPAD photodiode or the like. The second radiation receiver (PD2) may include other amplifiers and/or filters and/or other signal conditioning, which for simplicity are not discussed further here. Thus, it may also be a radiation receiver system. |
| permanent magnetic field | permanent magnetic field. The permanent magnetic field is preferably generated by one or more permanent magnets (PM1, PM2). The permanent magnetic flux B generated, for example, by the one or more permanent magnets (PM1, PM2) has a summing superimposing effect on the quantum dot (NV1) or the paramagnetic center (NV1) or the NV center (NV1) together with, for example, an external magnetic field. |
| PL | pump radiation source. The pump radiation source (PL) excites the quantum dot (NV1), or the paramagnetic center, or the NV center (NV1) to emit fluorescence radiation (FL) as a function of the magnetic flux density (B) at the location of the quantum dot (NV1), or the paramagnetic center, or the NV center (NV1). In the case of using NV centers in diamond as quantum dots or as paramagnetic centers (NV1), it is preferred to use an LED and/or a laser with 535 nm wavelength. A wavelength range of typically 500 nm to 600 nm is conceivable in the case of the use of NV centers in diamond as quantum dots or as paramagnetic centers (NV1) and is encompassed by the claims. |
| PL1 | first pump radiation source (PL1). The first pump radiation source (PL1) excites the quantum dot (NV1), or the paramagnetic center, or the NV center (NV1) to emit fluorescence radiation (FL) as a function of the magnetic flux density (B) at the location of the quantum dot (NV1), or the paramagnetic center, or the NV center (NV1). In the case of using NV centers in diamond as quantum dots or as paramagnetic centers (NV1), it is preferred to use an LED and/or a laser with 535 nm wavelength. A wavelength range of |

| | |
|---|---|
| | typically 500 nm to 600 nm is conceivable in the case of the use of NV centers in diamond as quantum dots or as paramagnetic centers (NV1) and is encompassed by the claims. |
| PLK | compensating radiation source. Preferably, this is an infrared LED, in particular preferably with a wavelength greater than 800 nm. |
| PM1 | first permanent magnet. |
| PM2 | second permanent magnet. |
| PM3 | third permanent magnet. |
| PM4 | fourth permanent magnet. |
| RE | reflector or other suitable optical functional element or other optical system for directing at least part of the pump radiation (LB1a) as reflected pump radiation (LB1b) towards the paramagnetic center (NV1). |
| RG | regulator. |
| RO | fluidic conduit, for example, a pipe or a vessel or a reactor or an electrochemical device or a boiler or a battery container or an accumulator container or a fuel cell or an electrolysis cell or a microfluidic or fluidic functional element, such as a dweller or a heat exchanger or an atomizer or a nozzle or a mixer, etc. The fluidic conduit (RO) may also be a wellbore (DH). In that case, the proposed sensor system (NVMS) can be used for reservoir exploration. |
| S | magnetic south pole (S). |
| S0 | receiver output signal. |
| S1 | reduced receiver output signal. |
| S3 | filter input signal. |
| S3' | additional filter input signal. |
| S4 | filter output signal. |
| S4' | additional filter output signal. |
| S5 | transmission signal. |
| S5' | orthogonal reference signal. |
| S6 | feedback signal. |
| S6' | additional feedback signal. |
| S7 | offset feedback signal. |
| S8 | complex feedback signal. |
| S9 | operating point control signal. |
| SMBG | symbol generator. |
| SO | probe. The probe (SO) is lowered into the wellbore (DH) on a cable (KA) in FIG. 74. The cable (KA) may comprise one or more optical fibers. The measuring system can be designed in such a way that, according to FIGS. 28 to 30, the sensor element, for example the diamond crystal, with the quantum dot (NV1), i.e., the paramagnetic center or the NV center (NV1), is separated from the other sensor system components. This has the advantage that the evaluation electronics (e.g., the integrated circuit (IC)) are thus not exposed to the extreme downhole (DH) conditions. However, provided that these components are adequately protected, they can also be lowered into the borehole (DH) as part of the probe. In this case, the probe (SO) has not only a sensor element with a quantum dot (NV1), but an entire sensor system (NVMS). In this case, the energy is preferably supplied via the cable (KA). The sensor system (NVMS) then signals the measurement results, e.g., via the cable (KA) or wirelessly, back to an evaluation unit on the surface. The probe (SO) may include actuators such as coils, motors, radiation sources, heaters, cooling devices, magnets and the like. The probe (SO) may include other detectors. The probe (SO) may include a computing unit for controlling these actuators and for acquiring readings from the detectors and for signaling status and measurement data to and receiving control data from a higher-level computer system on the surface. |
| Coil driver | coil driver. The coil drivers typically comprise the drive logic and the output stages for driving the Helmholtz coils (L2 to L7); |
| SQ | current source. |
| SS1 | control signal line. |
| STG | control unit. |
| SW1 | first threshold. |
| SW2 | second threshold. |
| T1 | first times. At the first times (T1), the first pump radiation source (PL1) is preferably active. This means that the first pump radiation source (PL1) emits pump radiation (LB, LB1a). If a compensation radiation source (PLK) is used, it is preferably not active during the first times (T1). This means that the compensation radiation source (PLK) preferably does not emit any compensation radiation (KS) in these first times (T1). An evaluation of the receiver output signal (S0) by the correlator (CORR) is possible in some configurations at the first times (T1). In this case, if the first radiation receiver (PD1) is sensitive to pump radiation (LB, LB1a, LB1b), a first optical |

LIST OF REFERENCE SYMBOLS

|   |   |
|---|---|
|   | filter (F1) is necessary to shield the first radiation receiver (PD1) from the pump radiation (LB, LB1a, LB1b). The first times (T1) are preferably different from the third times (T3) and the second times (T2). |
| T1' | shifted first times. The intensity of the fluorescence radiation (FL) received by the first radiation receiver (PD1) in the form of the receiver output signal (S0) appears in the receiver output signal (S0) at shifted first times (T1'), which are shifted by a fluorescence phase shift time ($\Delta$TFL) relative to the first times (T1). At the first times (T1), the pump radiation source (PL1) is preferably active. This means that the first pump radiation source (PL1) emits pump radiation (LB, LB1a). The quantum dot (NV1) or the paramagnetic center (NV1) or the NV center (NV1) is hit by at least a part of the pump radiation (LB, LB1a) and emits the fluorescence radiation (FL) delayed by the fluorescence phase shift time ($\Delta$TFL). Evaluation of the receiver output signal (S0) by the correlator (CORR) is possible in some configurations at the shifted first times (T1'). In this case, a first optical filter (F1) is typically required if the first radiation receiver (PD1) is sensitive to pump radiation (LB, LB1a, LB1b) to shield the first radiation receiver (PD1) from pump radiation (LB, LB1a, LB1b). The shifted first times (T1') preferably overlap with the first times (T1) and the second times (T2). As long as the first times (T1) are shorter than the fluorescence phase shift time ($\Delta$TFL), this may not be the case. |
| T2 | second times. At the second times (T2), the first pump radiation source (PL1) is preferably not active. This means that the first pump radiation source (PL1) does not emit any pump radiation (LB, LB1a). If a compensation radiation source (PLK) is used, it is preferably not active during the second times (T2). This means that the compensation radiation source (PLK) preferably does not emit any compensation radiation (KS) in these second times (T2). An evaluation of the receiver output signal (S0) by the correlator (CORR) is possible in some configurations at the second times (T2). In this case, no first optical filter (F1) is necessary to shield the first radiation receiver (PD1) from the pump radiation (LB, LB1a, LB1b), since no pump radiation (LB, LB1a, LB1b) should then be present in the sensor system (NVMS). In this respect, such sensor systems (NVMS) are less expensive but less sensitive. They work with the afterglow of the quantum dots (NV1) or the paramagnetic centers (NV1), or the NV centers (NV1). The second times (T2) are preferentially different from the first times (T1) and the third times (T3). |
| T3 | third times. At the third times (T3), the first pump radiation source (PL1) is preferably not active. This means that the first pump radiation source (PL1) does not emit any pump radiation (LB, LB1a). If a compensation radiation source (PLK) is used, it is preferably active in the third times (T3). This means that the compensation radiation source (PLK) emits compensation radiation (KS) preferentially in these second times (T2). An evaluation of the receiver output signal (S0) by the correlator (CORR) is not possible at the third times(T3), because the afterglow of the quantum dots (NV1) or the paramagnetic centers (NV1) or the NV centers (NV1) has already decayed by then. In this case, it is possible to use compensating radiation (KS) with a compensating radiation wavelength ($\lambda_{ks}$) that is not different from the fluorescence radiation wavelength ($\lambda_{fl}$) of the fluorescence radiation (FL) or the pump radiation wavelength ($\lambda_{pmp}$) of the pump radiation (LB, LB1a). However, this is not recommended. The third times (T3) are preferably different from the first times (T1) and the second times (T2). |
| TP | filter. As a low-pass filter, the filter can preferably be designed to be a linear filter with preferably large gain. Preferably, it already does not let through the frequency of the transmission signal (S5). All higher frequencies are preferably also filtered out. |
| TR1 | first transistor of the exemplary push-pull stage. |
| TR2 | second transistor of the exemplary push-pull stage. |
| USS | ultrasonic transmitter or ultrasonic transmission system. The ultrasonic transmitter (USS) emits an exemplary acoustic transmission wave (ASW), which is modified to an acoustic wave (AW), for example, at an object (Obj) or in the transmission channel and is then received by the proposed microphone (FIG. 21). Instead of an ultrasonic transmitter (USS), normal loudspeakers or infrasound transmitters can also be used. |

LIST OF REFERENCE SYMBOLS

| | |
|---|---|
| VDD | operating voltage line (VDD) to operating voltage potential. |
| VDS | vectorial output data stream (VDS) of the control and conditioning unit (IF). |
| WA | housing wall. |
| WI | winch. If necessary, the winch (WI) is motorized. |
| X1 | first body. |
| X2 | second body. |
| toothed rail | toothed rail. Device with a modulated surface or edge so that, depending on the positioning of the toothed rail, the magnetic flux (B) at the location of the quantum dot (NV1) or the paramagnetic center (NV1) or the NV center (NV1) is changed. The toothed rail has elevations - for example teeth - and depressions - for example windows. |

LIST OF CITED WRITINGS

Alexander M. Zaitsev, "Optical Properties of Diamond," published by Springer Verlag, Bernd Burchard et. Al., "NM Scale Resolution Single Ion Implantation Into Diamond for Quantum Dot Production", Diamond 2004 Conference Riva del Garda, B. Burchard, J. Meijer, M. Domhan, C. Wittmann, T. Gaebel, I. Popa, F. Jelezko, and J. Wrachtrup, "Generation of single color centers by focused nitrogen implantation" Appl. Opt. Phys. Lett. 87, 261909 (2005); https://doi.org/10.1063/1.2103389, Küpfmüller, Kohn, "Theoretical Electrical Engineering and Electronics" Springer 1993 Chapter 3, Francisco Herrera, Francisco Charte, Antonio J. Rivera, Maria J. del Jesus, "Multilabel Classification: Problem Analysis, Metrics and Techniques," Springer, Apr. 22, 2018, ISBN-13: 978-3319822693 referenced, Charu C. Aggarwal, "Neural Networks and Deep Learning: A Textbook" Springer; 1st edition, Sep. 13, 2018, C. Wang, C. Kurtsiefer, H. Weinfurter, B. Burchard, "Single photon emission from SiV centers in diamond produced by ion implantation" J. Phys. B: At. Mol. Opt. Phys., 39(37), 2006, Björn Tegetmeyer, "Luminescence properties of SiV-centers in diamond diodes" PhD thesis, University of Freiburg, 30 Jan. 2018, Carlo Bradac, Weibo Gao, Jacopo Forneris, Matt Trusheim, Igor Aharonovich, "Quantum Nanophotonics with Group IV defects in Diamond," DOI: 10.1038/s41467-020-14316-x, a rXiv:1906.10992, Rasmus Høy Jensen, Erika Janitz, Yannik Fontana, Yi He, Olivier Gobron, Ilya P. Radko, Mihir Bhaskar, Ruffin Evans, Cesar Daniel Rodriguez Rosenblueth, Lilian Childress, Alexander Huck, Ulrik Lund Andersen, "Cavity-Enhanced Photon Emission from a Single Germanium-Vacancy Center in a Diamond Membrane," arXiv:1912.05247v3 [quant-ph], 25 May 2020, Takayuki Iwasaki, Yoshiyuki Miyamoto, Takashi Taniguchi, Petr Siyushev, Mathias H. Metsch, Fedor Jelezko, Mutsuko Hatano, "Tin-Vacancy Quantum Emitters in Diamond," Phys. Rev. Lett. 119, 253601 (2017), DOI: 10.1103/PhysRevLett.119.253601, arXiv:1708.03576 [quant-ph], Matthew E. Trusheim, Noel H. Wan, Kevin C. Chen, Christopher J. Ciccarino, Ravishankar Sundararaman, Girish Malladi, Eric Bersin, Michael Walsh, Benjamin Lienhard, Hassaram Bakhru, Prineha Narang, Dirk Englund, "Lead-Related Quantum Emitters in Diamond" Phys. Rev. B 99, 075430 (2019), DOI: 10.1103/PhysRevB.99.075430, arXiv:1805.12202 [quant-ph].

EN 10 2018 127 394 A1, EN 076.8,102019120 EN 137.9028.3,102019121 EN 10 2019, 114.9102019121EN 10 2020 119414.5,130 PCT/EN 2020/100648, PCT/EN 2020/100 827

We claim:

1. A sensor system (NVMS) comprising:
   a quantum dot with a plurality of paramagnetic centers (NV1), wherein two or more paramagnetic centers (NV1) of the plurality of paramagnetic centers are couple to each other; and
   a drive and evaluation device (AWV);
   wherein:
   the drive and evaluation device (AWV) comprises:
      a first pump radiation source (PL1);
      a first radiation receiver (PD1);
      a sub-device including one or more compensation coils;
      a first multiplier (M1);
      a second multiplier (M2);
      a subtractor (A1);
      a filter (TP); and
      a controller (RG), the controller being a PI controller or functionally equivalent controller;
   the drive and evaluation device (AWV) irradiates the quantum dot with pump radiation (LB) at least temporarily using the first pump radiation source (PL1);
   the pump radiation (LB) of the first pump radiation source (PL1) depends on a transmission signal (S5) of the drive and evaluation device (AWV);
   the quantum dot emits fluorescence radiation (FL) upon irradiation with the pump radiation (LB);
   the fluorescence radiation (FL) depends on a magnetic flux density (B) at a location of the quantum dot and/or another physical parameter;
   the drive and evaluation device (AWV) generates a first output signal (out) with a signal component representing a measured value as a function of the fluorescence radiation (FL);
   the measured value depends on the value of the magnetic flux density (B) and/or the other physical parameter;
   the drive and evaluation device (AWV) readjusts a sensitivity of the quantum dot for the magnetic flux density (B) and/or the other physical parameter using a sub-device including the one or more compensation coils (LC);

the second multiplier (M2) multiplies the first output signal (out) by a transmitted signal (S5) and thus reconstructs an amplified component of the transmitted signal (S5) in the receiver output signal (S0) as a feedback signal (S6);

the subtractor (A1) subtracts the feedback signal (S6) from the receiver output signal (S0), thus forming a reduced receiver output signal (S1);

the first multiplier (M1) multiplies the reduced receiver output signal (S1) by the transmitted signal (S5) and generates a filter input signal (S3);

the filter (TP) filters the filter input signal (S3) to the first output signal (out);

the controller (RG) derives an operating point control signal (S9) from the first output signal (out);

the control is performed by the controller (RG) with a first time constant $\tau_1$;

the compensation control is performed using the filter (TP) with a second time constant $\tau_2$;

the first time constant $\tau_1$ of the controller (RG) is greater than the second time constant $\tau_2$ of the filter (TP);

in event of a change in the value of the magnetic flux density (B) or a change in the value of another of the physical parameters at the location of the plurality (NVC) of paramagnetic centers (NV1), the controller (RG) shifts the magnetic flux density (B) at the location of the plurality (NVC) of paramagnetic centers (NV1) in a direction of an operating point by subtracting or adding a coil current of the compensation coil (LC) supplied by the controller (RG), and the control and evaluation device (AWV) thus carries out the readjustment via the feedback signal (S6) in a compensating manner, such that the reduced receiver output signal (S1) no longer has any component of the transmitted signal (S5) in the reduced receiver output signal (S1) except for signal noise and control errors.

2. A sensor system (NVMS) comprising:

a quantum dot with a plurality of paramagnetic centers (NV1), wherein two or more paramagnetic centers (NV1) of the plurality (NVC) of paramagnetic centers (NV1) couple to each other, wherein the plurality of paramagnetic centers (NV1) is included in multiple nanodiamonds, the multiple nanodiamonds having different respective crystal orientations; and a drive and evaluation device (AWV);

wherein:

the drive and evaluation device comprises:
  a first pump radiation source (PL1);
  a first radiation receiver (PD1);
  a correlator (CORR), wherein the correlator includes;
  a sub-device including one or more compensation coils;
  a controller (RG), the controller being a PI controller or functionally equivalent controller;

the drive and evaluation device (AWV) irradiates the quantum dot with pump radiation (LB) at least temporarily by means of the first pump radiation source (PL1);

the pump radiation (LB) of the first pump radiation source (PL1) depends on a transmission signal (S5) of the drive and evaluation device (AWV);

the quantum dot emits fluorescence radiation (FL) upon irradiation with the pump radiation (LB);

the fluorescence radiation (FL) depends on a magnetic flux density (B) at a location of the quantum dot and/or another physical parameter;

the drive and evaluation device (AWV) generates, as a function of the fluorescence radiation (FL), by means of a correlator (CORR) which determines a component of a transmitted signal (S5) in a receiver output signal (S0) of the first radiation receiver (PD1), the component of the transmitted signal (S5) in the receiver output signal (S0) being a first output signal (out) which represents a measured value, wherein the correlator includes a synchronous demodulator, an optimal filter, or a matched filter;

the measured value depends on the value of the magnetic flux density (B) and/or the other physical parameter;

the drive and evaluation device (AWV) readjusts a sensitivity of the quantum dot for the magnetic flux density (B) and/or the other physical parameter by means of a sub-device in a form of one or more compensation coils (LC);

a current flow of the compensation coil (LC) depends on the fluorescence radiation (FL) of the quantum dot (NV1);

the drive and evaluation device (AWV) controls the sensitivity of the quantum dot;

the drive and evaluation device (AWV) compensatingly readjusting the sensitivity of the quantum dot by means of a dividing device as a function of a control signal of the control and evaluation device (AWV) by means of a controller (RG);

the compensation coils (LC), as a result of a change in an intensity of the fluorescence radiation (FL) in event of a change in the value of the magnetic flux density (B) or in the event of a change in the value of another physical parameter at the location of the plurality (NVC) of paramagnetic centers (NV1), shift the magnetic flux density (B) at the location of the plurality (NVC) of paramagnetic centers (NV1) in a direction of an operating point by means of a subtraction and/or addition of a coil current; and the drive and evaluation device (AWV) carries out this readjustment in a compensating manner, such that the receiver output signal (S0) of the first radiation receiver (PD1) no longer has any component of the transmitted signal (S5) in the receiver output signal (S0) except for signal noise and control errors, which means that the receiver output signal (S0) of the first radiation receiver (PD1) has a component of the transmission signal (S5) in the receiver output signal (S0) with an amplitude that is smaller than a predetermined amplitude bandwidth amount.

3. The sensor system according to claim 2, wherein the different respective crystal orientations are random.

4. The sensor system according to claim 2, wherein the correlator includes the synchronous demodulator.

5. The sensor system according to claim 2, wherein the correlator includes the optimal filter.

6. The sensor system according to claim 2, wherein the correlator includes the matched filter.

* * * * *